United States Patent
Hashimoto et al.

(10) Patent No.: US 7,824,996 B2
(45) Date of Patent: Nov. 2, 2010

(54) SEMICONDUCTOR DEVICE FABRICATION METHOD AND SEMICONDUCTOR DEVICE

(75) Inventors: Koji Hashimoto, Kanagawa-ken (JP); Soichi Inoue, Kanagawa-ken (JP); Kazuhiro Takahata, Kanagawa-ken (JP); Kei Yoshikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/724,019

(22) Filed: Mar. 15, 2010

(65) Prior Publication Data
US 2010/0196809 A1    Aug. 5, 2010

Related U.S. Application Data

(62) Division of application No. 11/643,907, filed on Dec. 22, 2006, which is a division of application No. 10/107,298, filed on Mar. 28, 2002, now Pat. No. 7,208,423.

(30) Foreign Application Priority Data

| Mar. 29, 2001 | (JP) | .......................... P2001-095038 |
| Apr. 20, 2001 | (JP) | .......................... P2001-123632 |
| Apr. 20, 2001 | (JP) | .......................... P2001-123633 |
| Feb. 25, 2002 | (JP) | .......................... P2002-047944 |

(51) Int. Cl.
H01L 21/302 (2006.01)
(52) U.S. Cl. .................. 438/316; 438/716; 438/717
(58) Field of Classification Search ................ 438/316, 438/716, 717
See application file for complete search history.

(56) References Cited

U.S. PATENT DOCUMENTS 4,908,430 A    3/1990   Zecher et al.

(Continued)

FOREIGN PATENT DOCUMENTS

EP    0 753 885 A1    3/1997

(Continued)

OTHER PUBLICATIONS

Notification of Reasons for Refusal issued by the Japanese Patent Office dated Apr. 18, 2006, for Japanese Patent Application No. 2001-123633, and English-language translation thereof.

(Continued)

*Primary Examiner*—Howard Weiss
*Assistant Examiner*—Steven H Rao
(74) *Attorney, Agent, or Firm*—Finnegan, Henderson, Farabow, Garrett & Dunner, L.L.P.

(57) ABSTRACT

A resist pattern (5) is formed in a dimension of a limitation of an exposure resolution over a hard mask material film (4) over a work film (3). The material film (4) is processed using the resist pattern (5) as a mask. A hard mask pattern (6) is thereby formed. Thereby a resist pattern (7), over a non-selected region (6b), having an opening (7a) through which a selection region (6a) in the mask pattern is exposed is formed. Only the mask pattern (6a) exposed through the opening (7a) is slimmed by performing a selection etching, the work film (3) is etched by using the mask pattern (6). A work film pattern (8) is thereby formed, which include a wide pattern section (8a) of a dimension width of the limitation of the exposure resolution and a slimmed pattern section (8a) of a dimension that is not more than the limitation of the exposure resolution.

16 Claims, 103 Drawing Sheets

U.S. PATENT DOCUMENTS

| | | |
|---|---|---|
| 4,908,830 A | 3/1990 | Yoshida et al. |
| 5,523,258 A | 6/1996 | Petti |
| 5,804,088 A | 9/1998 | McKee |
| 5,909,628 A | 6/1999 | Chatterjee et al. |
| 5,923,056 A | 7/1999 | Lee et al. |
| 5,972,769 A | 10/1999 | Tsu et al. |
| 6,136,700 A | 10/2000 | McAnally et al. |

FOREIGN PATENT DOCUMENTS

| | | |
|---|---|---|
| EP | 0 849 785 A2 | 6/1998 |
| JP | 2-303022 | 12/1990 |
| JP | 4-130709 | 5/1992 |
| JP | 5-326899 | 12/1993 |
| JP | 7-074158 | 3/1995 |
| JP | 9-186166 | 7/1997 |
| JP | 9-237777 | 9/1997 |
| JP | 11-087637 | 3/1999 |
| JP | 2000-058830 | 2/2000 |
| JP | 2000-181082 | 6/2000 |
| JP | 2000-258892 | 9/2000 |
| KR | 1996-19788 A | 6/1996 |

OTHER PUBLICATIONS

Notification of Reasons for Refusal issued by the Japanese Patent Office on Jan. 23, 2007, for Japanese Patent Application No. 2002-047944, and English-language translation thereof.

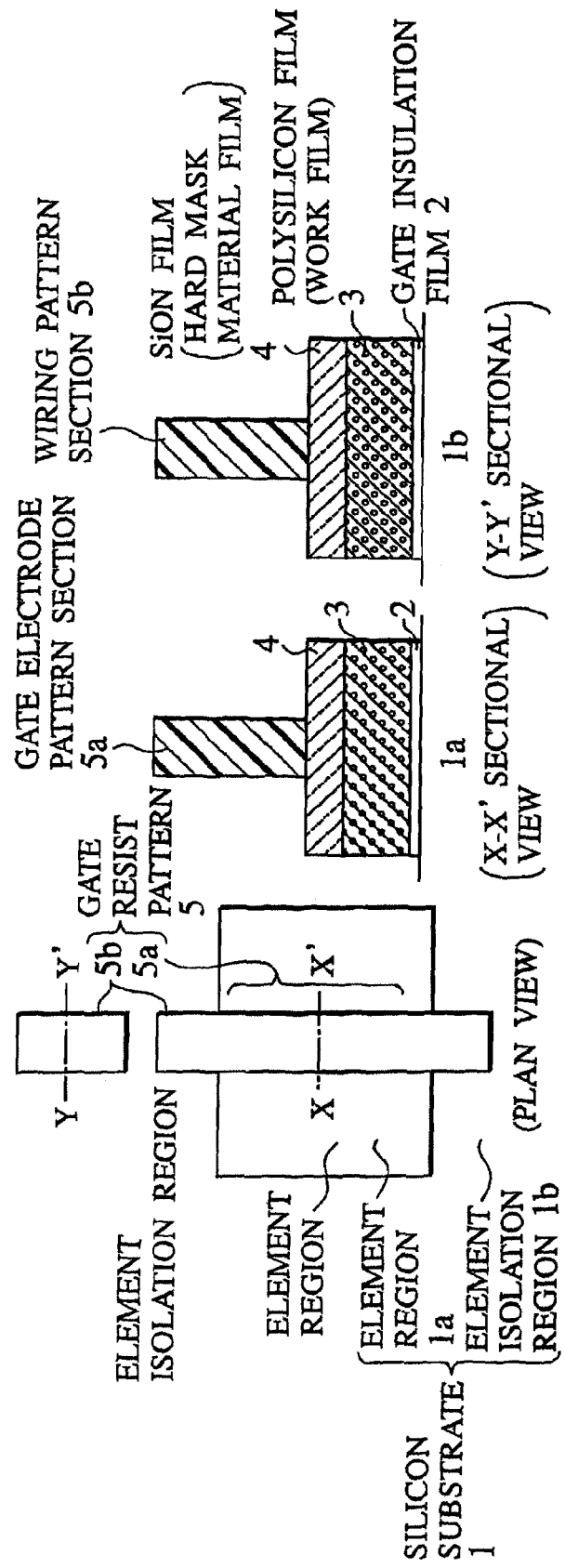

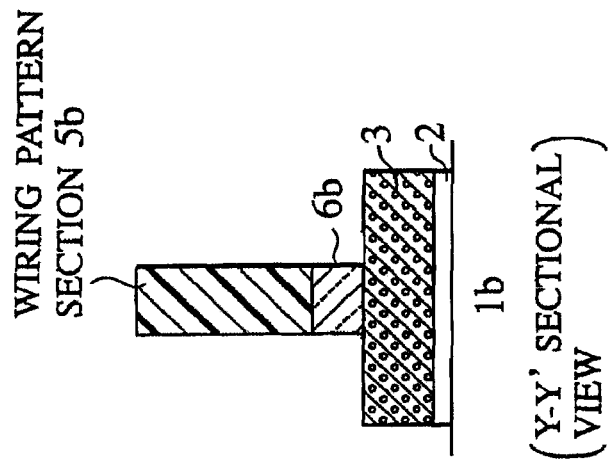
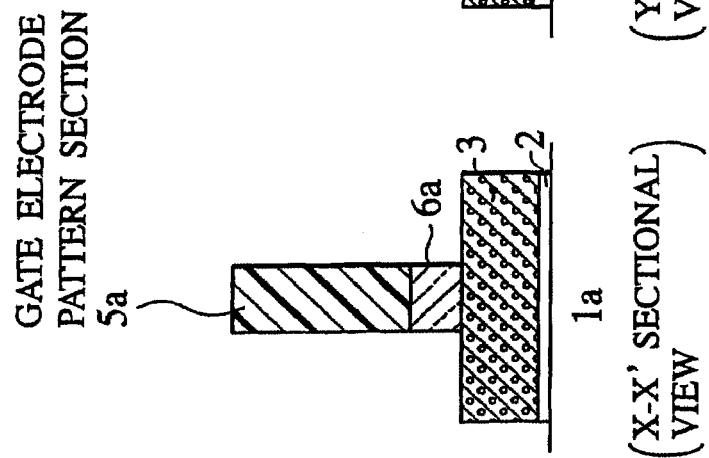
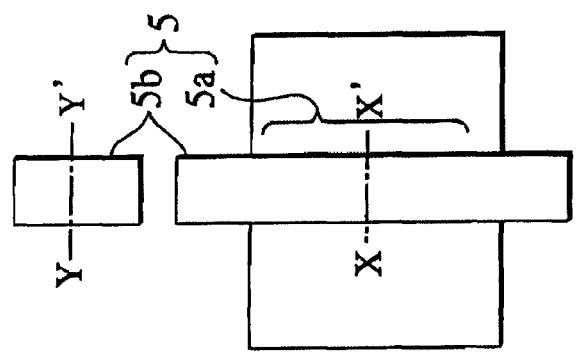

(Y-Y' SECTIONAL VIEW)

(X-X' SECTIONAL VIEW)

(PLAN VIEW)

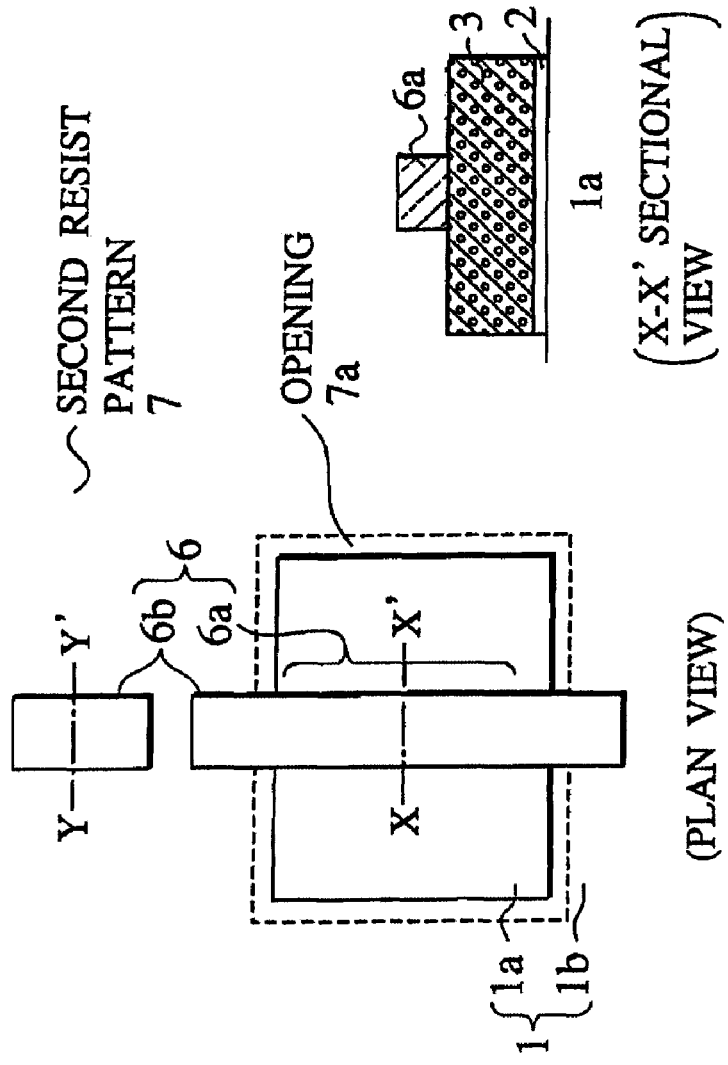

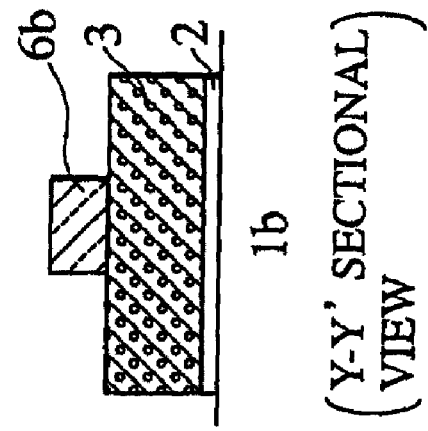
FIG.6C (Y-Y' SECTIONAL VIEW)
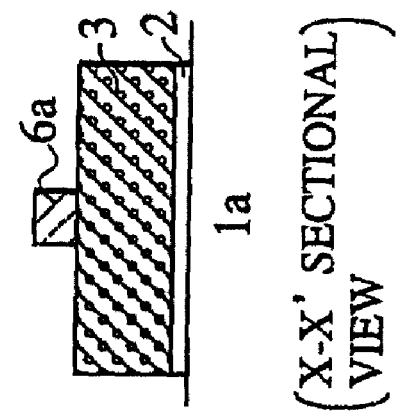
FIG.6B (X-X' SECTIONAL VIEW)
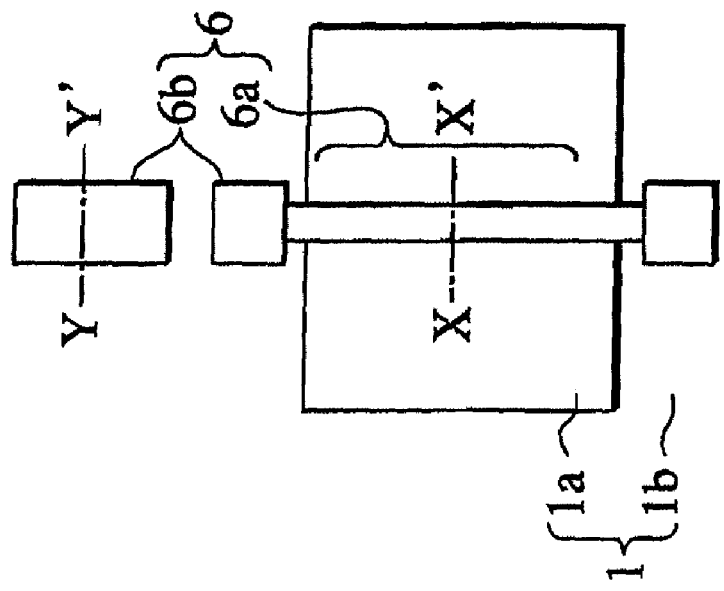
FIG.6A (PLAN VIEW)

FIG.8A
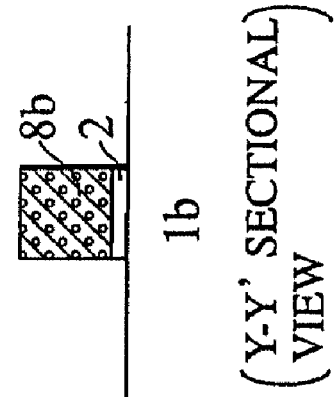
FIG.8B
FIG.8C
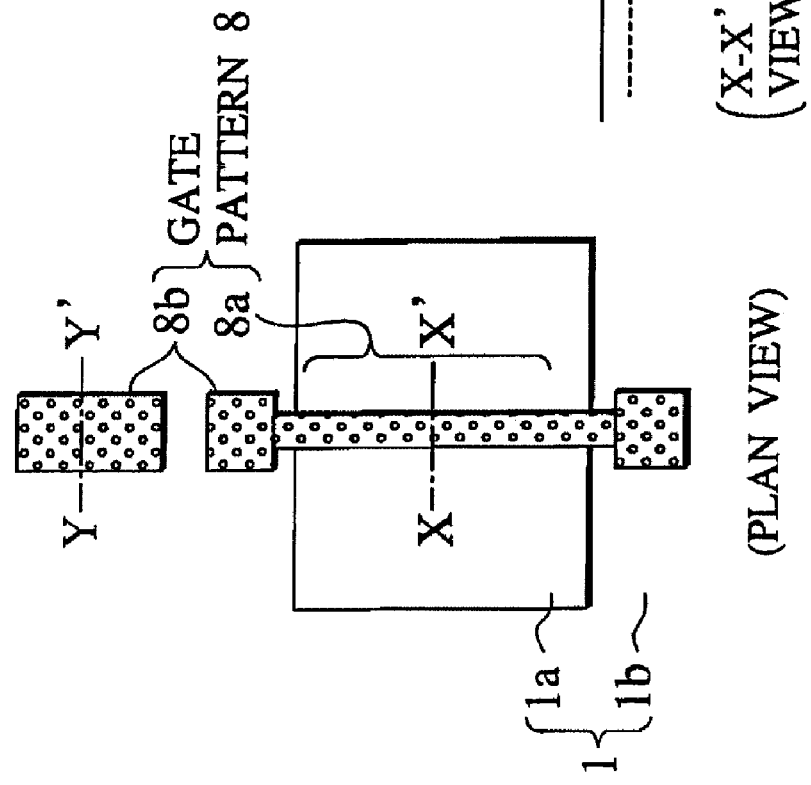

RESIST PATTERN BEFORE SLIMING

GATE PATTERN

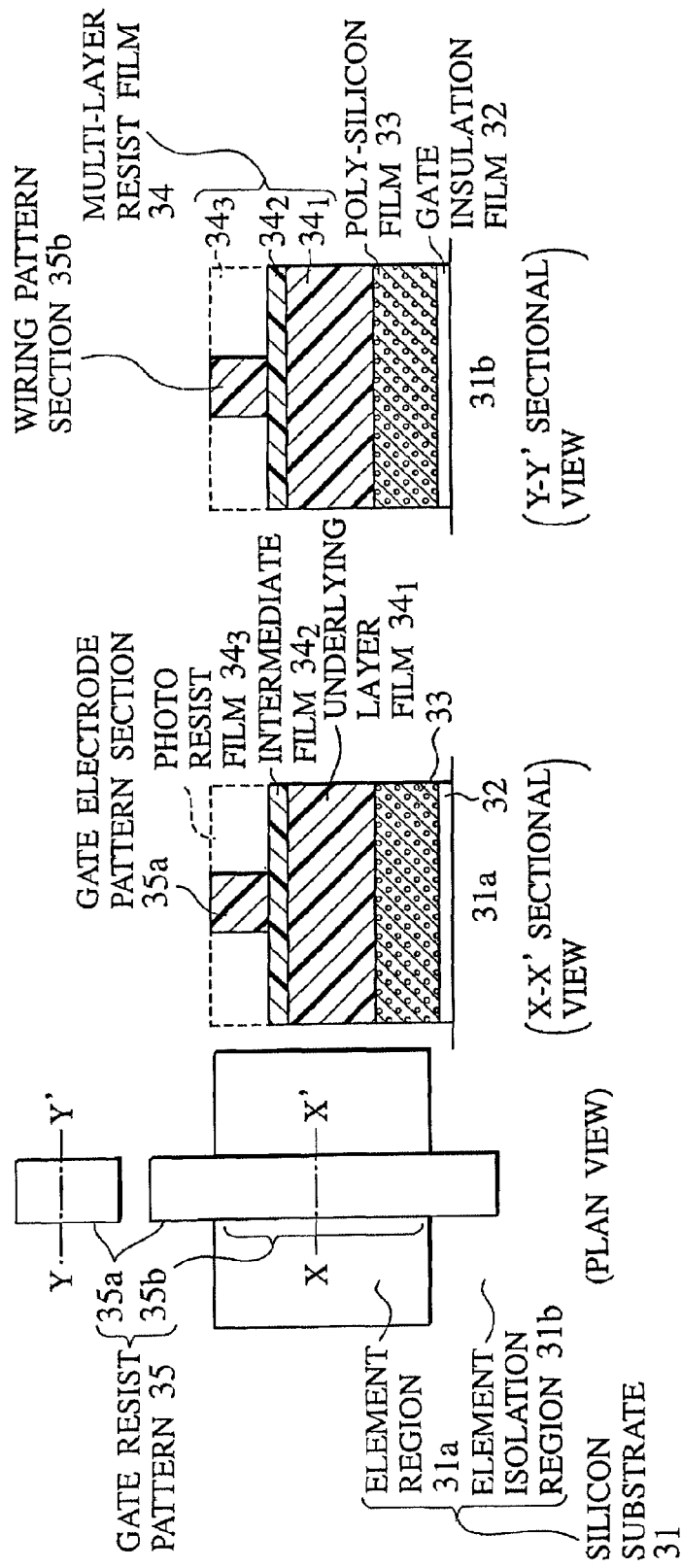

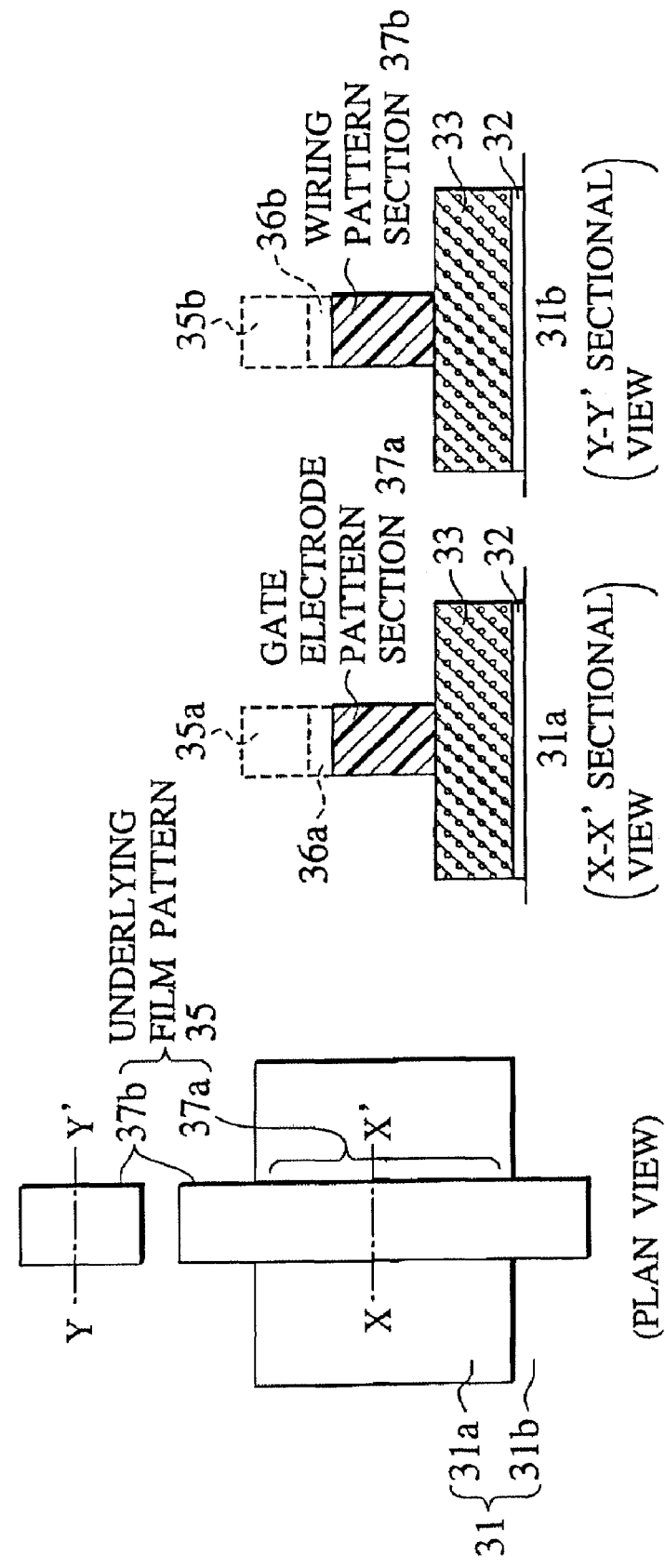

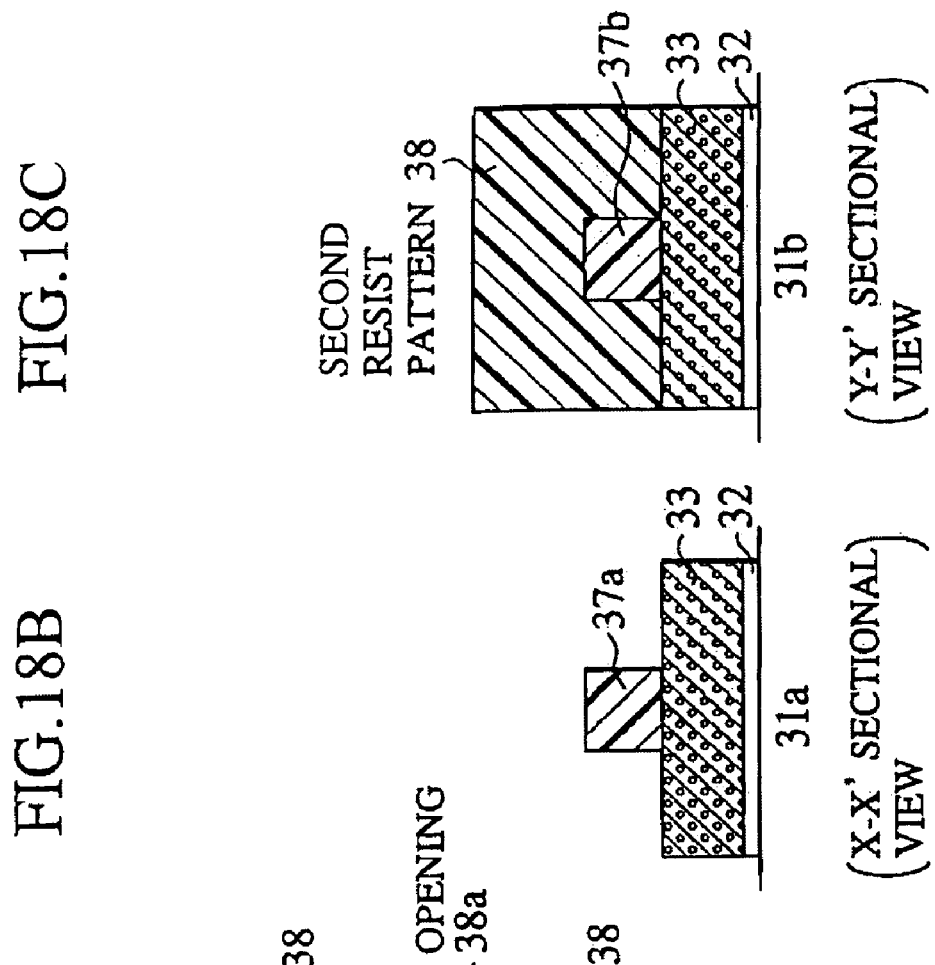
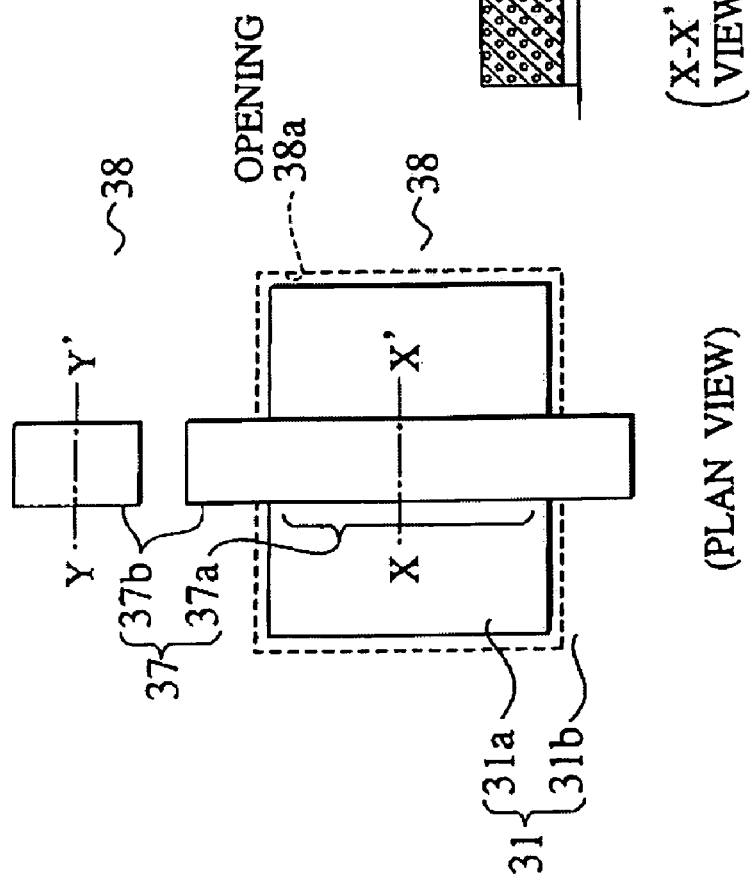

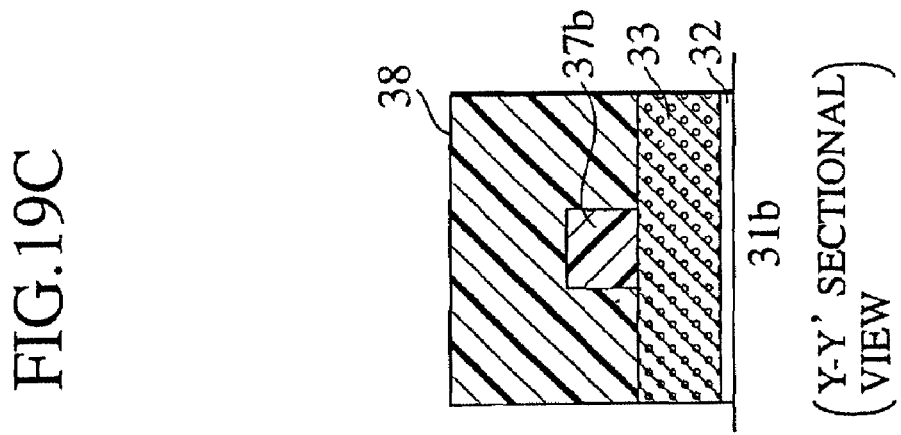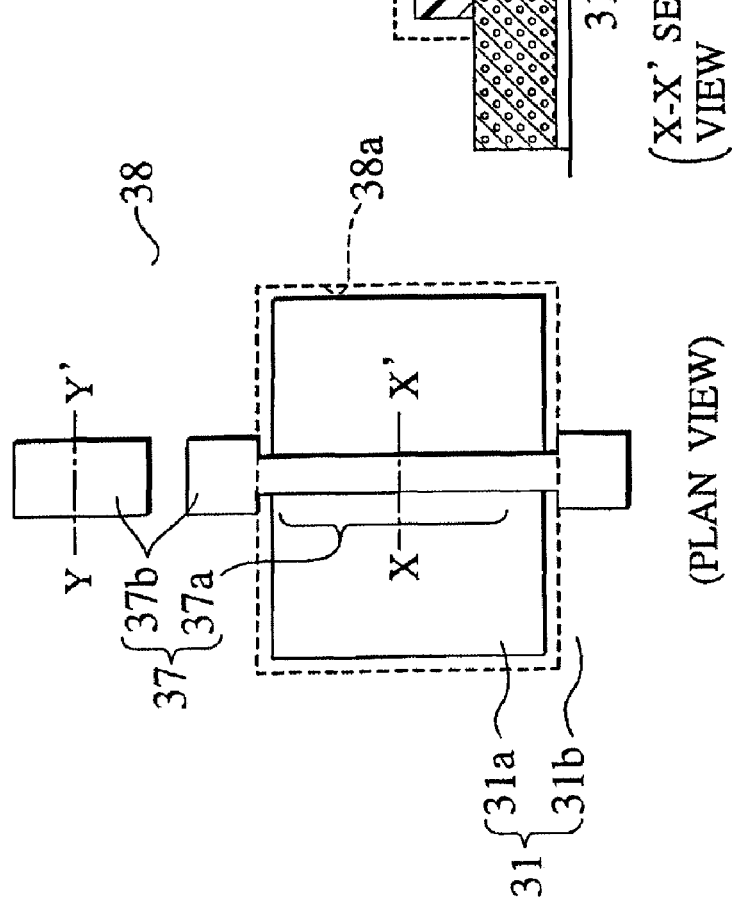

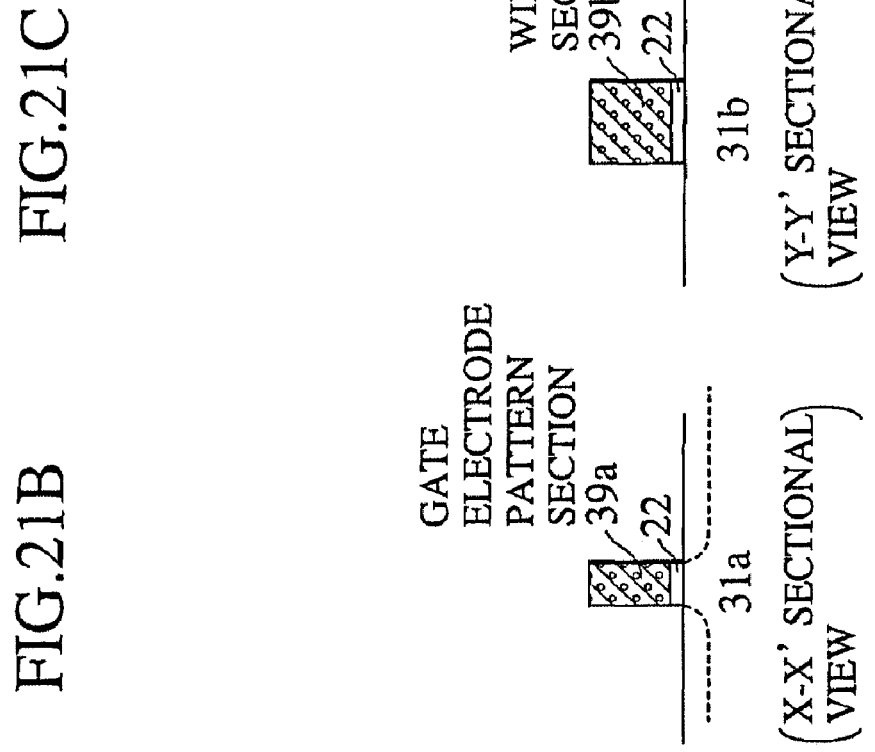

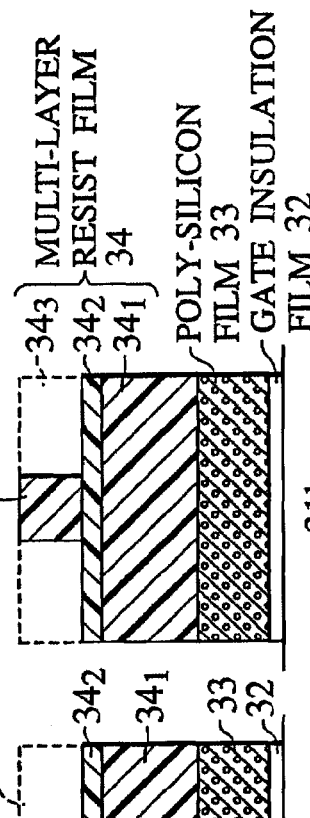
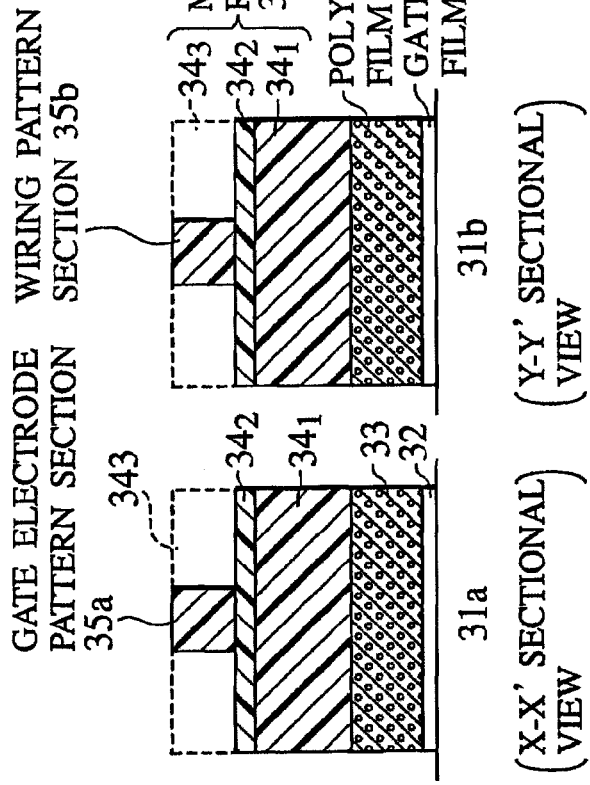
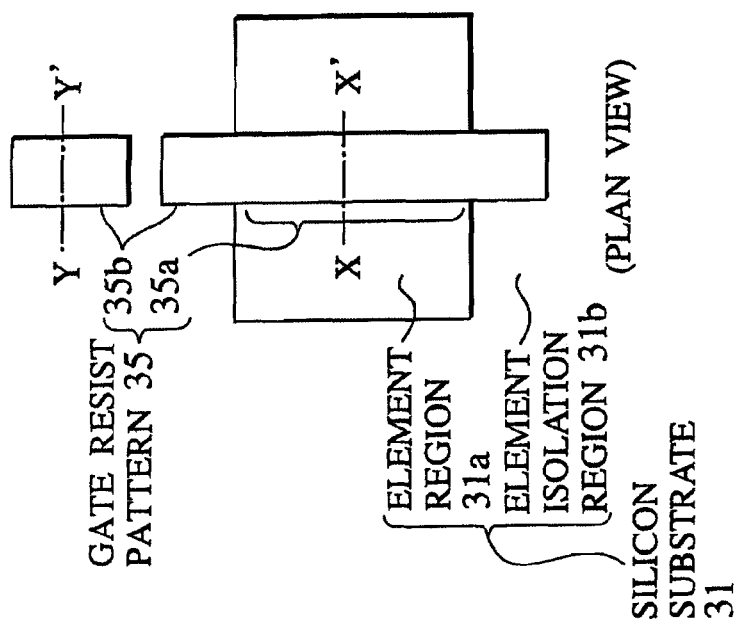

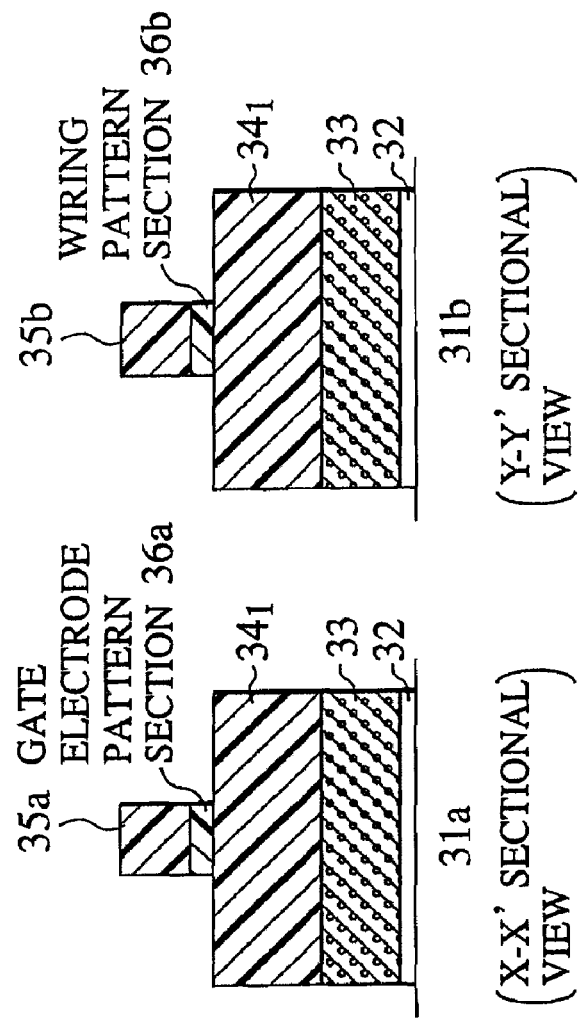

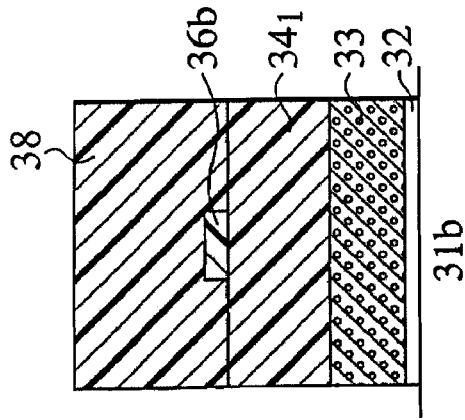
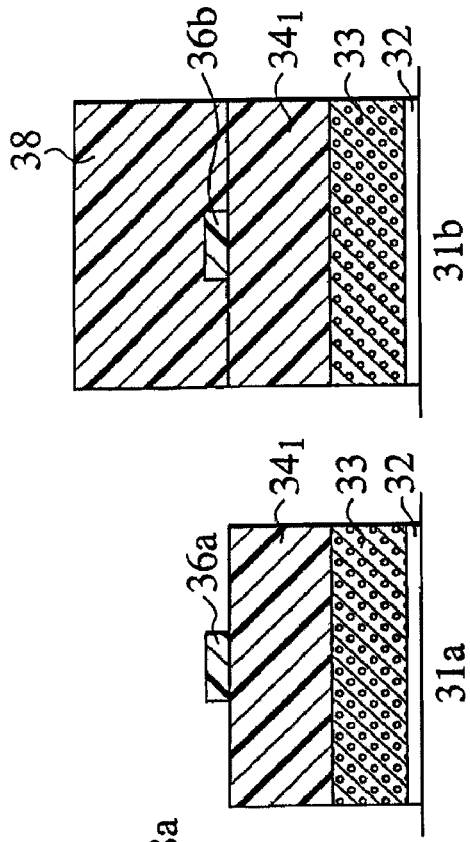
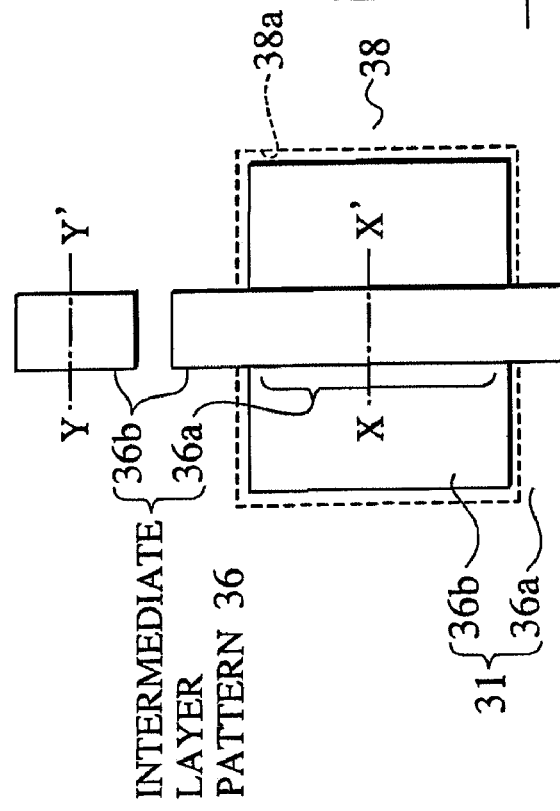
FIG.24A (PLAN VIEW)
FIG.24B (X-X' SECTIONAL VIEW)
FIG.24C (Y-Y' SECTIONAL VIEW)

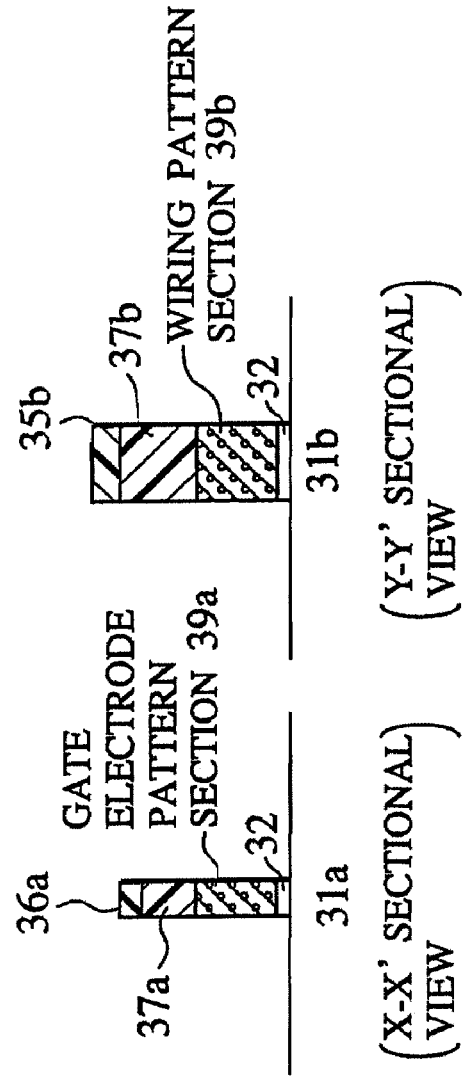
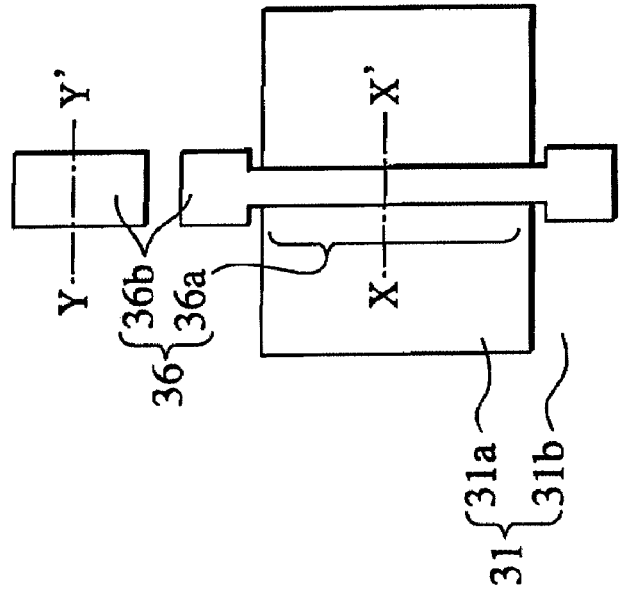

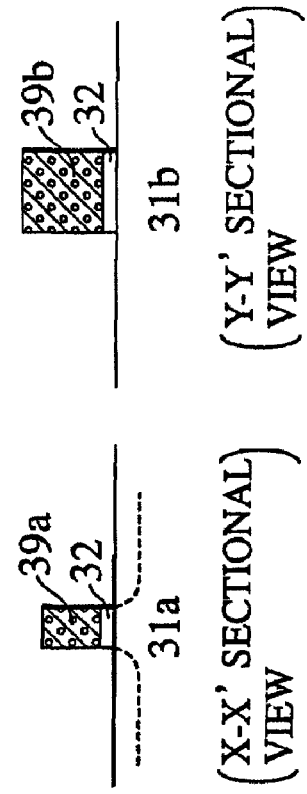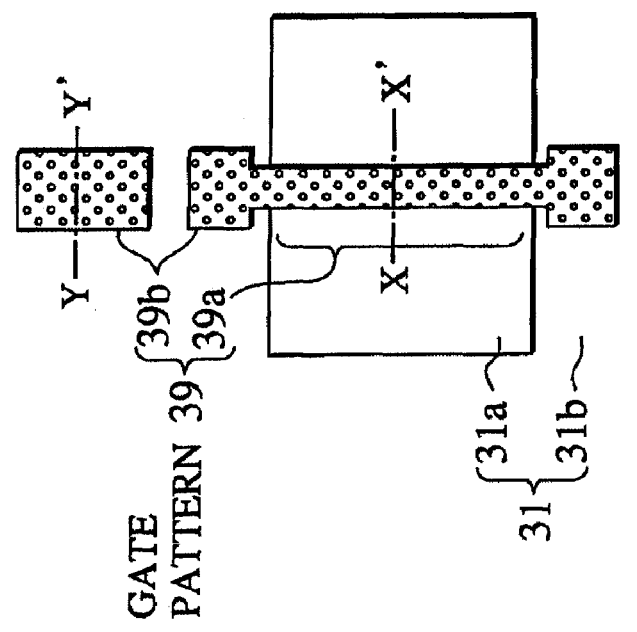

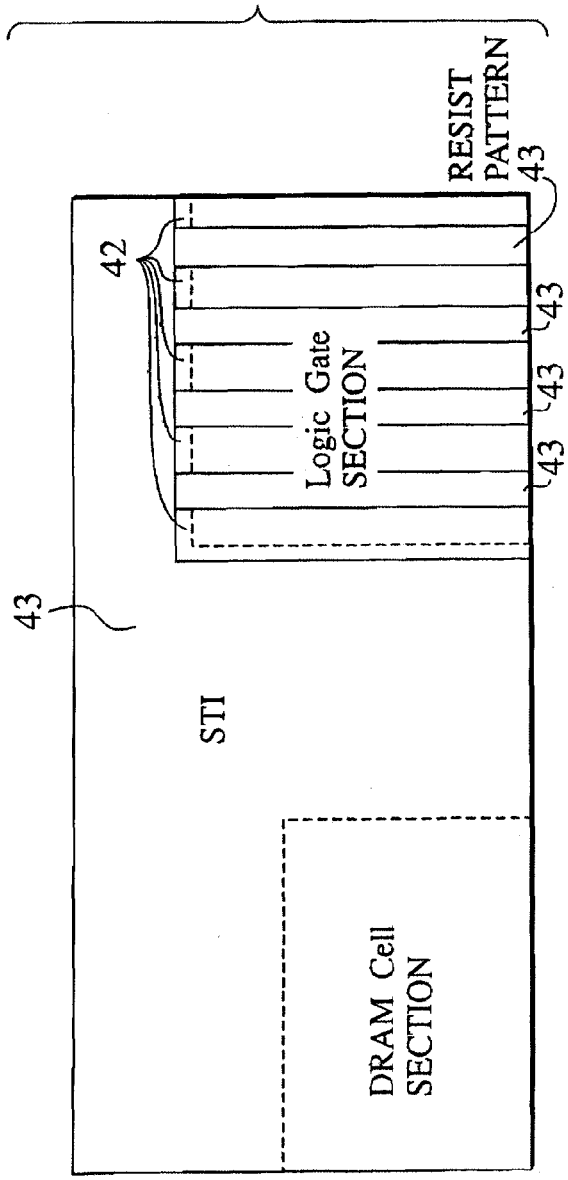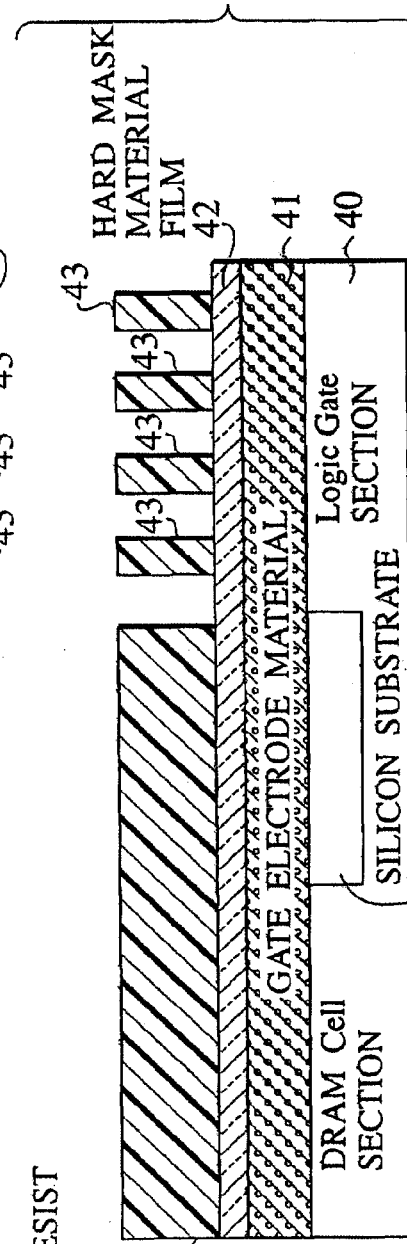
FIG. 28A
FIG. 28B

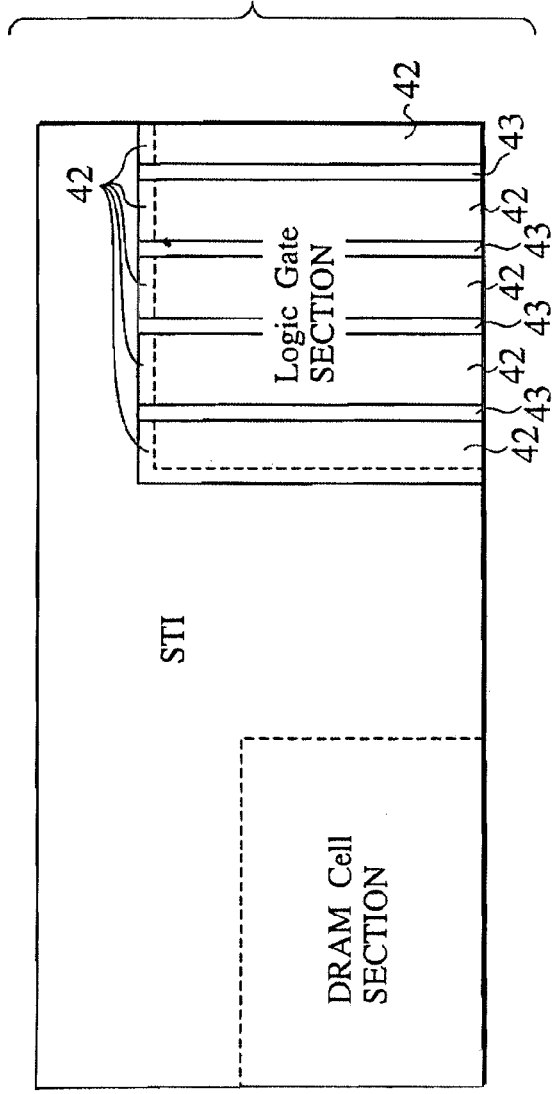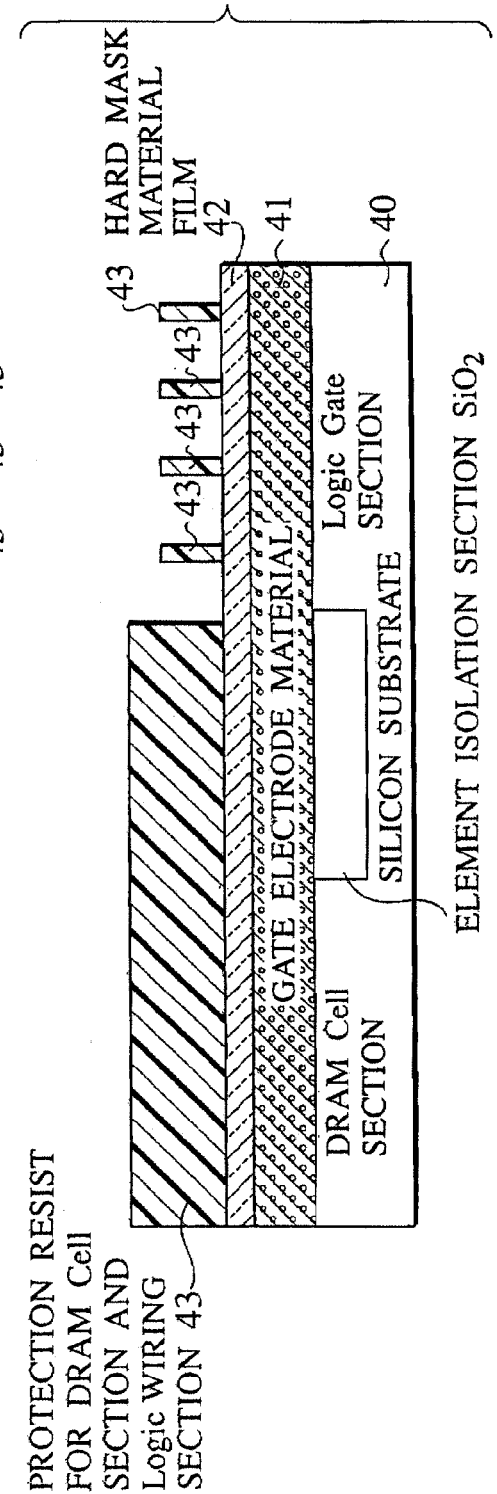

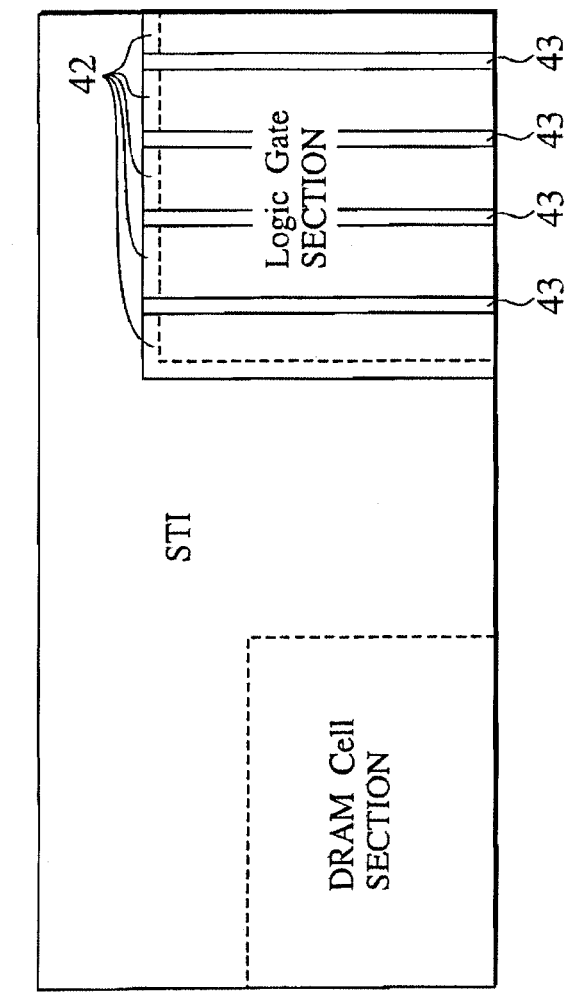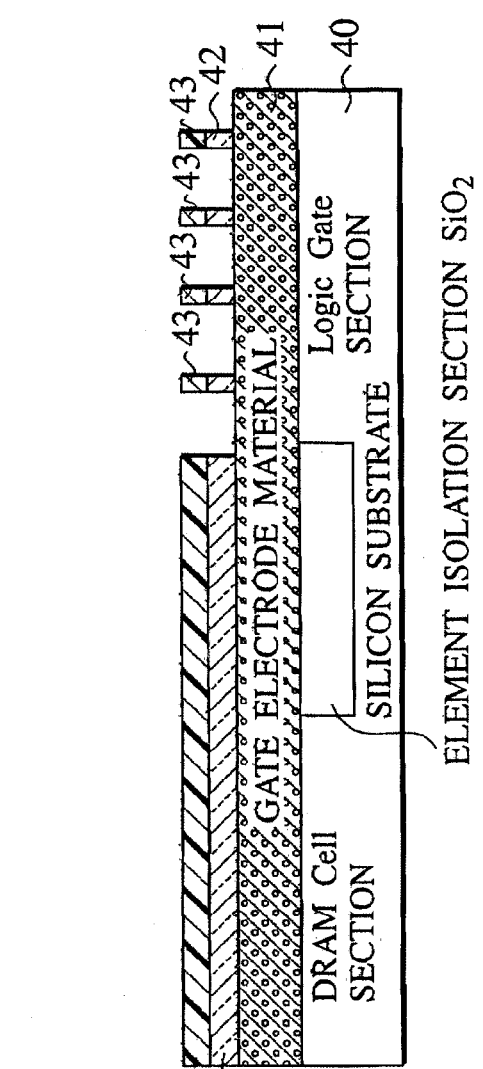

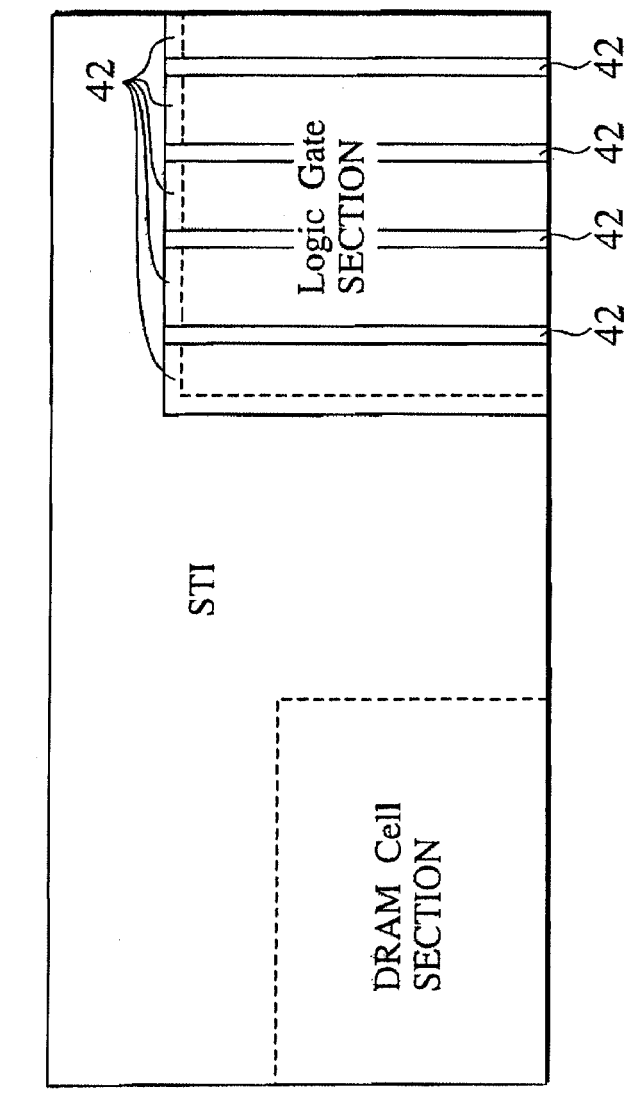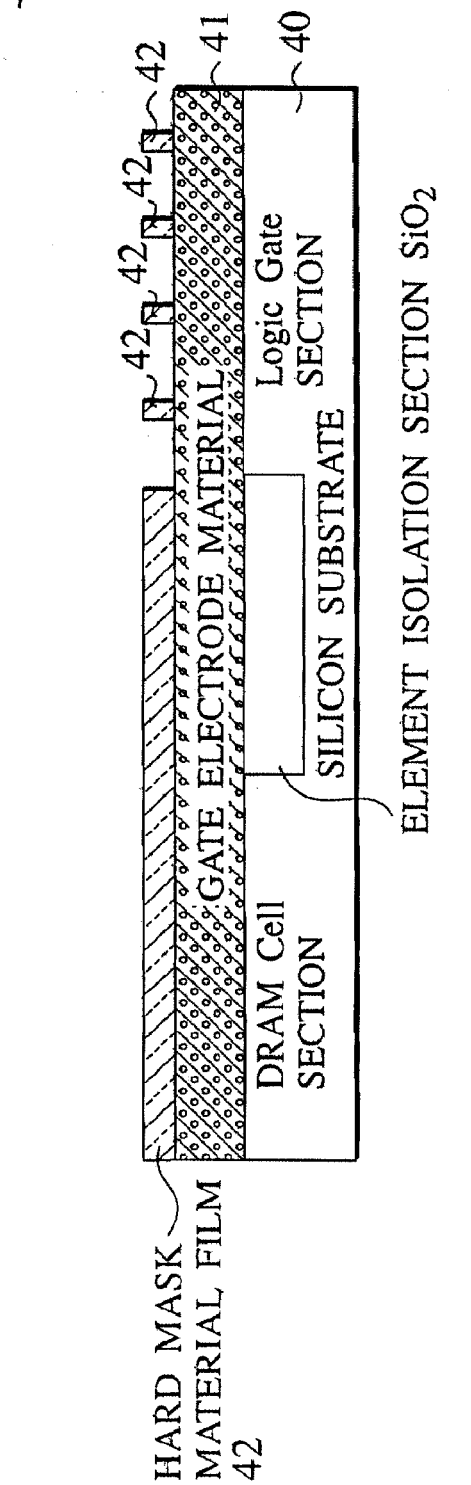
FIG.31A
FIG.31B

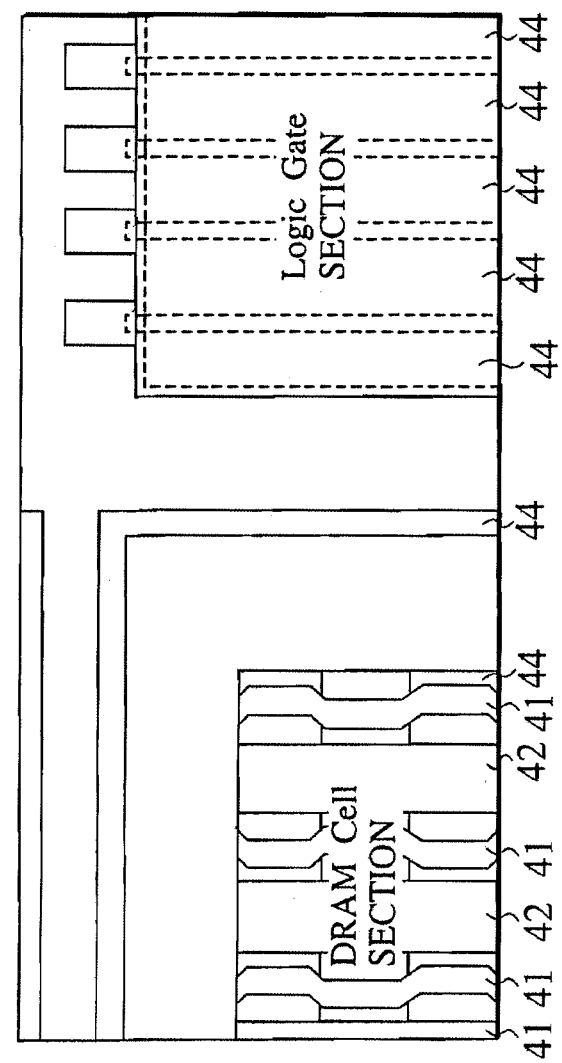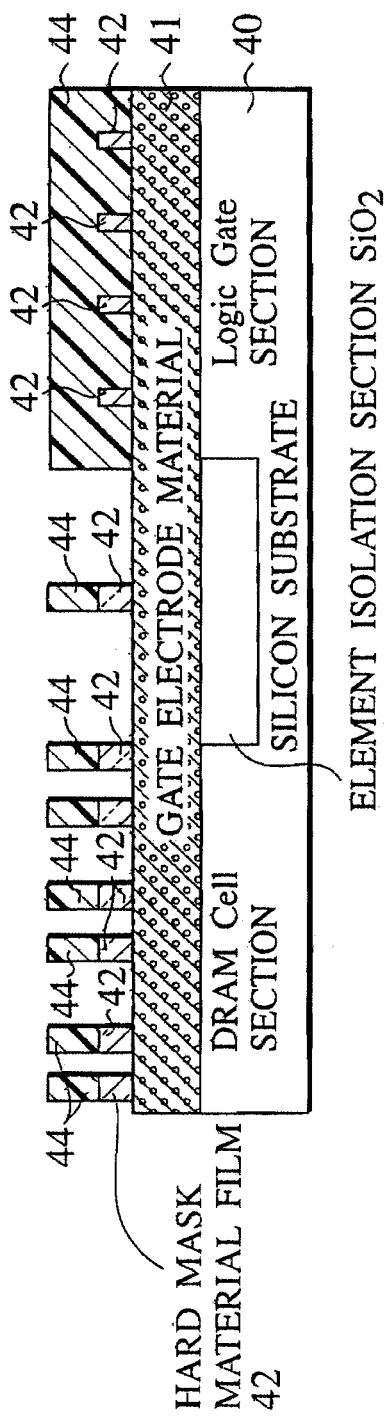

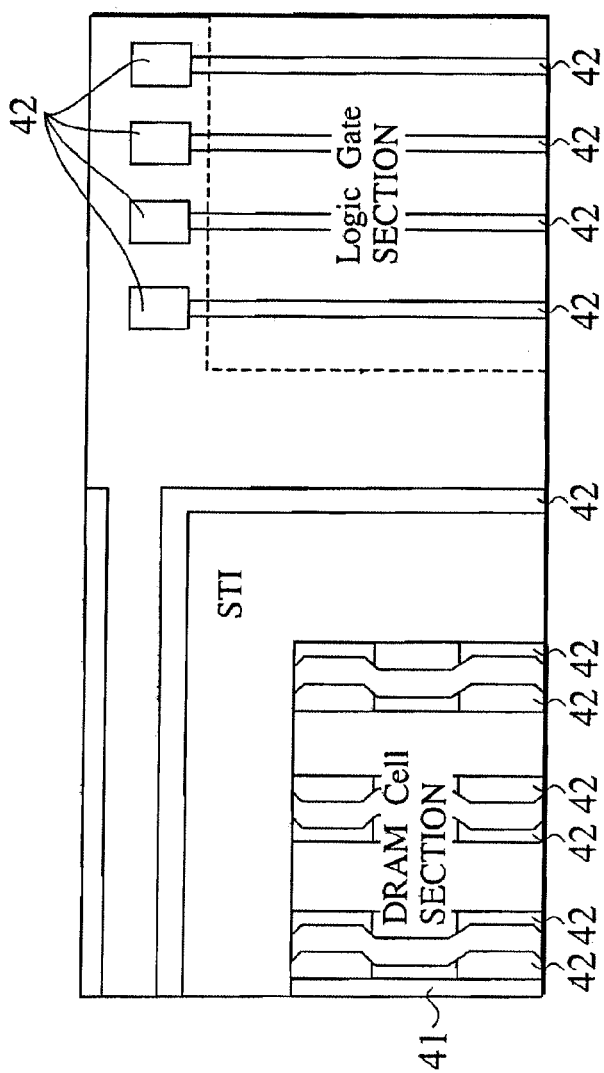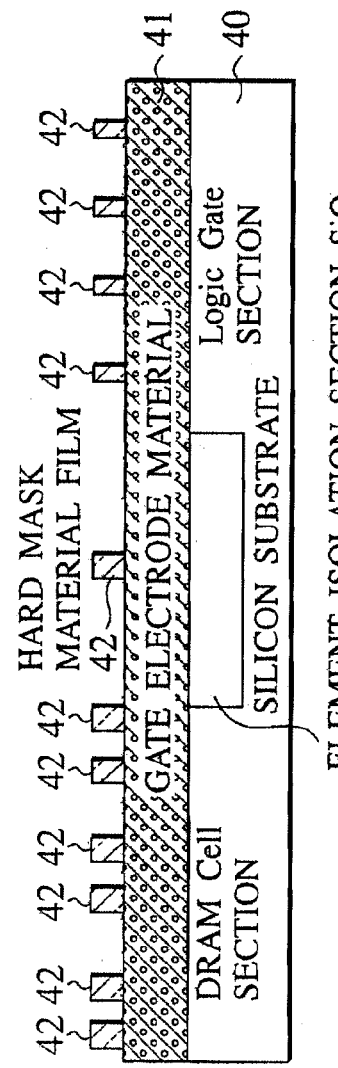

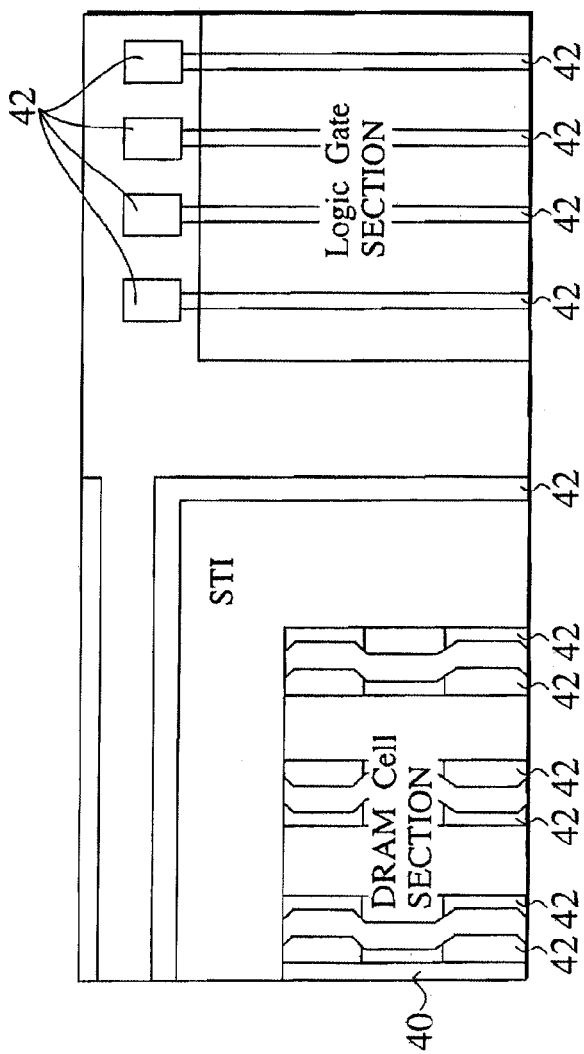
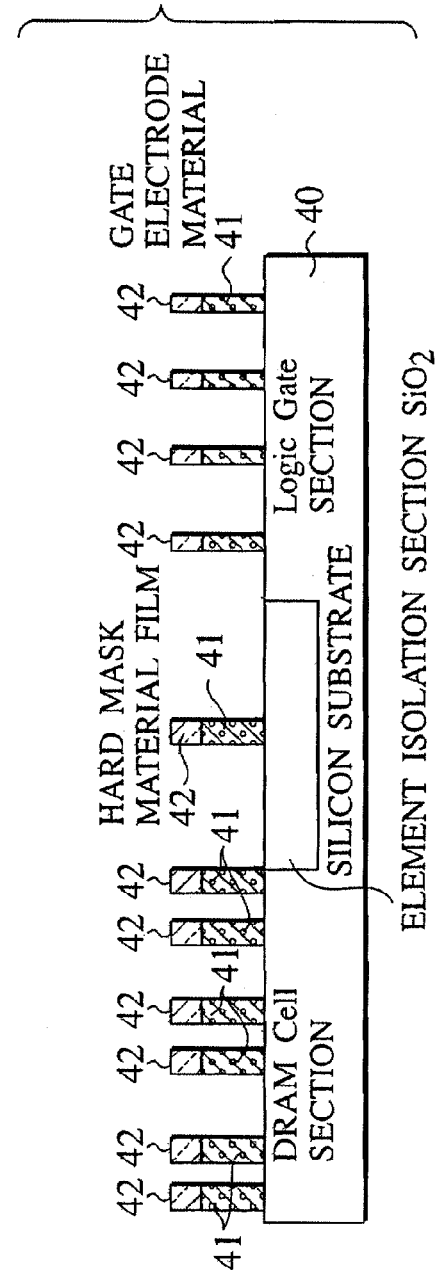

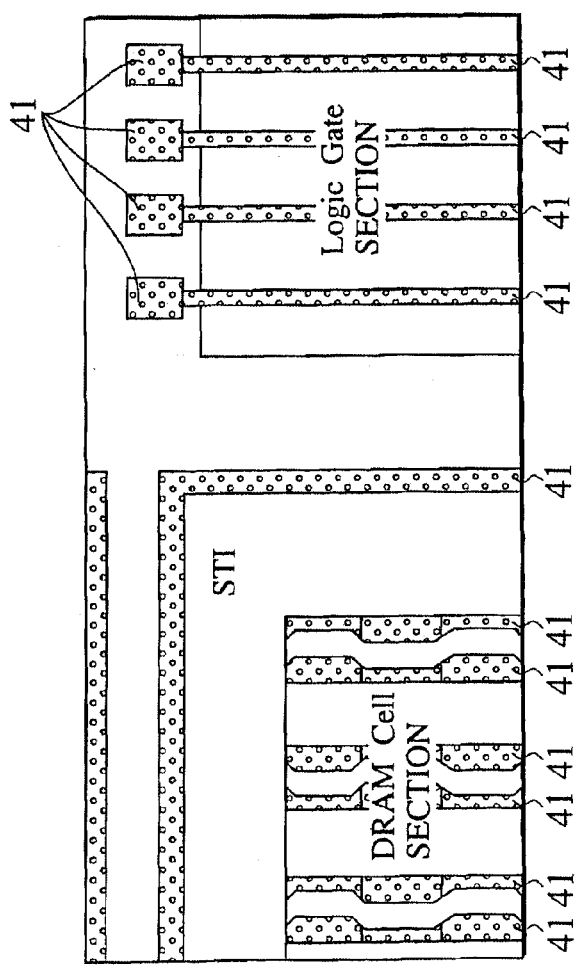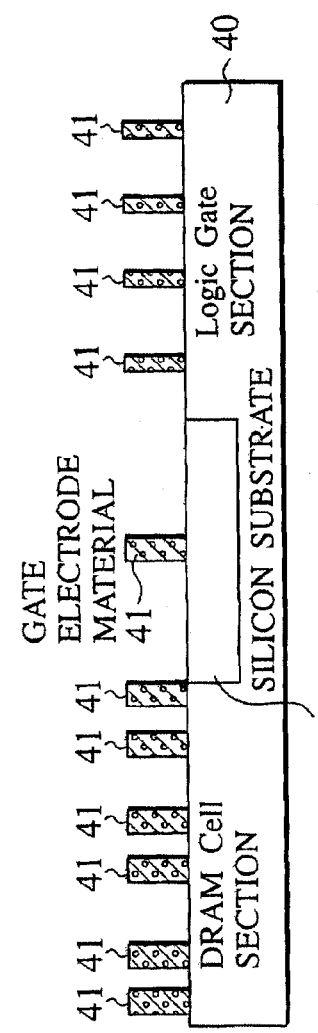

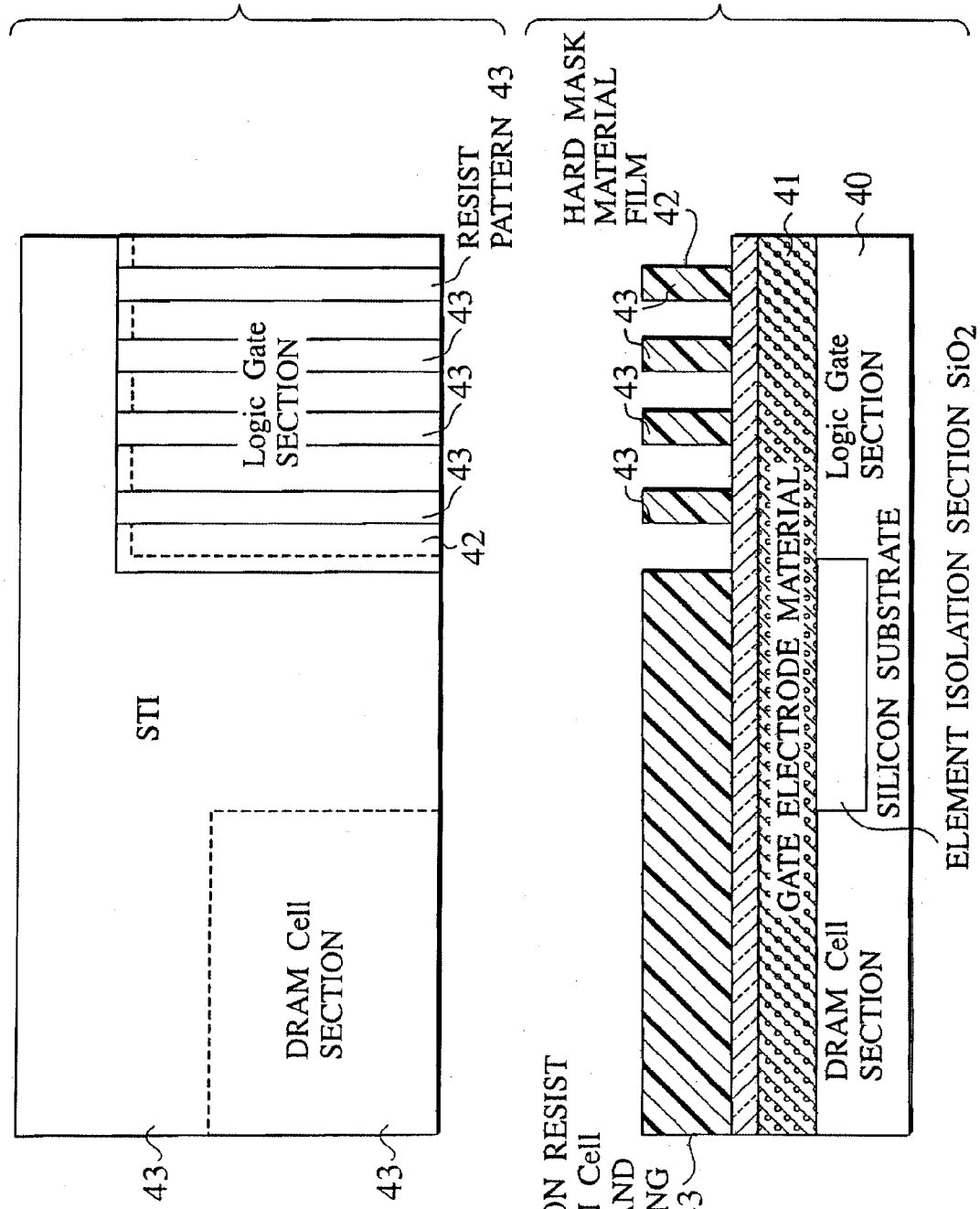

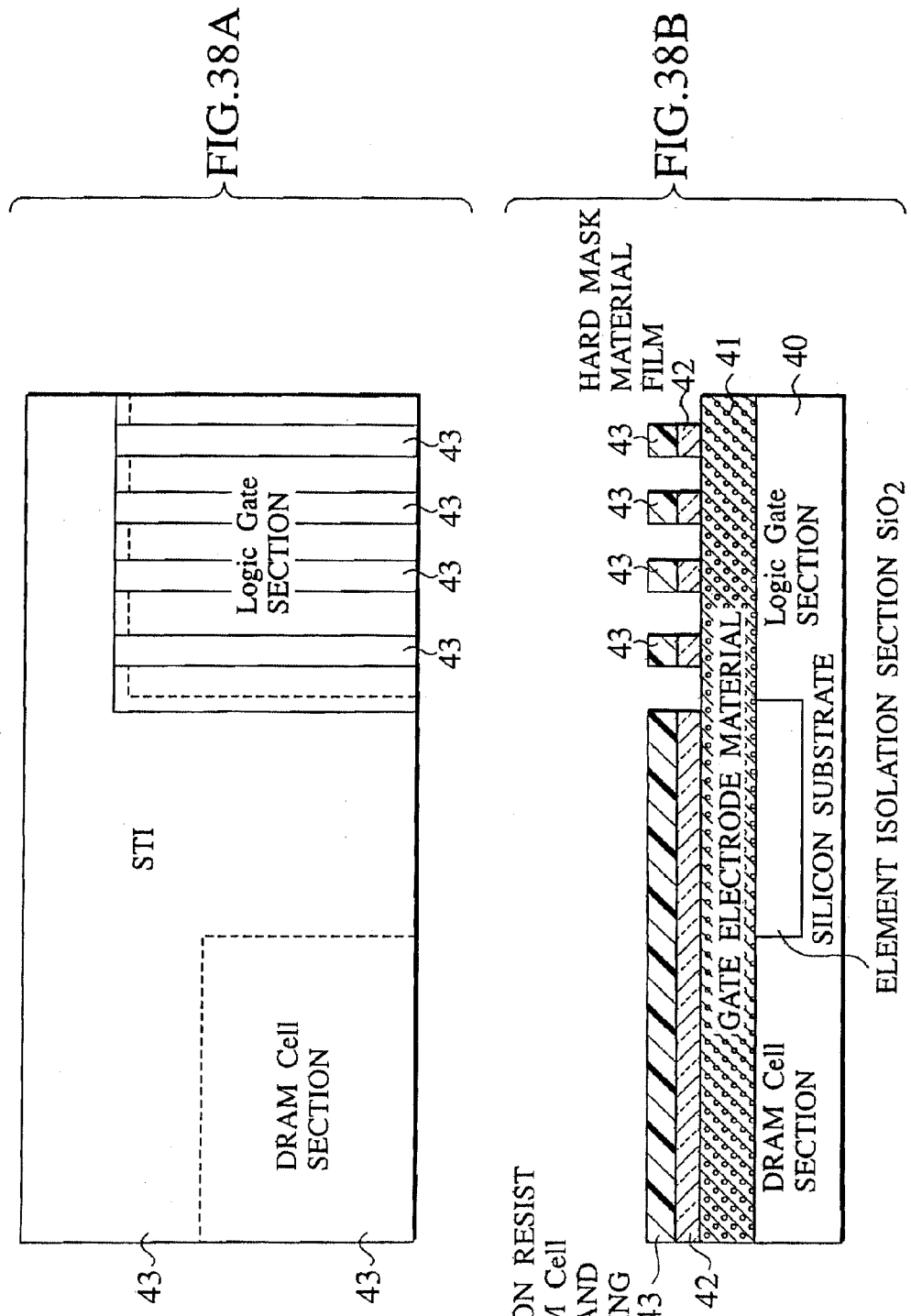

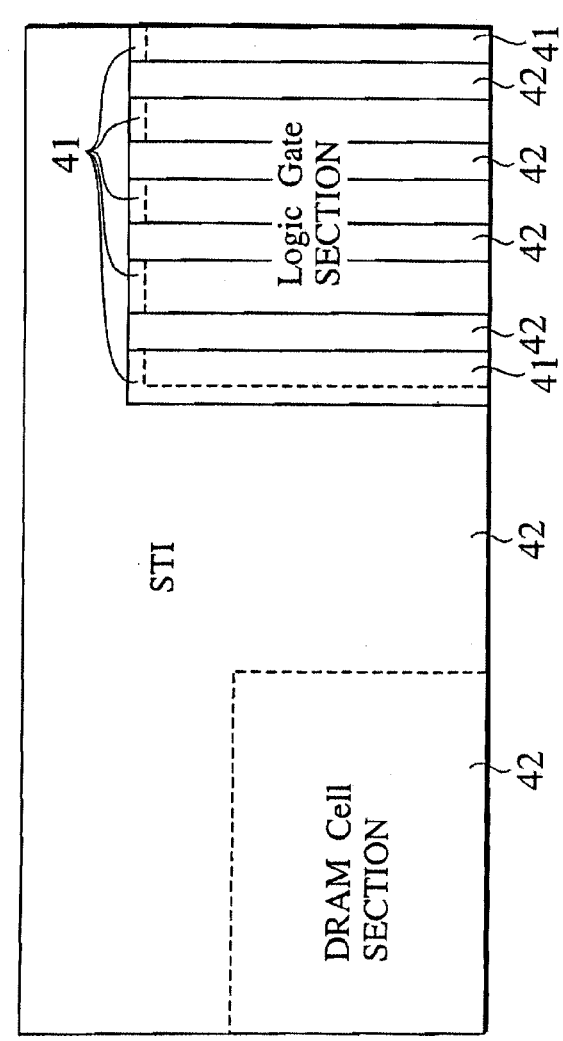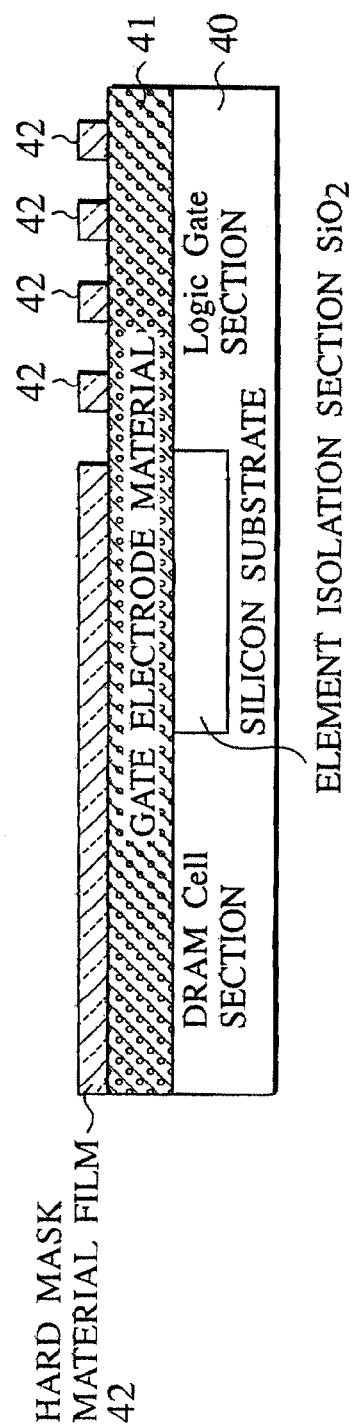

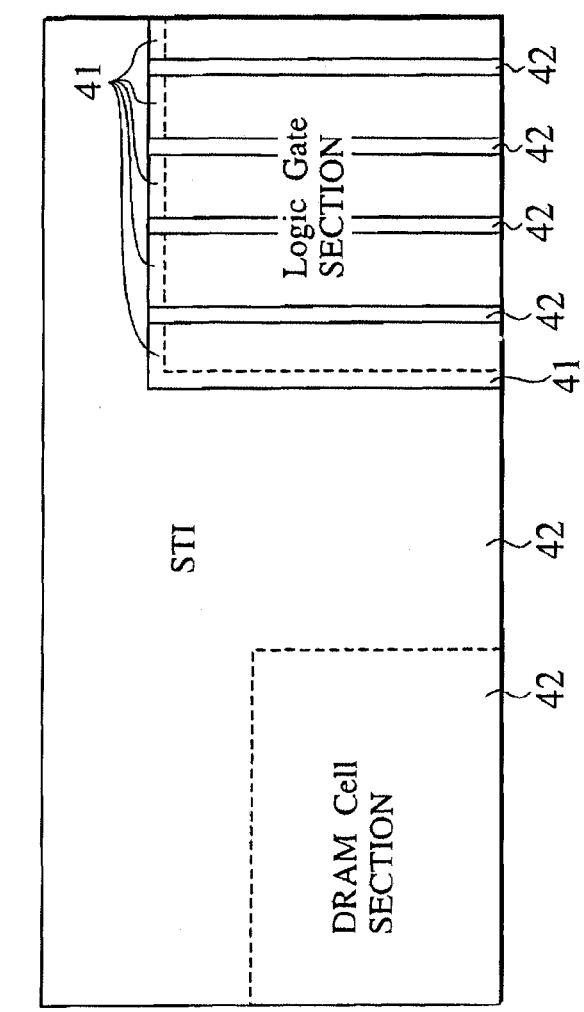
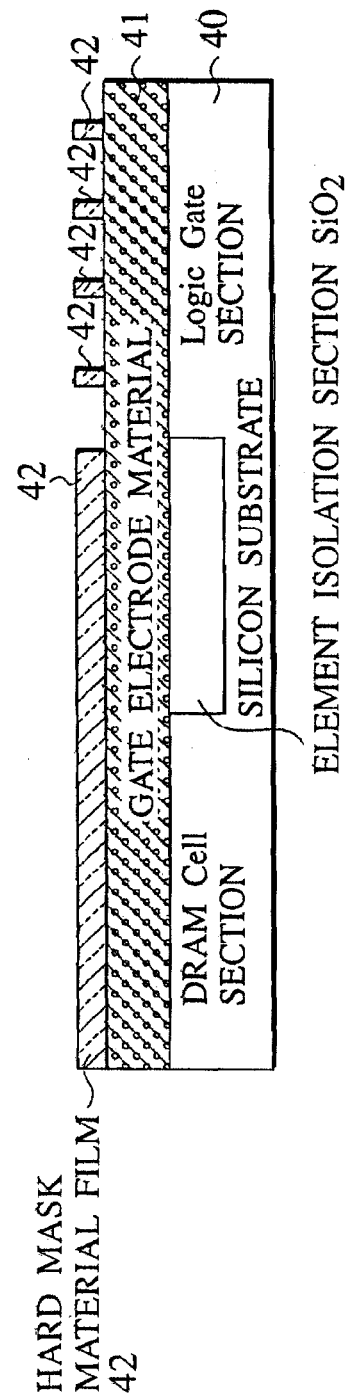
FIG. 40A
FIG. 40B

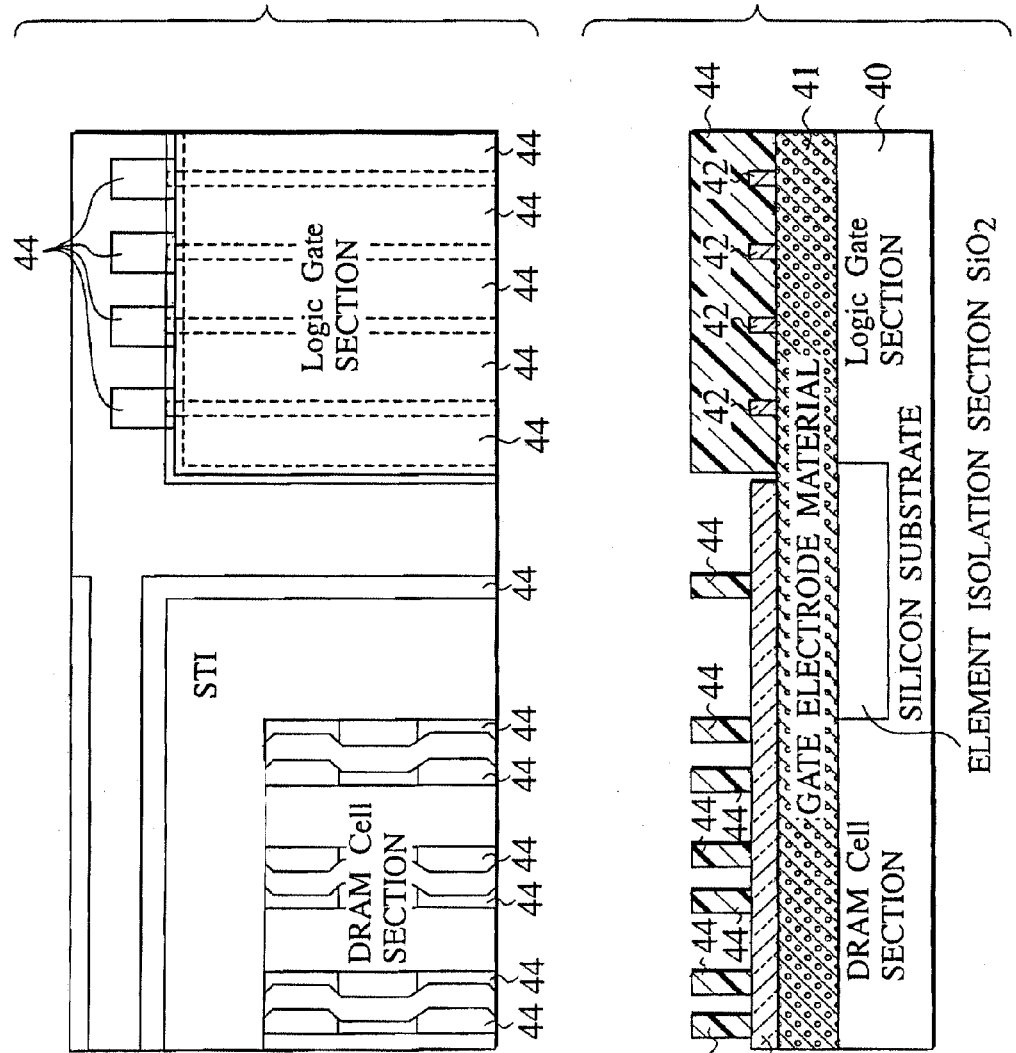

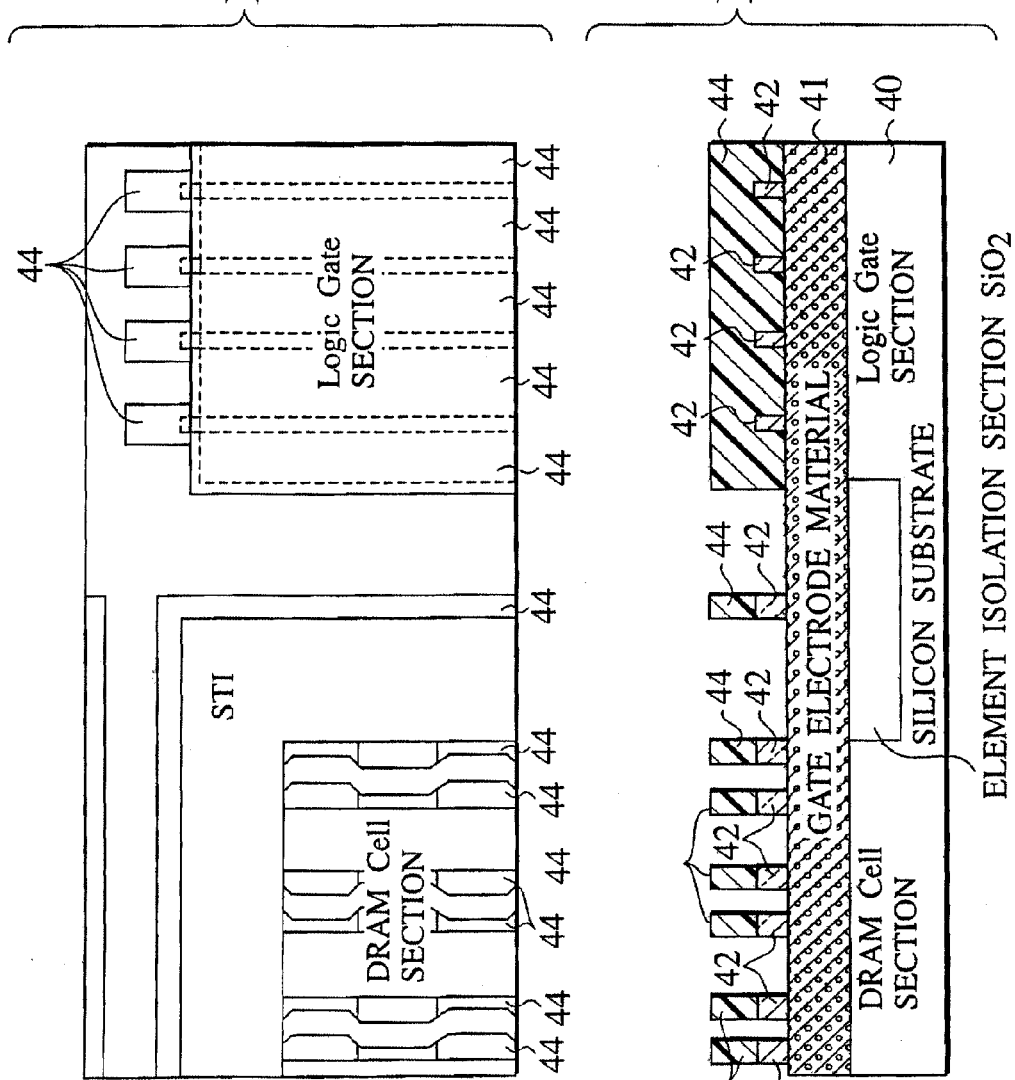

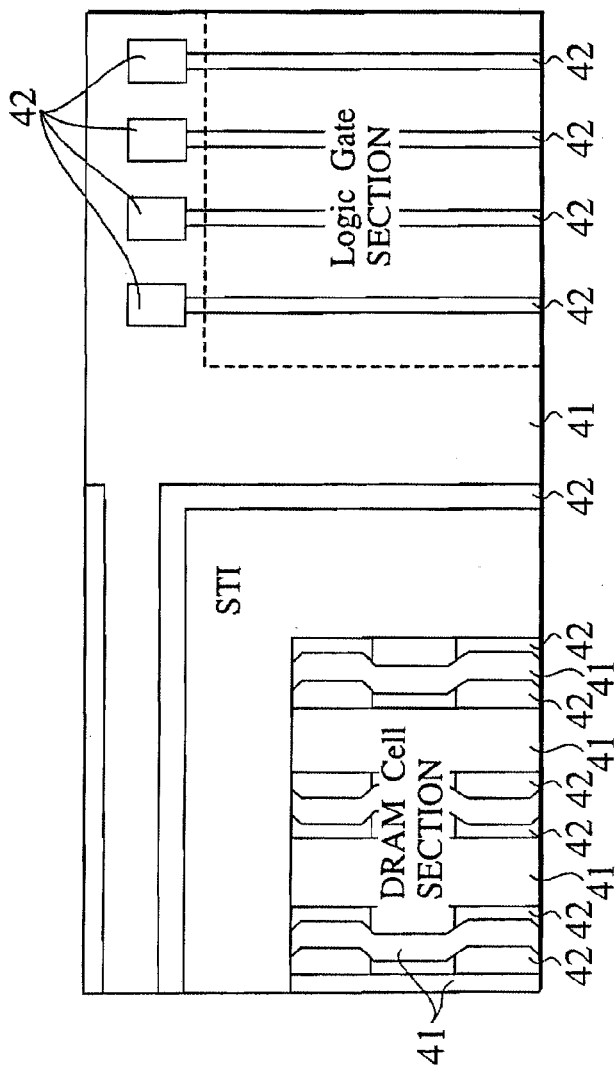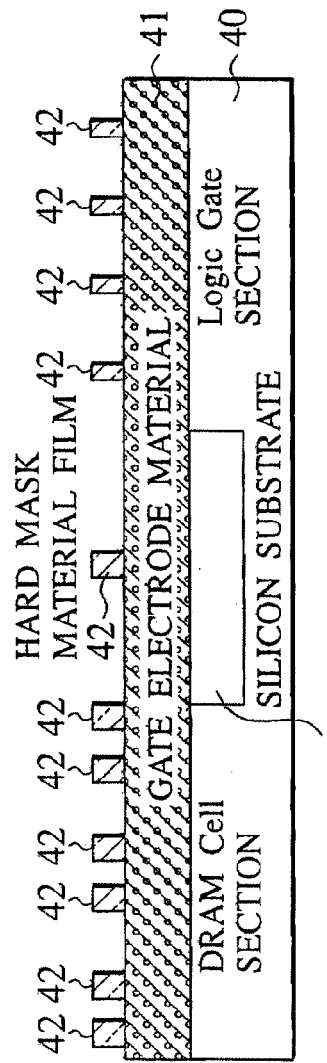
FIG. 43A / FIG. 43B

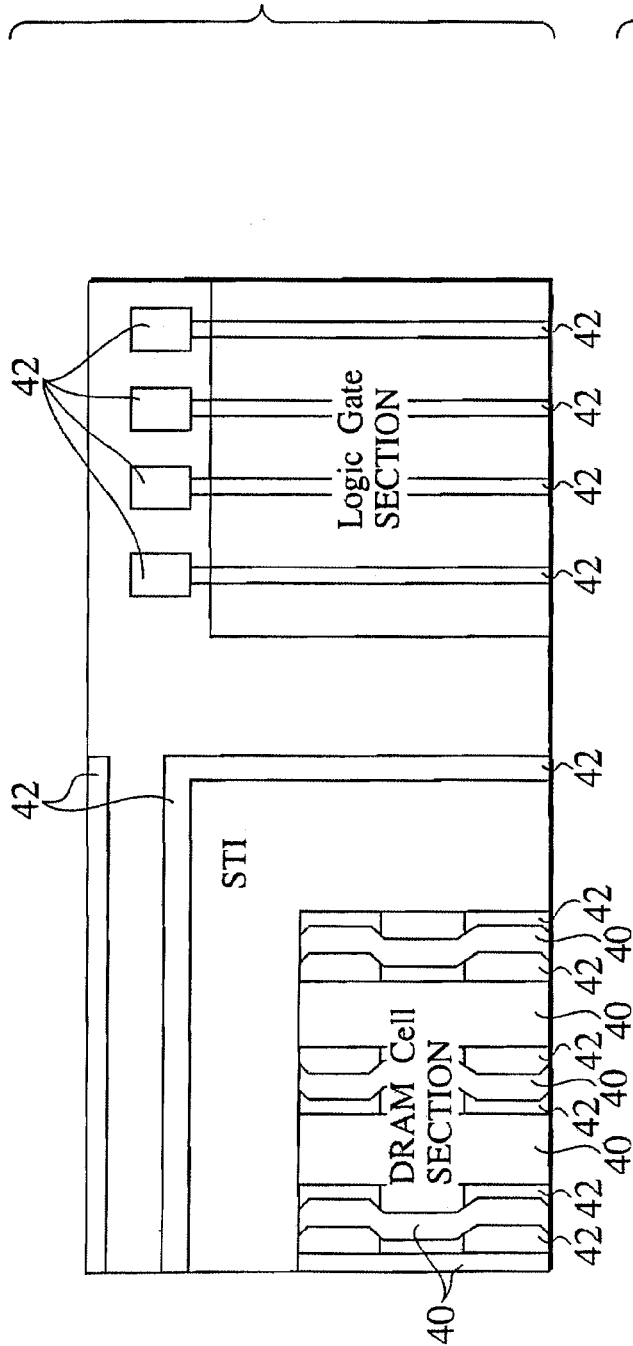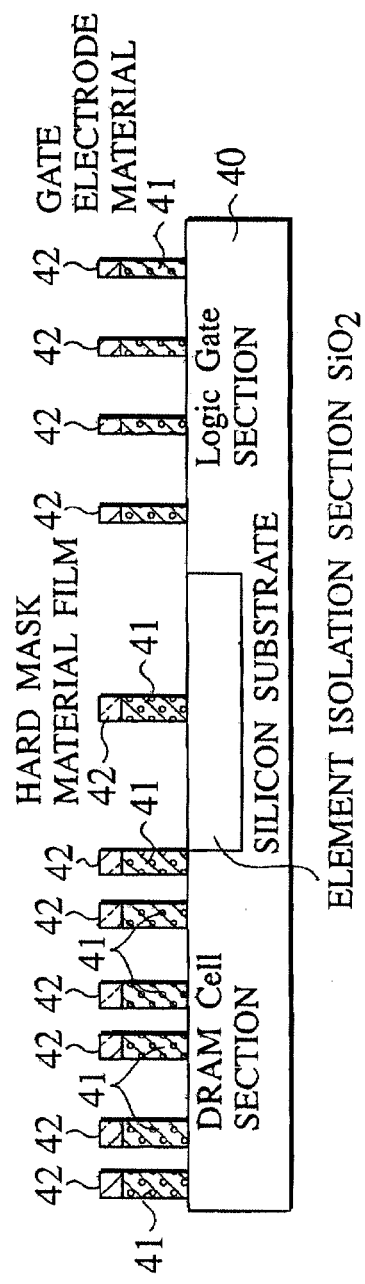

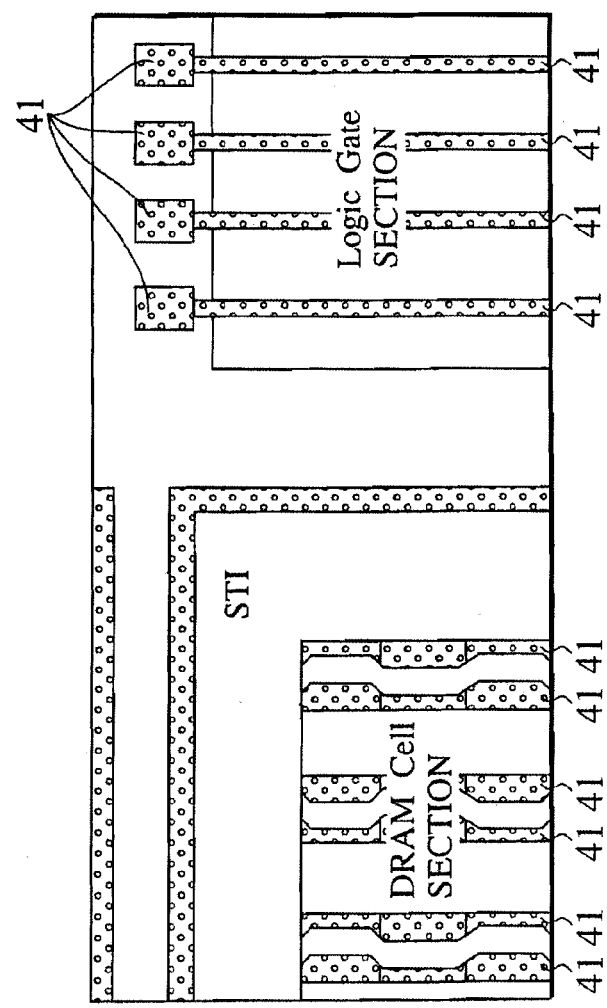
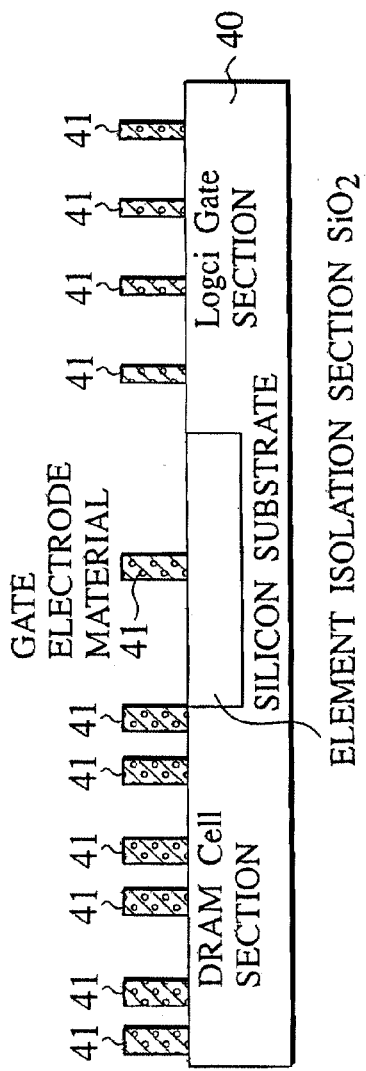
FIG.45A
FIG.45B

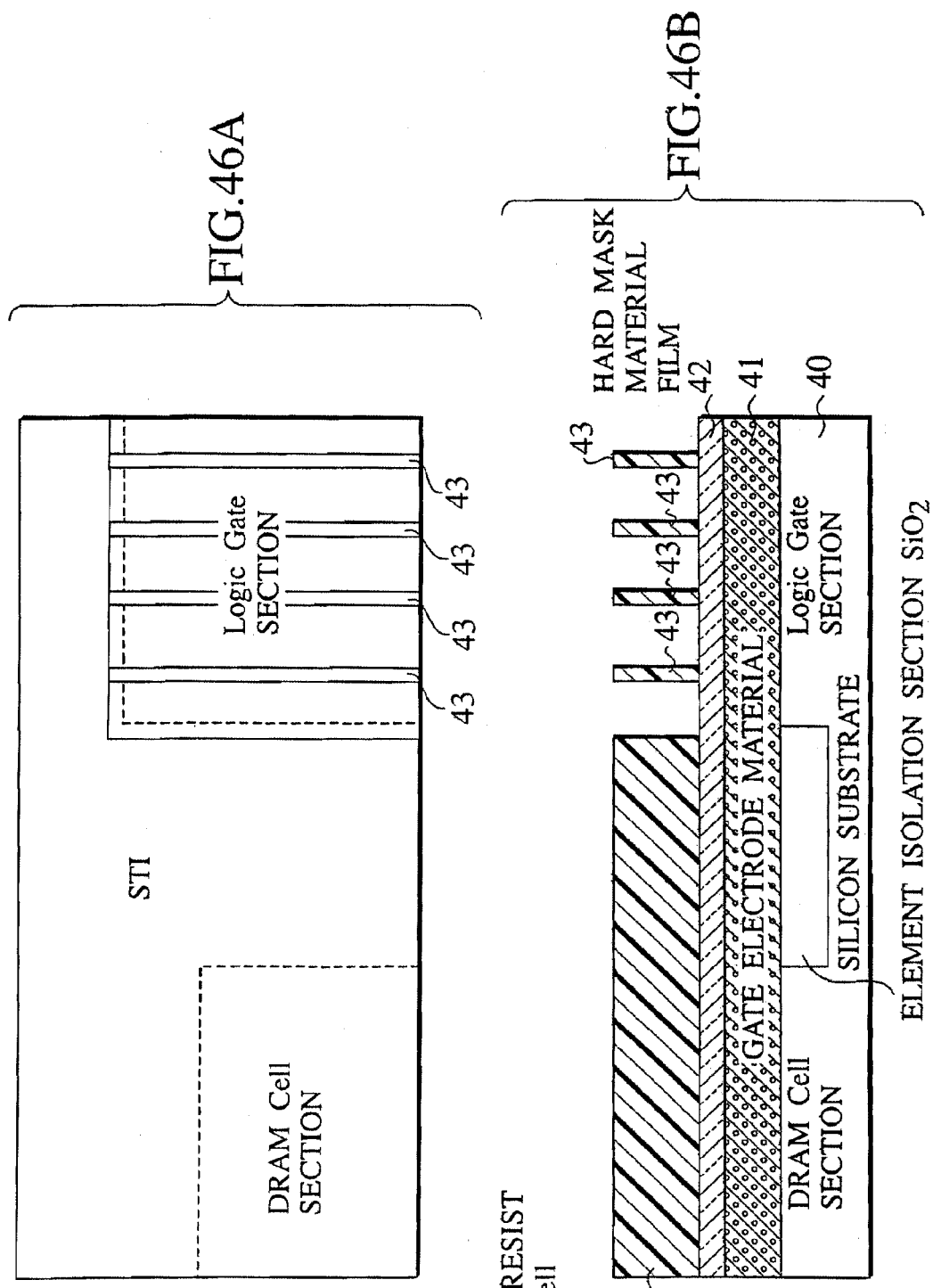

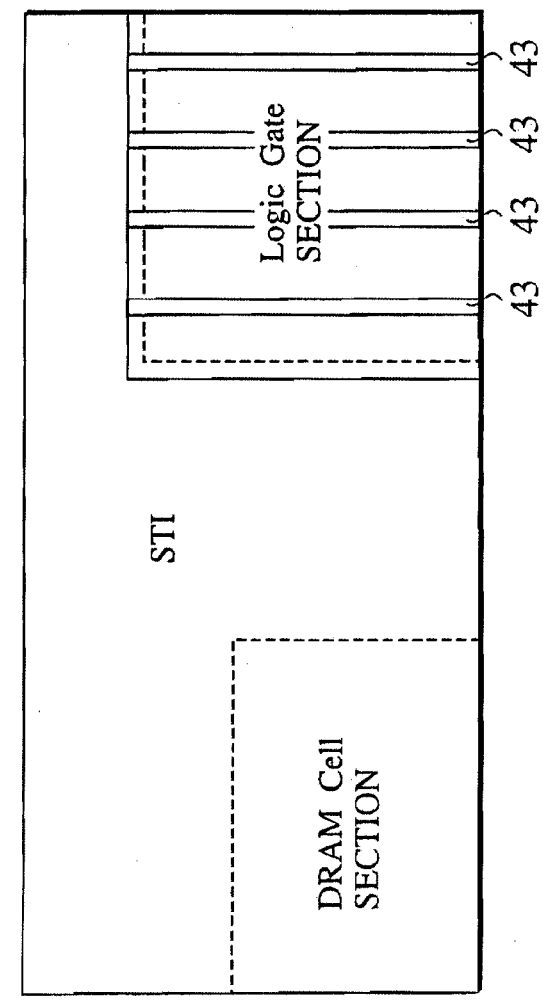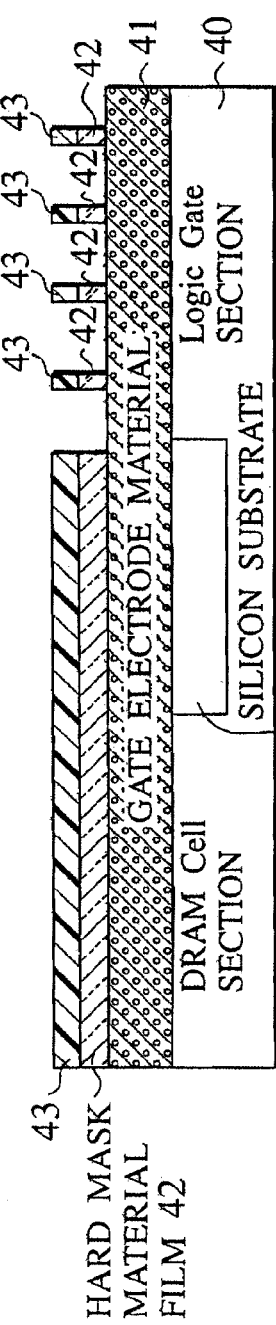

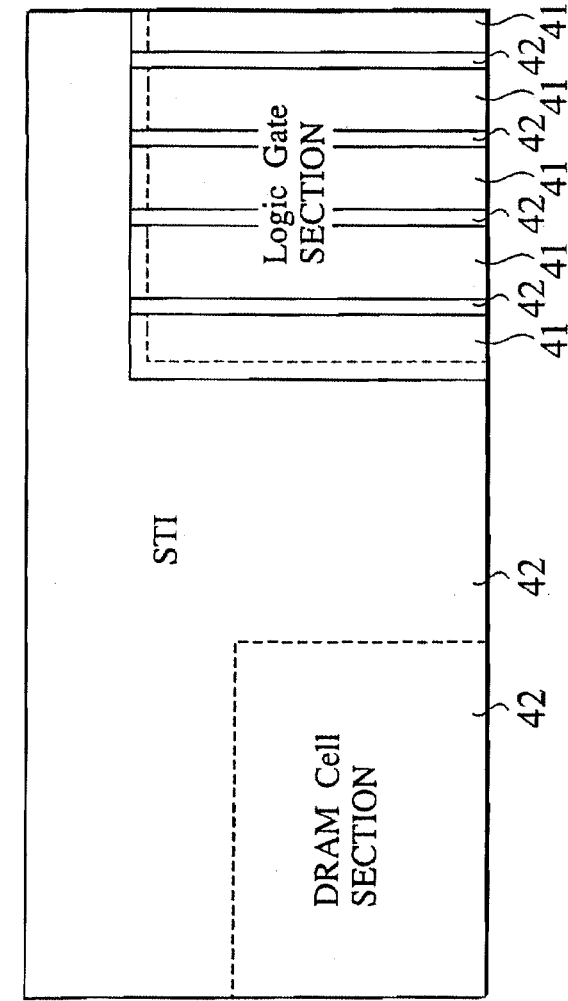
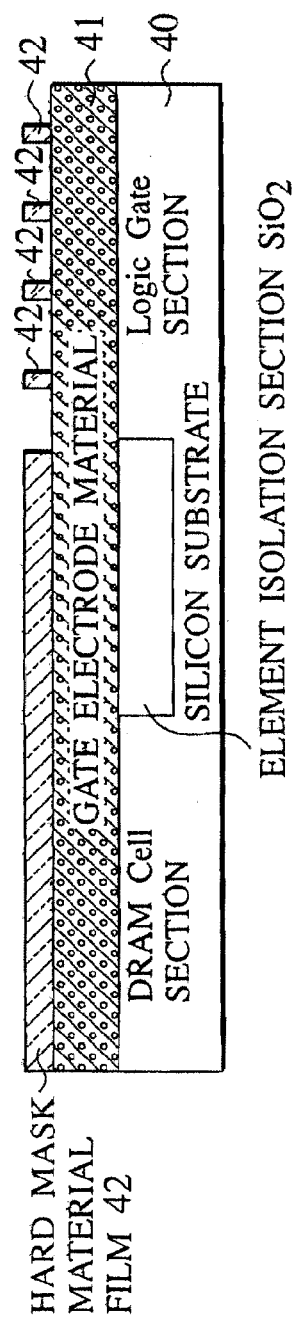
FIG.48A
FIG.48B

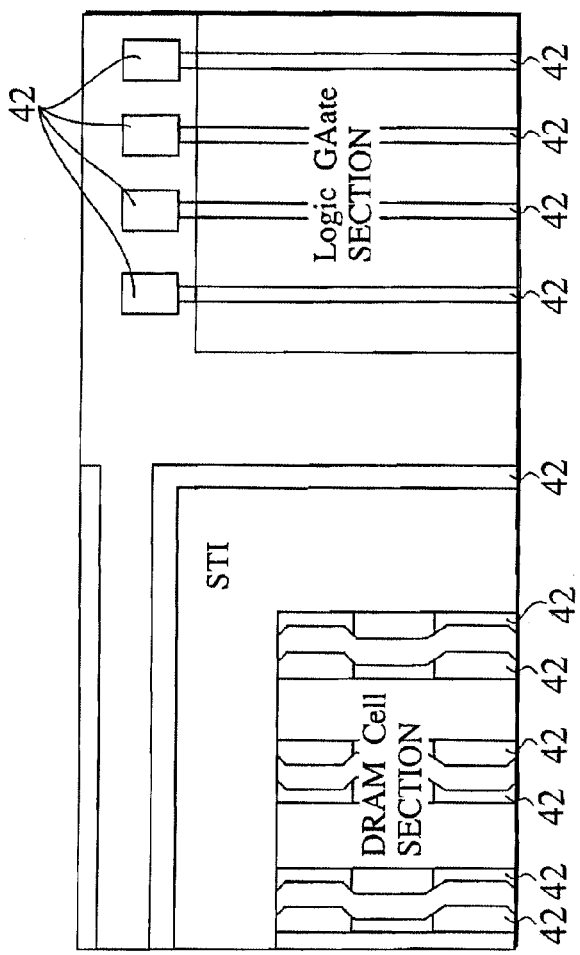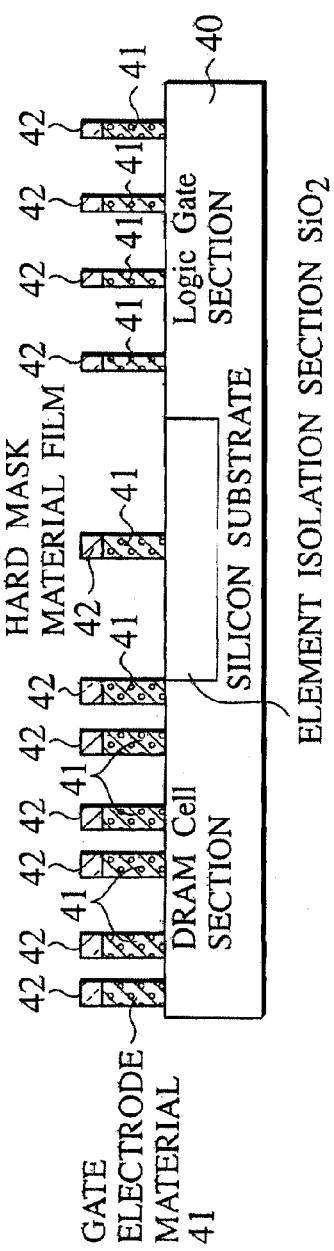

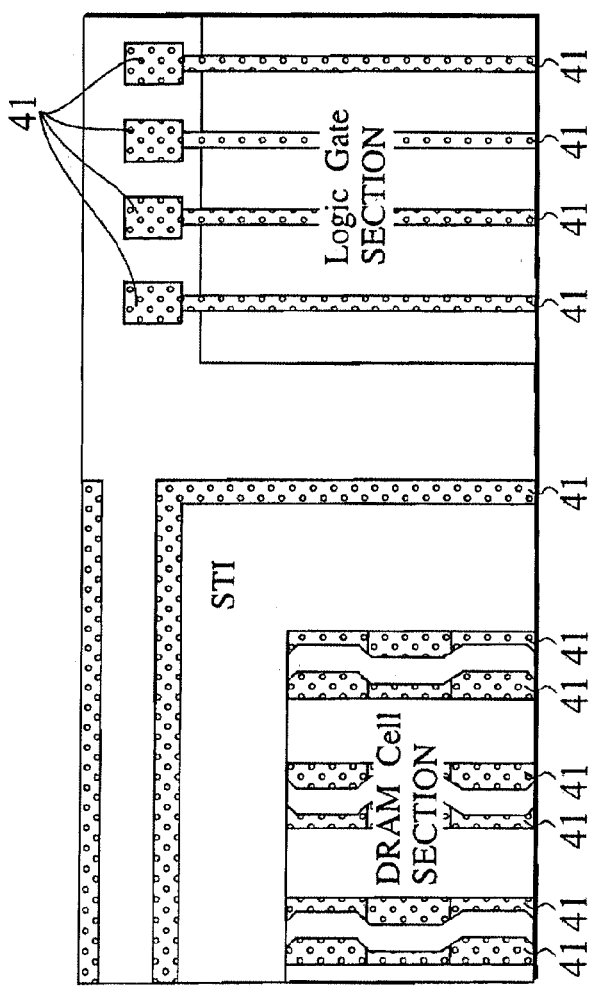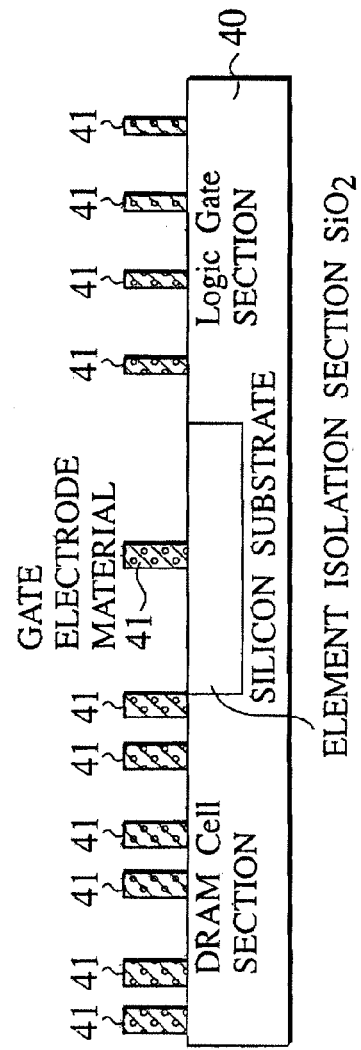

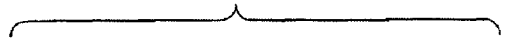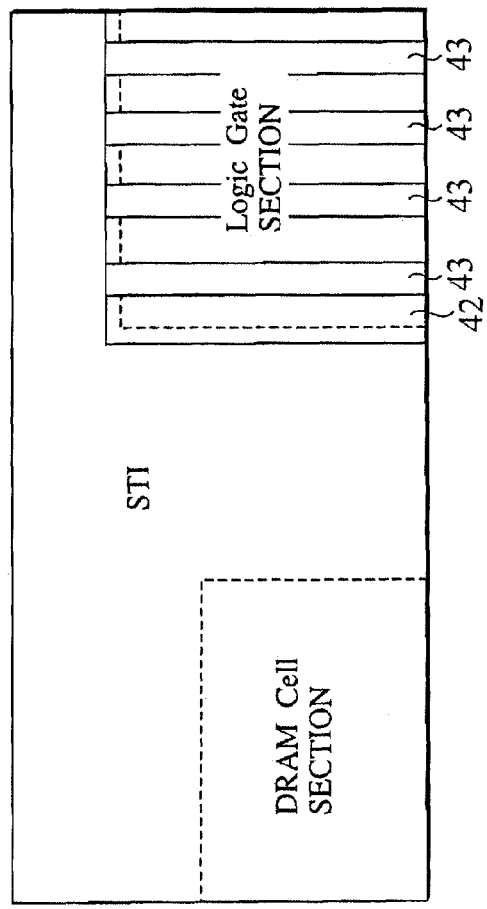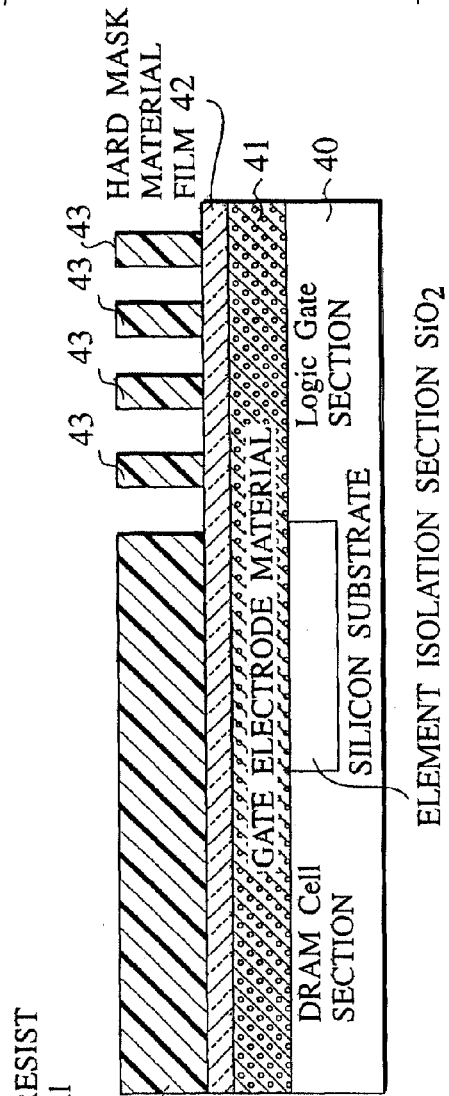

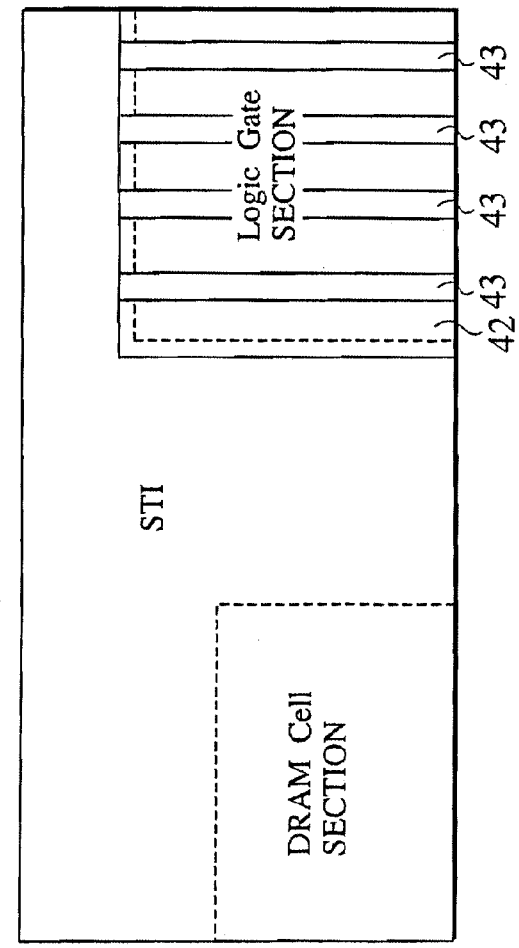
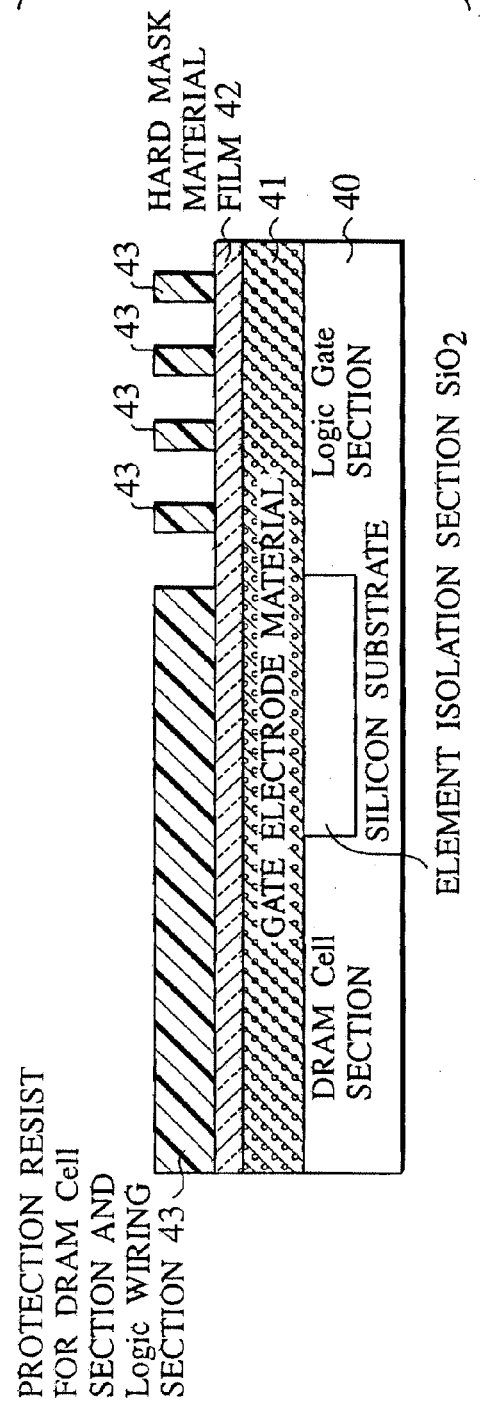
FIG.55A
FIG.55B

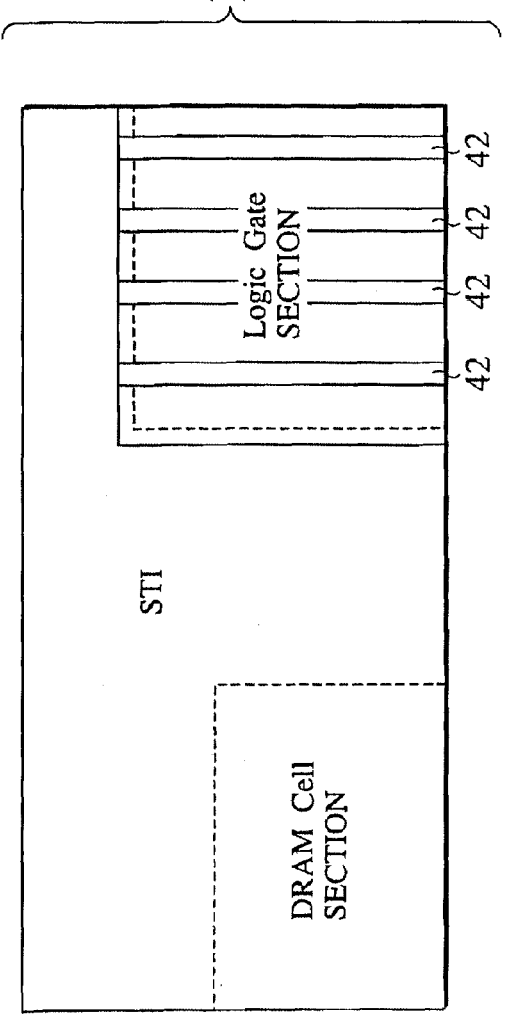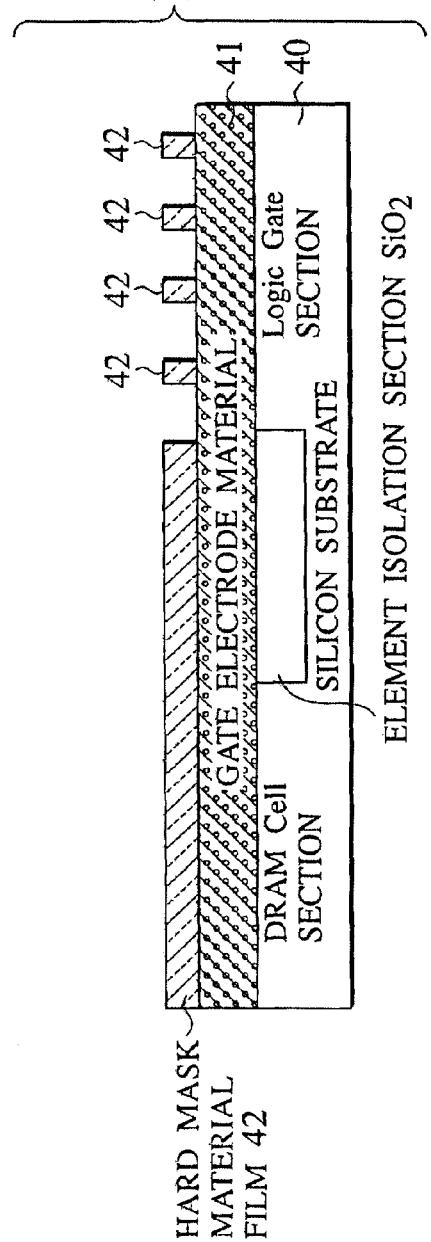

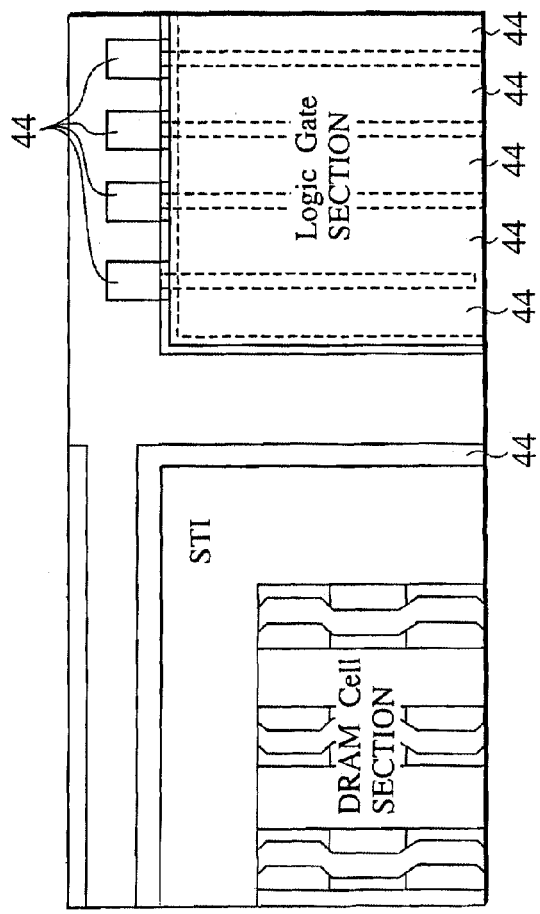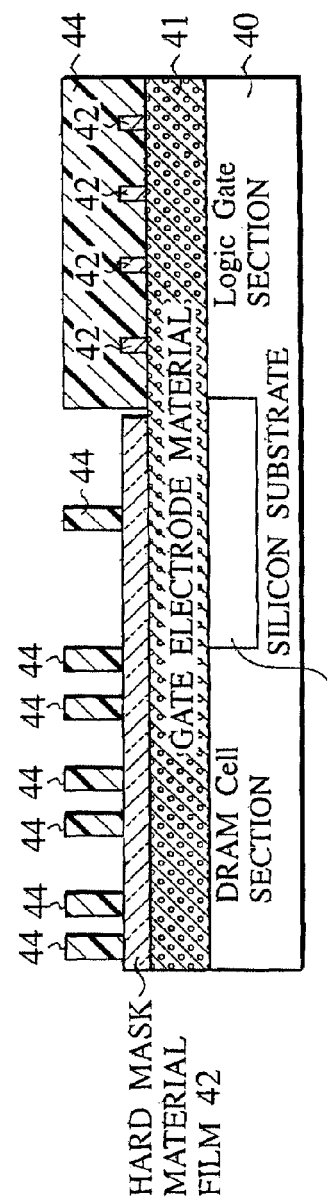

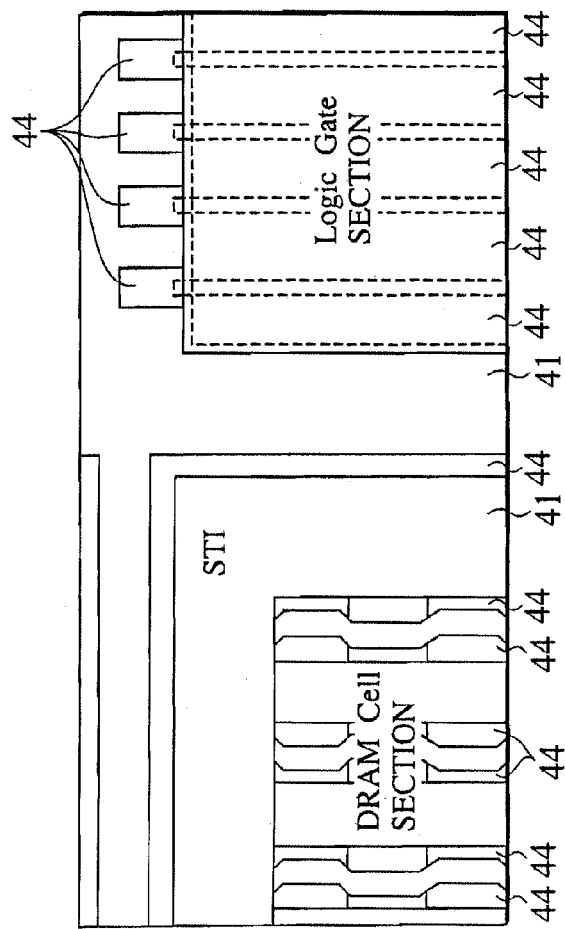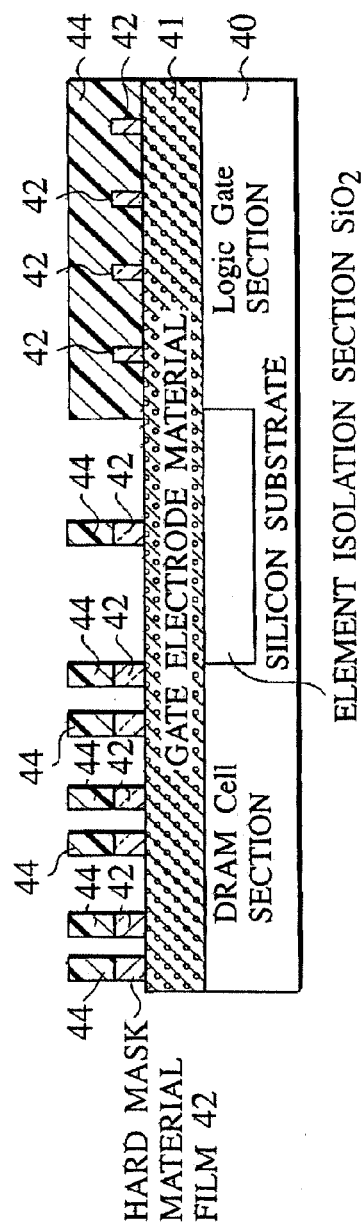

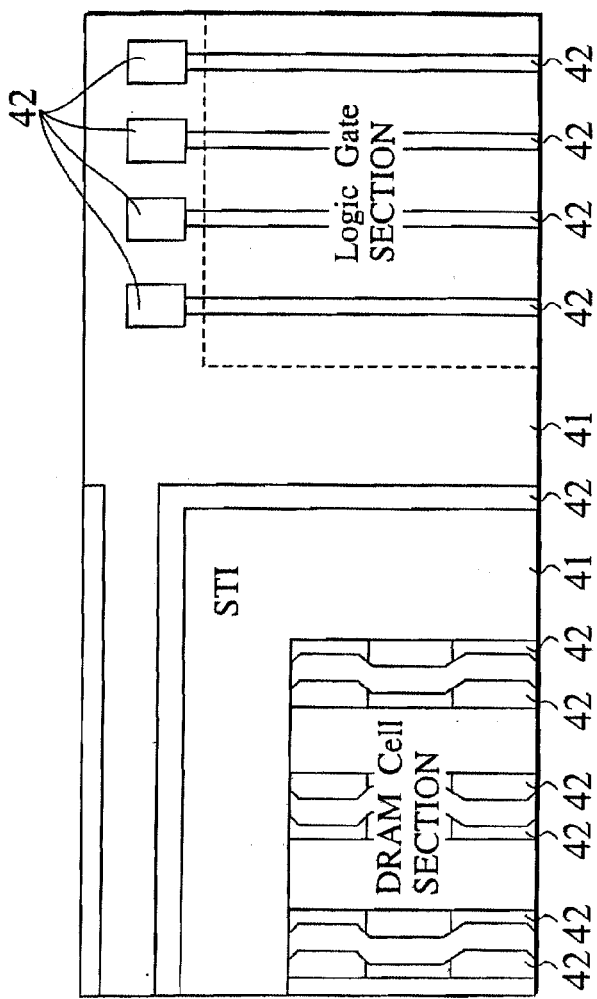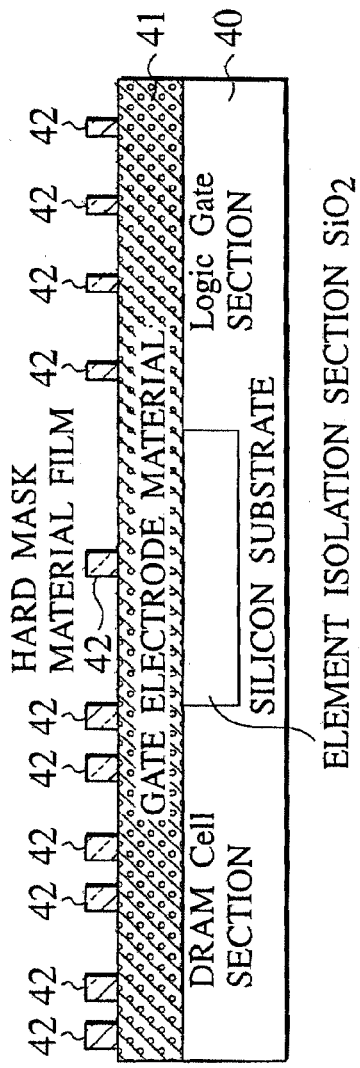

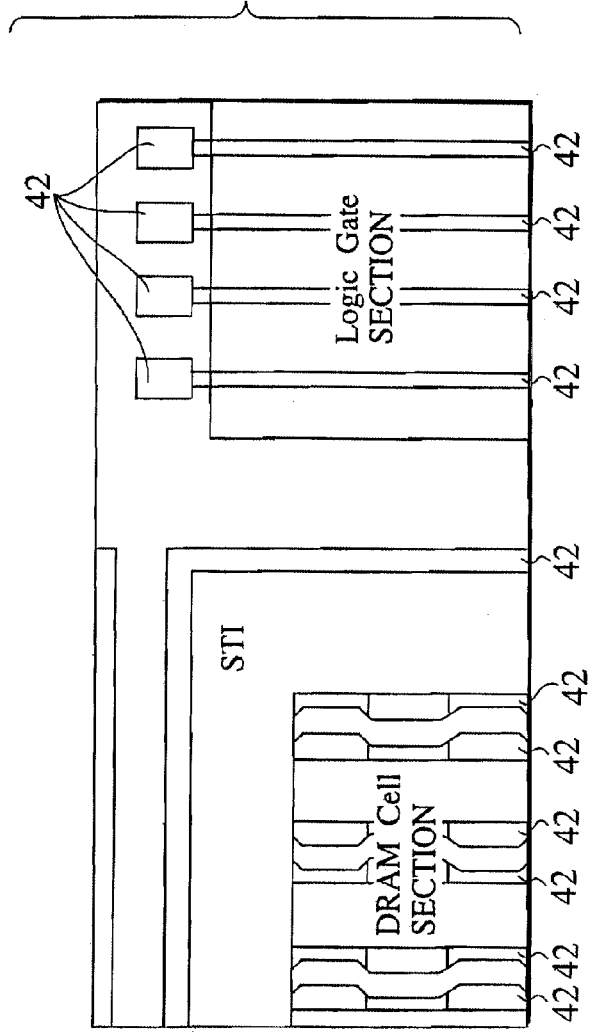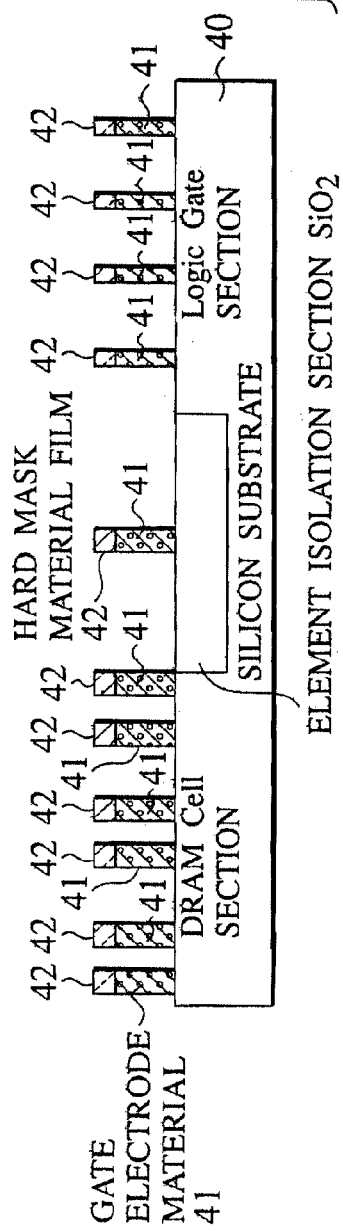

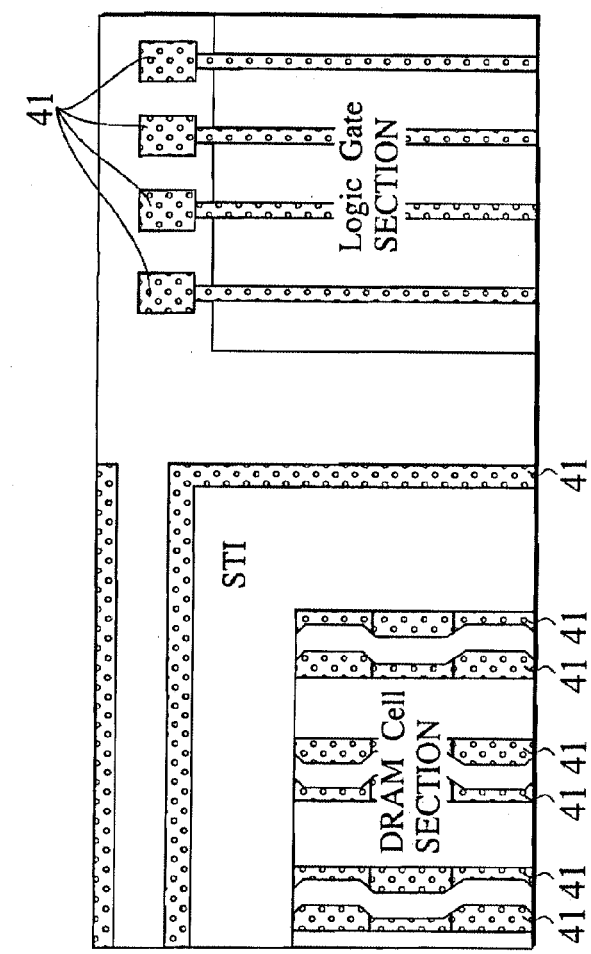
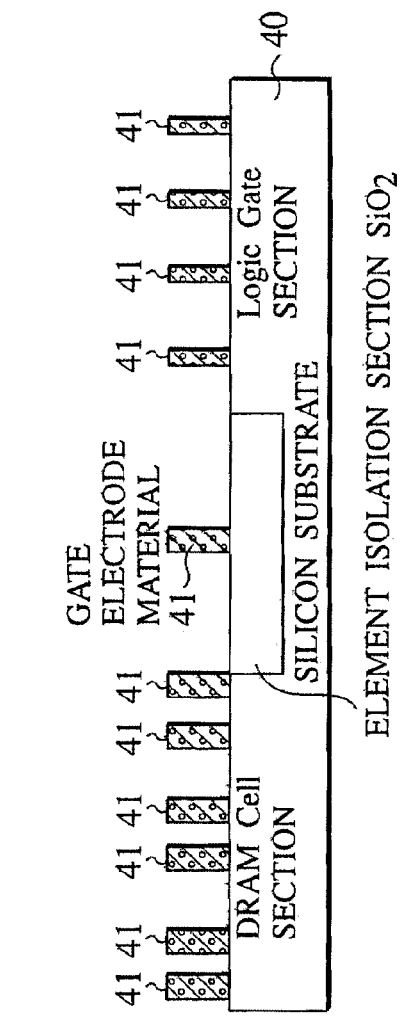

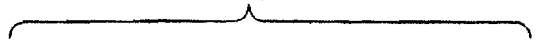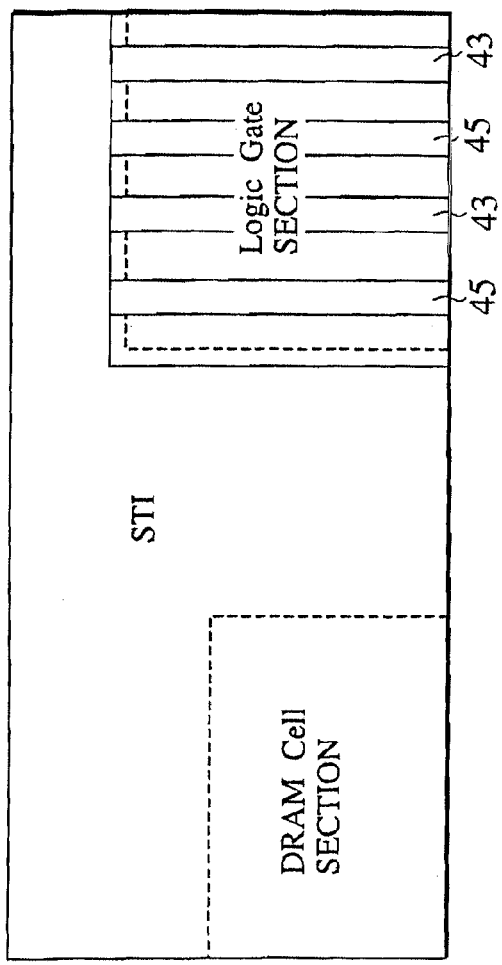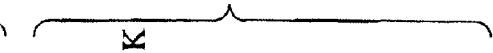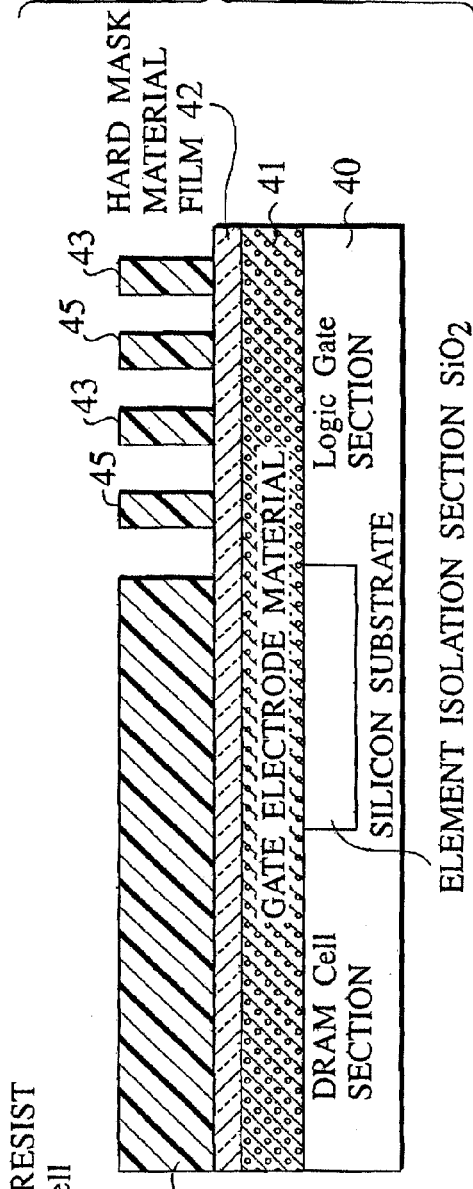

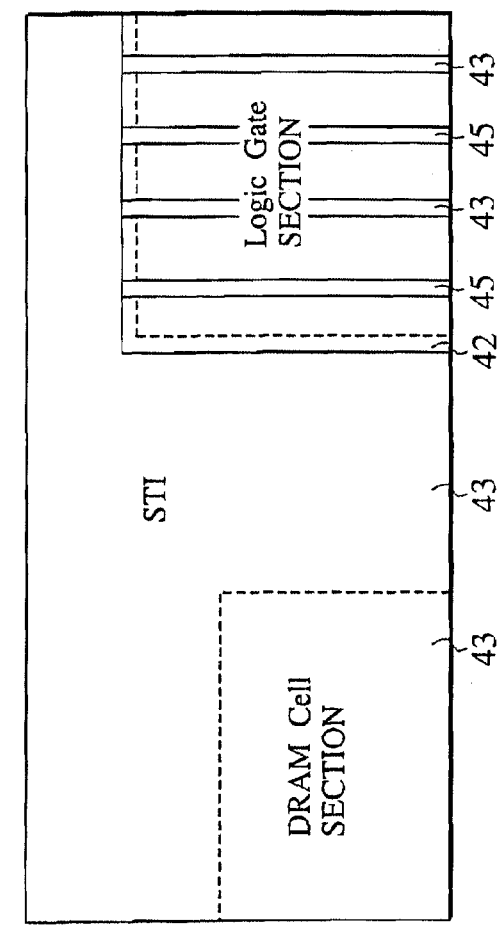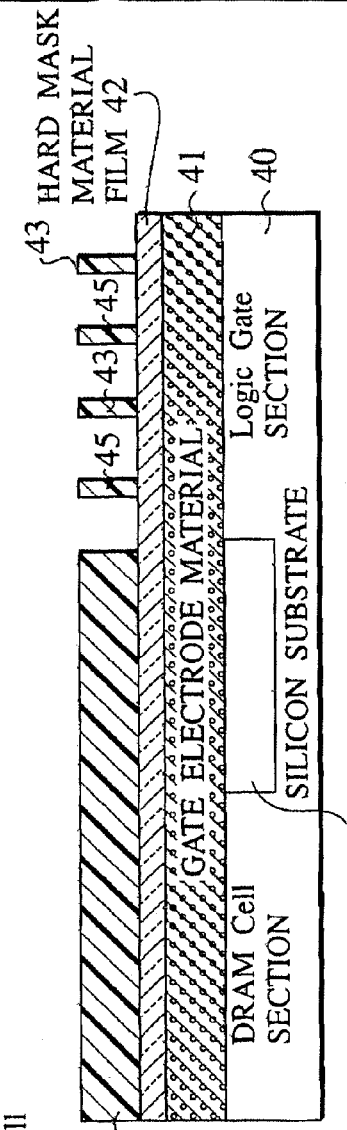

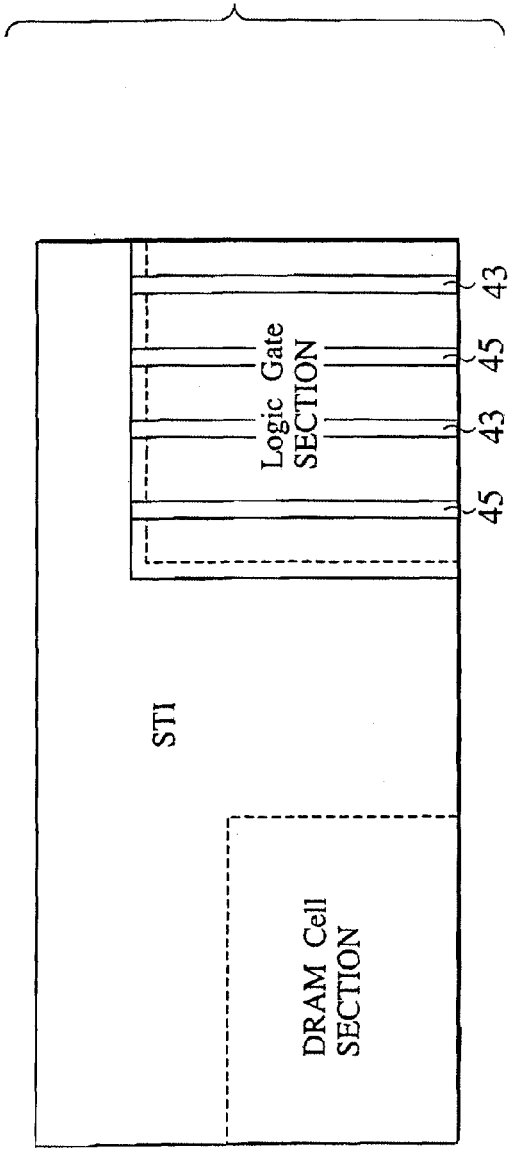
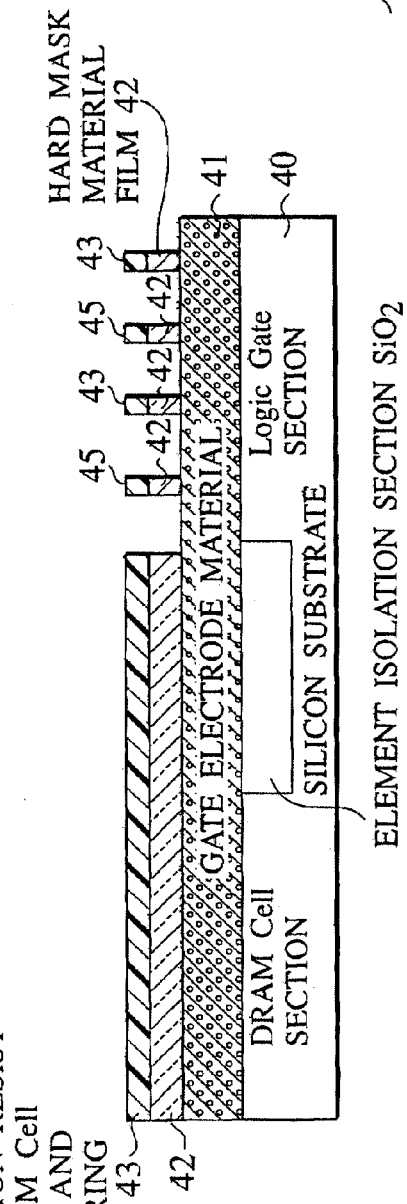

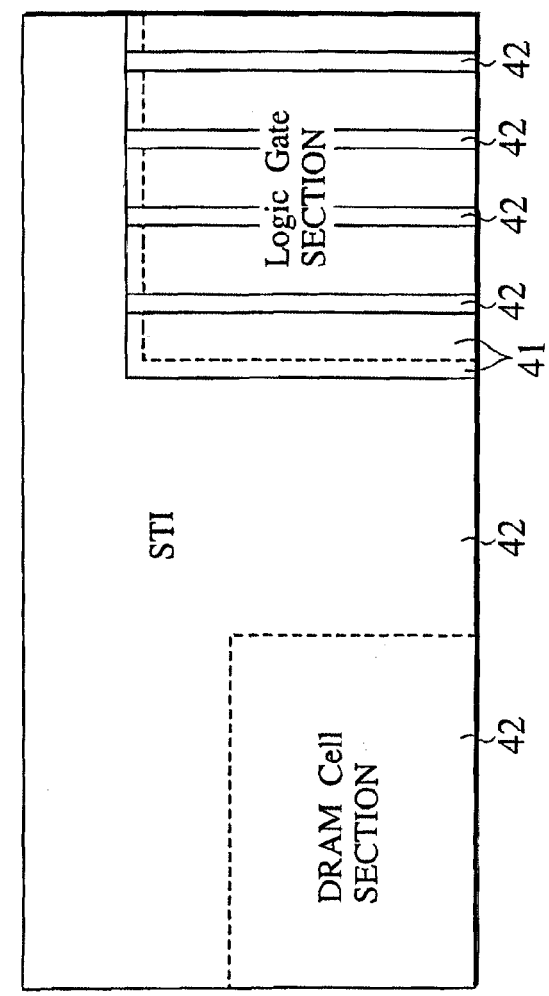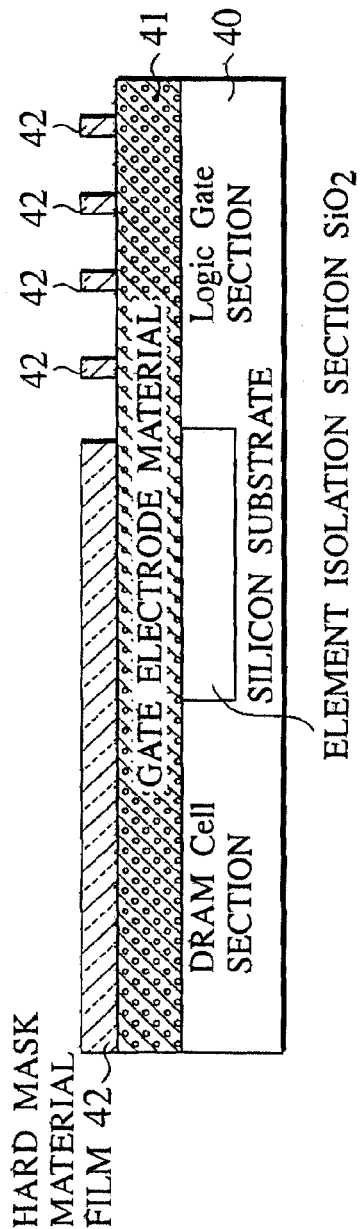

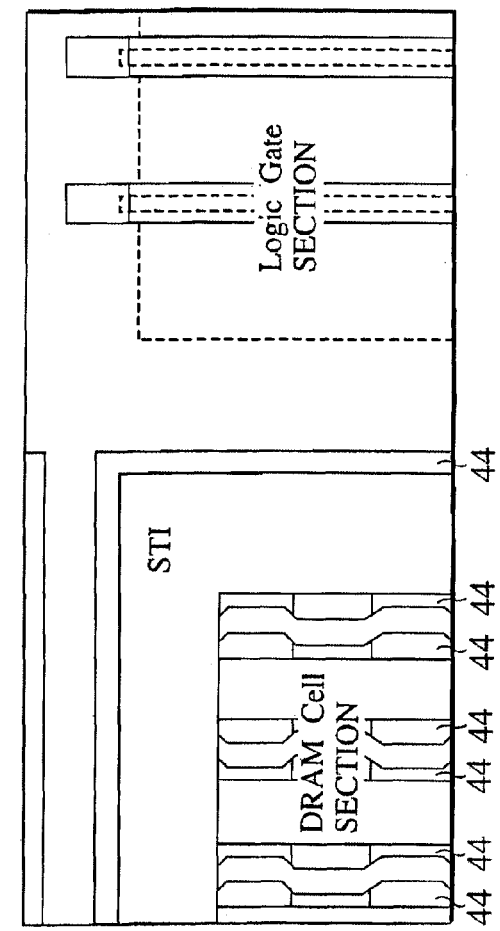
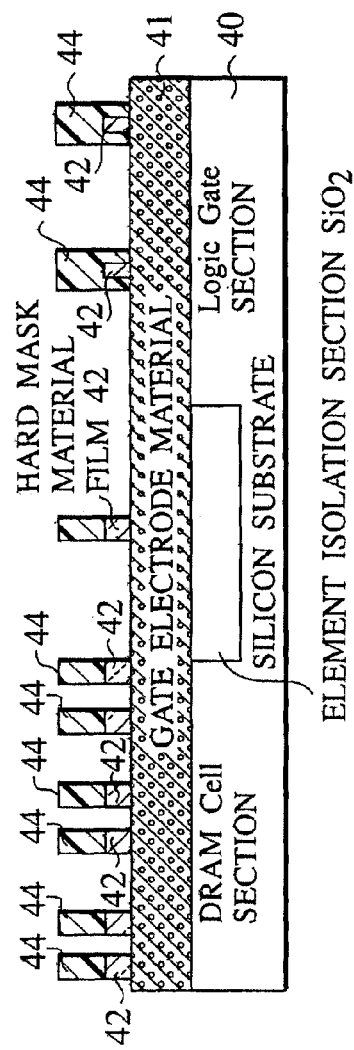

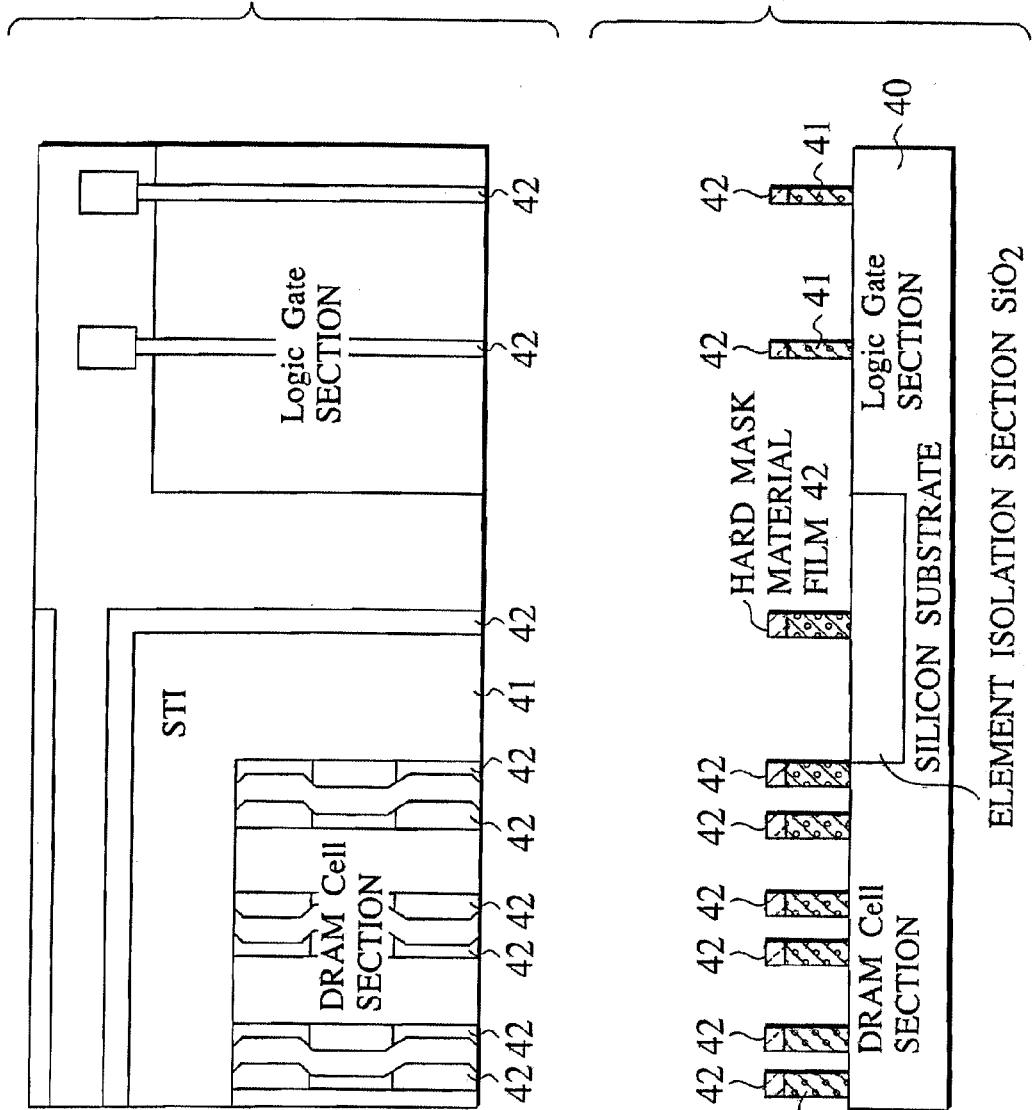

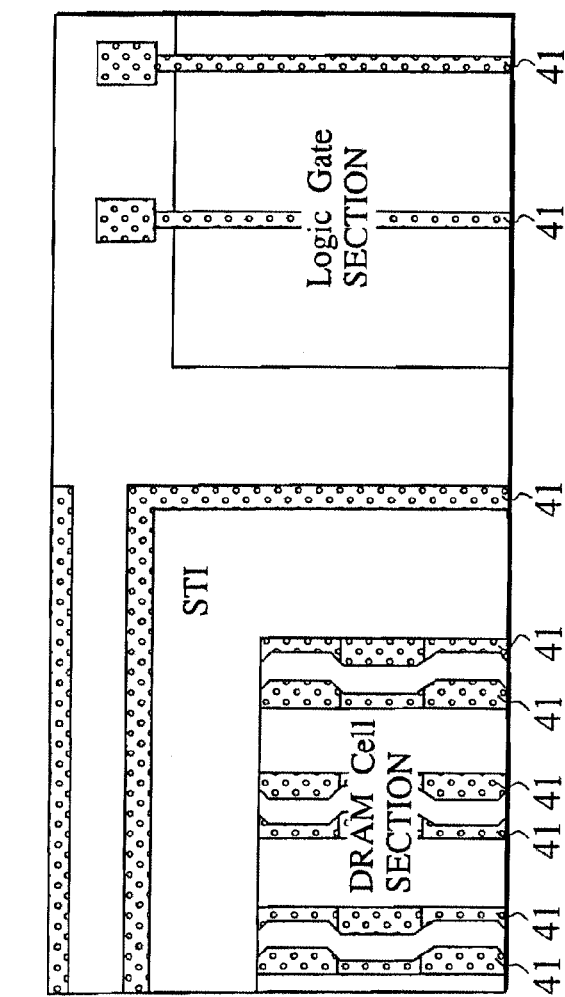
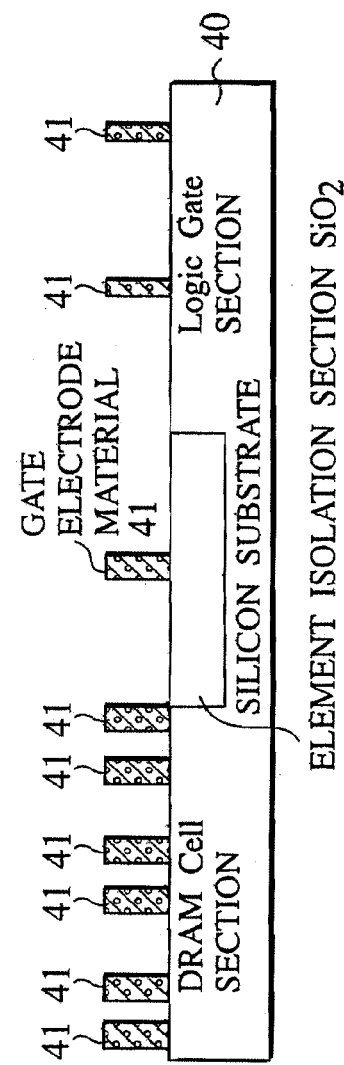

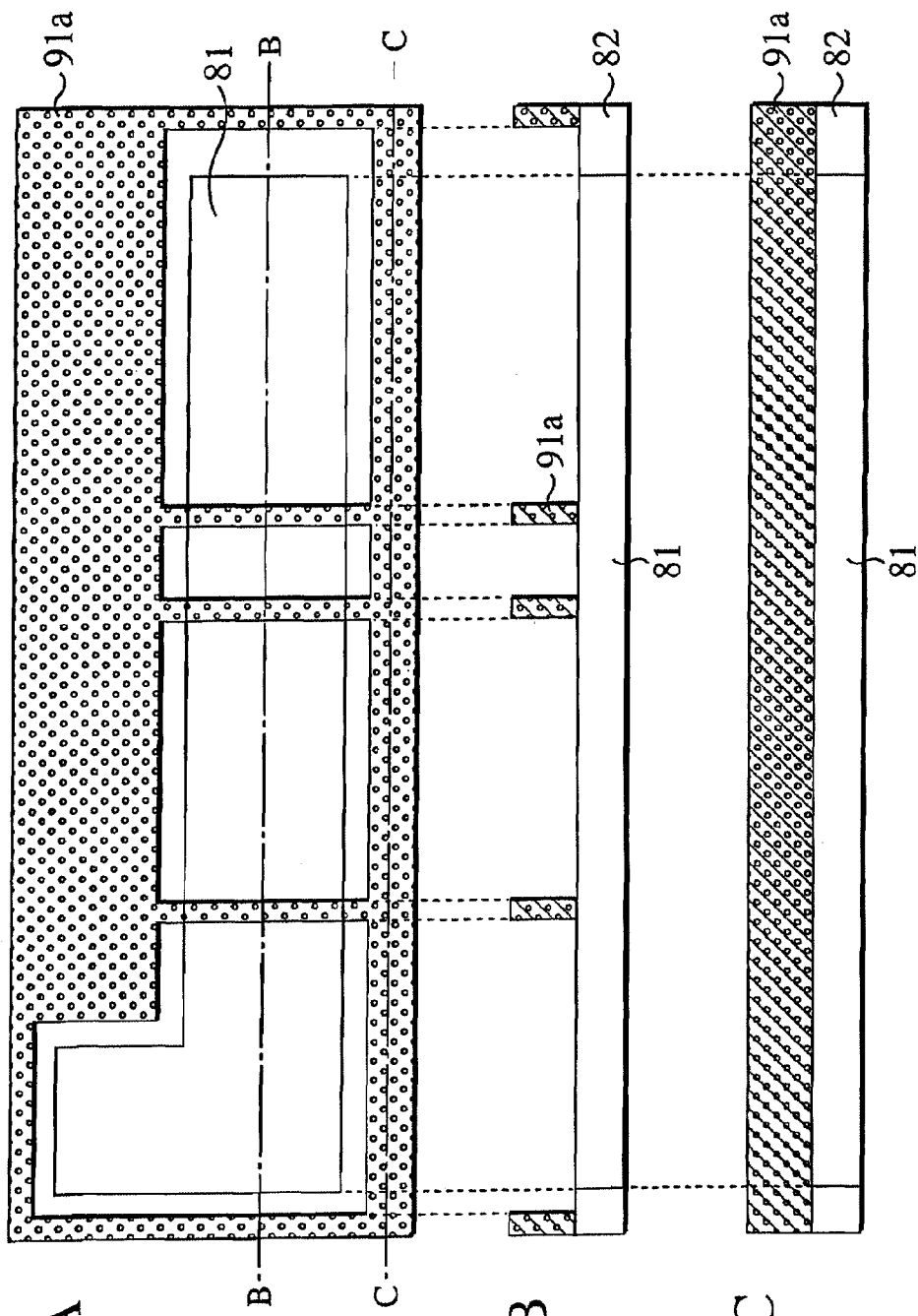

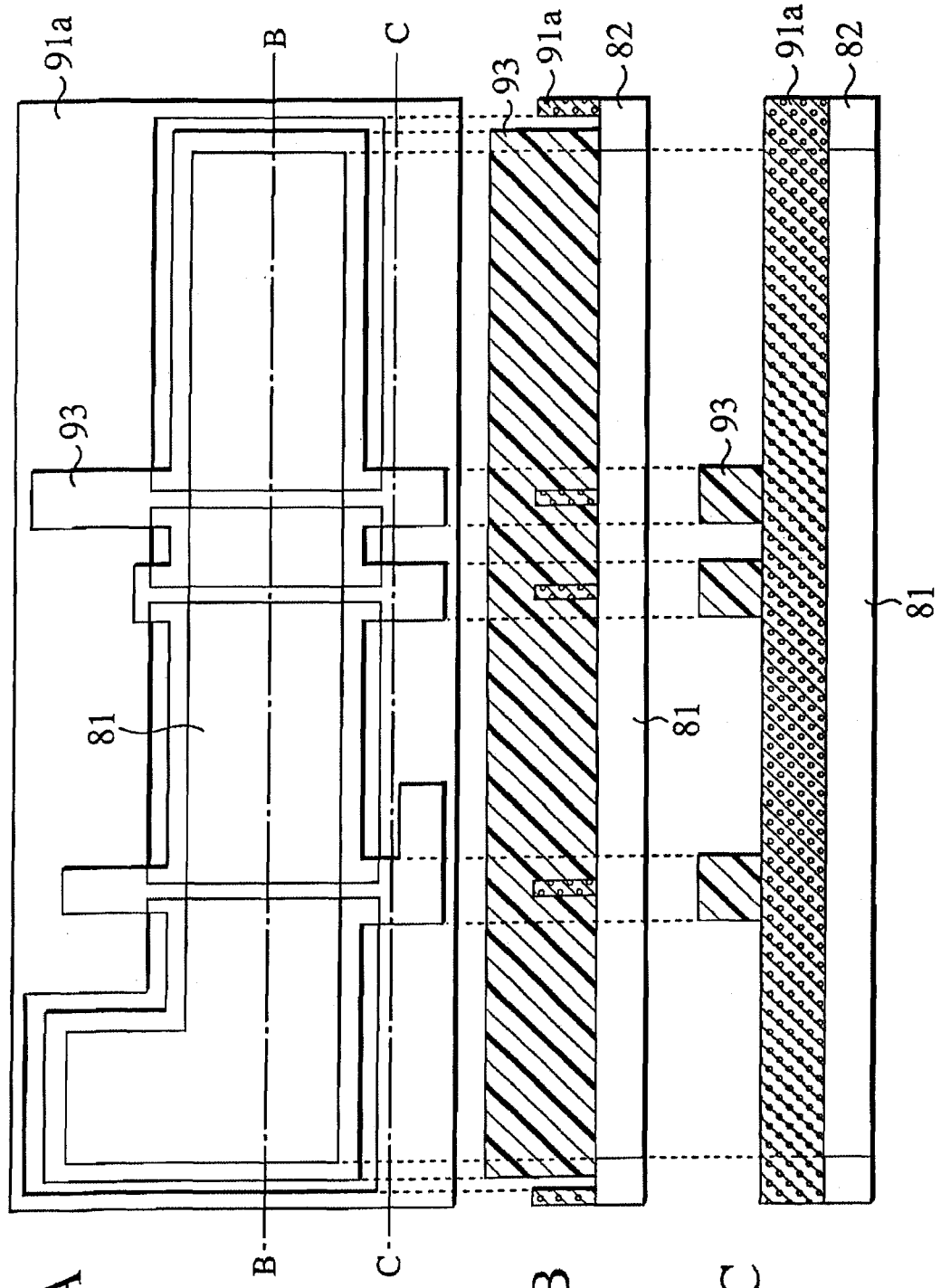

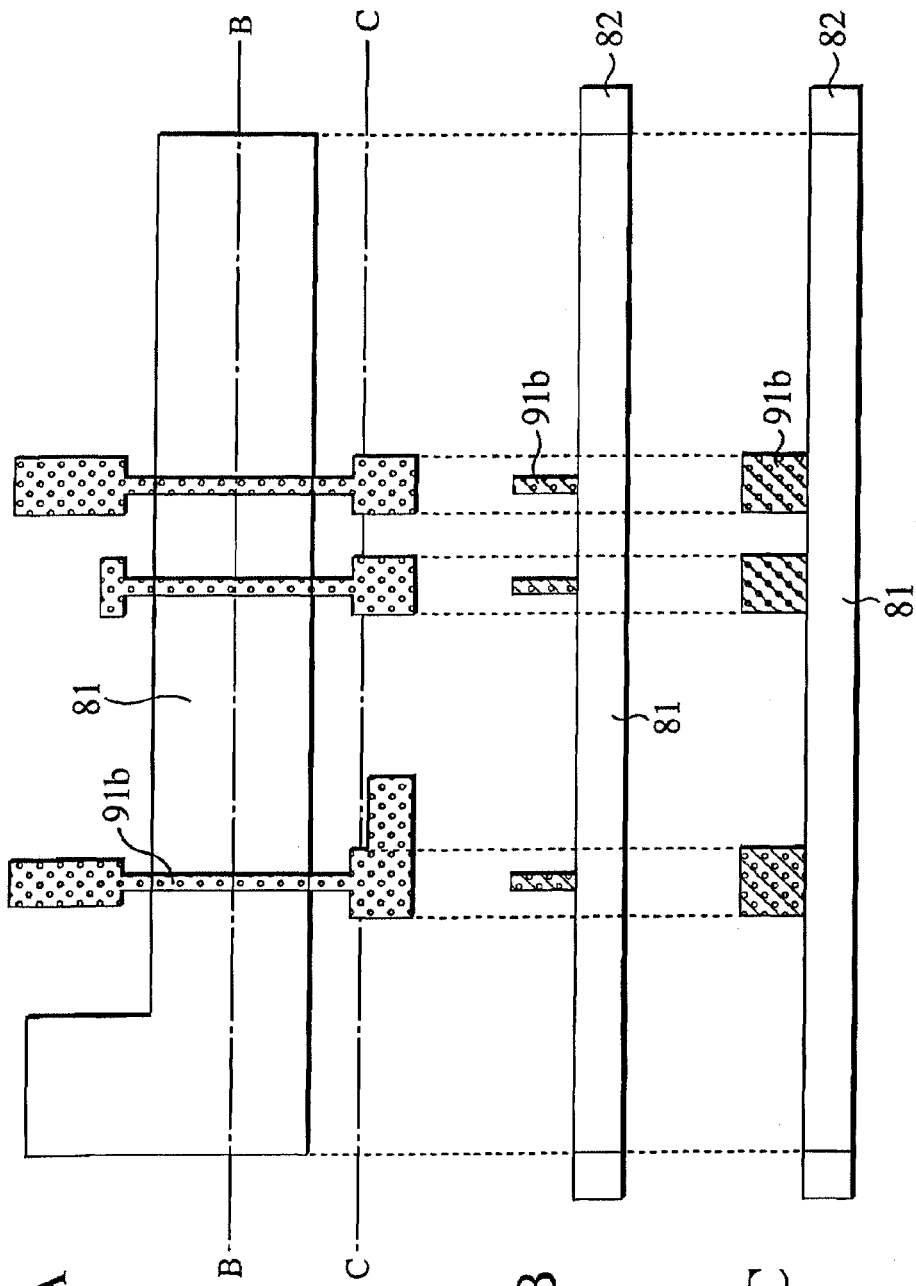

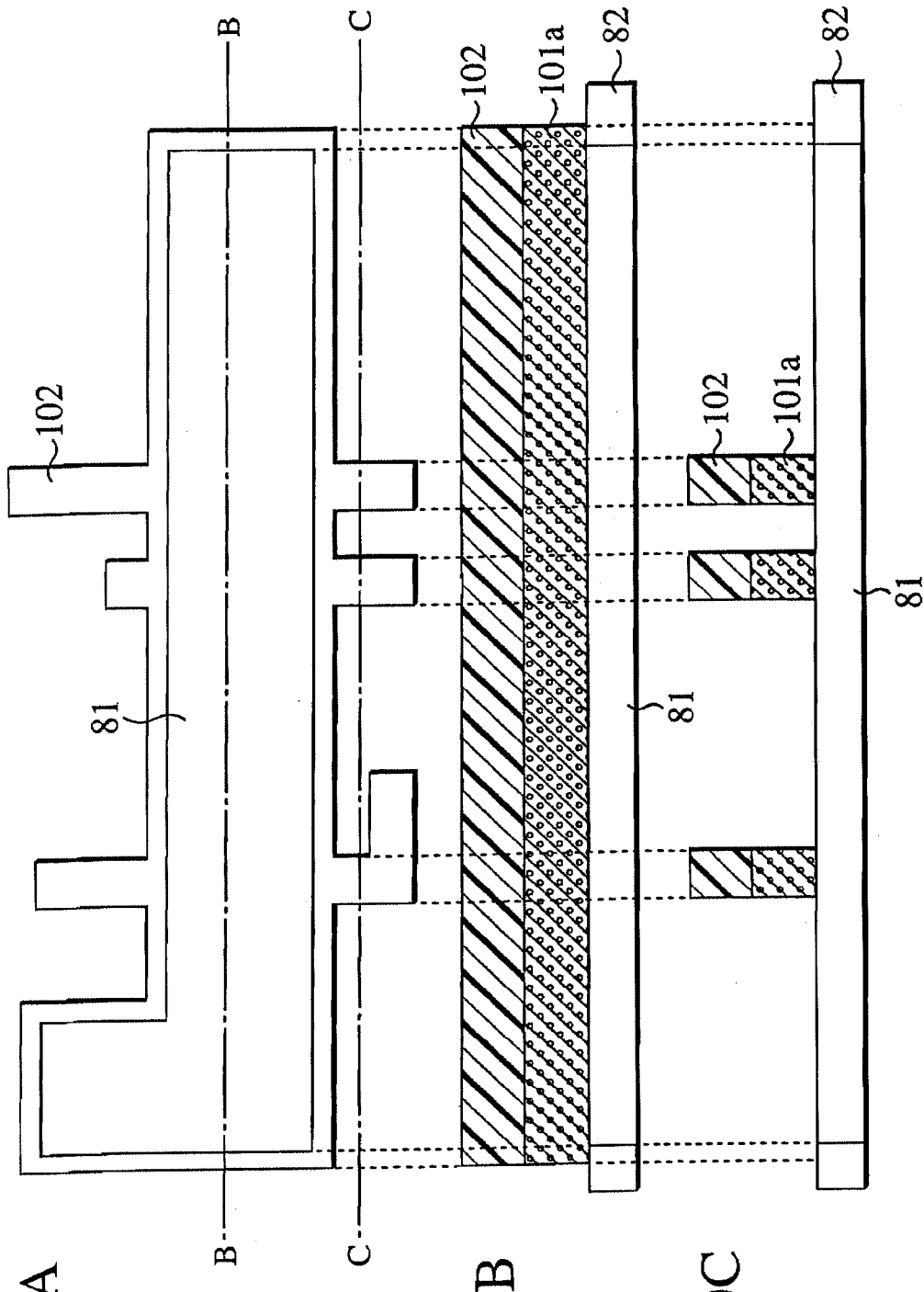

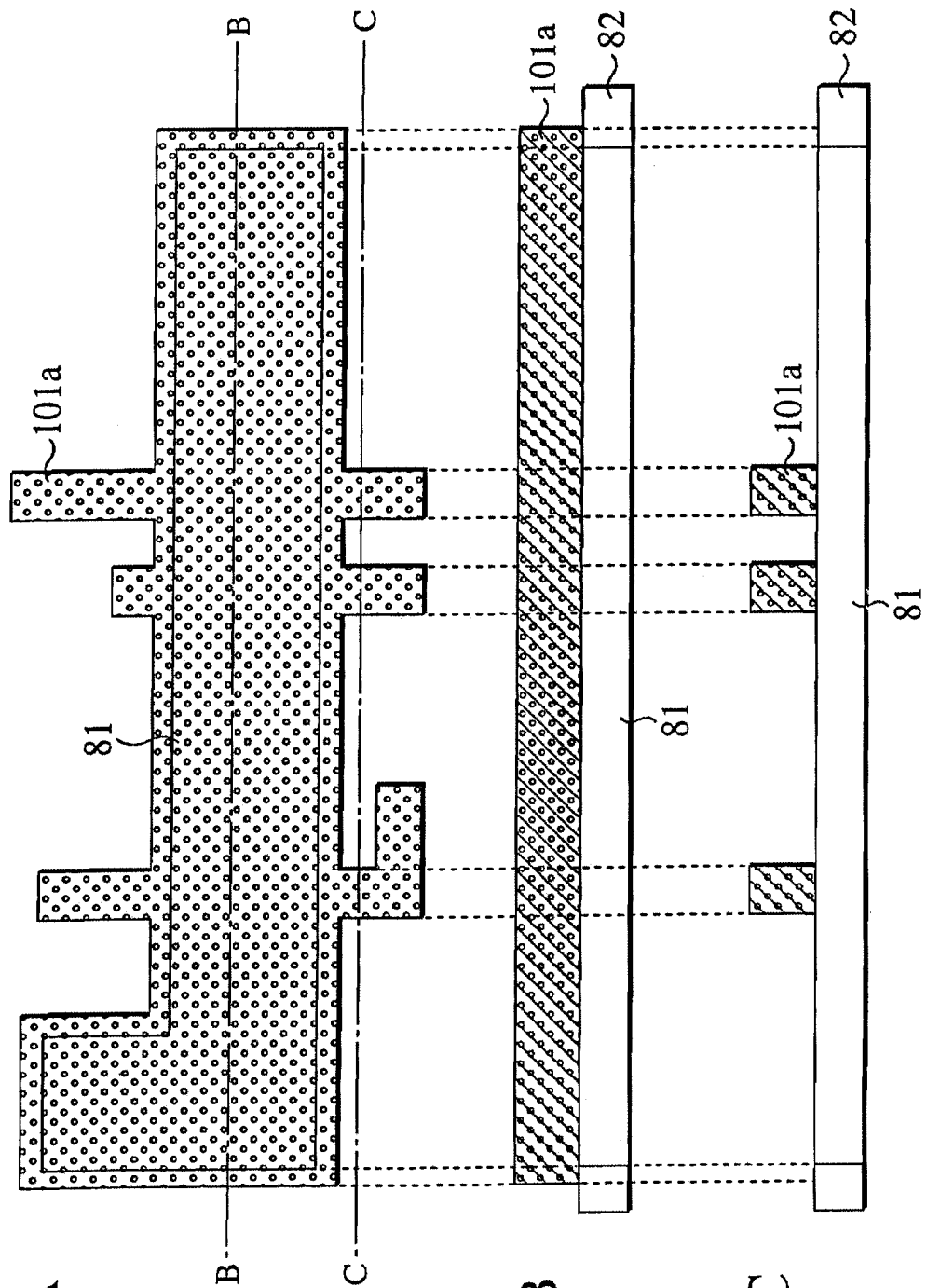

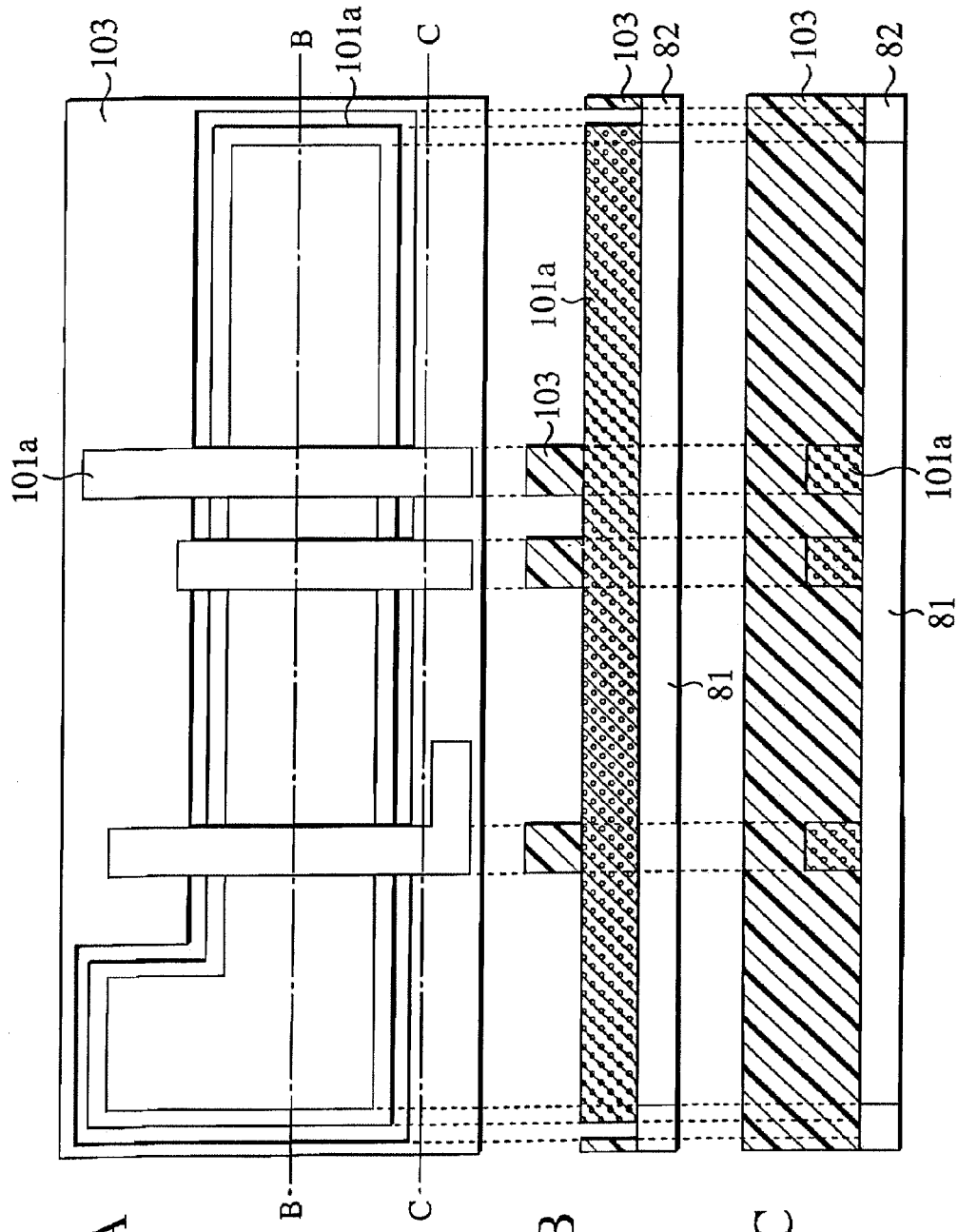

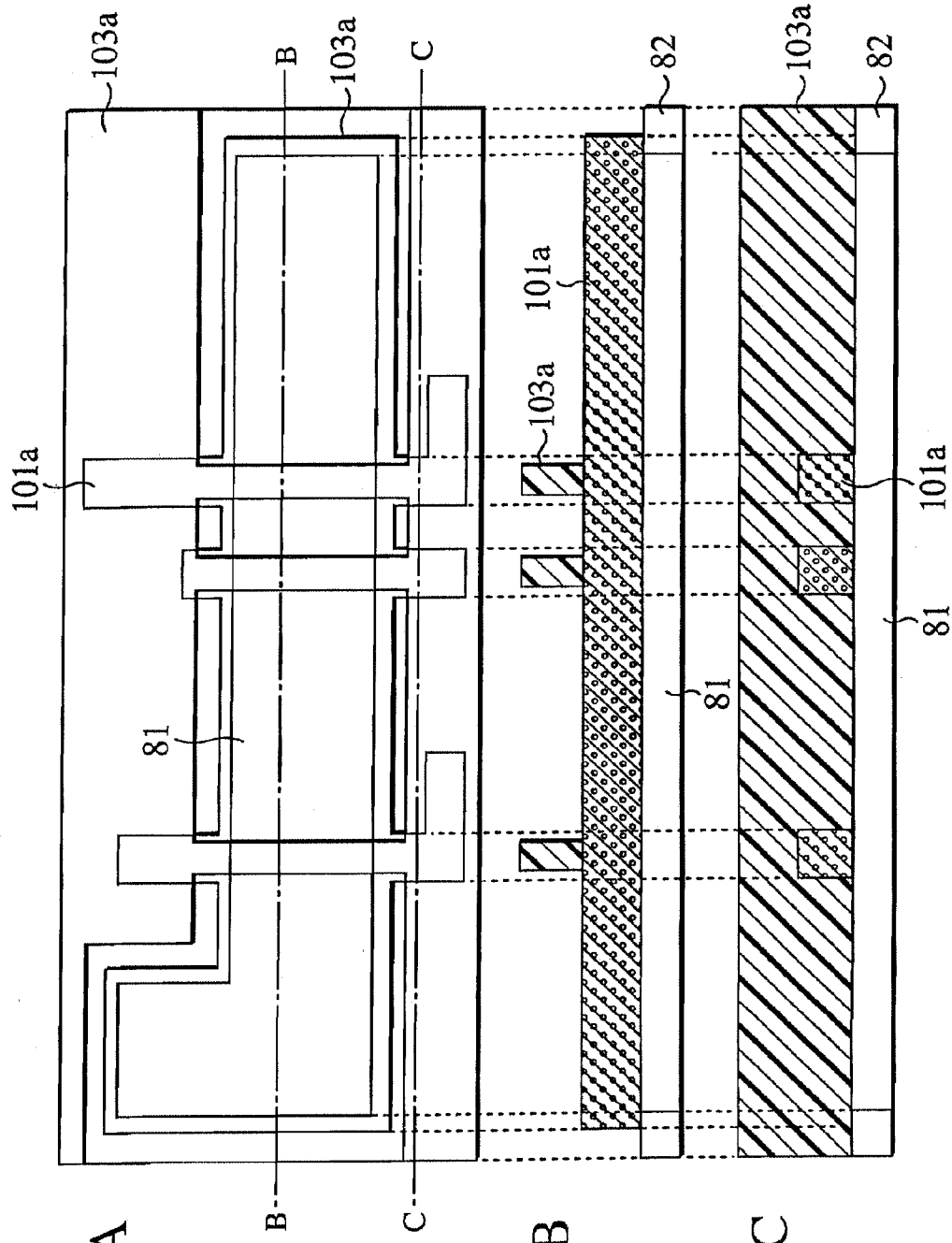

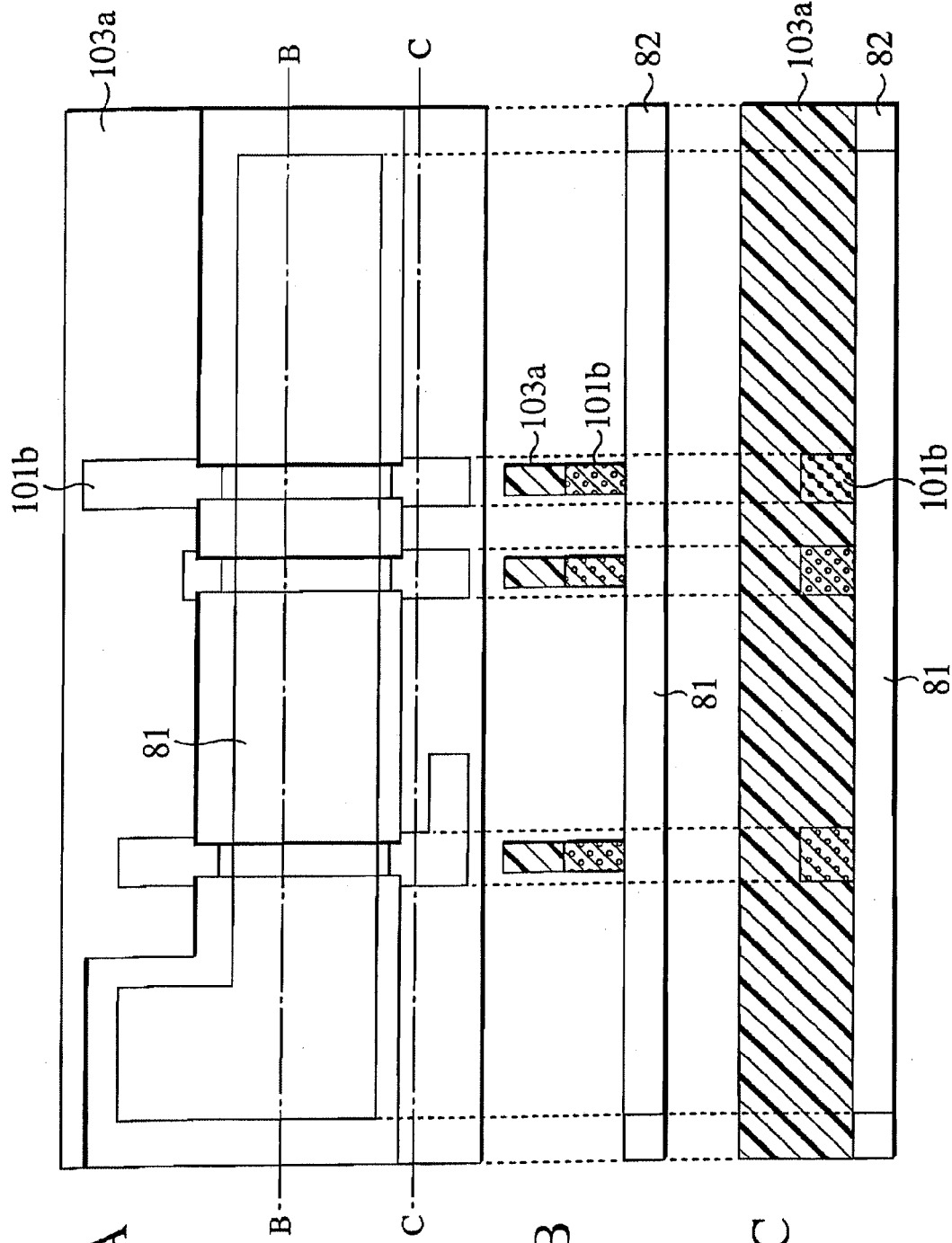

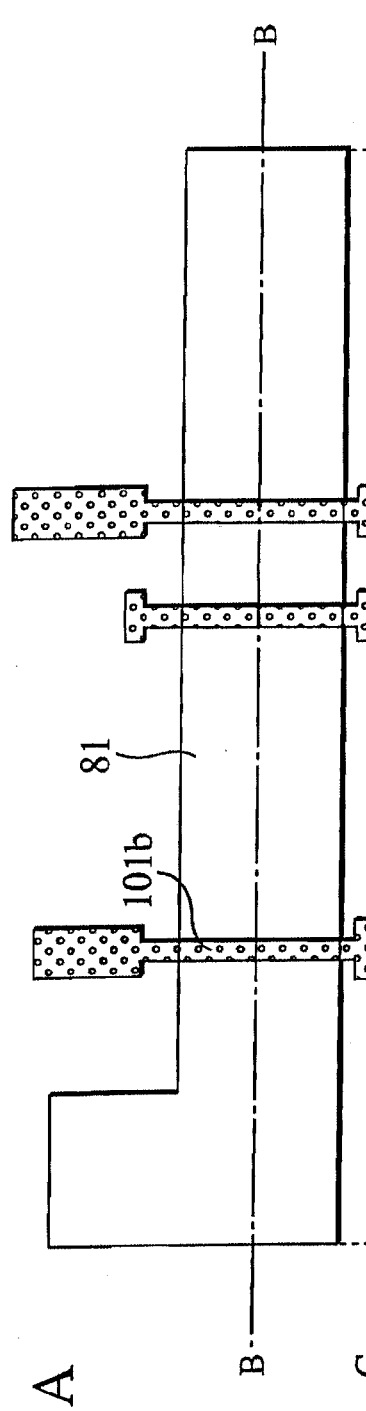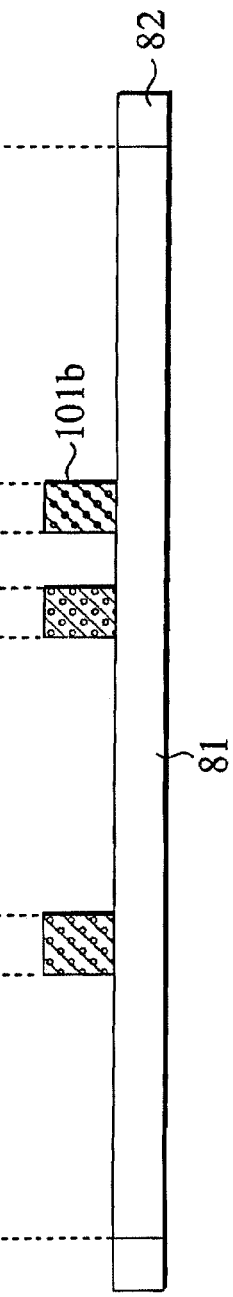
FIG.115A
FIG.115B
FIG.115C

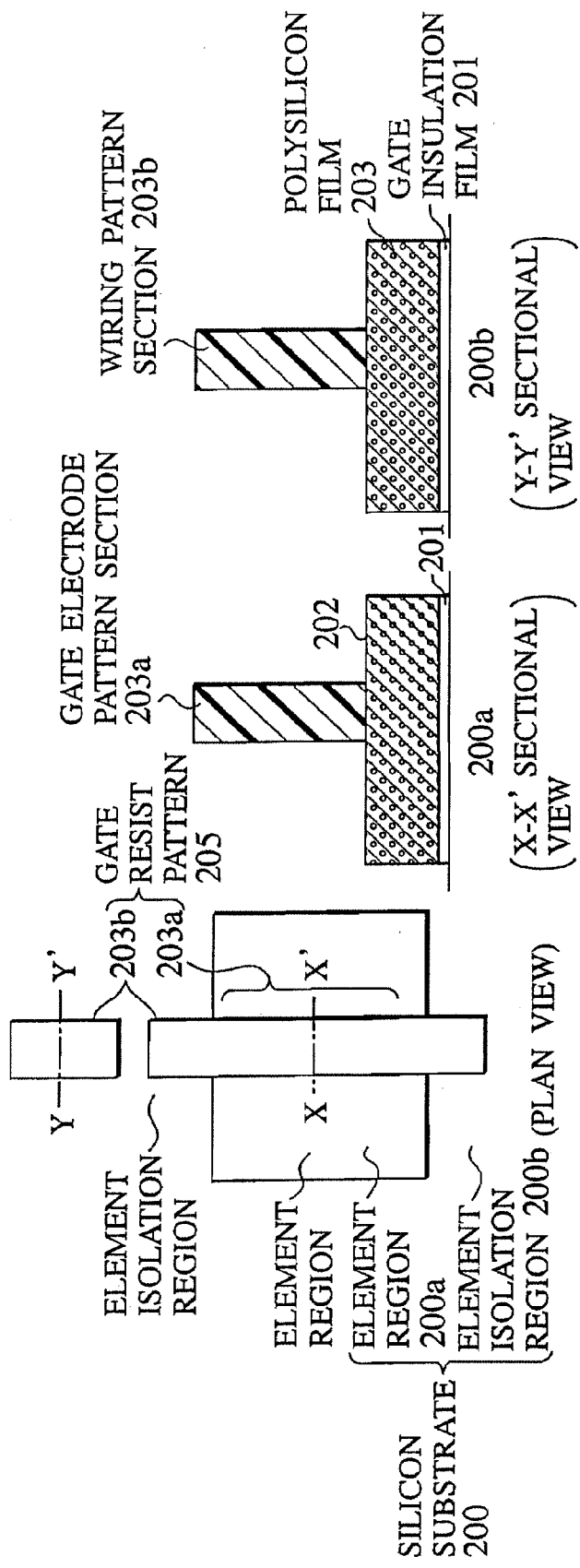

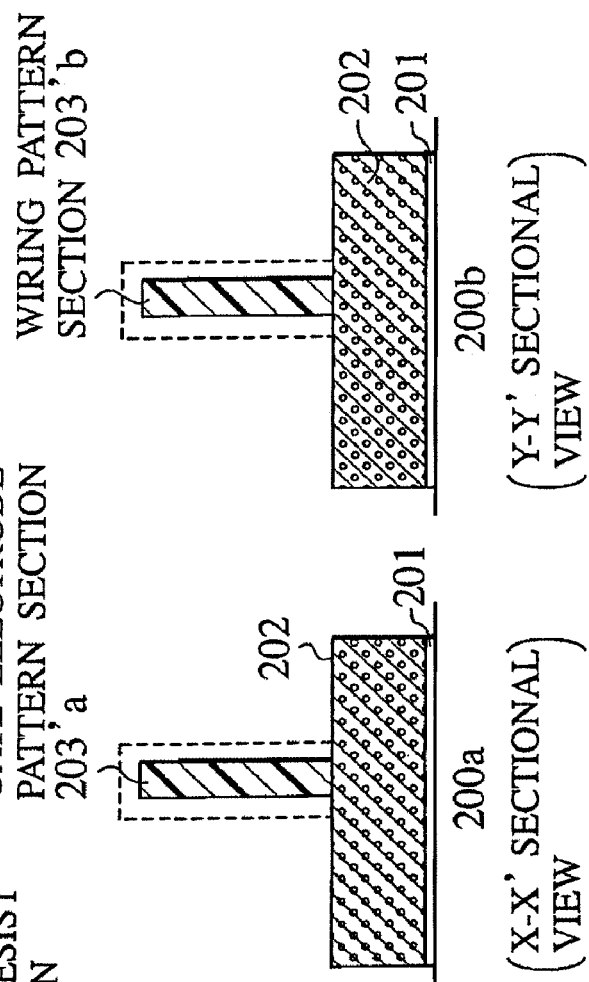
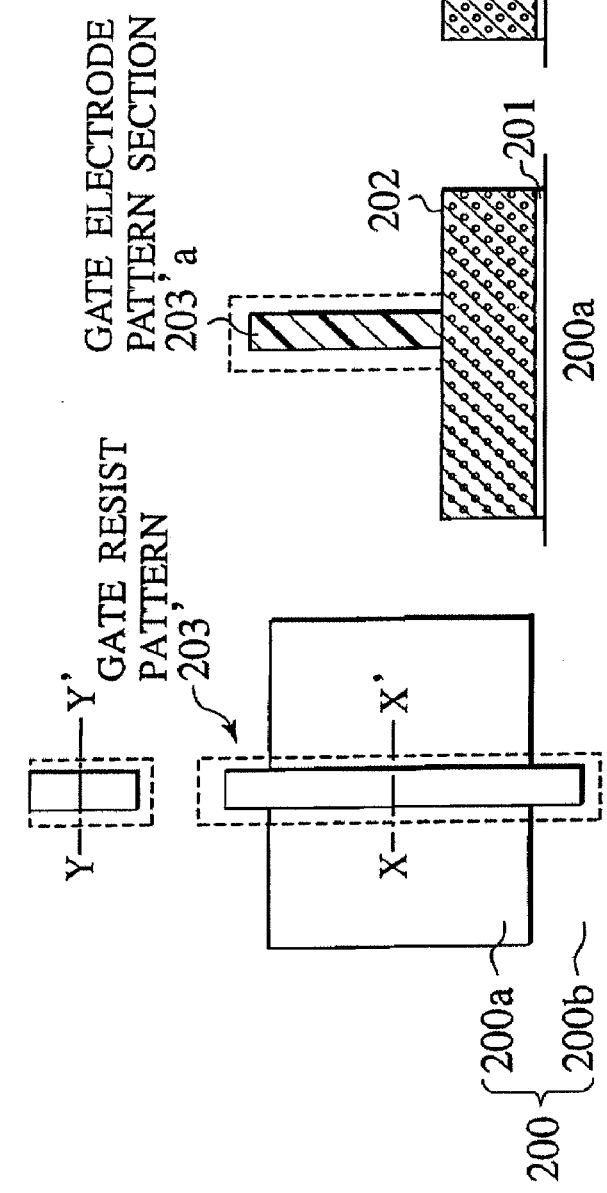

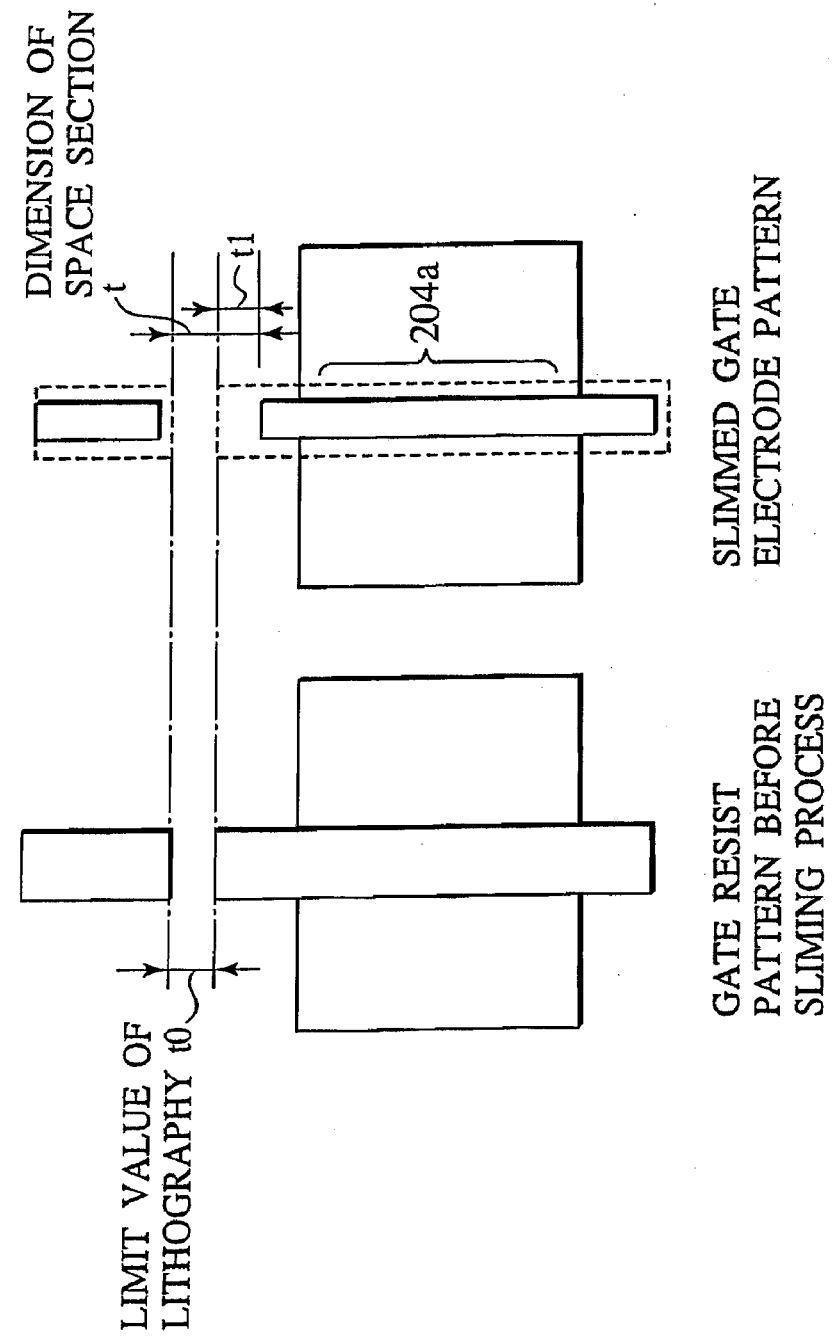

$P_1$: RESOLUTION LIMIT
VALUE OF
LITHOGRAPHY
$P_2$: DESIGN RULE

┌------┐ RESIST PATTERN BEFORE
└------┘ SLIMING PROCESS

┌──────┐ RESIST PATTERN AFTER
└──────┘ SLIMING PROCESS

US 7,824,996 B2

SEMICONDUCTOR DEVICE FABRICATION METHOD AND SEMICONDUCTOR DEVICE

CROSS REFERENCE TO RELATED APPLICATIONS

This application is a division of application Ser. No. 11/643,907, filed Dec. 22, 2006, which is a division of application Ser. No. 10/107,298, filed Mar. 28, 2002, now U.S. Pat. No. 7,208,423 upon and claims the benefit of priority from prior Japanese Patent Applications P2001-123632, filed on Apr. 20, 2001; P2001-123633, filed on Apr. 20, 2001; and P2002-47944, filed on Feb. 25, 2002; the entire contents of all of which are incorporated herein by reference in their entirety.

BACKGROUND OF THE INVENTION

1. Field of the Invention

The present invention relates to a semiconductor device fabrication method of fabricating system large scale integration (LSI) devices and the like having mixed logic and memory parts, and a semiconductor device fabricated by this method. More particularly, it relates to a fabricating method of forming a gate pattern of a metal oxide silicon (MOS) transistor in logic parts in a system LSI and a structure of the gate pattern of the MOS transistor.

2. Description of the Related Art

Recently, there is a strong demand of miniaturization and multifunction in consumer electronic products and information devices. It is, accordingly, necessary to manufacture those electronic products, for example, a system LSI based on microstructure technology.

The most important problem in the above current demand is therefore to fabricate a device pattern of a MOS transistor in a logic part with a microstructure. Although various researches and developments for exposure light sources, photo resists, ultra-resolution technology, and the like have been done, at the present time the lithography (exposure) technology does not satisfy the current demand to miniaturization.

Recently, a resist sliming method has been proposed as one of technologies to fabricate a device pattern with a dimension of not more than a limitation of lithography resolution. This method can fabricate fine patterns with a dimension of not more than the limitation of a lithography resolution by performing an isotropy etching and the like for a resist pattern after the fabrication of this resist pattern.

Hereinafter, a description will be given of an example in which the resist sliming method is applied to a MOS transistor fabrication process.

FIGS. 120A-120C through FIG. 125 are plan views of a fabrication process of a MOS transistor in a logic section and sectional views thereof along lines X-X' and Y-Y'. That is, as shown in FIGS. 120A-120C, a gate insulating film 201 is formed over a silicon substrate 200 including an element region 200a and an element isolation region 200b by a thermal oxidation method and the like. After this process, a work material film, for example, a poly-silicon film 202 as a gate electrode material film is deposited over the gate insulation film 201 by a chemical vapor deposition (CVD) method.

Following this process, a resist is applied over the poly-silicon film 202 and then dried, and a lithography process (exposure) is performed in order to form a first resist pattern, for example, a gate resist pattern 203 with a limitation dimension of the lithography (exposure) gate resist pattern forming process. In this process, the gate resist pattern 203 is formed over the element region 200a and the element isolation region 200b. Here, the pattern section over the element region 200a is called to as a gate electrode pattern section 203a and the pattern section over the element isolation region 200b is called to as a wiring pattern section 203b.

As shown in FIGS. 121A to 121C, the gate resist pattern 203 is processed by the isotropy dry etching using $O_2$ series gas, and as shown by dotted lines in those figures, the sliming process is performed in order to form the gate resist pattern 203' whose dimension is not more than the limitation of the lithography (Gate resist sliming process).

Next, as shown in FIGS. 122A to 122C, the poly-silicon film 202 is etched by a reactive ion etching (RIE) method using the gate resist pattern 203' as a mask. This process makes the gate pattern 204 having a gate electrode pattern section 204a formed over the element region 200a and a wiring pattern section 204b formed over the element isolation region 200b (Gate electrode working process).

Next, as shown in FIGS. 123A to 123C, the gate resist pattern 203' is removed from the surface of the gate pattern 204 by $O_2$ asking method and the like (Resist removing process).

Thereby, it is possible to form the gate resist pattern 203' having a pattern width that is not more than the limitation of the lithography resolution, and then possible to form the fine gate pattern 204 having a pattern width of not more than the limitation of the lithography resolution by performing the etching process for the poly-silicon film 202 as the gate electrode material film using the gate resist pattern 203' as the mask.

After the above processes, although not shown, an impurity is doped into the surface of the silicon substrate 200 by using the gate electrode pattern section 204a as the mask in order to form the source and drain diffusion layer (designated by the dotted lines in FIG. 123B) of the MOS transistor. Following this process, the known layer insulation formation and wiring process are performed, and the MOS transistor fabrication process is thereby completed.

However, in the resist sliming process according to the related art described above, although a fine pattern of the gate electrode pattern section 204a corresponding to a line pattern can be formed, the space section in the wiring pattern section 204b is enlarged. Therefore it is necessary to relax the design rule for the space section when compared with the case not using the sliming process because the space section in the wiring pattern section 204b is enlarged by the execution of the sliming process. That is, as shown in FIGS. 124A and 124B, the dimension "t" (the distance of the adjacent gate patterns) in the space section in the wiring pattern 204b can be reduced to the dimension "to" of the lithography resolution limitation when no sliming process is performed. But, when the sliming process is performed, the dimension "$t_0$" can be relaxed to the dimension "$t_0+2t_1$" that is obtained by adding the dimension "$t_0$" (as the dimension of the lithography resolution limitation) and the dimension "$2t_1$" (as the sliming values of both sides). As a result, although the related sliming method has the effect to improve the performance of the operation speed of the MOS transistor because the fine gate electrode pattern in the MOS transistor can be formed, it has no effect to reduce a semiconductor chip area because the design rule of the space section in the wiring pattern section should be relaxed when compared with the normal lithography process using no sliming process.

FIG. 125 shows a gate pattern in a dynamic random access memory (DRAM) cell. In FIG. 125, the dotted lines show a resist pattern before the sliming process and the solid lines show a resist pattern after the sliming process. The memory cell section requires a fine pattern pitch in order to increase the integration. However, when the related art sliming process is applied to the memory cell section, a space pattern dimension $P_1$ after the sliming process cannot be reached to the limitation of a space resolution in a lithography process. This means that the dimension $P_2$ of the space pattern in the lithography process should be relaxed. As a result, the gate pattern pitch in the memory cell section is relaxed, so that there is a possibility to cause a drawback in which the chip area of a system LSI having relatively large-scale memory cells is expanded.

That is, the sliming process has various drawbacks because a pattern for which no sliming process is necessary is also slimmed by performing the sliming process. For example, in a case that both a fine line pattern and a narrow-width space pattern are obtained, when the line pattern is slimmed, the dimension of the narrow-width space pattern becomes also wide. Therefore it is necessary to set the dimension of the space pattern to a narrow dimension before performing this sliming process. This causes a difficulty to perform a lithography process.

As described above, although the sliming process to form a fine line pattern is well known, it is difficult to obtain a desired pattern dimension in the entire area of a same layer including various patterns, for example, a fine line pattern and a narrow space-width space pattern.

By the way, the related art also has following problems.

In a case to form a gate layer circuit pattern of a semiconductor device in which logic sections and memory sections are mixed using a combination of the exposure using an alternating phase shift mask and the resist sliming process for the logic gate section, it is necessary to performing following three exposure processes. In the first and second exposure processes as a double exposure process, the logic gate section is exposed by using the alternating phase shift mask and a trim mask in order to form the resist pattern, and the resist pattern is then slimed by the sliming process. After this process, in the third exposure process, both the memory cell section and the wiring section are exposed. This related art method must require those three exposure processes described above. That is, this related art method should perform the exposure processes of many times.

Further, with advancing semiconductor device miniaturization, it becomes difficult to form a fine pattern of the semiconductor devices. In order to solve this problem, a lithography process uses a thin film resist having a thin thickness. When a thin-film resist is used, it is necessary to perform a highly selective etching for a target etching material in order to avoid occurrence to disappear the thin film resist having a thin thickness. In the highly selective etching the target etching material is etched while protecting the resist pattern from an etching gas by adhering reaction products generated by the etching onto the resist. Hence, the amount of reaction products greatly affects a process accuracy of the target etching material. Specifically speaking, the amount of reaction products becomes increase according to increasing an etching area. For this reason, when a line pattern and the like is formed, a line width in an area having a rough line pattern becomes large when compared with that in an area of a dense line pattern. That is, in the etching method of this type, a dimension of a line pattern is greatly changed according to the density of the pattern.

Furthermore, when a sliming process (to slim a resist pattern by etching) is performed for a resist pattern, the amount of the sliming is also changed according to the density of the pattern.

BRIEF SUMMARY OF THE INVENTION

A semiconductor device fabrication method according to an embodiment includes, depositing a mask material film over a work film and forming a first resist pattern over the mask material film by a first exposure process, forming a mask pattern by processing the mask material film using the first resist pattern as a mask, removing the first resist pattern, forming a second resist pattern over the work film including the mask pattern, and the second resist pattern covering a non-selected region of the mask pattern and having an opening through which a selected region in the mask pattern is exposed by a second exposure process, sliming the part in the mask pattern exposed through the opening of the second resist pattern, removing the second resist pattern, and forming a work film pattern having a pattern section of a wide dimension width and a pattern section of a narrow dimension width by etching the work film using the mask pattern as a mask.

BRIEF DESCRIPTION OF THE DRAWINGS

FIGS. 1A-1C are a plan view and sectional views along X-X' and Y-Y' lines of the plan view of a semiconductor device made by the process in the semiconductor device fabrication method according to the first embodiment;

FIGS. 2A-2C are a plan view and sectional views along X-X' and Y-Y' lines of the plan view of the semiconductor device made by the process in the semiconductor device fabrication method according to the first embodiment;

FIG. 4A-4C are a plan view and sectional views along X-X' and Y-Y' lines of the plan view of the semiconductor device made by the process in the semiconductor device fabrication method according to the first embodiment;

FIGS. 6A-6C are a plan view and sectional views along X-X' and Y-Y' lines of the plan view of the semiconductor device made by the process in the semiconductor device fabrication method according to the first embodiment;

FIGS. 8A-8C are a plan view and sectional views along X-X' and Y-Y' lines of the plan view of the semiconductor device made by the process in the semiconductor device fabrication method according to the first embodiment;

FIGS. 16A-16C are a plan view and sectional views along X-X' and Y-Y' lines of the plan view of the semiconductor device made by each process in the semiconductor device fabrication method according to the third embodiment;

FIGS. 17A-17C are a plan view and sectional views along X-X' and Y-Y' lines of the plan view of the semiconductor device made by each process in the semiconductor device fabrication method according to the third embodiment;

FIGS. 18A-18C are a plan view and sectional views along X-X' and Y-Y' lines of the plan view of the semiconductor device made by each process in the semiconductor device fabrication method according to the third embodiment;

FIGS. 19A-19C are a plan view and sectional views along X-X' and Y-Y' lines of the plan view of the semiconductor device made by each process in the semiconductor device fabrication method according to the third embodiment;

FIGS. 21A-21C are a plan view and sectional views along X-X' and Y-Y' lines of the plan view of the semiconductor device made by each process in the semiconductor device fabrication method according to the third embodiment;

FIGS. 22A-22C are a plan view and sectional views of the plan view of a semiconductor device made by each process in the semiconductor device fabrication method according to the fourth embodiment;

FIGS. 23A-23C are a plan view and sectional views along X-X' and Y-Y' lines of the plan view of the semiconductor device made by each process in the semiconductor device fabrication method according to the fourth embodiment;

FIGS. 24A-24C are a plan view and sectional views along X-X' and Y-Y' lines of the plan view of the semiconductor device made by each process in the semiconductor device fabrication method according to the fourth embodiment;

FIGS. 26A-26C are a plan view and sectional views along X-X' and Y-Y' lines of the plan view of the semiconductor device made by each process in the semiconductor device fabrication method according to the fourth embodiment;

FIGS. 27A-27C are a plan view and sectional views along X-X' and Y-Y' lines of the plan view of the semiconductor device made by each process in the semiconductor device fabrication method according to the fourth embodiment;

FIG. 28 is a plan view and a sectional view of the plan view of a semiconductor device made by the semiconductor device fabrication method according to the fifth embodiment;

FIG. 29 is a plan view and a sectional view of the plan view of the semiconductor device made by the semiconductor device fabrication method according to the fifth embodiment;

FIG. 30 is a plan view and a sectional view of the plan view of the semiconductor device made by the semiconductor device fabrication method according to the fifth embodiment;

FIG. 31 is a plan view and a sectional view of the plan view of the semiconductor device made by the semiconductor device fabrication method according to the fifth embodiment;

FIG. 33 is a plan view and a sectional view of the plan view of the semiconductor device made by the semiconductor device fabrication method according to the fifth embodiment;

FIG. 34 is a plan view and a sectional view of the plan view of the semiconductor device made by the semiconductor device fabrication method according to the fifth embodiment;

FIG. 35 is a plan view and a sectional view of the plan view of the semiconductor device made by the semiconductor device fabrication method according to the fifth embodiment;

FIG. 36 is a plan view and a sectional view of the plan view of the semiconductor device made by the semiconductor device fabrication method according to the fifth embodiment;

FIG. 37 is a plan view and a sectional view of the plan view of a semiconductor device made by the semiconductor device fabrication method according to the sixth embodiment;

FIG. 38 is a plan view and a sectional view of the plan view of the semiconductor device made by the semiconductor device fabrication method according to the sixth embodiment;

FIG. 39 is a plan view and a sectional view of the plan view of the semiconductor device made by the semiconductor device fabrication method according to the sixth embodiment;

FIG. 40 is a plan view and a sectional view of the plan view of the semiconductor device made by the semiconductor device fabrication method according to the sixth embodiment;

FIG. 41 is a plan view and a sectional view of the plan view of the semiconductor device made by the semiconductor device fabrication method according to the sixth embodiment;

FIG. 42 is a plan view and a sectional view of the plan view of the semiconductor device made by the semiconductor device fabrication method according to the sixth embodiment;

FIG. 43 is a plan view and a sectional view of the plan view of the semiconductor device made by the semiconductor device fabrication method according to the sixth embodiment;

FIG. 44 is a plan view and a sectional view of the plan view of the semiconductor device made by the semiconductor device fabrication method according to the sixth embodiment;

FIG. 45 is a plan view and a sectional view of the plan view of the semiconductor device made by the semiconductor device fabrication method according to the sixth embodiment;

FIG. 46 is a plan view and a sectional view of the plan view of a semiconductor device made by the semiconductor device fabrication method according to the seventh embodiment;

FIG. 47 is a plan view and a sectional view of the plan view of the semiconductor device made by the semiconductor device fabrication method according to the seventh embodiment;

FIG. 48 is a plan view and a sectional view of the plan view of the semiconductor device made by the semiconductor device fabrication method according to the seventh embodiment;

FIG. 52 is a plan view and a sectional view of the plan view of the semiconductor device made by the semiconductor device fabrication method according to the seventh embodiment;

FIG. 53 is a plan view and a sectional view of the plan view of the semiconductor device made by the semiconductor device fabrication method according to the seventh embodiment;

FIG. 54 is a plan view and a sectional view of the plan view of a semiconductor device made by the semiconductor device fabrication method according to the eighth embodiment;

FIG. 55 is a plan view and a sectional view of the plan view of the semiconductor device made by the semiconductor device fabrication method according to the eighth embodiment;

FIG. 57 is a plan view and a sectional view of the plan view of the semiconductor device made by the semiconductor device fabrication method according to the eighth embodiment;

FIG. 59 is a plan view and a sectional view of the plan view of the semiconductor device made by the semiconductor device fabrication method according to the eighth embodiment;

FIG. 60 is a plan view and a sectional view of the plan view of the semiconductor device made by the semiconductor device fabrication method according to the eighth embodiment;

FIG. 61 is a plan view and a sectional view of the plan view of the semiconductor device made by the semiconductor device fabrication method according to the eighth embodiment;

FIG. 62 is a plan view and a sectional view of the plan view of the semiconductor device made by the semiconductor device fabrication method according to the eighth embodiment;

FIG. 63 is a plan view and a sectional view of the plan view of the semiconductor device made by the semiconductor device fabrication method according to the eighth embodiment;

FIG. 64 is a plan view and a sectional view of the plan view of a semiconductor device made by the semiconductor device fabrication method according to the ninth embodiment;

FIG. 65 is a plan view and a sectional view of the plan view of the semiconductor device made by the semiconductor device fabrication method according to the ninth embodiment;

FIG. 66 is a plan view and a sectional view of the plan view of the semiconductor device made by the semiconductor device fabrication method according to the ninth embodiment;

FIG. 67 is a plan view and a sectional view of the plan view of the semiconductor device made by the semiconductor device fabrication method according to the ninth embodiment;

FIG. 69 is a plan view and a sectional view of the plan view of the semiconductor device made by the semiconductor device fabrication method according to the ninth embodiment;

FIG. 71 is a plan view and a sectional view of the plan view of the semiconductor device made by the semiconductor device fabrication method according to the ninth embodiment;

FIG. 72 is a plan view and a sectional view of the plan view of the semiconductor device made by the semiconductor device fabrication method according to the ninth embodiment;

FIGS. 105A-105C are a plan view and sectional views along B-B and C-C lines of the plan view of a semiconductor device made by the process in a semiconductor device fabrication method according to the first example of the eleventh embodiment;

FIGS. 106A-106C are a plan view and sectional views along B-B and C-C lines of the plan view of a semiconductor device made by the process in a semiconductor device fabrication method according to the first example of the eleventh embodiment;

FIGS. 108A-108C are a plan view and sectional views along B-B and C-C lines of the plan view of a semiconductor device made by the process in a semiconductor device fabrication method according to the first example of the eleventh embodiment;

FIGS. 110A-110C are a plan view and sectional views along B-B and C-C lines of the plan view of a semiconductor device made by the process in a semiconductor device fabrication method according to the second example of the eleventh embodiment;

FIGS. 111A-111C are a plan view and sectional views along B-B and C-C lines of the plan view of a semiconductor device made by the process in a semiconductor device fabrication method according to the second example of the eleventh embodiment;

FIGS. 112A-112C are a plan view and sectional views along B-B and C-C lines of the plan view of a semiconductor device made by the process in a semiconductor device fabrication method according to the second example of the eleventh embodiment;

FIGS. 113A-113C are a plan view and sectional views along B-B and C-C lines of the plan view of a semiconductor device made by the process in a semiconductor device fabrication method according to the second example of the eleventh embodiment;

FIGS. 114A-114C are a plan view and sectional views along B-B and C-C lines of the plan view of a semiconductor device made by the process in a semiconductor device fabrication method according to the second example of the eleventh embodiment;

FIGS. 115A-115C are a plan view and sectional views along B-B and C-C lines of the plan view of a semiconductor device made by the process in a semiconductor device fabrication method according to the second example of the eleventh embodiment;

FIGS. 120A-120C are a plan view and sectional views along X-X' and Y-Y' lines of the plan view of a semiconductor device made by the process in a semiconductor device fabrication method according to a related art;

FIGS. 121A-121C are a plan view and sectional views along X-X' and Y-Y' lines of the plan view of the semiconductor device made by the process in the semiconductor device fabrication method according to a related art;

FIGS. 122A-122C are a plan view and sectional views along X-X' and Y-Y' lines of the plan view of the semiconductor device made by the process in the semiconductor device fabrication method according to a related art;

FIGS. 123A-123C are a plan view and sectional views along X-X' and Y-Y' lines of the plan view of the semiconductor device made by the process in the semiconductor device fabrication method according to a related art;

FIGS. 124A and 124B are diagrams showing patterns before and after sliming process in the semiconductor device fabrication method of a related art; and FIG. 125 is a diagram showing gate patterns before and after sliming process in the semiconductor device fabrication method of a related art.

DETAILED DESCRIPTION OF EMBODIMENTS

Figure 3C:
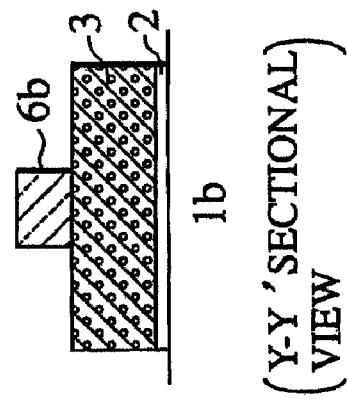
FIGS. 3A-3C are a plan view and sectional views along X-X' and Y-Y' lines of the plan view of the semiconductor device made by the process in the semiconductor device fabrication method according to the first embodiment.

Various embodiments will be described with reference to the accompanying drawings. It is to be noted that the same or similar reference numerals are applied to the same or similar parts and elements throughout the drawings, and the description of the same or similar parts and elements will be omitted or simplified. In addition, through the entire description of this specification, prepositions, such as "on", "over", and "under" are used to cover both cases where there is a physical contact (layers or films are directly contacted to each other) and there is no physical contact (layers or films are not directly contacted to each other) in a semiconductor device.

First Embodiment

A description will be given of the semiconductor device fabrication method according to the first embodiment.

The first embodiment is an application example to a system LSI (Large-scale integration) including logic parts and memory parts mixed in the semiconductor device. FIGS. 1A-1C through FIGS. 9A-9C are plan views and sectional views along X-X' and Y-Y' lines of the corresponding plan views of each process in a resist sliming method for fabricating a metal oxide silicon (MOS) transistor.

That is, as shown in FIGS. 1A-1C, a gate insulation film 2 of a thickness 1-3 nm is formed by a thermal oxidation method performed for the silicon substrate 1 having the element region 1a and the element isolation region 1b. Following this process, a work material film (as a work film), for example, the polysilicon layer 3 of a thickness 150-200 nm is formed by a low pressure chemical vapor deposition (a low pressure CVD) method and the like. Following this process, a mask material film, for example, a SiON film 4 as a hard mask material film (first material) of a thickness 50-100 nm is formed by a sputter method and the like. It is acceptable to use one of or a combination of $SiO_2$, $Si_3N_4$ or $Al_2O_3$, SIC, and a carbon film instead of SiON for the hard mask material film 4. Also, bottom anti-reflection coating (BARC) can be combined with the above hard mask material. These $Al_2O_3$, SiC, and a carbon film become a film as an optical anti-reflection material film against the underlying layer.

Next, a photo resist is applied over the SiON film 4 by a spin coating method and then dried. After this process, a resist pattern (first resist pattern), for example, a gate resist pattern 5 is formed over the SiON film 4 over the element region 1a and the element isolation region 1b with a dimension of the limitation of the lithography resolution (Gate resist pattern formation process). In this process, it is acceptable to apply an anti-reflection material film of an apply type before performing the spin coating using the resist.

Here, the gate resist pattern section over the element region 1a is called to as the gate electrode pattern part 5a and the gate resist pattern section over the element isolation region 1b is called to as the wiring patterns part 5b.

Next, as shown in FIGS. 2A-2C, a dry etching process by a reactive ion etching (RIE) method and the like is performed for the SiON film 4 using the gate resist pattern 5 as a mask. This dry etching makes a hard mask pattern 6 having a gate electrode pattern 6a and a wiring pattern section 6b (Hard mask work process).

When the anti-reflection material film of an apply type is formed, the work process of the anti-reflection material film is performed before the hard mask work process. In this hard mask work process a gas of a phloro-carbon series such as $CHF_3$ is used as the etching gas.

Figure 3B:
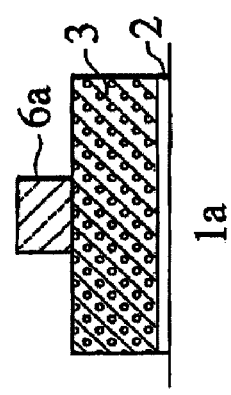
Figure 3A:
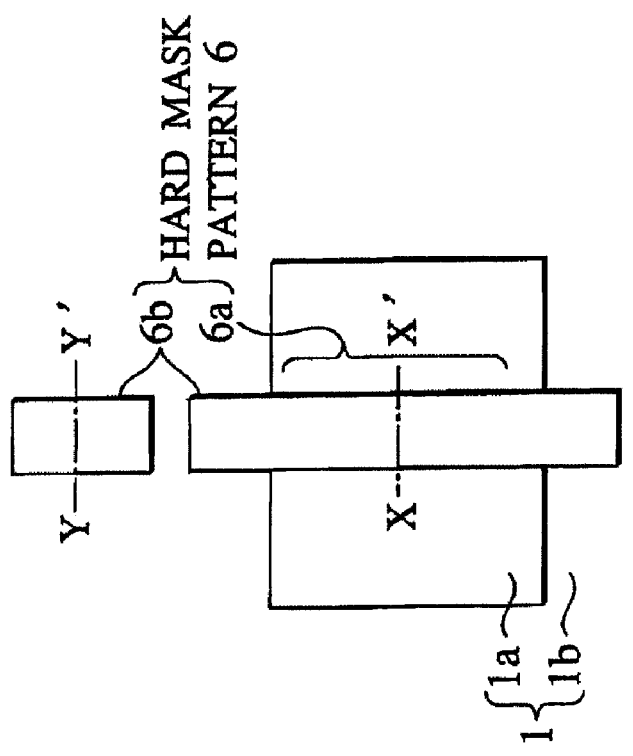

Next, as shown in FIGS. 3A-3C, the gate resist pattern 5 is removed by the $O_2$ ashing (Resist remove process). In this resist remove process, it is preferred to use a wet etching using a stripper solution made of a mixed solution of a hydrogen peroxide solution and a sulfuric acid or a combination of this mixed solution and others.

Next, as shown in FIGS. 4A-4C, the spin coating of a photo resist is performed for the silicon substrate 1 including the hard mask pattern 6 and the photo-resist is dried. Then, the second lithography (exposure) process is performed in order to form the second resist pattern 7 having a predetermined pattern as an anti-etching material (Sliming pattern exposure process).

In this process, the second resist pattern 7 is so formed that a part (for example, a gate electrode pattern in a logic section), in the second resist pattern 7 which is slimmed by a sliming process becomes an opening, and a part (for example, a wiring pattern section over the element isolation section over which a fine space pattern section is formed and a memory cell pattern section with a relative high integration and the like) to which no slimming process is performed is covered with the second resist pattern 7. The opening 7a is so formed that it has a margin for a deviation between the opening 7a and the element region 1a (see FIGS. 5A-5C). That is, it is preferred to form the opening 7a larger in area than the element region 1a, for example, tens of nanometers in dimension.

In this process it is preferred to use a resist of a negative tone to the resist that is used in the formation for the element isolation region. For example, when a resist of a positive type is used for the element isolation region 1a, a resist of a negative type is used for the formation of the resist pattern 7, and when a resist of a negative type is used for the element isolation region 1a, a resist of a positive type is used for the formation of the resist pattern 7. This has an advantage to decrease the fabrication cost because the exposure mask used in the formation of the element isolation region 1b may also be used in the formation process of this second resist pattern 7.

In addition, because in the second lithography process the second resist is formed over a step-shaped pattern (hard mask pattern), it is also possible to use a multi-resist process using a flat material to even the surface of the resist pattern.

Figure 5C:
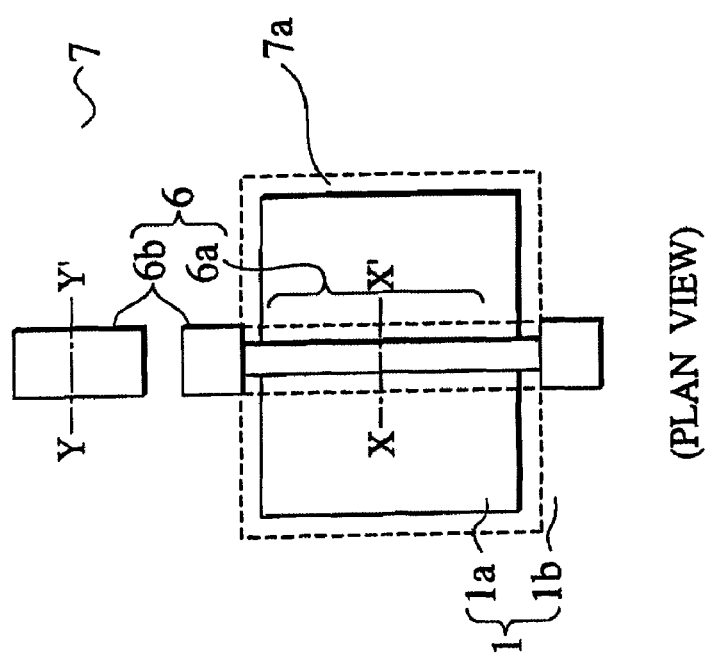
FIGS. 5A-5C are a plan view and sectional views along X-X' and Y-Y' lines of the plan view of the semiconductor device made by the process in the semiconductor device fabrication method according to the first embodiment.
Figure 5B:
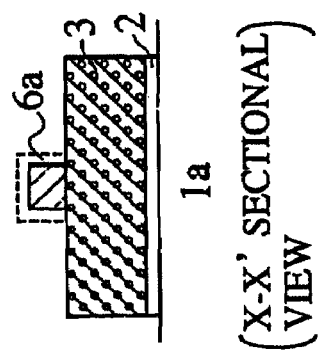
Figure 5A:
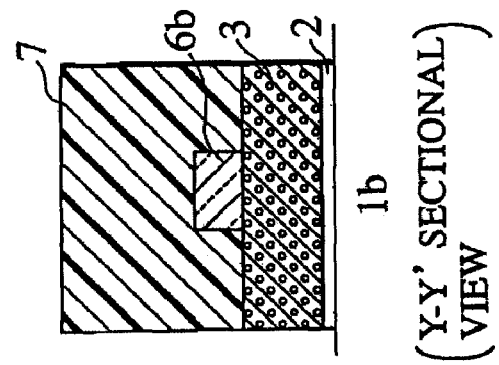

Next, as shown in FIGS. 5A-5C, using the second resist pattern 7 as a mask the gate electrode pattern 6a that is opened through the opening 7a in the second resist pattern 7 is etched by, the dry etching method such as CDE (Chemical Dry Etching) method or RIE method, or by the wet etching method. This etching process performs the selective sliming for the gate electrode pattern section 6a through the opening 7a in order to form the pattern whose dimension is not more than the limitation of the lithography resolution (Hard mask electrode work process).

In those processes, when the dry etching is performed as the etching for the gate electrode pattern section 6a, a gas of a phloro-carbon series, for example, $CHF_3$ is used as the etching gas. In the wet etching process, a hot $H_3PO_4$ is used as the etching solution.

Next, as shown in FIGS. 6A-6C, the second resist pattern 7 is removed by the $O_2$ ashing and the like (Resist remove process). In this ashing process, it is preferred to use the wet etching method using a stripper solution made of a mixed solution of a hydrogen peroxide solution and a sulfuric acid or a combination of this mixed solution and others.

Figure 7C:
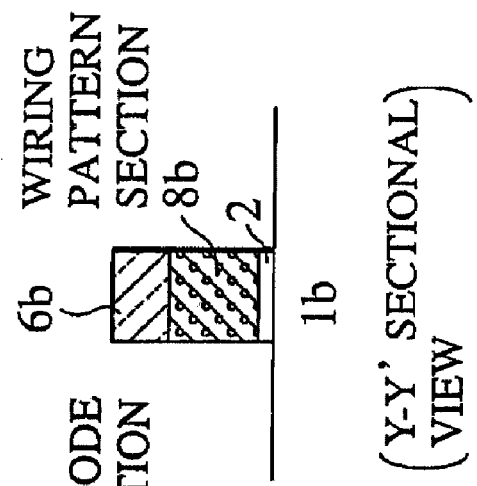
FIGS. 7A-7C are a plan view and sectional views along X-X' and Y-Y' lines of the plan view of the semiconductor device made by the process in the semiconductor device fabrication method according to the first embodiment.
Figure 7B:
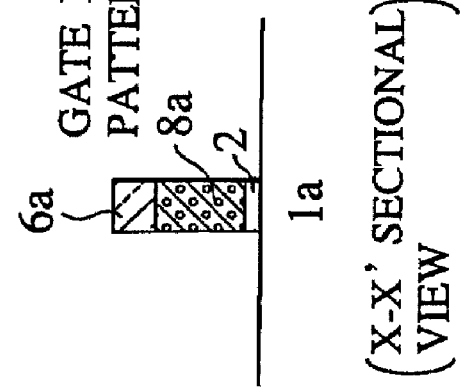
Figure 7A:
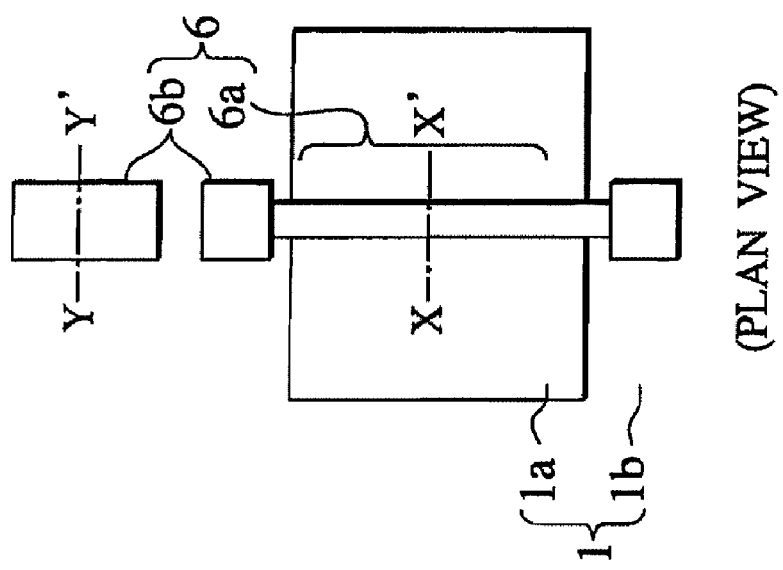

Next, as shown in FIGS. 7A-7C, the poly-silicon film 3 is etched by the dry-etching such as RIE method and the like using the hard mask pattern 6 as a mask in order to form a gate pattern 8 including a gate electrode pattern section 8a and a wiring pattern section 8b (Gate electrode work process). Following this process, the gate insulation film 2 is etched. In this etching process, a gas of Halogen series such as $Cl_2$, HBr and the like is used as the etching gas for the poly-silicon film 3.

Next, as shown in FIGS. 8A-8C, the hard mask pattern 6 is removed by the wet etching method and the like (Hard mask remove process). In this etching process, a hot $H_3PO_4$ is used as the etching solution.

Figure 9A:
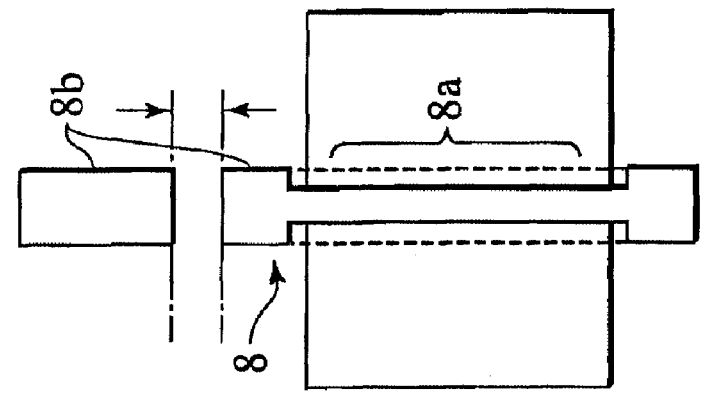
FIGS. 9A and 9B are diagrams showing patterns before and after sliming process in the semiconductor device fabrication method according to the first embodiment.
Figure 9B:
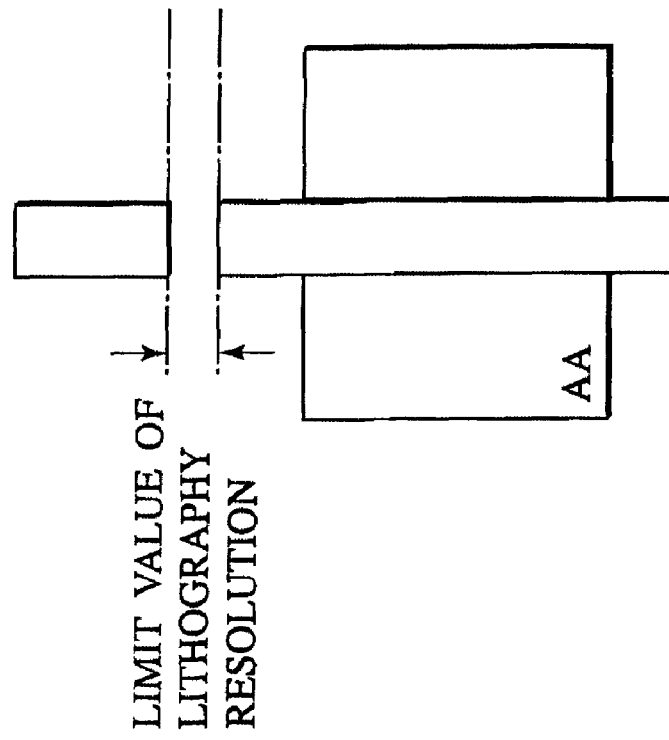

As shown in FIGS. 9A and 9B, a portion, for example, the gate electrode pattern section 8a of a transistor in a logical part that should be formed in a fine dimension is formed to a fine pattern whose dimension is not more than the limitation of the lithography resolution by performing the sliming process. Further, a space portion that should be formed in a fine dimension, for example, the wiring pattern section 8b (a space section between the gate patterns over the element isolation portion or a memory cell section) is formed in a fine space, not by performing the sliming process, that is equal to the limitation of the lithography resolution.

After those processes described above, although the following doping process is not shown, an impurity is doped into the silicon substrate 1 using the gate electrode pattern section 8a as a mask in order to form the source-drain diffusion layer (designated by the dotted lines, see FIG. 8) of the MOS transistor. After this process, the known layer insulation film formation process and the known wiring process are performed, so that the fabrication of the MOS transistor is completed.

According to this embodiment, the selective sliming process is performed only for the part (the gate electrode pattern section in a transistor in the logic section) with a fine line dimension. It is thereby possible to form the fine gate electrode pattern 8a (line pattern) by performing the sliming process and to form the fine wiring pattern 8b (a space pattern) by performing no sliming process, and it is thereby possible to realize effects to increase the performance of the transistor operation and to reduce the semiconductor chip area simultaneously.

Figure 10:
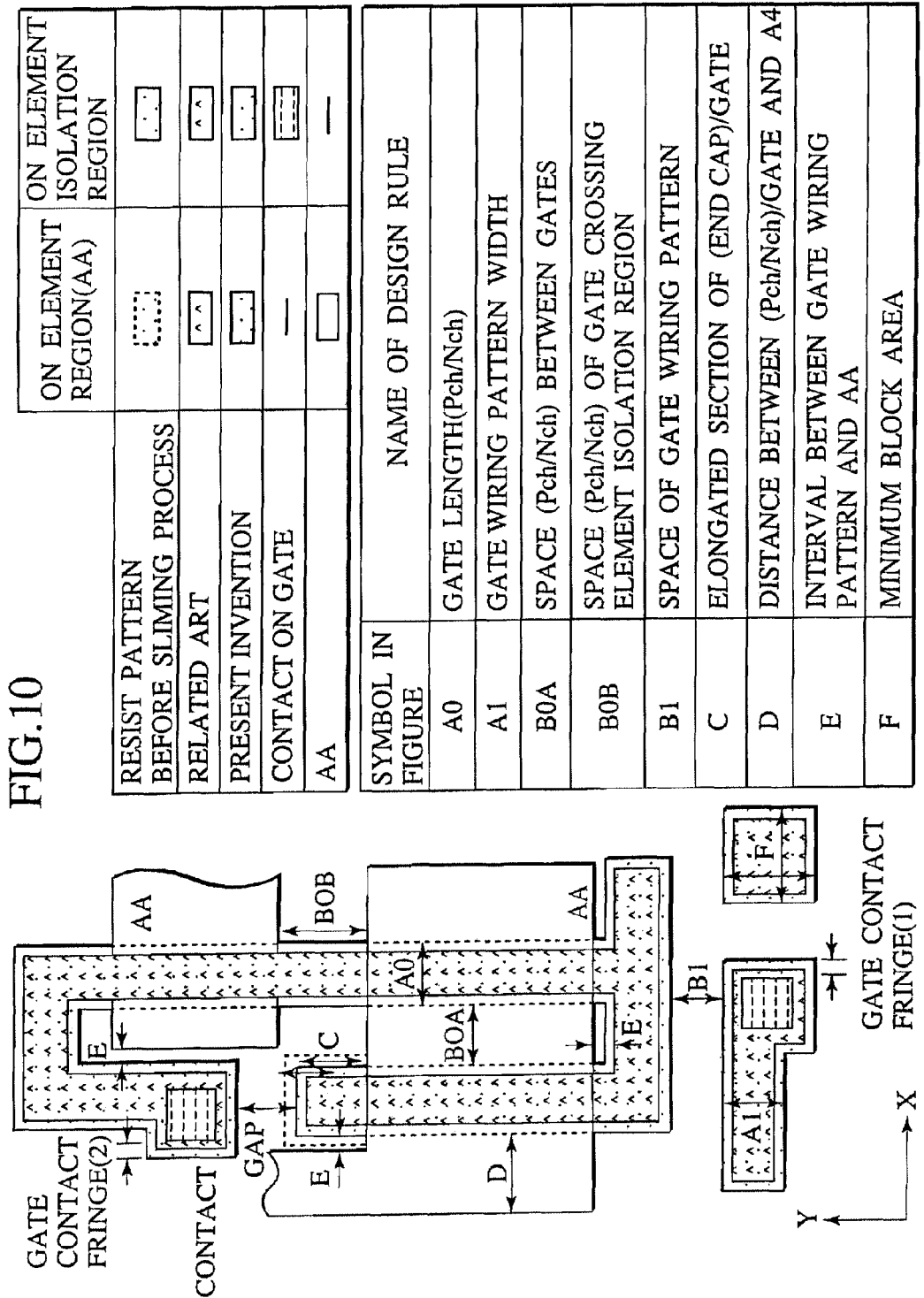
FIG. 10 is a diagram showing results of the semiconductor device fabrication method according to the first embodiment and a related semiconductor device fabrication method.

Next, the semiconductor device fabrication method of this embodiment and the semiconductor device fabrication method of the related art will be compared according to each item of an actual design rule. FIG. 10 shows a pattern layout and items of actual gate contact (GC) layer/element region (AA) layer. That is, FIG. 10 shows plane-shaped patterns after transfer by this embodiment and the related art.

In FIG. 10, A0 indicates a gate length of a transistor. In a design rule of this gate length, this embodiment can set the same design rule that is used in the related art. Hence, it is possible to realize a MOS transistor of a high performance by performing the sliming process that can form a fine gate length.

A1 indicates a wiring pattern width in the element isolation region. Because the sliming is performed for this portion (the wiring pattern width) in the related art, not performed in this embodiment, this portion becomes a fine pattern in the related art. However, in the majority of cases, the magnitude of a gate contact fringe determines an impact on the chip size caused by the portion specified by A1, and because the gate contact fringe is determined by a margin of the gate contact matching, it is necessary to have a gate contact fringe of a certain magnitude independently from the portion designated by A1. That is, even if a design value of the portion A1 becomes a fine magnitude, this affects a small impact given to the chip size.

Further, in this embodiment and the related art, rules of a space BOA between gates and gate space BOB crossing the element isolation region take a same value. This embodiment can reduce the dimension of the space B1 of the gate wiring pattern to the limitation of the lithography resolution. Therefore this embodiment has a greatly effect to reduce the chip size. The reference character "C" designates an end cap of a transistor. It is necessary to keep a certain region (area) in order to prevent that the end of the gate is over the portion AA by the matching deviation between a line shortening and the end cap portion. That is, in the related art, it is necessary to perform a patterning of the region designated by the dotted lines for the sliming process performed for the element isolation region. Therefore this pattering region in the related art is greater in area than that in this embodiment. In order to avoid any occurrence of short phenomenon during the formation of the resist pattern, the method of the related art should set a relatively large size of the space (see the portion Gap) over the element isolation region during the lithography process. This is a drawback of the related art considering the reduction of the chip area. The same drawback occurs for the width E between the gate wiring pattern and the portion AA (because the rule of E is determined by the magnitude of the matching margin between GC-AA (the gate layer GC and the portion AA). This embodiment and the related art have the same design rule for the distance D between the gate and the portion AA. Although the related art can form a fine pattern of the minimum area F of the gate, this reduction of the area does not affect the reduction of the chip size when the space (see Gap) cannot be reduced in area and even if this gate area can be reduced.

As described above, there is no difference between this embodiment and the related art about the rules A0, A1, BOA, BOB, D, and F. However, this embodiment has the advantage of the reduction of the chip size (chip area) about the rules A1, B1, C, and E when compared with the related art. Therefore, on the whole the semiconductor device fabrication method of this embodiment is far superior to the method of the related art in the reduction of the chip area.

In addition, according to this embodiment, the sliming is performed for the pattern over the element region and not performed for the pattern over the element isolation section. Therefore the second resist pattern 7 transferred during the second exposure process becomes a reverse pattern of the element region 1a. In this case, it is possible to form the opening 7a, that is transferred in the second exposure process, in the second resist pattern 7 greater in area than the element region 1a in order to have the margin for a deviation between the element region 1a and the second resist pattern 7. Furthermore, in this case, when the reverse tone (a positive type or a negative type) is used, that is reversed in tone to the resist used in the formation of the element isolation region, the mask to be used in the second exposure process can also be used as the same mask that was used in the formation of the element isolation region. This can thereby reduce the fabrication cost.

In addition, according to this embodiment, because the sliming process is not performed for the memory cell section by using the second resist pattern, it is possible to keep the dimension of the limitation of the lithography resolution obtained in the first exposure process. Accordingly, even if a relatively large-scaled memory cell is mounted in a system LSI, the semiconductor device fabrication method of this embodiment can prevent to increase the chip area of the semiconductor chip when compared with the related art.

Furthermore, according to this embodiment, because the gate length can be formed to the dimension that is not more than the limitation of the lithography resolution by performing the sliming process, it is possible to obtain a high performance such as the operation speed of the transistor and the like.

Second Embodiment

Next, a description will be given of the semiconductor device fabrication method according to the second embodiment with reference to FIGS. 11A-11B to FIG. 15.

Similar to the first embodiment, the second embodiment is an example in which the present invention is applied to a system LSI including logic parts and memory parts mixed. In particularly, in the second embodiment, the hard mask is not removed after the gate electrode is processed, namely, the hard mask is remained and used as a self-alignment contact between a source-drain diffusion layer and this remaining hard mask.

Figure 11:
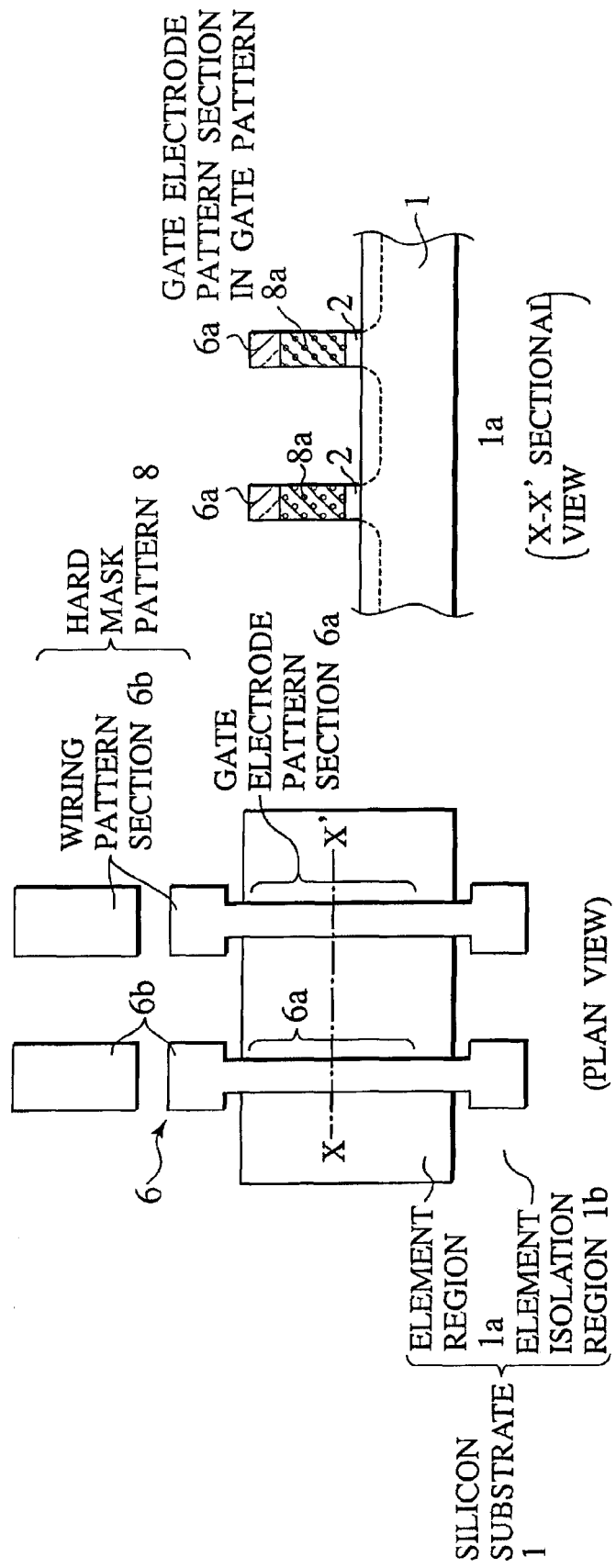
FIGS. 11A and 11B are a plan view and a sectional view along Y-Y' line of the plan view of a semiconductor device made by the process in the semiconductor device fabrication method according to the second embodiment.

FIGS. 11A and 11B are a plan view and a sectional view along Y-Y' line of the plan view of the gate electrode work process performed by the resist sliming method in the semiconductor device fabrication method. FIG. 12 to FIG. 15 show sectional views of each fabrication process until the formation of the self-alignment contact. That is, in the second embodiment, firstly, like the first embodiment, following processes are executed in order: Gate resist pattern formation process, hard mask work process, resist remove process, reverse lithography process, hard mask sliming process, gate electrode work process, and resist remove process. After those processes are completed, as a result, a gate pattern 8 including a fine gate electrode pattern section (line pattern) 8a and a fine wiring pattern section (space pattern section) 8b is formed, as shown in FIG. 11. In this case, the fine gate electrode pattern section 8a has a dimension that is not more than the limitation of the lithography resolution by performing the sliming, and the sliming is not performed for the fine wiring pattern section 8b.

Figure 12:
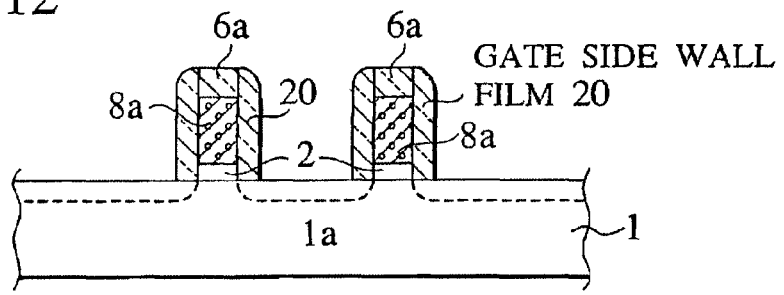
FIG. 12 is a sectional view of the semiconductor device made by the process in the semiconductor device fabrication method according to the second embodiment.

Next, as shown in FIG. 12, for example, SiON film, that will become a gate wall, film is deposited with a thickness 25-100 nm over the silicon substrate 1 by CVD method and the like. After this, the gate side wall film 20 is formed on the side wall of both the hard mask pattern 6a and the gate electrode pattern 8a by performing etching such as ME method and the like (Side wall formation process). In this process, a gas of a halogen series such as $Cl_2$, HBr and the like is used as the etching gas.

Figure 13:
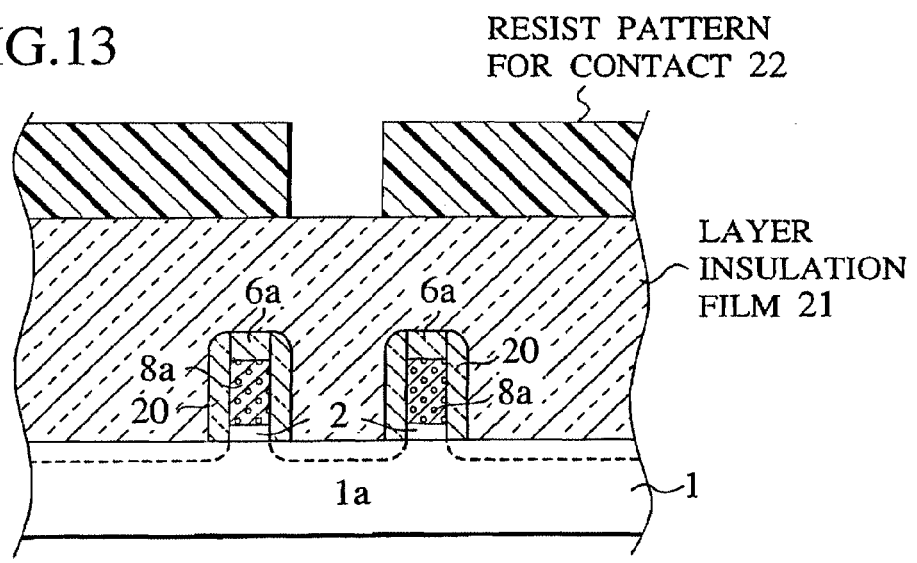
FIG. 13 is a sectional view of the semiconductor device made by the process in the semiconductor device fabrication method according to the second embodiment.

Next, as shown in FIG. 13, after a layer insulation film 21 such as an oxidation film of a thickness 0.5-2.0 μm is deposited over the silicon substrate 1 including the gate electrode pattern 8a by CVD method and the like (Layer insulation film formation process), and the surface of the layer insulation film 21 is then processed so that it becomes a flat surface by a CMP (Chemical mechanical polishing) method (Planarization process for layer insulation film). Following this planarization process, a resist pattern to be used for the formation of a contact is formed over the layer insulation film 21 flatted (Contact resist formation process).

Figure 14:
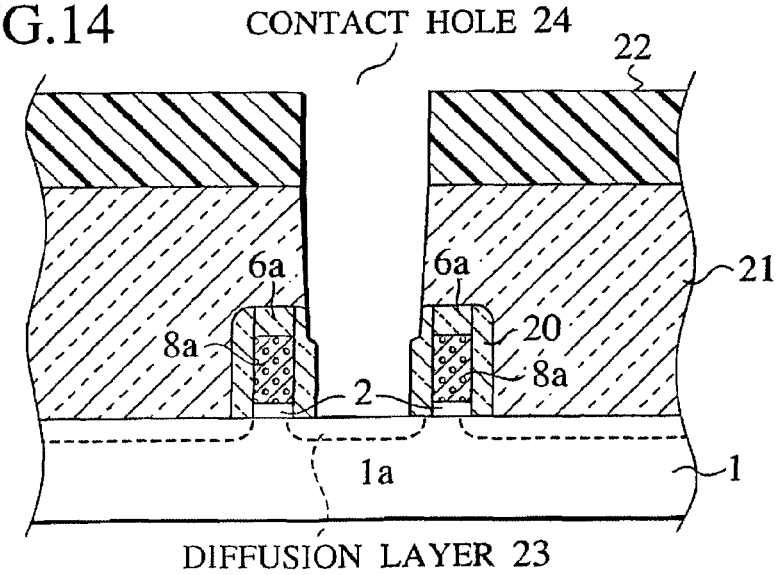
FIG. 14 is a sectional view of the semiconductor device made by the process in the semiconductor device fabrication method according to the second embodiment.

Next, as shown in FIG. 14, the layer insulation film 21 is removed by performing the etching of RIE method and the like using the resist pattern 22 as a mask, so that a contact hole 24 is formed (Layer insulation etching process). This contact hole is reached to the source-drain diffusion layer 23 over the silicon substrate 1. In this process, a gas of a phloro-carbon series such as CxFx and the like is used as the etching gas in order to form the contact hole 24 by an etching selection rate of the layer insulation film 21 and the gate side wall film 20.

Figure 15:
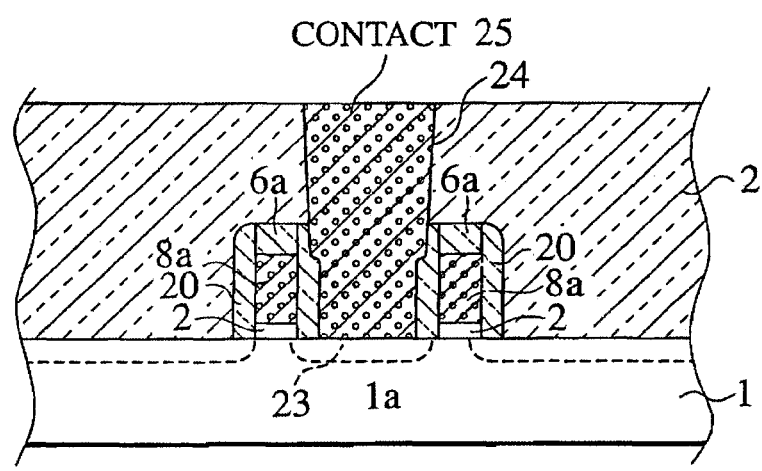
FIG. 15 is a sectional view of the semiconductor device made by the process in the semiconductor device fabrication method according to the second embodiment.

Next, as shown in FIG. 15, after the resist pattern is removed by the oxidation ashing and the like (Resist remove process), an electrode material such as a poly-silicon and the like is deposited over the contact hole 24 by performing CVD method and the like. Then, unnecessary parts in the deposited electrode material are removed, so that an imbedded contact 25 is formed (Contact formation process).

According to the second embodiment, like the first embodiment, it is possible to form the fine line pattern by the sliming process and to form the fine space pattern not by performing the sliming process. In addition, because the gate electrode pattern is formed to a dimension that is not more than the limitation of the lithography resolution, it is possible to increase the performance of the operation speed of the transistor. Further, a following effect can be obtained in addition to the effect in which the increasing of the transistor performance and the chip shrink to reduce the chip area:

That is, the contact hole 24 is formed based on the etching selection ratio of the layer insulation film ($SiO_2$) and the hard mask pattern 6 by using the remaining hard mask pattern 6a over the gate electrode pattern 8. Thereby, it is possible to protect the gate electrode pattern section 8a and to form the contact hole 24 in self-alignment. This effect can introduce to reduce the number of the fabrication steps.

Third Embodiment

Next, a description will be given of the semiconductor device fabrication method according to the third embodiment with reference to FIGS. 16A-16C to FIGS. 21A-21C.

Like the first embodiment, the third embodiment is an example in which the present invention is applied to a system LSI including logic parts and memory parts mixed. In particularly, in the third embodiment, a multi-resist process is used instead of the use of the hard mask.

FIGS. 16A-16C to FIGS. 21A-21C show plan views and sectional views along Y-Y' line of the plan views of the semiconductor device fabrication method. That is, in the third embodiment, first, as shown in FIGS. 16A-16C, a gate insulation film 32, a work film, for example, a poly-silicon film 33 as a gate electrode material film are deposited over a silicon substrate 31 having an element region 31a and an element isolation region 31b in order. After those deposition processes, a multi-layer resist film 34 is formed over the poly-silicon film 33.

The multi-layer resist film 34 is made up of an underlying film $34_1$, an intermediate film $34_2$, and a photo resist film $34_3$. The underlying film $34_1$ is made up of a carbon or an organic film such as a resist of a novolak series formed over the poly-silicon film 33. The intermediate film $34_2$ is made up of a SOG (Spin on Glass) or $SiO_2$ and the like formed on the underlying film $34_1$. The photo resist film $34_3$ is formed on the intermediate film $34_2$. Those underlying film $34_1$ and the intermediate film $34_2$ act as the optical anti-reflection material film.

The underlying film $34_1$ or the intermediate film $34_2$ acts as a mask material for the etching process for the work film. The underlying film $34_1$, the intermediate film $34_2$, and the photo-resist film $34_3$ are formed by drying after the spin coating process, for example. The underlying film $34_1$ is formed in a thickness of approximately 0.5 μm, the intermediate film $34_2$ is formed in a thickness of approximately 10 nm, and the photo-resist film $34_3$ is formed in a thickness of approximately 0.2 μm.

Next, by the first lithography (exposure) process the photo-resist film $34_3$ is patterned in order to form the gate resist pattern 35, having the gate electrode pattern section 35a over the element region 31a and the wiring pattern section 35b over the element isolation region 31b, in a thickness of the limitation of the lithography resolution (Gate resist pattern formation process). Hereinafter, the gate resist pattern section over the element region 31a is called to as a gate electrode pattern section 35a, and the gate resist pattern section over the element isolation region 31b is called to as a wiring pattern section 35b.

Next, as shown in FIGS. 17A-17C, the reflection inhibition film, namely, the intermediate film $34_2$ and the underlying film $34_1$ are patterned by performing the dry etching such as CDE and the like using the gate resist pattern 35 as a mask, in order, so that the intermediate pattern 36 and the underlying film pattern 37 are formed (Reflection inhibition film work process). In this process, a mixed gas of a phloro-carbon series such as $CHF_3/O_2$ and the like is used as the etching gas for the intermediate film $34_2$. Further, a mixed gas of $N_2/O_2$ is used for the etching gas for the underlying film $34_1$ when it is a resist of a novolak series. In addition, both the intermediate film pattern 36 and the gate underlying film pattern 37 have the gate electrode pattern section 36a and 37a, and the wiring pattern section 36b and 37b.

During the patterning is performed in the underlying film 37, both the photo-resist film pattern 35 and the intermediate film pattern 36 are gradually removed and finally, they are completely removed. Accordingly, the underlying film pattern 37 acts as a mask pattern when the poly-silicon film is etched, that will be described later.

Next, as shown in FIGS. 18A-18C, like the first embodiment, a photo-resist is applied over the silicon substrate 31 including the underlying film 37 by performing the spin coating and then dried. After those processes, by performing the second lithography (exposure) process, a second resist pattern 38, as an anti-etching material, having a predetermined pattern in which the gate electrode pattern section 37a in the underlying film pattern 37 is exposed through the opening 38a and the wiring pattern section 37b is covered by this second resist pattern 38 (Sliming pattern exposure process).

In this process, the resist of a selection ratio having an anti-etching function during the sliming process performing the etching to the underlying film pattern 37, that will be described later, is used for the second resist pattern 38. In addition, it is preferred to form the opening 38a having a matching margin against the element region. For example, it is so formed that the opening 38a is greater in dimension than the area of the element region by several ten nm. Furthermore, it is preferred to use a resist of a negative tone to the resist that is used in the formation for the element isolation region. For example, when a resist of a positive type is used for the element isolation region, a resist of a negative type is used for the formation of the resist pattern, and when a resist of a negative type is used for the element isolation region, a resist of a positive type is used for the formation of the resist pattern. This has an advantage to decrease the fabrication cost because the exposure mask used in the formation of the element isolation region may also be used in the formation process of this second resist pattern.

Moreover, because in the second lithography process the second resist is formed over a step-shaped pattern (hard mask pattern), it is also possible to use a multi-resist process using a flat material to even the surface of the resist pattern.

Next, as shown in FIGS. 19A-19C, an isotropy etching is performed for the gate electrode pattern section 37a in the underlying film pattern 37 exposed through the opening 38a in the second resist pattern 38 by CDE method and the like, using the second resist pattern 38 as a mask. Then, as shown by the dotted line in FIGS. 19A and 19B, only the gate electrode pattern section 37a is slimmed through the opening 38a by performing the selective etching so that the pattern dimension of the gate electrode pattern section 37a is not more than the limitation of the lithography resolution (Underlying sliming work process). In this sliming process, a mixed gas of $N_2/O_2$ is used as an etching gas for the underlying film pattern section 37a, for example.

Figures 20A, 20B, 20C:
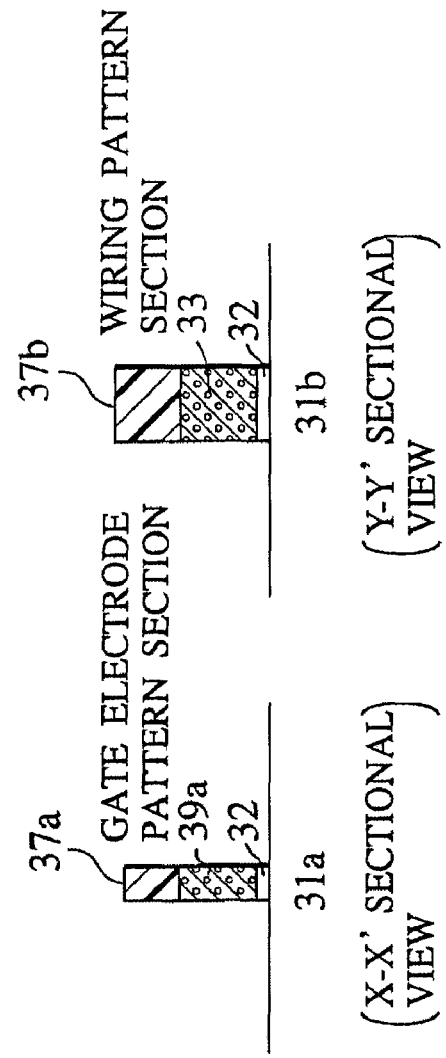
FIGS. 20A-20C are a plan view and sectional views along X-X' and Y-Y' lines of the plan view of the semiconductor device made by each process in the semiconductor device fabrication method according to the third embodiment.

Next, as shown in FIGS. 20A-20C, the poly-silicon film 33 is etched by the dry-etching such as RIE method and the like using the underlying film pattern 37 as a mask in order to form a gate pattern 39 including a gate electrode pattern section 39a and a wiring pattern section 39b (Gate electrode work process). Following this process, the gate insulation film 32 is etched. In this etching process, a gas of Halogen series such as $Cl_2$, HBr and the like is used as the etching gas for the poly-silicon film 33.

Next, as shown in FIGS. 21A-21C, the underlying film pattern 37 is removed by $O_2$ ashing method and the like (Underlying film remove process).

Thereby, a portion, for example, the gate electrode pattern section 39a of a transistor in a logical part that should be formed in a fine dimension is formed to a fine pattern whose dimension is not more than the limitation of the lithography resolution by performing the sliming process. Further, a space portion that should be formed to a fine dimension, for example, the wiring pattern section 39b (a space section between the gate patterns over the element isolation portion or a memory cell section) is formed to a fine dimension, not by performing the sliming process, that is equal to the limitation of the lithography resolution.

After those processes described above, although the following doping process is not shown, an impurity is doped into the silicon substrate 31 using the gate electrode pattern section 39a as a mask in order to form the source-drain diffusion layer (designated by the dotted lines, see FIG. 21B) of the MOS transistor. After this process, the known layer insulation film formation process and the known wiring process are performed, so that the fabrication of the MOS transistor is completed.

According to the third embodiment, in addition to the effects of the first and second embodiments described above, a following effect can be obtained.

It is possible to form the photo-resist film $34_3$ that becomes the first resist pattern 35 with a thickness that is enough to pattern the thin intermediate film $34_2$ of a thickness of approximately 10 nm. Because the third embodiment can form the photo-resist film 343 in a thinner thickness when compared with the film of 0.4 μm in the related art and the film of 0.4 μm in the first embodiment, it is possible to increase the accuracy of processing the pattern by increasing the resolution. This leads to increase the transistor performance.

Fourth Embodiment

Next, a description will be given of the semiconductor device fabrication method according to the fourth embodiment with reference to FIGS. 22A-22C to FIGS. 27A-27C. In those drawings and following descriptions, the same component parts having the same function and the same configuration of the third embodiment will be referred by using the same reference characters and numbers, and omitted the detailed explanation for the same component parts.

The difference between the fourth embodiment and the third embodiment is following. Although the sliming process is performed for the underlying film pattern in the third embodiment, the sliming process is performed for the intermediate film pattern in the fourth embodiment.

That is, as shown in FIGS. 22A-22C, the gate insulation film 32 and the poly-silicon film 33 are deposited on the silicon substrate 31 having the element region 31a and the element isolation region 31b in order. After those deposition processes, The underlying film $34_1$, the intermediate film $34_2$, and the photo-resist film $34_3$ are deposited in order, as the multi-layer resist film 34.

By the first lithography (exposure) process the photo-resist film $34_3$ is patterned in order to form the gate resist pattern 35, having the gate electrode pattern section 35a over the element region 31a and the wiring pattern section 35b over the element isolation region 31b, in a thickness of the limitation of the lithography resolution (Gate resist pattern formation process).

Next, as shown in FIGS. 23A-23C, the dry etching is performed for the intermediate film $34_2$ by using RIE etching and the like using the gate resist pattern 35 as a mask, so that the intermediate pattern 36 having the gate electrode pattern section 36a over the element region 31a and the wiring pattern section 36b over the element isolation area 31b is formed (Reflection inhibition film work process). In this process, a mixed gas of a phloro-carbon series such as $CHF_3/O_2$ and the like is used as the etching gas for the intermediate film $34_2$.

Next, the photo-resist pattern 35 on the intermediate pattern 36 is removed by performing $O_2$ ashing (Resist film remove process). After this process, like the third embodiment, as shown in FIGS. 24A-24C, by performing the second lithography (exposure) process, the second resist pattern 38, as an anti-etching material, having a predetermined pattern in which the gate electrode pattern section 36a in the intermediate film pattern 36 is exposed through the opening 38a and the wiring pattern section 36b is covered by this second resist pattern 38 (Sliming pattern exposure process). In this process, the resist of a selection ratio having an anti-etching function during the sliming process performing the etching to the intermediate film pattern 36, that will be described later, is used for the second resist pattern 38.

In addition, it is preferred to form the opening 38a having a matching margin against the element region. For example, it is so formed that the opening 38a is greater in dimension than the area of the element region by several ten nm. Furthermore, it is preferred to use a resist of a negative tone to the resist that is used in the formation for the element isolation region. For example, when a resist of a positive type is used for the element isolation region, a resist of a negative type is used for the formation of the resist pattern, and when a resist of a negative type is used for the element isolation region, a resist of a positive type is used for the formation of the resist pattern. This has an advantage to decrease the fabrication cost because the exposure mask used in the formation of the element isolation region may also be used in the formation process of this second resist pattern.

Moreover, because in the second lithography process the second resist is formed over a step-shaped pattern (hard mask pattern), it is also possible to use a multi-resist process using a flat material to even the surface of the resist pattern.

Figure 25C:
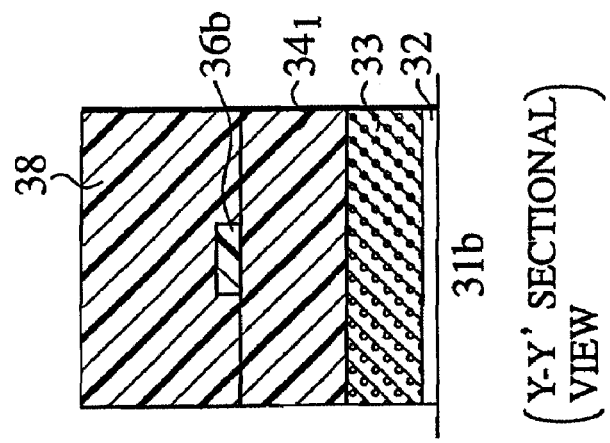
FIGS. 25A-25C are a plan view and sectional views along X-X' and Y-Y' lines of the plan view of the semiconductor device made by each process in the semiconductor device fabrication method according to the fourth embodiment.
Figure 25B:
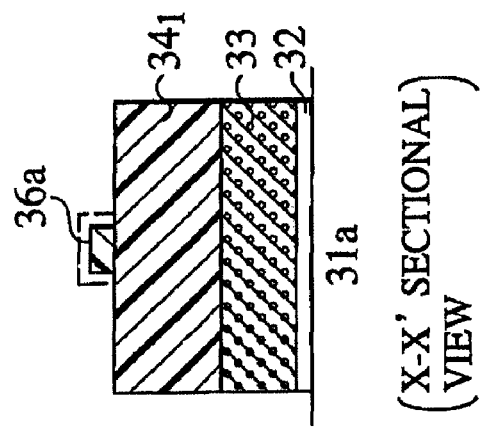
Figure 25A:
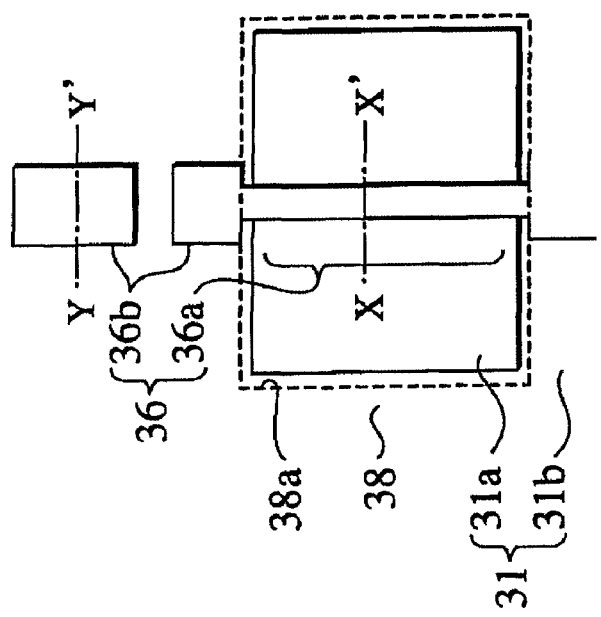

Next, as shown in FIGS. 25A-25C, the isotropy etching is performed for the intermediate film pattern 36a exposed through the opening 38a in the second resist pattern 38 by CDE method and the like using the second resist pattern 38 as a mask. Then, as shown by the dotted line in FIGS. 25A and 25B, only the intermediate film pattern section 36a is slimmed through the opening 38a by performing the selective etching so that the pattern dimension of the intermediate film pattern section 36a is not more than the limitation of the lithography resolution (Intermediate film sliming work process). In this sliming process, a mixed gas of phloro-carbon series such as $CHF_3/O_2$ is used as an etching gas for the intermediate film pattern section 36a, for example.

Next, as shown in FIGS. 26A-26C, the underlying film $34_1$ is etched by the dry-etching such as RIE method and the like using the intermediate film pattern 36 as a mask and the poly-silicon film 33 is then etched in order to form a gate pattern 39 including the gate electrode pattern section 39a and the wiring pattern section 39b (Gate electrode work process). Following this process, the gate insulation film 32 is etched. In this etching process for the intermediate film, a mixed gas of $N_2/O_2$ is used as the etching gas, and a gas of Halogen series such as $Cl_2$, HBr and the like is used as the etching gas for the poly-silicon film 33. During the etching to the poly-silicon film 38, the intermediate film pattern 36 is gradually removed and finally completely removed.

Next, as shown in FIGS. 27A-27C, the underlying film pattern 37 is removed by O2 ashing method and the like (Underlying film remove process). Thereby, a portion, for example, the gate electrode pattern section 39a of a transistor in a logical part that should be formed to a fine dimension is formed to a fine pattern whose dimension is not more than the limitation of the lithography resolution by performing the sliming process. Further, a space portion that should be formed to a fine dimension, for example, the wiring pattern section 39b (a space section between the gate patterns over the element isolation portion or a memory cell section) is formed to a fine dimension, not by performing the sliming process, that is equal to the limitation of the lithography resolution.

After those processes described above, although the following doping process is not shown, an impurity is doped into the silicon substrate 31 using the gate electrode pattern section 39a as a mask in order to form the source-drain diffusion layer (designated by the dotted lines, see FIG. 27B) of the MOS transistor. After this process, the known layer insulation film formation process and the known wiring process are performed, so that the fabrication of the MOS transistor is completed.

According to the fourth embodiment, like the third embodiment, it is possible to form the thin first resist, so that the accuracy of processing can be increased because the resolution is increased. This leads to increase the transistor performance.

As described above in detail, according to the first to fourth embodiments, it is possible to form a fine pattern without increasing of the chip area, and thereby possible to increase the performance of transistors in a semiconductor device in operation speed and the like, because following processes are performed: Transferring a resist, pattern, whose dimension is not more than the limitation of the resolution of the exposure process, to the mask material film or the hard mask material film; Using the resist pattern, the mask pattern or the selection area in the hard mask pattern, for example, the gate electrode pattern section is exposed through an opening section, and the non-selection region, for example, the wiring pattern section is covered; and Performing the selective sliming process for the pattern in the selected area exposed through the opening section.

Furthermore, because the circuit pattern section over the element region, for example, the gate electrode pattern is formed in the dimension width that is not more than the limitation of the resolution of the exposure process, it is possible to increase the performance and the like of the transistors in the semiconductor device.

Fifth Embodiment

Next, a description will be given of the semiconductor device fabrication method according to the fifth embodiment with reference to FIG. 28 to FIG. 36. FIG. 28 to FIG. 36 show plan views and sectional views of process flows in the formation of a gate layer pattern of a semiconductor integrated circuit.

In FIG. 28 to FIG. 72, the reference character "STI" means the technical term "Shallow Trench Isolation".

In the fifth embodiment, a gate pattern in a logic gate section is formed in the semiconductor integrated circuit by a first exposure process using an alternating phase shift mask (for example, a Levenson phase-shifting mask), and an element isolation section pattern for a DRAM cell section and a wiring pattern are formed by a second exposure process using a trim mask. In the processes of the gate pattern and the wiring pattern, an insulating film as a hard mask material film is formed between a resist film and a gate electrode material. Further, a sliming process is performed for the resist pattern in the logic gate section.

First, as shown in FIG. 28, an element isolation section is formed over a silicon substrate (a process substrate) 40 by a thermal oxidation method and the like. A logical gate section (a first region, for example, a gate region of a transistor), a DRAM cell region (a second region, for example, a memory cell section), and an element isolation section (the second region) made up of $SiO_2$ are thereby formed.

Next, a poly-silicon film of a thickness 150-200 nm is formed as a gate electrode material film 41 that is a work material film by a low-pressure CVD method and the like.

Next, a SiON film of a thickness 50-100 nm is formed as a hard mask material film (a first material) 42 over the gate electrode material film 41 made up of the poly-silicon film by a spatter method and the like. It is possible to use one of or a combination of $SiO_2$, $Si_3N_4$, $Al_2O_3$, SiC, a carbon film and the like instead of SiON as the hard mask material film 42. Also, bottom anti-reflection coating (BARC) can be combined with the above hard mask material. By the way, those $Al_2O_3$, SiC, and the carbon film are used as an optical anti-reflection material film.

Next, a photo resist is coated on the hard mask material film 42 by performing a spin coating and then dried.

Next, a resist pattern is formed over the Logic gate section by performing a first lithography process (the first exposure process) using the alternating phase shift mask. This resist pattern is formed in a dimension of the limitation of the lithography resolution (Gate resist pattern formation process). In this case, it is possible to apply an anti-reflection material film of an apply type before the spin coating process for the resist pattern.

Next, as shown in FIG. 29, the sliming process is performed for the resist pattern in the Logic gate section in order to form a fine resist pattern (a second resist pattern). It is preferred to use photo resists of a different tone for the resist pattern formed over the Logic gate section and the resist pattern formed over both the DRAM cell section and the element isolation section. For example, a photo resist of a negative tone should be used for the Logic gate section when a photo resist of a positive tone is used for the DRAM cell section and the element isolation section. On the contrary, a photo resist of a positive tone should be used for the Logic gate section when a photo resist of a negative tone is used for the DRAM cell section and the element isolation section. This has an advantage to decrease the fabrication cost because the exposure mask used in the formation of the DRAM cell section and the element isolation region may also be used in the formation process of this second resist pattern.

Next, as shown in FIG. 30, a dry etching is performed for the hard mask material film 42 in the Logic gate section by RIE (Reactive Ion Etching) method and the like using the resist pattern as a mask, so that a hard mask pattern (a first pattern) can be formed (Hard mask material film work process). In this hard mask material film work process, a gas of a phloro-carbon series such as $CHF_3$ is used as the etching gas.

Following this process, as shown in FIG. 31, the photo resist 43 is removed by $O_2$ ashing method and the like. The hard mask pattern (the first pattern) is exposed (Resist remove process). In the remove process of the photo resist 43, it is possible to use a wet etching method using a stripper solution made of a mixed solution of a hydrogen peroxide solution and a sulfuric acid or a combination of this mixed solution and others.

Figure 32A:
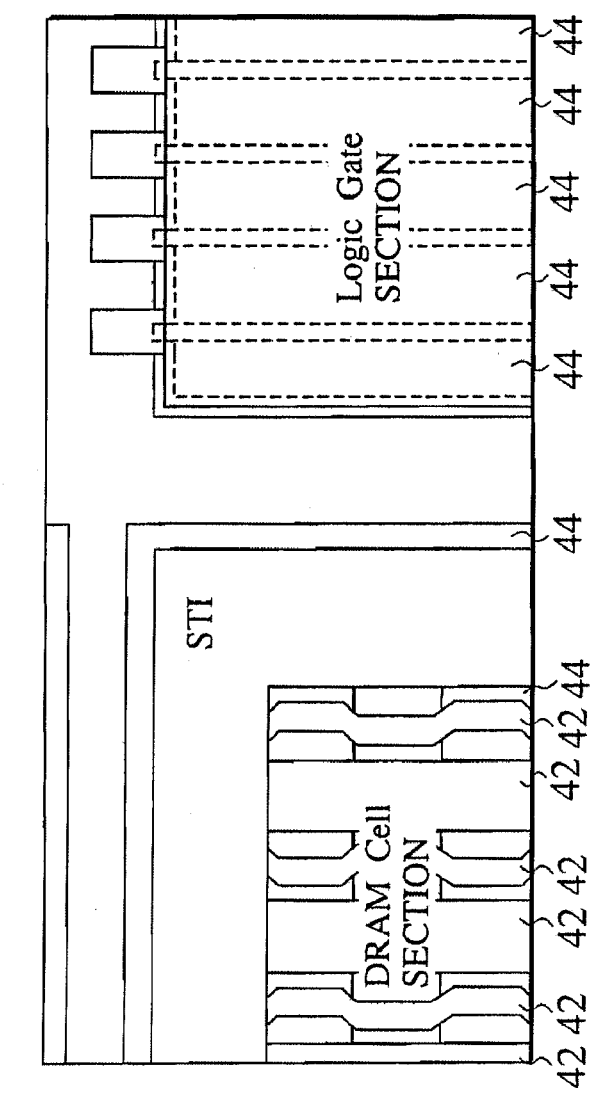
FIG. 32 is a plan view and a sectional view of the plan view of the semiconductor device made by the semiconductor device fabrication method according to the fifth embodiment.
Figure 32B:
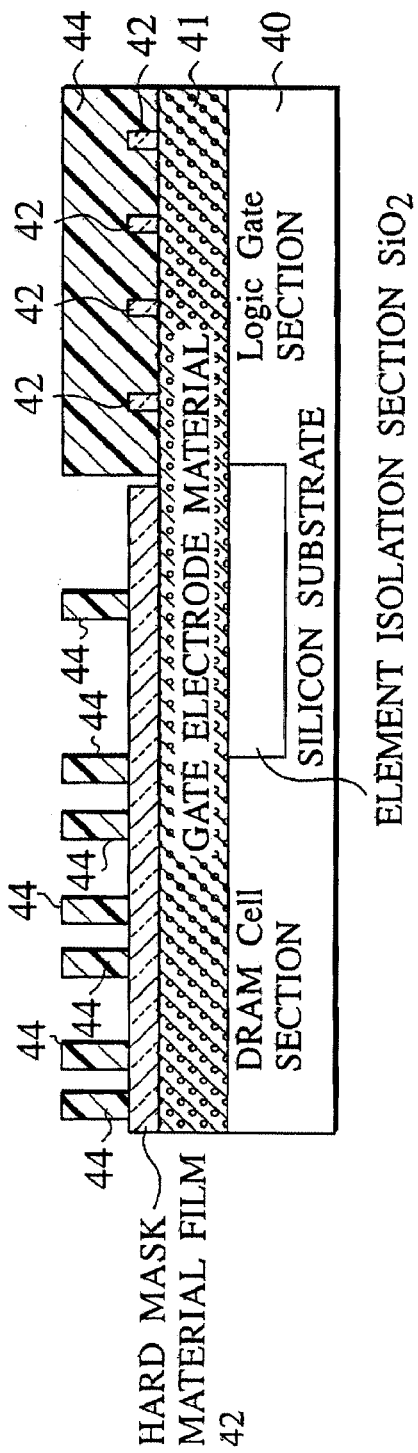

Next, as shown in FIG. 32, using a trim mask, the photo resist (resist) 44 is applied over the hard mask pattern in the Logic gate section, and a photo resist pattern (a third resist pattern) 44 is formed over the DRAM cell section and the element isolation section by performing a second lithography process (a second exposure).

Next, as shown in FIG. 33, the dry etching is performed for the hard mask material film 42 over the DRAM cell section and the element isolation section by using the photo resist 44 in the Logic gate section as a mask, so that the hard mask pattern is formed (Hard mask material film work process). In this hard mask material film work process, a gas of a phloro-carbon series such as $CHF_3$ is used as the etching gas.

After this process, as shown in FIG. 34, the photo resist 44 is removed by the ashing method and the like (Resist remove process). In the remove process of the photo resist 44, it is also possible to perform the wet etching using a stripper solution made of a mixed solution of a hydrogen peroxide solution and a sulfuric acid or a combination of this mixed solution and others.

Next, as shown in FIG. 35, the gate electrode material film 41 is etched by RIE method and the like using the pattern of the hard mask material film 42 as a mask, so that a hard mask pattern (a second pattern) including a gate electrode pattern and a wiring pattern is thereby formed. In this process, a gas of a phloro-carbon series such as $CHF_3$ is used as the etching gas.

After this process, as shown in FIG. 36, the hard mask material film 42 as the hard mask pattern is removed by the wet etching method and the like (Hard mask remove process). In this etching process, a hot $H_3PO_4$ is used as the etching solution. Thereby, the gate electrode pattern and the wiring pattern in the semiconductor device can be formed.

As described above, according to the semiconductor device fabrication method of the fifth embodiment, because it is possible to form a desired circuit pattern by performing double lithography processes (as first and second exposure processes), it is possible to reduce the number of exposure processes when compared with the semiconductor device fabrication method of the related art. This can reduce the semiconductor manufacturing cost.

On the contrary, when the circuit pattern of the semiconductor device is formed by using the process in which the hard mask material film 42 is not used, the semiconductor device fabrication method of the related art must performs following three exposure processes: a first exposure process for the Logic gate section by using the alternating phase shift mask; a second exposure process for the Logic gate section and the element isolation section by suing a trim mask; and a third exposure process for the DRAM cell section after the completion of the sliming process.

In the semiconductor device fabrication method of the fifth embodiment, it is possible to use one of or a combination of following materials as the hard mask material film: SiON, $Si_3N_4$, $SiO_2$, $Al_2O_3$, SiC, and a carbon film. Also, bottom anti-reflection coating (BARC) can be combined with the above hard mask material.

Furthermore, it is acceptable to use one of following cases in the formation of the resist pattern by the first exposure process using the alternating phase shift mask and the second exposure process using the trim mask: the resist pattern is formed directly on the hard mask material film; the resist pattern is formed over the anti-reflection material film; and the resist pattern is formed by the multi-layer resist mask process.

Moreover, the trim mask is a chromium mask or a half tone mask. It is possible to form a higher-resolution circuit pattern of the DRAM cell section in the semiconductor device when the half tone mask is used as the trim mask.

Sixth Embodiment

Next, a description will be given of the semiconductor device fabrication method according to the sixth embodiment with reference to FIG. 37 to FIG. 45. FIG. 37 to FIG. 45 show plan views and sectional views of process flows in the formation of a gate layer pattern of a semiconductor integrated circuit.

In the sixth embodiment, a gate pattern in a logic gate section is formed in the semiconductor integrated circuit by a first exposure process using an alternating phase shift mask (for example, a Levenson phase-shifting mask), and an element isolation section pattern for a DRAM cell section and a wiring pattern are formed by a second exposure process using a trim mask. In the processes of the gate pattern and the wiring pattern, an insulating film as a hard mask material film is formed between a resist film and a gate electrode material. Further, a sliming process is performed for the pattern of the hard mask material film. This sliming process in the sixth embodiment is different from the fifth embodiment.

First, as shown in FIG. 37, an element isolation section is formed over a silicon substrate (a process substrate) 40 by a thermal oxidation method and the like. A logical gate section (a first region, for example, a gate region of a transistor), a DRAM cell region (a second region, for example, a memory cell section), and an element isolation section (the second region) made up of $SiO_2$ are thereby formed.

Next, a poly-silicon film of a thickness 150-200 nm is formed as a gate electrode material film 41 that is a work material film by a low-pressure CVD method and the like.

Next, a SiON film of a thickness 50-100 nm is formed as a hard mask material film (a first material) 42 over the gate electrode material film 41 made up of the poly-silicon film by a spatter method and the like. It is possible to use one of or a combination of $SiO_2$, $Si_3N_4$, $Al_2O_3$, SiC, a carbon film and the like instead of SiON as the hard mask material film 42. Also, bottom anti-reflection coating (BARC) can be combined with the above hard mask material. By the way, those $Al_2O_3$, SiC, and the carbon film are used as an optical anti-reflection material film.

Next, a photo resist is coated on the hard mask material film 42 by performing a spin coating and then dried.

Next, a resist pattern is formed over the Logic gate section by performing a first lithography process (the first exposure process) using the alternating phase shift mask. This resist pattern is formed in a dimension of the limitation of the lithography resolution (Gate resist pattern formation process). In this case, it is possible to apply an anti-reflection material film of an apply type before the spin coating process for the resist pattern.

Next, as shown in FIG. 38, the hard mask material film 42 in the Logic gate section is etched by the dry etching method such as RIE method and the like using the resist pattern as a mask, so that the hard mask pattern (a first pattern) is formed (Hard mask material film work process). In this hard mask material film work process, a gas of a phloro-carbon series such as $CHF_3$ is used as the etching gas.

Following this process, as shown in FIG. 39, the photo resist 43 is removed by $O_2$ asking method and the like. The hard mask pattern (the first pattern) is thereby exposed (Resist remove process). In the remove process of the photo resist 43, it is possible to use a wet etching method using a stripper solution made of a mixed solution of a hydrogen peroxide solution and a sulfuric acid or a combination of this mixed solution and others.

Next, as shown in FIG. 40, the sliming process is performed for the pattern of the hard mask material film in the Logic gate section by the dry etching and the like, so that a fine hard mask material film pattern (a second pattern) can be formed.

Next, as shown in FIG. 41, using a trim mask, the photo resist (resist) 44 is applied on the hard mask pattern in the Logic gate section, and a photo resist pattern (a second resist pattern) 44 is formed over the DRAM cell section and the element isolation section by performing a second lithography process (a second exposure).

Next, as shown in FIG. 42, the dry etching is performed for the hard mask material film 42 over the DRAM cell section and the element isolation section by using the photo resist 44 in the Logic gate section as a mask, so that the hard mask pattern is formed (Hard mask material film work process). In this hard mask material film work process, a gas of a phloro-carbon series such as $CHF_3$ is used as the etching gas.

After this process, as shown in FIG. 43, the photo resist 44 is removed by the asking method and the like (Resist remove process). In the remove process of the photo resist 44, it is also possible to perform the wet etching using a stripper solution made of a mixed solution of a hydrogen peroxide solution and a sulfuric acid or a combination of this mixed solution and others.

Next, as shown in FIG. 44, the gate electrode material film 41 is etched by RIE method and the like using the pattern of the hard mask material film 42 as a mask, so that a hard mask pattern (a second pattern) including a gate electrode pattern and a wiring pattern is thereby formed. In this process, a gas of a phloro-carbon series such as $CHF_3$ is used as the etching gas.

After this process, as shown in FIG. 45, the hard mask material film 42 as the hard mask pattern is removed by the wet etching method and the like (Hard mask remove process). In this etching process, a hot $H_3PO_4$ is used as the etching solution. Thereby, the gate electrode pattern and the wiring pattern in the semiconductor device can be formed.

As described above, according to the semiconductor device fabrication method of the sixth embodiment, because it is possible to form a desired circuit pattern by performing the double lithography processes (as the first and second exposure processes), it is possible to reduce the number of exposure processes when compared with the semiconductor device fabrication method of the related art. This can reduce the semiconductor manufacturing cost.

On the contrary, when the circuit pattern of the semiconductor device is formed by using the process in which the hard mask material film 42 is not used, the semiconductor device fabrication method of the related art must performs following three exposure processes: a first exposure process for the Logic gate section by using the alternating phase shift mask; a second exposure process for the Logic gate section and the element isolation section by suing a trim mask; and a third exposure process for the DRAM cell section after the completion of the sliming process.

In the semiconductor device fabrication method of the sixth embodiment, it is possible to use one of or a combination of following materials as the hard mask material film: SiON, $Si_3N_4$, $SiO_2$, $Al_2O_3$, SiC, and a carbon film. Also, bottom anti-reflection coating (BARC) can be combined with the above hard mask material.

Furthermore, it is acceptable to use one of following cases in the formation of the resist pattern by the first exposure process using the alternating phase shift mask and the second exposure process using the trim mask: the resist pattern is formed directly on the hard mask material film; the resist pattern is formed over the anti-reflection material film; and the resist pattern is formed by the multi layer resist mask process.

Moreover, the trim mask is a chromium mask or a half tone mask. It is possible to form a higher-resolution circuit pattern of the DRAM cell section in the semiconductor device when the half tone mask is used as the trim mask.

Seventh Embodiment

Next, a description will be given of the semiconductor device fabrication method according to the seventh embodiment with reference to FIG. 46 to FIG. 53. FIG. 46 to FIG. 53 show plan views and sectional views of process flows in the formation of a gate layer pattern of a semiconductor integrated circuit.

In the seventh embodiment, a gate pattern in a logic gate section is formed in the semiconductor integrated circuit by a first exposure process using an alternating phase shift mask (for example, a Levenson phase-shifting mask), and an element isolation section pattern for a DRAM cell section and a wiring pattern are formed by a second exposure process using a trim mask. In the processes of the gate pattern and the wiring pattern, an insulating film as a hard mask material film is formed between a resist film and a gate electrode material. Further, the seventh embodiment performs no sliming process that is different from the fifth, sixth, eighth, and ninth embodiments.

First, as shown in FIG. 46, an element isolation section is formed over a silicon substrate (a process substrate) 40 by a thermal oxidation method and the like. A logical gate section (a first region, for example, a gate region of a transistor), a DRAM cell region (a second region, for example, a memory cell section), and an element isolation section (the second region) made up of $SiO_2$ are thereby formed.

Next, a poly-silicon film of a thickness 150-200 nm is formed as a gate electrode material film 41 that is a work material film by a low-pressure CVD method and the like.

Next, a SiON film of a thickness 50-100 nm is formed as a hard mask material film (a first material) 42 over the gate electrode material film 41 made up of the poly-silicon film by a spatter method and the like. It is possible to use one of or a combination of $SiO_2$, $Si_3N_4$, $Al_2O_3$, SiC, a carbon film and the like instead of SiON as the hard mask material film 42. By the way, those $Al_2O_3$, SIC, and the carbon film are used as an optical anti-reflection material film.

Next, a photo resist is coated on the hard mask material film 42 by performing a spin coating and then dried.

Next, a resist pattern is formed over the Logic gate section by performing a first lithography process (the first exposure process) using the alternating phase shift mask. This resist pattern is formed in a dimension of the limitation of the lithography resolution (Gate resist pattern formation process). In this case, it is possible to apply an anti-reflection material film of an apply type before the spin coating process for the resist pattern.

Next, as shown in FIG. 47, the hard mask material film 42 in the Logic gate section is etched by the dry etching method such as RIE method and the like using the resist pattern as a mask, so that the hard mask pattern (a first pattern) is formed (Hard mask material film work process). In this hard mask material film work process, a gas of a phloro-carbon series such as $CHF_3$ is used as the etching gas.

Following this process, as shown in FIG. 48, the photo resist 43 is removed by $O_2$ ashing method and the like. The hard mask pattern (the first pattern) is thereby exposed (Resist remove process). In the remove process of the photo resist 43, it is possible to use a wet etching method using a stripper solution made of a mixed solution of a hydrogen peroxide solution and a sulfuric acid or a combination of this mixed solution and others.

Figures 49A, 49B:
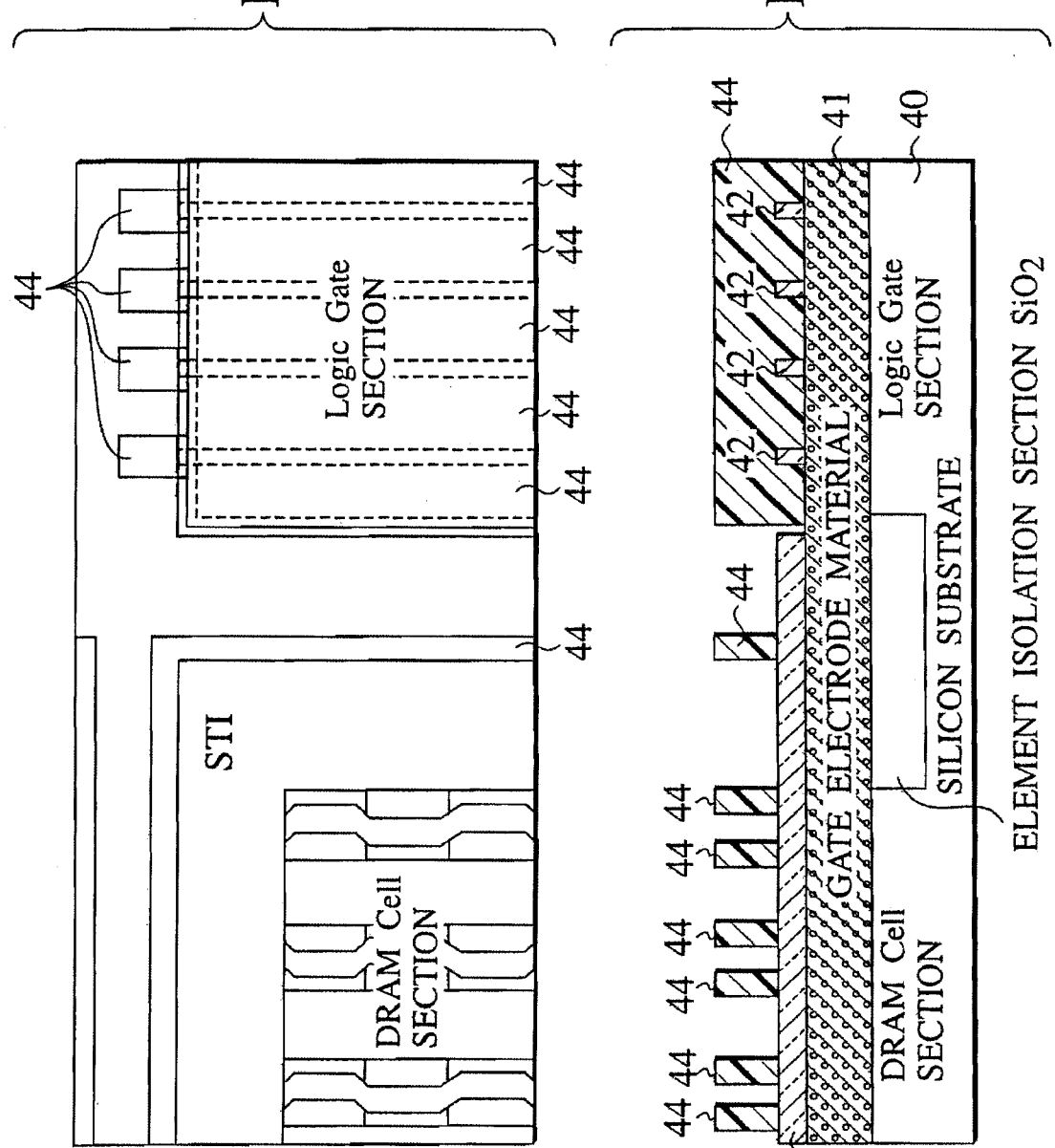
FIG. 49 is a plan view and a sectional view of the plan view of the semiconductor device made by the semiconductor device fabrication method according to the seventh embodiment.

Next, as shown in FIG. 49, using a trim mask, the photo resist (resist) 44 is applied on the hard mask pattern in the Logic gate section, and a photo resist pattern (a second resist pattern) 44 is formed over the DRAM cell section and the element isolation section by performing a second lithography process (a second exposure).

Figure 50A:
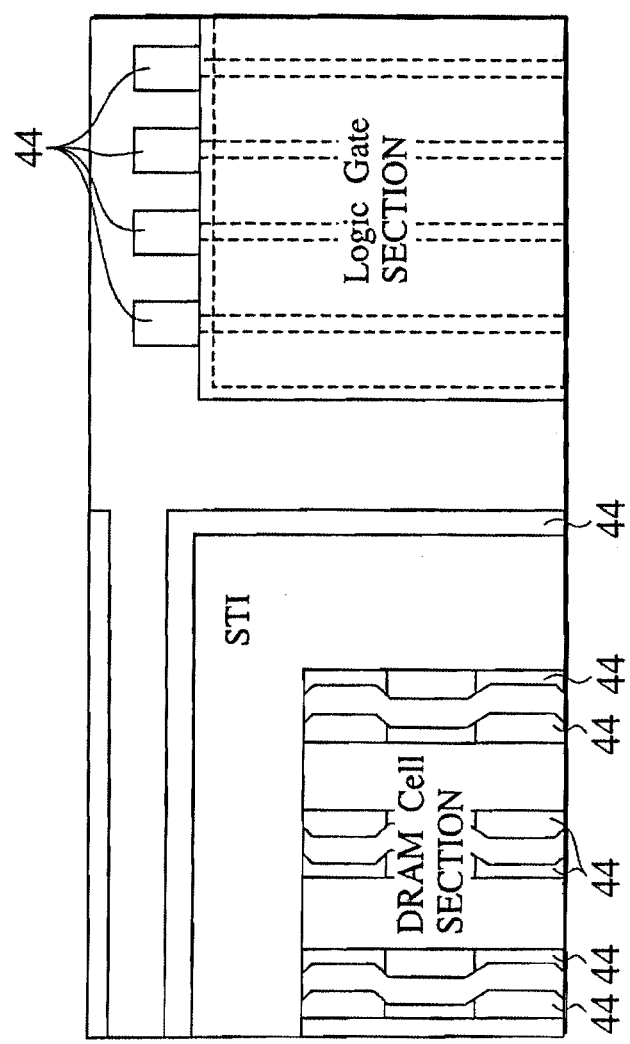
FIG. 50 is a plan view and a sectional view of the plan view of the semiconductor device made by the semiconductor device fabrication method according to the seventh embodiment.
Figure 50B:
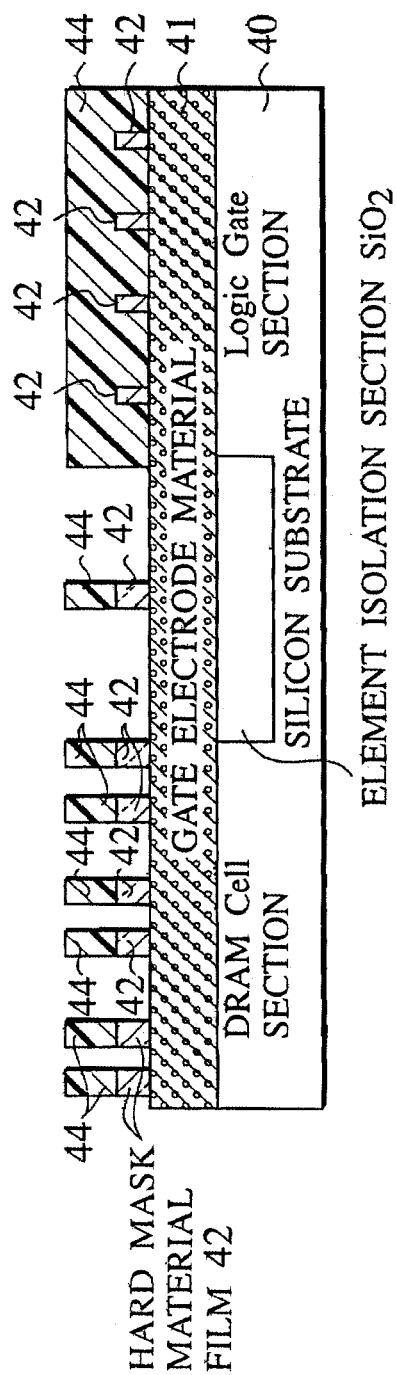

Next, as shown in FIG. 50, the dry etching is performed for the hard mask material film 42 over the DRAM cell section and the element isolation section by using the photo resist 44 in the Logic gate section as a mask, so that the hard mask pattern (a second pattern) is formed (Hard mask material film work process). In this hard mask material film work process, a gas of a phloro-carbon series such as $CHF_3$ is used as the etching gas.

Figure 51A:
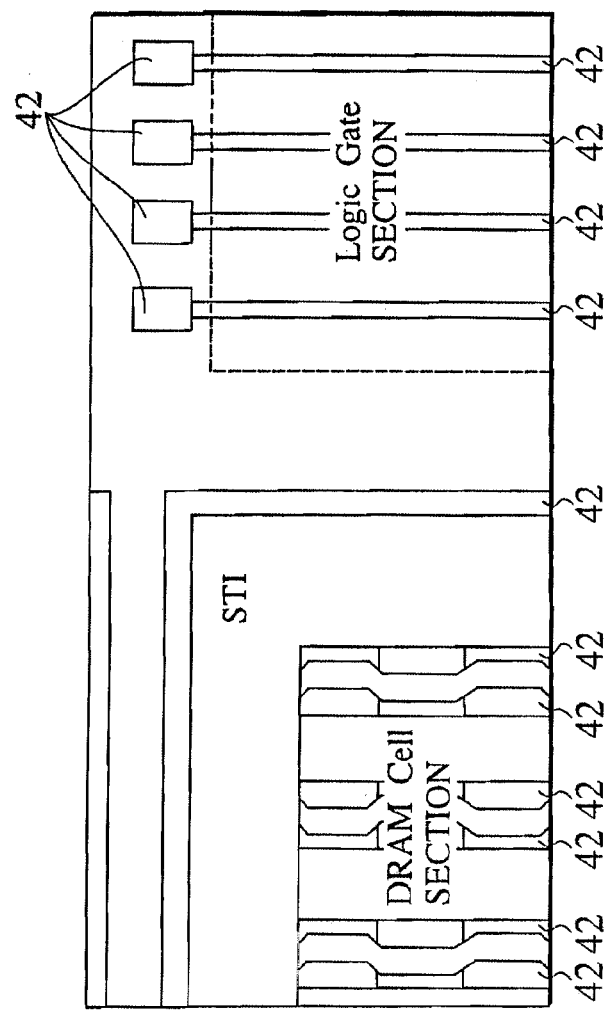
FIG. 51 is a plan view and a sectional view of the plan view of the semiconductor device made by the semiconductor device fabrication method according to the seventh embodiment.
Figure 51B:
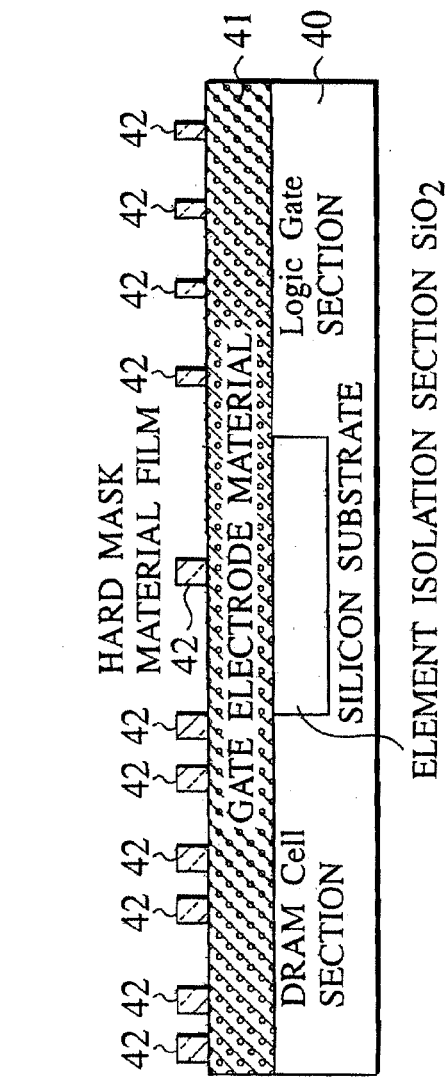

After this process, as shown in FIG. 51, the photo resist 44 is removed by the ashing method and the like (Resist remove process). In the remove process of the photo resist 44, it is also possible to perform the wet etching using a stripper solution made of a mixed solution of a hydrogen peroxide solution and a sulfuric acid or a combination of this mixed solution and others.

Next, as shown in FIG. 52, the gate electrode material film 41 is etched by RIE method and the like using the pattern of the hard mask material film 42 as a mask, so that a hard mask pattern (a second pattern) including a gate electrode pattern and a wiring pattern is thereby formed. In this process, a gas of a phloro-carbon series such as $CHF_3$ is used as the etching gas.

After this process, as shown in FIG. 53, the hard mask material film 42 as the hard mask pattern is removed by the wet etching method and the like (Hard mask remove process). In this etching process, a hot $H_3PO_4$ is used as the etching solution. Thereby, the gate electrode pattern and the wiring pattern in the semiconductor device can be formed.

As described above, according to the semiconductor device fabrication method of the seventh embodiment, because it is possible to form a desired circuit pattern by performing the double lithography processes (as the first and second exposure processes), it is possible to reduce the number of exposure processes when compared with the semiconductor device fabrication method of the related art. This can reduce the semiconductor manufacturing cost.

On the contrary, when the circuit pattern of the semiconductor device is formed by using the process in which the hard mask material film 42 is not used, the semiconductor device fabrication method of the related art must performs following three exposure processes: a first exposure process for the Logic gate section by using the alternating phase shift mask; a second exposure process for the Logic gate section and the element isolation section by suing a trim mask; and a third exposure process for the DRAM cell section after the completion of the sliming process.

In the semiconductor device fabrication method of the seventh embodiment, it is possible to use one of or a combination of following materials as the hard mask material film: SiON, $Si_3N_4$, $SiO_2$, $Al_2O_3$, SiC, and a carbon film.

Furthermore, it is acceptable to use one of following cases in the formation of the resist pattern by the first exposure process using the alternating phase shift mask and the second exposure process using the trim mask: the resist pattern is formed directly on the hard mask material film; the resist pattern is formed over the anti-reflection material film; and the resist pattern is formed by the multi-layer resist mask process.

Moreover, the trim mask is a chromium mask or a half tone mask. It is possible to form a higher-resolution circuit pattern of the DRAM cell section in the semiconductor device when the half tone mask is used as the trim mask.

Eighth Embodiment

Next, a description will be given of the semiconductor device fabrication method according to the eighth embodiment with reference to FIG. 54 to FIG. 63. FIG. 54 to FIG. 63 show plan views and sectional views of process flows in the formation of a gate layer pattern of a semiconductor integrated circuit.

In the eighth embodiment, a gate pattern in a logic gate section is formed in the semiconductor integrated circuit by a first exposure process using an alternating phase shift mask (for example, a Levenson phase-shifting mask), and an element isolation section pattern for a DRAM cell section and a wiring pattern are formed by a second exposure process using a trim mask. In the processes of the gate pattern and the wiring pattern, an insulating film as a hard mask material film is formed between a resist film and a gate electrode material. Further, a sliming process is performed for both the resist pattern and the pattern of the hard mask material film, that is different from the cases of the fifth, sixth, and seventh embodiments.

First, as shown in FIG. 54, an element isolation section is formed over a silicon substrate (a process substrate) 40 by a thermal oxidation method and the like. A logical gate section (a first region, for example, a gate region of a transistor), a DRAM cell region (a second region, for example, a memory cell section), and an element isolation section (the second region) made up of $SiO_2$ are thereby formed.

Next, a poly-silicon film of a thickness 150-200 nm is formed as a gate electrode material film 41 that is a work material film by a low-pressure CVD method and the like.

Next, a SiON film of a thickness 50.100 nm is formed as a hard mask material film (a first material) 42 over the gate electrode material film 41 made up of the poly-silicon film by a spatter method and the like. It is possible to use one of or a combination of $SiO_2$, $Si_3N_4$, $Al_2O_3$, SiC, a carbon film and the like instead of SiON as the hard mask material film 42. Also, bottom anti-reflection coating (BARC) can be combined with the above hard mask material. By the way, those $Al_2O_3$, SiC, and the carbon film are used as an optical anti-reflection material film.

Next, a photo resist is coated over the hard mask material film 42 by performing a spin coating and then dried.

Next, a resist pattern is formed over the Logic gate section by performing a first lithography process (the first exposure process) using the alternating phase shift mask. This resist pattern is formed in a dimension of the limitation of the lithography resolution (Gate resist pattern formation process). In this case, it is possible to apply an anti-reflection material film of an apply type before the spin coating process for the resist pattern.

Next, as shown in FIG. 55, the sliming process is performed for the resist pattern in the Logic gate section in order to form a fine resist pattern (a second resist pattern). It is preferred to use photo resists of a different tone for the resist pattern formed over the Logic gate section and the resist pattern formed over both the DRAM cell section and the element isolation section. For example, a photo resist of a negative tone should be used for the Logic gate section when a photo resist of a positive tone is used for the DRAM cell section and the element isolation section. On the contrary, a photo resist of a positive tone should be used for the Logic gate section when a photo resist of a negative tone is used for the DRAM cell section and the element isolation section. This has an advantage to decrease the fabrication cost because the exposure mask used in the formation of the DRAM cell section and the element isolation region may also be used in the formation process of this second resist pattern.

Figure 56A:
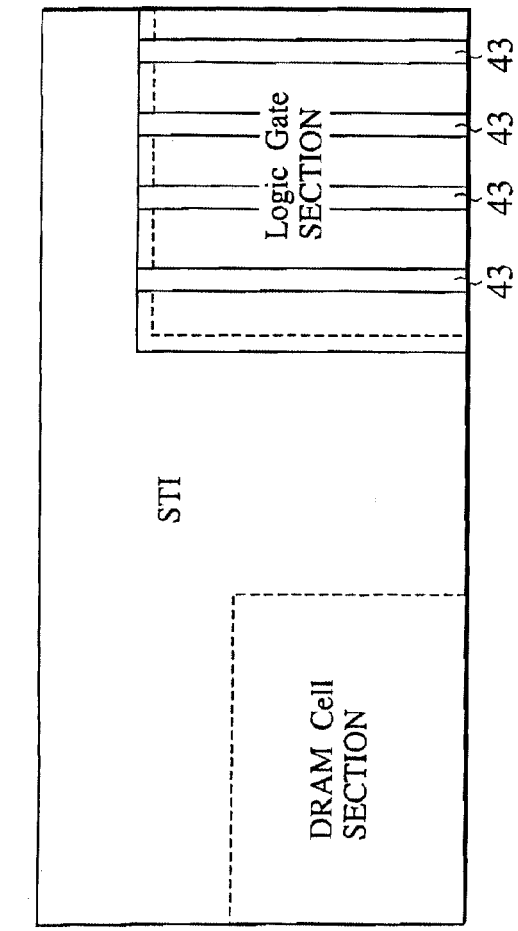
FIG. 56 is a plan view and a sectional view of the plan view of the semiconductor device made by the semiconductor device fabrication method according to the eighth embodiment.
Figure 56B:
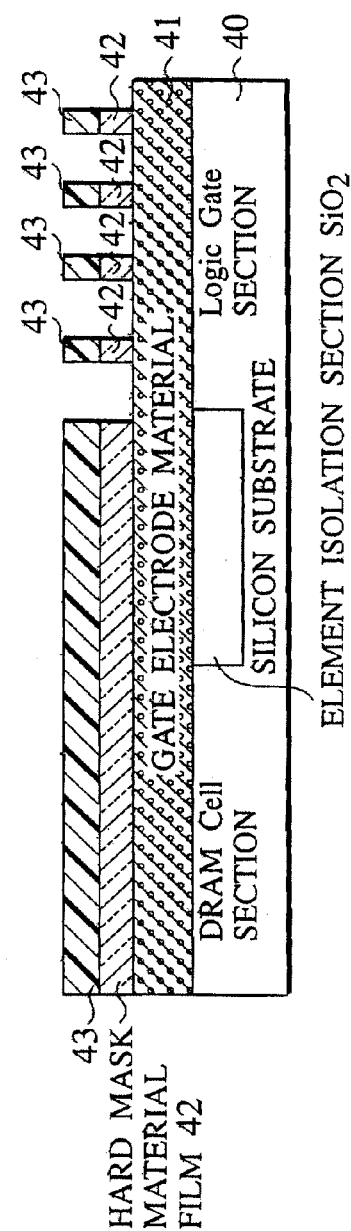

Next, as shown in FIG. 56, a dry etching is performed for the hard mask material film 42 in the Logic gate section by RIE method and the like using the resist pattern as a mask, so that a hard mask pattern (a first pattern) can be formed (Hard mask material film work process). In this hard mask material film work process, a gas of a phloro-carbon series such as $CHF_3$ is used as the etching gas.

Following this process, as shown in FIG. 57, the photo resist 43 is removed by $O_2$ aching method and the like. The hard mask pattern (the first pattern) is exposed (Resist remove process). In the remove process of the photo resist 43, it is possible to use a wet etching method using a stripper solution made of a mixed solution of a hydrogen peroxide solution and a sulfuric acid or a combination of this mixed solution and others.

Figure 58A:
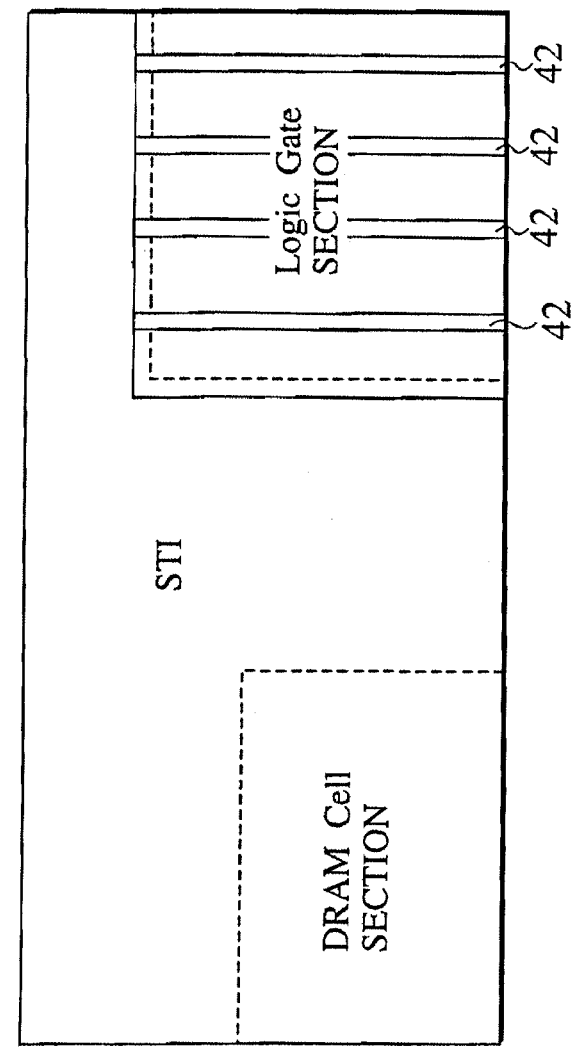
FIG. 58 is a plan view and a sectional view of the plan view of the semiconductor device made by the semiconductor device fabrication method according to the eighth embodiment.
Figure 58B:
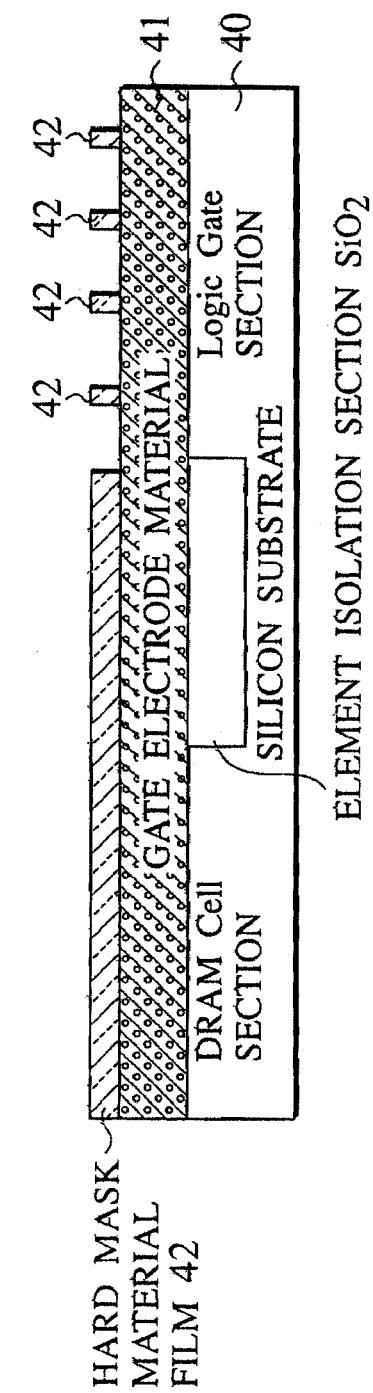

Next, as shown in FIG. 58, the sliming process is performed for the pattern of the hard mask material film in the Logic gate section by the dry etching and the like, so that a fine hard mask material film pattern (a second pattern) can be formed.

Next, as shown in FIG. 59, using a trim mask, the photo resist (resist) 44 is applied on the hard mask pattern in the Logic gate section, and a photo resist pattern (a third resist pattern) 44 is formed over the DRAM cell section and the element isolation section by performing a second lithography process (a second exposure).

Next, as shown in FIG. 60, the dry etching is performed for the hard mask material film 42 over the DRAM cell section and the element isolation section by using the photo resist 44 in the Logic gate section as a mask, so that the hard mask pattern is formed (Hard mask material film work process). In this hard mask material film work process, a gas of a phloro-carbon series such as $CHF_3$ is used as the etching gas.

After this process, as shown in FIG. 61, the photo resist 44 is removed by the ashing method and the like (Resist remove process). In the remove process of the photo resist 44, it is also possible to perform the wet etching using a stripper solution made of a mixed solution of a hydrogen peroxide solution and a sulfuric acid or a combination of this mixed solution and others.

Next, as shown in FIG. 62, the gate electrode material film 41 is etched by RIE method and the like using the pattern of the hard mask material film 42 as a mask, so that a hard mask pattern (a second pattern) including a gate electrode pattern and a wiring pattern is thereby formed. In this process, a gas of a phloro-carbon series such as $CHF_3$ is used as the etching gas.

After this process, as shown in FIG. 63, the hard mask material film 42 as the hard mask pattern is removed by the wet etching method and the like (Hard mask remove process). In this etching process, a hot $H_3PO_4$ is used as the etching solution. Thereby, the gate electrode pattern and the wiring pattern in the semiconductor device can be formed.

As described above, according to the semiconductor device fabrication method of the eighth embodiment, because it is possible to form a desired circuit pattern by performing the double lithography processes (as the first and second exposure processes), it is possible to reduce the number of exposure processes when compared with the semiconductor device fabrication method of the related art. This can reduce the semiconductor manufacturing cost.

On the contrary, when the circuit pattern of the semiconductor device is formed by using the process in which the hard mask material film 42 is not used, the semiconductor device fabrication method of the related art must performs following three exposure processes: a first exposure process for the Logic gate section by using the alternating phase shift mask; a second exposure process for the Logic gate section and the element isolation section by suing a trim mask; and a third exposure process for the DRAM cell section after the completion of the sliming process.

In the semiconductor device fabrication method of the eighth embodiment, it is possible to use one of or a combination of following materials as the hard mask material film: SiON, $Si_3N_4$, $SiO_2$, $Al_2O_3$, SiC, and a carbon film.

Furthermore, it is acceptable to use one of following cases in the formation of the resist pattern by the first exposure process using the alternating phase shift mask and the second exposure process using the trim mask: the resist pattern is formed directly on the hard mask material film; the resist pattern is formed over the anti-reflection material film; and the resist pattern is formed by the multi-layer resist mask process.

Moreover, the trim mask is a chromium mask or a half tone mask. It is possible to form a higher-resolution circuit pattern of the DRAM cell section in the semiconductor device when the half tone mask is used as the trim mask.

Ninth Embodiment

Next, a description will be given of the semiconductor device fabrication method according to the ninth embodiment with reference to FIG. 64 to FIG. 72.

FIG. 64 to FIG. 72 show plan views and sectional views of process flows in the formation of a gate layer pattern of a semiconductor integrated circuit.

In the ninth embodiment, a gate pattern and a dummy pattern are formed in a logic gate section in the semiconductor integrated circuit by a first exposure process using an alternating phase shift mask (for example, a Levenson phase-shifting mask), and the dummy pattern is removed and an element isolation section pattern for a DRAM cell section and a wiring pattern are formed by a second exposure process using a trim mask. In the processes of the gate pattern and the wiring pattern, an insulating film as a hard mask material film is formed between a resist film and a gate electrode material. Further, a sliming process is performed for the resist pattern including the dummy pattern in the logic gate section.

First, as shown in FIG. 64, an element isolation section is formed over a silicon substrate (a process substrate) 40 by a thermal oxidation method and the like. A logical gate section (a first region, for example, a gate region of a transistor), a DRAM cell region (a second region, for example, a memory cell section), and an element isolation section (the second region) made up of $SiO_2$ are thereby formed.

Next, a poly-silicon film of a thickness 150-200 nm is formed as a gate electrode material film 41 that is a work material film by a low-pressure CVD method and the like.

Next, a SiON film Of a thickness 50-100 nm is formed as a hard mask material film (a first material) 42 over the gate electrode material film 41 made up of the poly-silicon film by a spatter method and the like. It is possible to use one of or a combination of $SiO_2$, $Si_3N_4$, $Al_2O_3$, SiC, a carbon film and the like instead of SiON as the hard mask material film 42. Also, bottom anti-reflection coating (BARC) can be combined with the above hard mask material. By the way, those $Al_2O_3$, SiC, and the carbon film are used as an optical anti-reflection material film.

Next, a photo resist is coated on the hard mask material film 42 by performing a spin coating and then dried. A dummy pattern 45 is formed simultaneously during the formation of the gate pattern because a density of the gate pattern in the Logic gate section is rough in the case of the ninth embodiment.

Next, a resist pattern is formed over the Logic gate section by performing a first lithography process (the first exposure process) using the alternating phase shift mask. This resist pattern is formed in a dimension of the limitation of the lithography resolution (Gate resist pattern formation process). In this case, it is possible to apply an anti-reflection material film of an apply type before the spin coating process for the resist pattern.

Next, as shown in FIG. 65, the sliming process is performed for the resist pattern 43 and the dummy pattern 45 in the Logic gate section in order to form a fine resist pattern. It is preferred to use photo resists of a different tone for the dummy pattern and the resist pattern formed over the Logic gate section and the resist pattern formed over both the DRAM cell section and the element isolation section. For example, a photo resist of a negative tone should be used for the Logic gate section when a photo resist of a positive tone is used for the DRAM cell section and the element isolation section. On the contrary, a photo resist of a positive tone should be used for the Logic gate section when a photo resist of a negative tone is used for the DRAM cell section and the element isolation section. This has an advantage to decrease the fabrication cost because the exposure mask used in the formation of the DRAM cell section and the element isolation region may also be used in the formation process of this second resist pattern.

Next, as shown in FIG. 66, a dry etching is performed for the hard mask material film 42 in the Logic gate section by RIE method and the like using the resist pattern 43 and the dummy pattern 45 in the Logic gate section as a mask, so that a hard mask pattern (a first pattern) can be formed (Hard mask material film work process). In this hard mask material film work process, a gas of a phloro-carbon series such as $CHF_3$ is used as the etching gas.

Following this process, as shown in FIG. 67, the pattern of the photo resist 43 and the dummy pattern 45 are removed by $O_2$ ashing method and the like. The hard mask pattern (the first pattern) is thereby exposed (Resist remove process). In the remove process of the pattern of the photo resist 43 and the dummy pattern 45, it is possible to use a wet etching method using a stripper solution made of a mixed solution of a hydrogen peroxide solution and a sulfuric acid or a combination of this mixed solution and others.

Figure 68A:
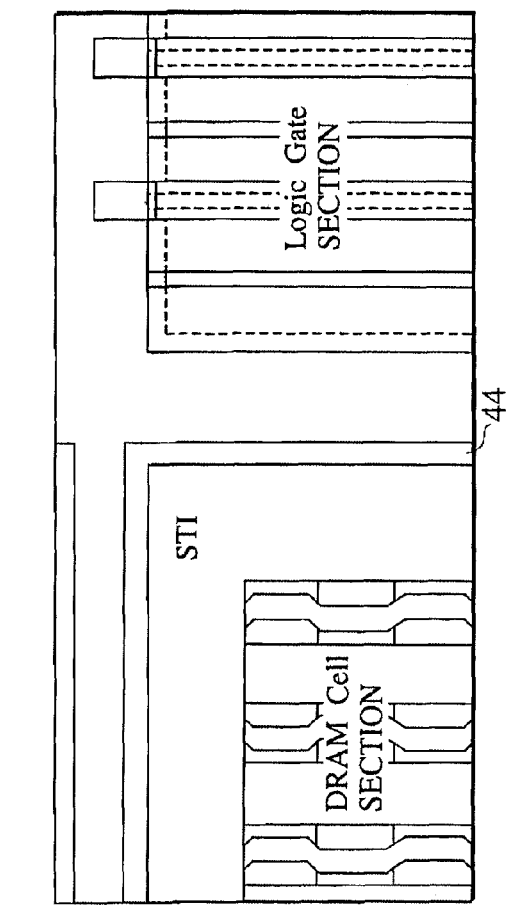
FIG. 68 is a plan view and a sectional view of the plan view of the semiconductor device made by the semiconductor device fabrication method according to the ninth embodiment.
Figure 68B:
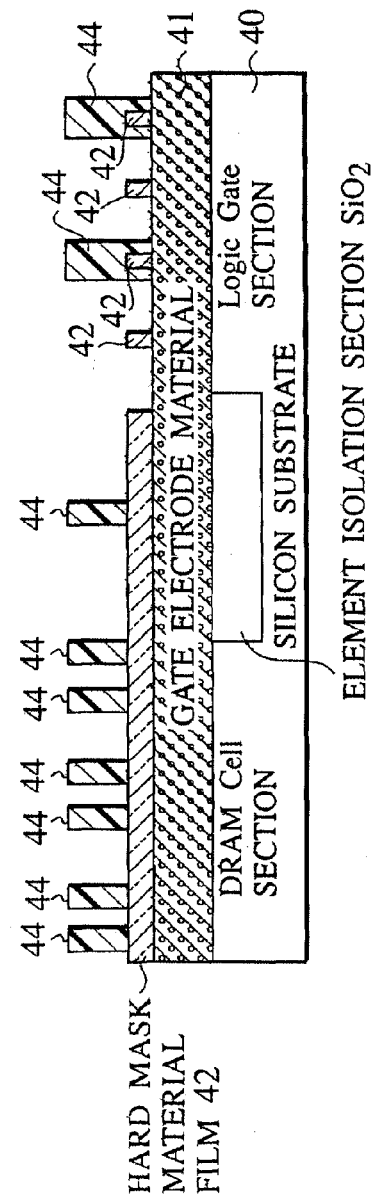

Next, as shown in FIG. 68, using a trim mask, the photo resist (resist) 44 is applied on the hard mask pattern in the Logic gate section. In this case, no photo resist is applied on the part of the hard mask pattern corresponding to the dummy pattern 45 that has been removed. The photo resist pattern 44 is formed over the DRAM cell section and the element isolation section by performing a second lithography process (a second exposure).

Next, as shown in FIG. 69, the dry etching is performed for the hard mask material film 42 over the DRAM cell section and the element isolation section by using the photo resist 44 in the Logic gate section as a mask; so that the hard mask pattern is formed (Hard mask material film work process). In this hard mask material film work process, a gas of a phloro-carbon series such as $CHF_3$ is used as the etching gas.

Figure 70A:
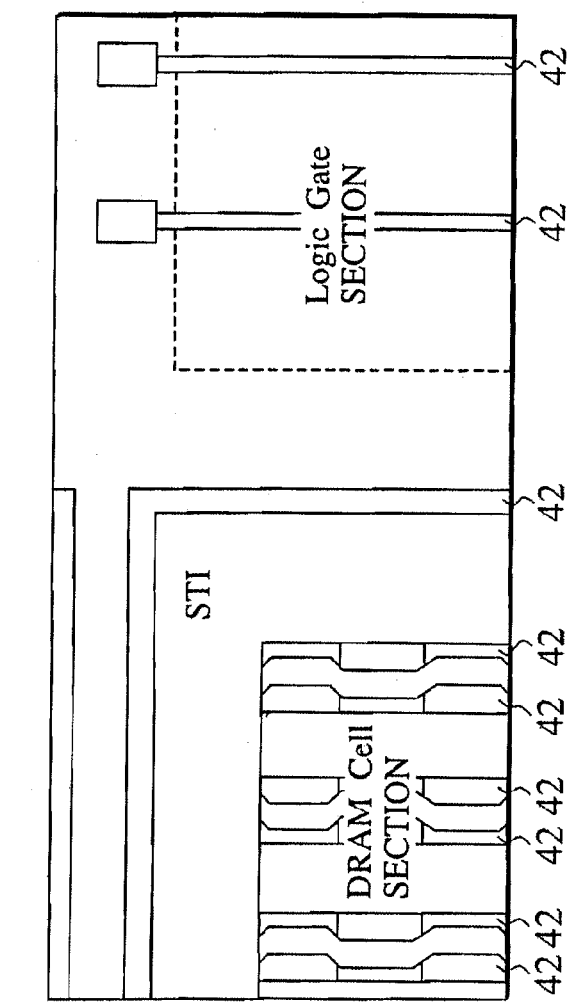
FIG. 70 is a plan view and a sectional view of the plan view of the semiconductor device made by the semiconductor device fabrication method according to the ninth embodiment.
Figure 70B:
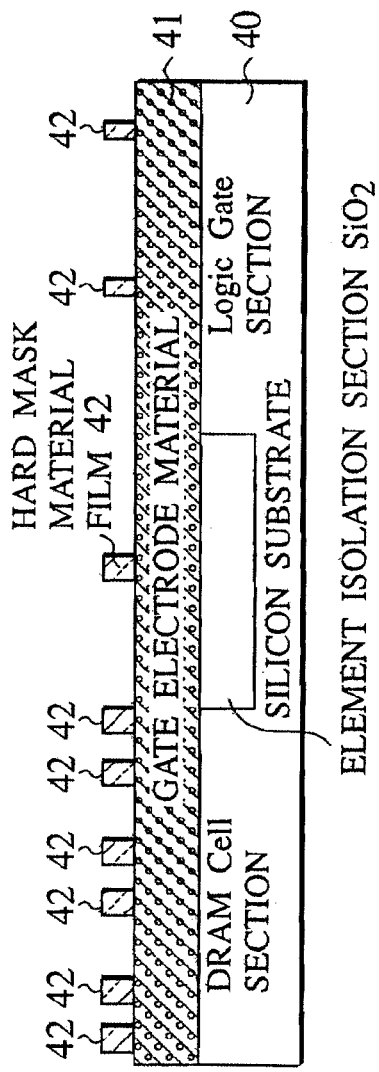

After this process, as shown in FIG. 70, the photo resist 44 is removed by the ashing method and the like (Resist remove process). In the remove process of the photo resist 44, it is also possible to perform the wet etching using a stripper solution made of a mixed solution of a hydrogen peroxide solution and a sulfuric acid or a combination of this mixed solution and others.

Next, as shown in FIG. 71, the gate electrode material film 41 is etched by RIE method and the like using the pattern of the hard mask material film 42 as a mask, so that a hard mask pattern (a second pattern) including a gate electrode pattern and a wiring pattern is thereby formed. In this process, a gas of a phloro-carbon series such as $CHF_3$ is used as the etching gas.

After this process, as shown in FIG. 72, the hard mask material film 42 as the hard mask pattern is removed by the wet etching method and the like (Hard mask remove process). In this etching process, a hot $H_3PO_4$ is used as the etching solution. Thereby, the gate electrode pattern and the wiring pattern in the semiconductor device can be formed.

As described above, according to the semiconductor device fabrication method of the eighth embodiment, because it is possible to form a desired circuit pattern by performing the double lithography processes (as the first and second exposure processes), it is possible to reduce the number of exposure processes when compared with the semiconductor device fabrication method of the related art. This can reduce the semiconductor manufacturing cost. In addition, in the semiconductor device fabrication method of the ninth embodiment in which the resist pattern of a high density including the dummy pattern in the logic gate section, it is possible to increase the accuracy of a dimension by the expansion of a focus margin and by the decreasing of the aberration during the exposure.

On the contrary, when the circuit pattern of the semiconductor device is formed by using the process in which the hard mask material film 42 is not used, the semiconductor device fabrication method of the related art must performs following three exposure processes: a first exposure process for the Logic gate section by using the alternating phase shift mask; a second exposure process for the Logic gate section and the element isolation section by suing a trim mask; and a third exposure process for the DRAM cell section after the completion of the sliming process.

In the semiconductor device fabrication method of the ninth embodiment, it is possible to use one of or a combination of following materials as the hard mask material film: SiON, $Si_3N_4$, $SiO_2$, $Al_2O_3$, SiC, and a carbon film.

Furthermore, it is acceptable to use one of following cases in the formation of the resist pattern by the first exposure process using the alternating phase shift mask and the second exposure process using the trim mask: the resist pattern is formed directly over the hard mask material film; the resist pattern is formed over the anti-reflection material film; and the resist pattern is formed by the multi-layer resist mask process.

Moreover, the trim mask is a chromium mask or a half tone mask. It is possible to form a higher-resolution circuit pattern of the DRAM cell section in the semiconductor device when the half tone mask is used as the trim mask.

As described above in detail, according to the semiconductor device fabrication method of the fifth to ninth embodiments, because the desired circuit pattern can be formed over the work substrate (the silicon substrate) using a first material (the mask material film), for example, the hard mask material film, by performing only double lithography processes (first and second exposure processes), it is possible to reduce the number of the exposure processes when compared with the semiconductor device fabrication method of the related art, and thereby to reduce the semiconductor device fabrication cost.

Thus, according to the semiconductor device fabrication method of the fifth to ninth embodiments, it is possible to provide a semiconductor device having a high performance and a reduced a chip area thereof. Further, it is possible to manufacture semiconductor devices with a low manufacturing cost because the semiconductor fabrication cost of the embodiments can reduce the number of exposure processes. Moreover it is possible to provide the semiconductor device of a high performance in operation speed and the like by the semiconductor device fabrication method according to the embodiments.

Tenth Embodiment

Hereinafter, a description will be given of the semiconductor device fabrication method according to the tenth embodiment.

Tenth embodiment relates to a formation of a gate layer pattern in an integrated circuit (IC) in which a memory circuit region and a logic circuit region are mixed. In the tenth embodiment, a narrow space pattern is formed for the memory circuit region without performing the sliming process, and the narrow line pattern is formed in the logic circuit region by use of the sliming process.

Figure 73:
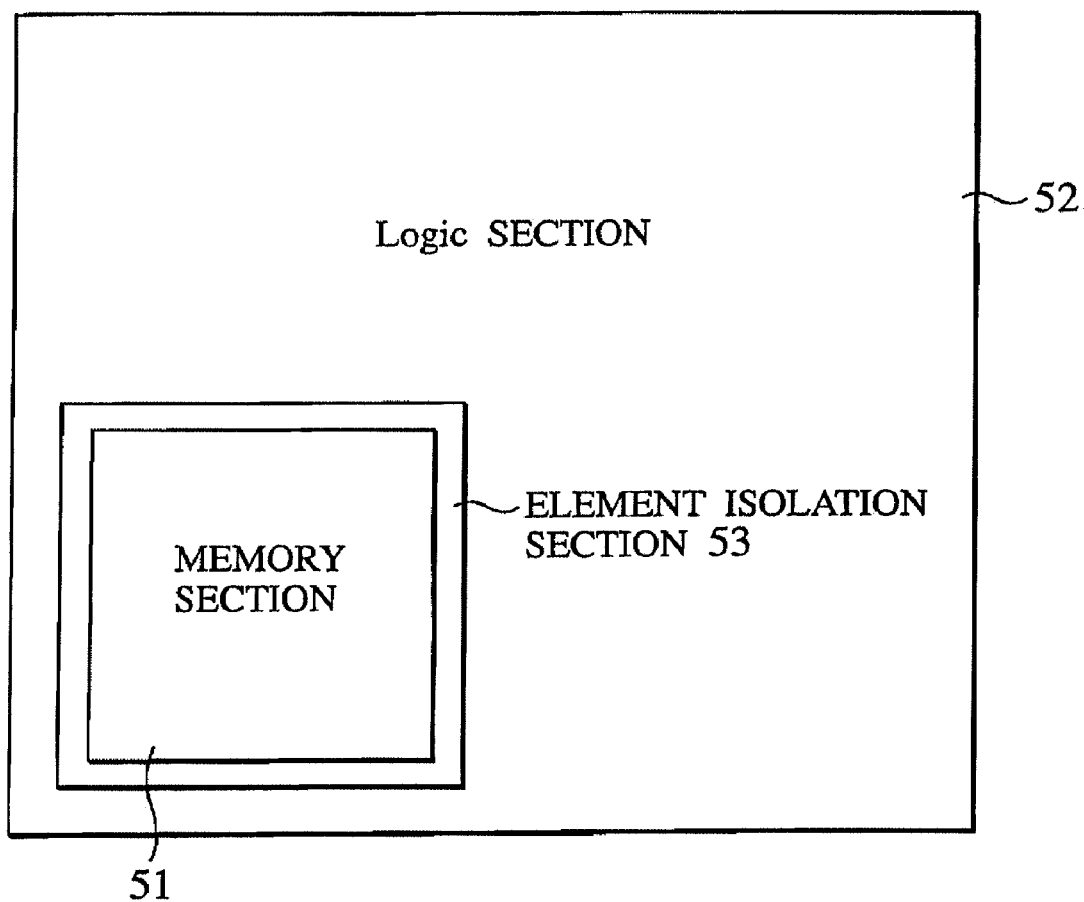
FIG. 73 is a schematic diagram showing a semiconductor device according to the tenth embodiment.

FIG. 73 is a schematic diagram of an integrated circuit according to the tenth embodiment. As shown in FIG. 73, the memory region 51 is separated from the logic region 52 through an element isolation region 53. For example, a dynamic random access memory (DRAM), a static random access memory (SRAM), an electrically erasable/programmable read only memory (EEPROM, such as a flash memory), and the like are arranged in the memory region 51, and, various logic circuits are arranged in the logic region 52.

A description will be given of concrete examples of the first embodiment. First example.

FIG. 74 to FIG. 80 are sectional view of a manufacturing process of a gate layer (gate electrodes and gate wirings) according to the first example of the first embodiment.

Figure 74:
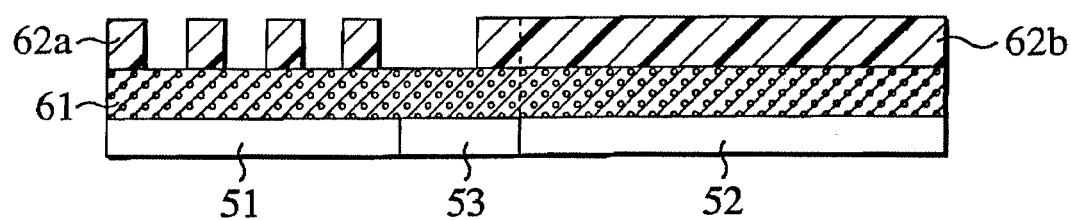
FIG. 74 is a sectional diagram showing a part of the semiconductor device fabrication method according to a first example of the tenth embodiment.

Firstly, as shown in FIG. 74, a gate material film 61, for example, a poly-silicon film is formed over a semiconductor substrate having a memory circuit formation region 11, a logic circuit formation region 12, and an element isolation region 13 (whose isolation width is approximately several ten μm). A resist film is then formed over the gate material film 21.

Following this process, a pattern is transferred onto the resist film using an exposure mask, and the resist film is developed in order to form resist patterns 62a and 62b. This resist pattern 62b covers (or protects) the region where at least the gate pattern in the logic region 52 will be arranged.

At this time, in order to certainly protect the logic region 52 from a position-mismatching during a pattern exposure or from a variation of a dimension of the resist pattern caused by variations in the fabrication processes such as an operation of an exposure device, a state of an underlying substrate, and the like, the end portion of the resist pattern 62b is formed over the element isolation region 53. By the way, the exposure mask used in this exposure process has been treated by an optical proximity correction (OPC) so that the gate pattern is formed in a desired dimension over the wafer in consideration of the effect of the pattern arrangement around of the space between gate patterns and around the gate patterns.

Figure 75:
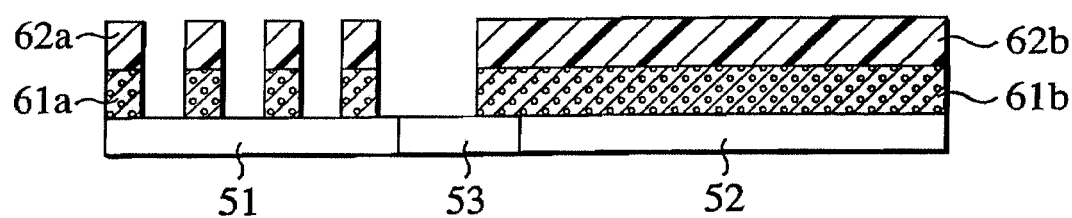
FIG. 75 is a sectional diagram showing a part of the semiconductor device fabrication method according to the first example of the tenth embodiment.
Figure 76:
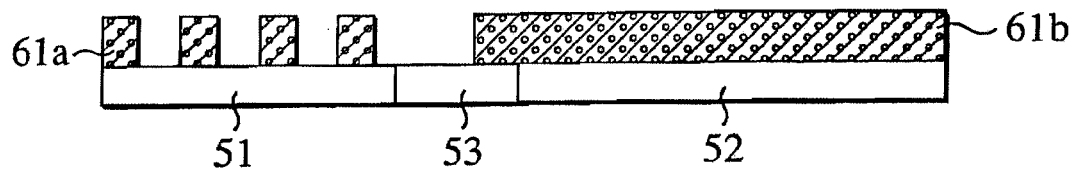
FIG. 76 is a sectional diagram showing a part of the semiconductor device fabrication method according to the first example of the tenth embodiment.

Following this process, as shown in FIG. 75, the gate material film 61 is etched using the resist patterns 62a and 62b as a mask, so that the gate material pattern 61a (gate pattern) and the gate material film pattern 621b are formed. Further, as shown in FIG. 76, the resist patterns 62a and 62b are then removed.

Figure 77:
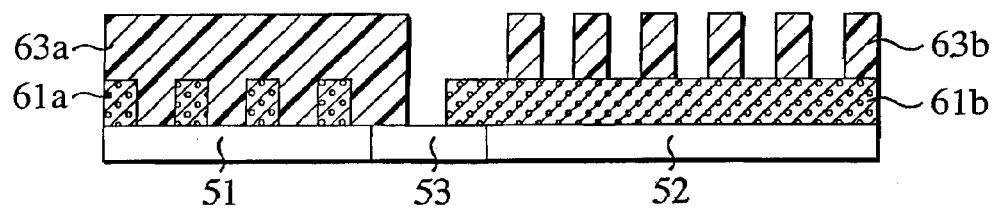
FIG. 77 is a sectional diagram showing a part of the semiconductor device fabrication method according to the first example of the tenth embodiment.

Next, as shown in FIG. 77, after the resist covers the entire area of the gate layer, a pattern is transferred to the resist film using an exposure mask, and the obtained resist pattern is then developed, so that the resist patterns 63a and 63b are formed. This resist pattern 63b will be used for formation the gate pattern in the logic region 52 and the resist pattern 63a covers (protects) the region in which at least the gate pattern in the memory region 51 is formed.

At this time, in order to certainly protect the memory region 52 from a position-mismatching during a pattern exposure or from a variation of a dimension of the resist pattern caused by variations in the fabrication processes such as an operation of an exposure device, a state of an underlying substrate, and the like, the end portion of the resist pattern 63a is formed over the element isolation region 53. In addition, in order to eliminate the unnecessary gate material film from the element isolation region 53, the end portion of the resist pattern pa is separated in position from the end portion of the gate material film pattern 61b. In other words, this process uses the exposure mask that is so designed that the end portion of the resist pattern 63a is not overlapped to the end portion of the resist pattern 62b formed by the process shown in FIG. 74, even if a variation of the dimension occurs by fluctuation in the process.

In addition, the exposure mask used in this exposure process, like the mask used in the process in FIG. 74, may be treated by the optical proximity correction (OPC). Further, it is possible to use a multi-layer resist film as the resist film used in this exposure process. This multi-layer resist film is made up of a laminated layer made up of upper layer resist and an underlying resist. The exposure pattern is transferred onto the upper layer resist. The underlying resist has a planarization function, an anti-etching function, and an optical anti-reflection function. This planarization function is to plane the uneven surface based on the underlying pattern.

Figure 78:
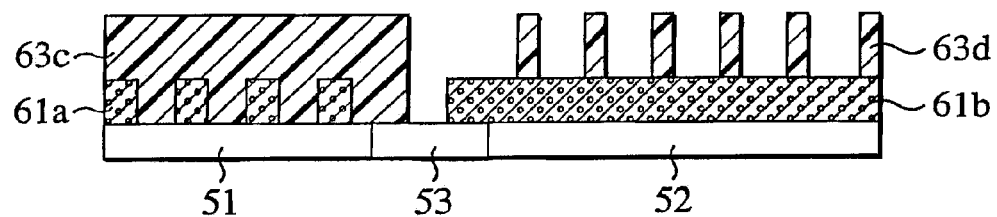
FIG. 78 is a sectional diagram showing a part of the semiconductor device fabrication method according to the first example of the tenth embodiment.

Next, as shown in FIG. 78, the resist patterns 63a and 63b are etched in order to form the resist patterns 63c and 63d, respectively. The resist pattern in the logic region 52 is slimmed (or trimmed) by this etching process.

Figure 79:
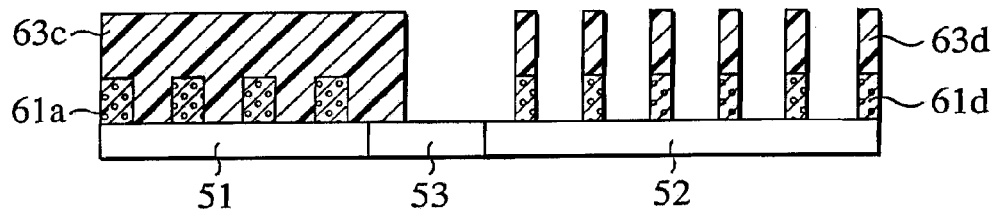
FIG. 79 is a sectional diagram showing a part of the semiconductor device fabrication method according to the first example of the tenth embodiment.
Figure 80:
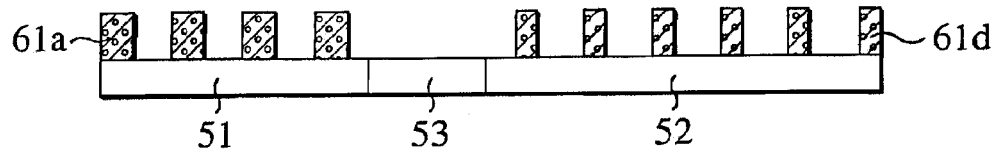
FIG. 80 is a sectional diagram showing a part of the semiconductor device fabrication method according to the first example of the tenth embodiment.
Figure 89:
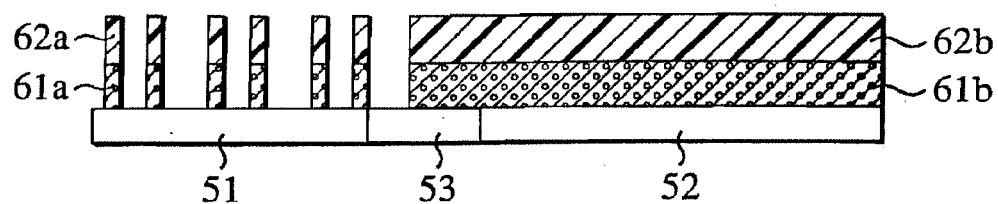
FIG. 89 is a sectional diagram showing a part of the semiconductor device fabrication method according to the first modification example of the tenth embodiment.
Figure 90:
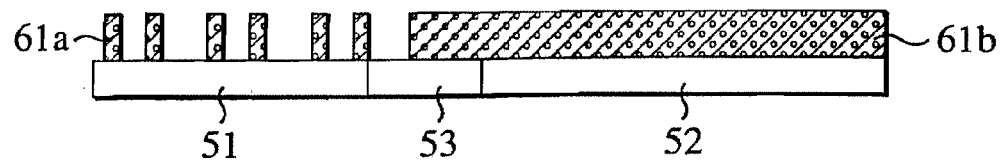
FIG. 90 is a sectional diagram showing a part of the semiconductor device fabrication method according to the first modification example of the tenth embodiment.
Figure 91:
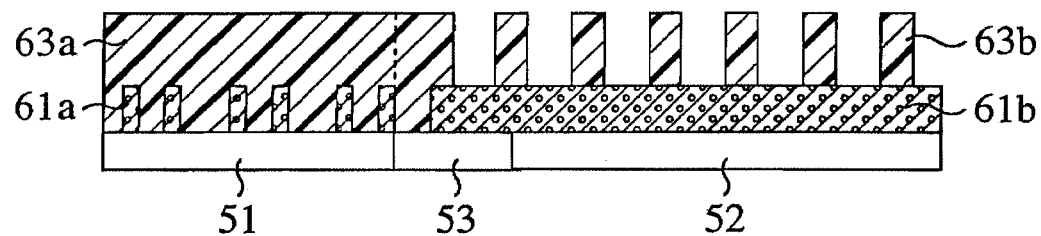
FIG. 91 is a sectional diagram showing a part of the semiconductor device fabrication method according to the first modification example of the tenth embodiment.
Figure 92:
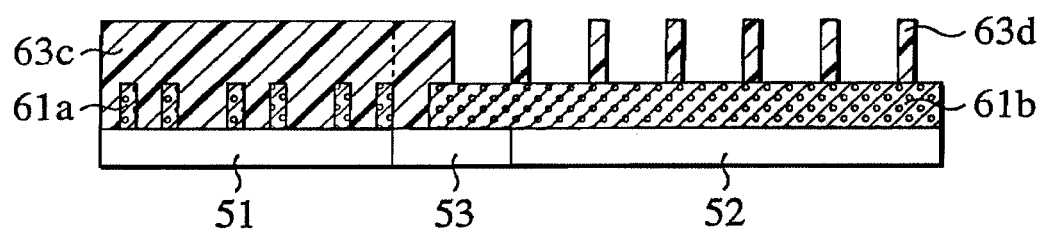
FIG. 92 is a sectional diagram showing a part of the semiconductor device fabrication method according to the first modification example of the tenth embodiment.

Following this process, as shown in FIG. 79, the gate material film is etched using the resist patterns 63c and 63d as a mask so that the gate material film pattern 61d (gate pattern) is formed. Further, as shown in FIG. 89, the resist pattern 63c and 63d are removed.

As described above, according to the first example of the tenth embodiment, it is possible to form the gate pattern in the logic region whose dimension is not more than the limitation of the lithography process by performing the sliming process, and also possible to form the gate pattern in the memory region in a narrow space width because the sliming process does not affect this gate pattern in the memory region.

Second Example

FIG. 81 to FIG. 87 are sectional view of a manufacturing process of a gate layer (gate electrodes and gate wirings) according to the second example of the tenth embodiment.

In the first example of the tenth embodiment described above, the gate pattern is firstly formed in the memory region and the gate pattern is then formed in the logic region. On the contrary, in this second example of the tenth embodiment, the gate pattern is firstly formed in the logic region and the gate pattern is then formed in the memory region.

Figure 81:
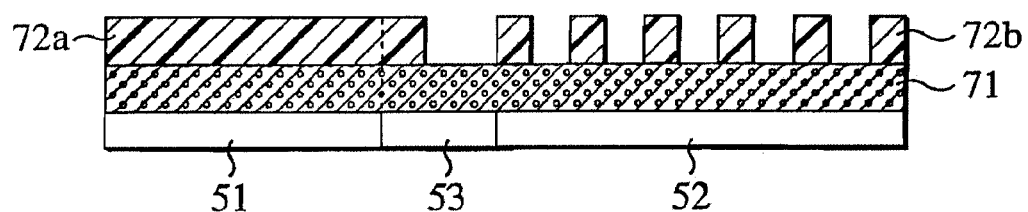
FIG. 81 is a sectional diagram showing a part of the semiconductor device fabrication method according to a second example of the tenth embodiment.

Firstly, as shown in FIG. 81, like the first example, a gate material film 71, for example, a poly-silicon film is formed over a work substrate and a resist film is further formed over the gate material film 71. Following this process, a pattern is transferred onto the resist film using an exposure mask and the resist film is developed in order to form resist patterns 72a and 72b. The resist pattern 72b is used for formation of the gate pattern in the logic region 52. This resist pattern 72a covers (or protects) the region where at least the gate pattern in the memory region 51 will be arranged.

At this time, in order to certainly protect the memory region 51 from a position-mismatching during a pattern exposure or from a variation of a dimension of the resist pattern caused by variations in the fabrication processes such as an operation of an exposure device, a state of an underlying substrate, and the like, the end portion of the resist pattern 72a is formed over the element isolation region 53. By the way, like the first example, the exposure mask used in the exposure process has been treated by the optical proximity correction (OPC).

Figure 82:
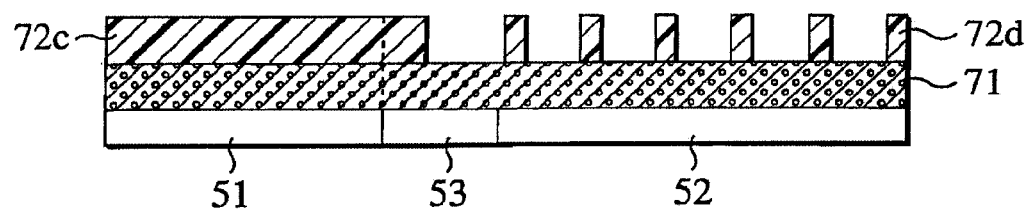
FIG. 82 is a sectional diagram showing a part of the semiconductor device fabrication method according to the second example of the tenth embodiment.

Next, as shown in FIG. 82, the resist patterns 72a and 72b are etched in order to form the resist pattern 72c and 72d. By performing this etching process, the resist pattern in the logic region 52 is slimmed (trimmed).

Figure 83:
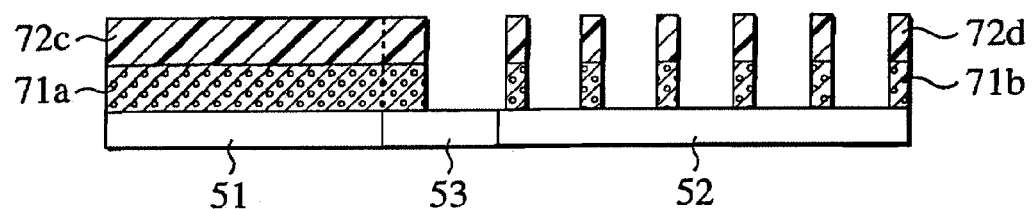
FIG. 83 is a sectional diagram showing a part of the semiconductor device fabrication method according to a second example of the tenth embodiment.
Figure 84:
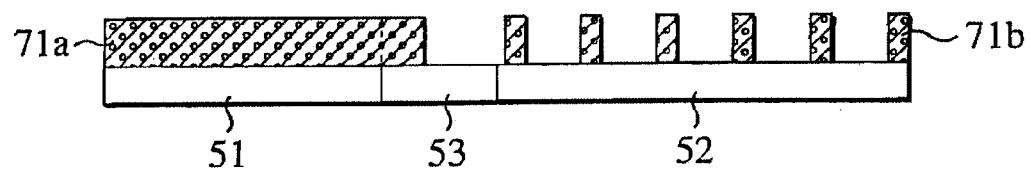
FIG. 84 is a sectional diagram showing a part of the semiconductor device fabrication method according to a second example of the tenth embodiment.

Next, as shown in FIG. 83, the gate material film 71 is etched using the resist patterns 72c and 72d as a mask, so that the gate material film pattern 71a and the gate material film pattern 71b (gate pattern) are formed. Furthermore, as shown in FIG. 84, the resist patterns 72a and 72b are then removed.

Figure 85:
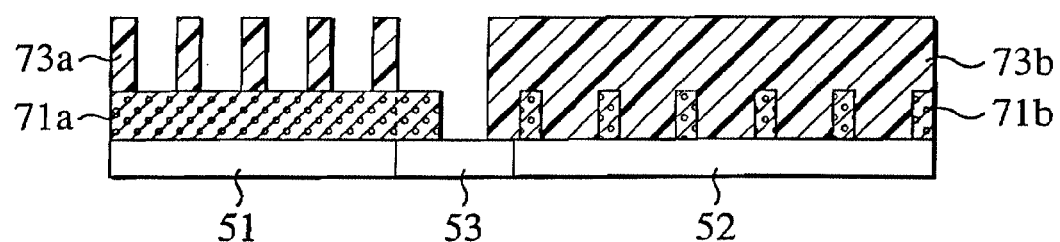
FIG. 85 is a sectional diagram showing a part of the semiconductor device fabrication method according to a second example of the tenth embodiment.

Next, as shown in FIG. 85, after the resist covers the entire area of the gate layer, a pattern is transferred to the resist film using an exposure mask, and the obtained resist pattern is then developed, so that the resist patterns 73a and 73b are formed. This resist pattern 73a will be used for the formation the gate pattern in the memory region 51 and the resist pattern 73b covers (protects) the region in which at least the gate pattern in the logic region 52 is formed.

At this time, in order to certainly protect the logic region 51 from a position-mismatching during a pattern exposure or from a variation of a dimension of the resist pattern caused by variations in the fabrication processes such as an operation of an exposure device, a state of an underlying substrate, and the like, the end portion of the resist pattern 73b is formed over the element isolation region 53. In addition, in order to eliminate the unnecessary gate material film from the element isolation region 53, the end portion of the resist pattern 73b is separated in position from the end portion of the gate material film pattern 71b. In other words, this process uses the exposure mask that is so designed that the end portion of the resist pattern 73a is not overlapped to the end portion of the resist pattern 72b formed by the process shown in FIG. 81 even if a variation of the dimension occurs by fluctuation in the process.

In addition, the exposure mask used in this exposure process, like the mask used in the first example, may be treated by the optical proximity correction (OPC). Further, it is possible to use a multi-layer resist film as the resist film used in this exposure process. This multi-layer resist film is made up of a laminated layer made up of an upper layer resist and an underlying resist. The exposure pattern is transferred onto the upper layer resist. The underlying resist has a planarization function, an anti-etching function, and an optical anti-reflection function. This planarization function is to plane the uneven surface based on the underlying pattern.

Figure 86:
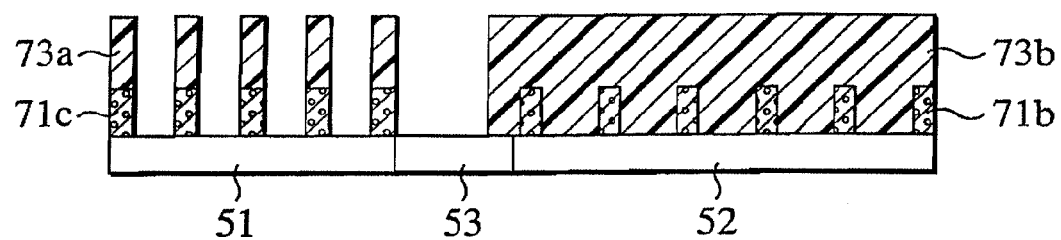
FIG. 86 is a sectional diagram showing a part of the semiconductor device fabrication method according to a second example of the tenth embodiment.
Figure 87:
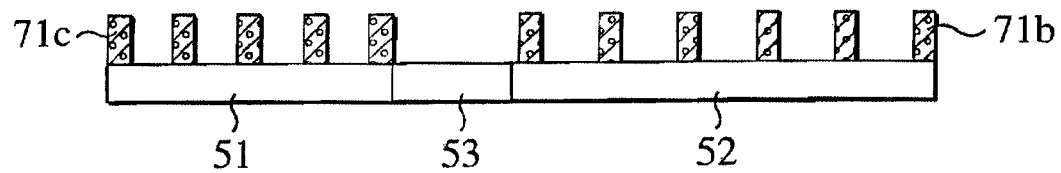
FIG. 87 is a sectional diagram showing a part of the semiconductor device fabrication method according to a second example of the tenth embodiment.
Figure 88:
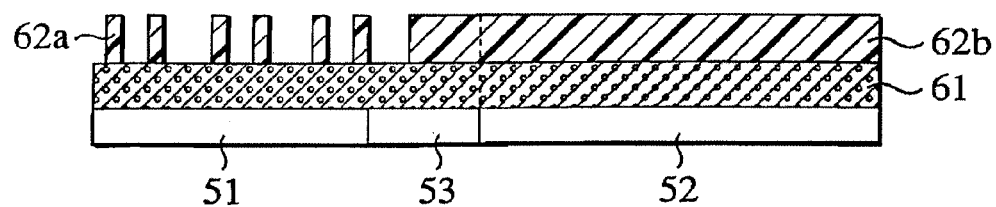
FIG. 88 is a sectional diagram showing a part of the semiconductor device fabrication method according to a first modification example of the tenth embodiment.

Next, as shown in FIG. 86, the gate material film is etched using the resist patterns 73a and 73b as a mask, so that the gate material film pattern 71c (gate pattern) is formed. Further, as shown in FIG. 87, the resist pattern 73a and 73b are removed.

As described above, like the first example of the tenth embodiment, it is possible to form the gate pattern in the logic region whose dimension is not more than the limitation of the lithography process by performing the sliming process, and also possible to form the gate pattern in the memory region in a narrow space width because the sliming process does not affect this gate pattern in the memory region.

First Modification Example

FIG. 88 to FIG. 94 are sectional views of a manufacturing process of a gate layer according to the first modification example of the tenth embodiment. The basic process in the first modification example is the same as that of the first example of the tenth embodiment shown in FIG. 74 to FIG. 80. Accordingly, the same components shown in FIG. 88 to FIG. 94 corresponding to the elements used in FIG. 74 to FIG. 80 will be referred with the same characters and numbers, and the detailed explanation is omitted here.

In the process in the first example shown in FIG. 77, the end portion of the resist pattern 63a is separated in position from the end portion of the gate material film pattern 61b. On the contrary, in the first modification example, in the process shown in FIG. 91, the end portion of the resist pattern 63a is overlapped to the end portion of the gate material film pattern 61b. In other word, the exposure mask is used so that the end portion of the resist pattern 63a is overlapped to the end portion of the resist pattern 62b formed in the process shown in FIG. 88 in consideration of a variation of the dimension caused by fluctuation in the process.

Figure 93:
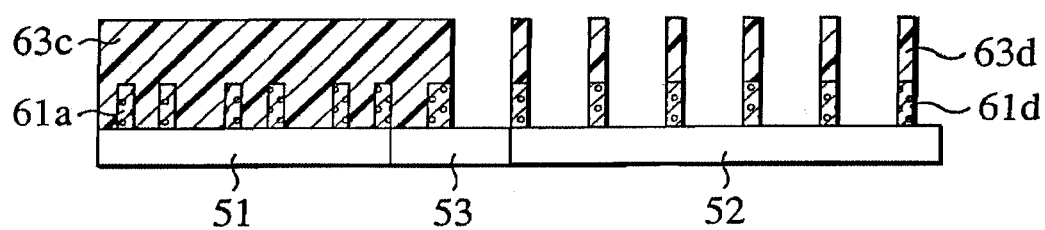
FIG. 93 is a sectional diagram showing a part of the semiconductor device fabrication method according to the first modification example of the tenth embodiment.
Figure 94:
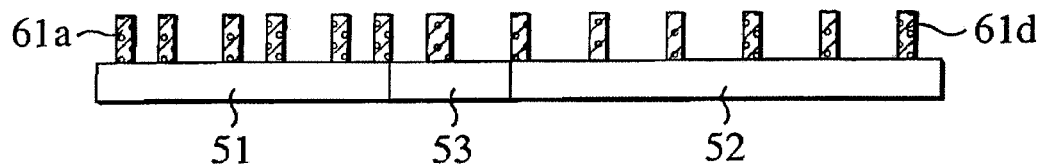
FIG. 94 is a sectional diagram showing a part of the semiconductor device fabrication method according to the first modification example of the tenth embodiment.
Figure 95:
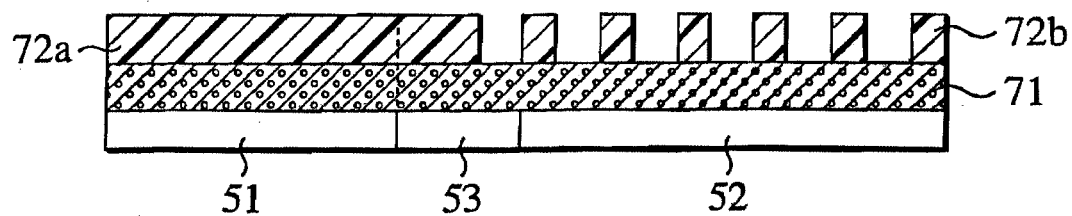
FIG. 95 is a sectional diagram showing a part of the semiconductor device fabrication method according to a second modification example of the tenth embodiment.
Figure 96:
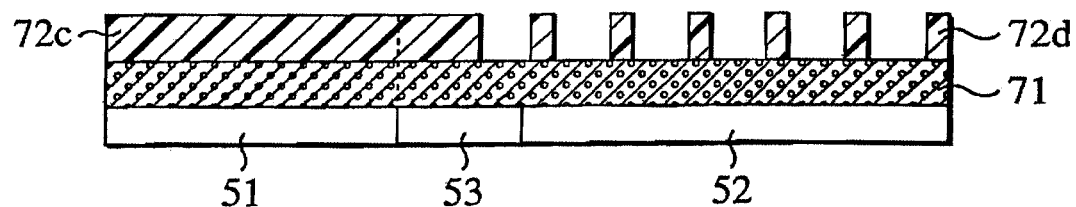
FIG. 96 is a sectional diagram showing a part of the semiconductor device fabrication method according to the second modification example of the tenth embodiment.

By using this mask pattern, it is possible to protect the element isolation region 53 from the etching for the gate material film performed in the process shown in FIG. 93.

Second Modification Example

FIG. 95 to FIG. 101 are sectional views of a manufacturing process of a gate layer according to the second modification example of the tenth embodiment. The basic process in the second modification example is the same as that of the second example of the tenth embodiment shown in FIG. 81 to FIG. 87. Accordingly, the same components shown in FIG. 95 to FIG. 101 corresponding to the elements used in FIG. 81 to FIG. 87 will be referred with the same characters and numbers, and the detailed explanation is omitted here.

In the process shown in FIG. 85 in the second example of the tenth embodiment, the end portion of the resist pattern 73b is separated in position from the end portion of the gate material film pattern 71a. On the contrary, in the second modification example, in the process shown in FIG. 99, the end portion of the resist pattern 73b is overlapped to the end portion of the gate material film pattern 71a. In other word, the exposure mask is used so that the end portion of the resist pattern 73b is overlapped to the end portion of the resist pattern 72a formed in the process shown in FIG. 95 in consideration of a variation of the dimension caused by fluctuation in the process.

Figure 97:
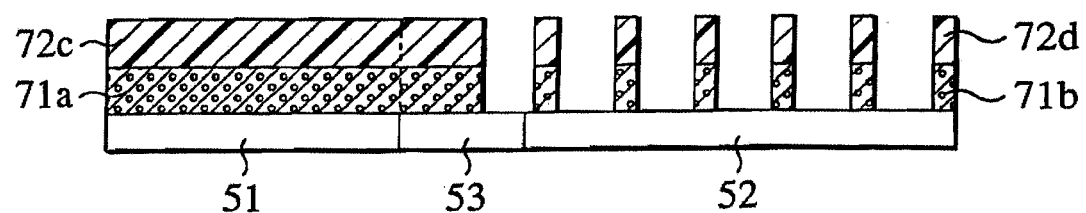
FIG. 97 is a sectional diagram showing a part of the semiconductor device fabrication method according to the second modification example of the tenth embodiment.
Figure 98:
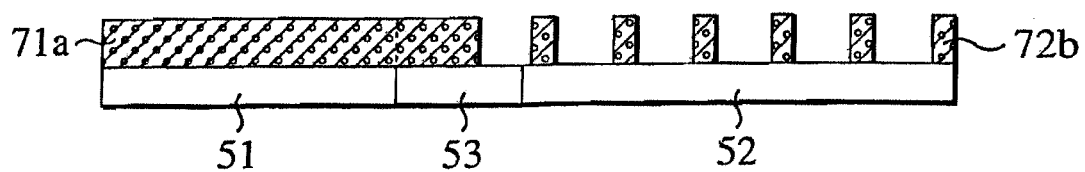
FIG. 98 is a sectional diagram showing a part of the semiconductor device fabrication method according to the second modification example of the tenth embodiment.
Figure 99:
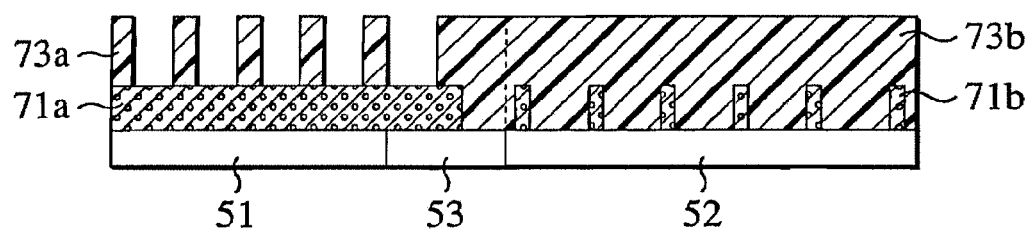
FIG. 99 is a sectional diagram showing a part of the semiconductor device fabrication method according to the second modification example of the tenth embodiment.
Figure 100:
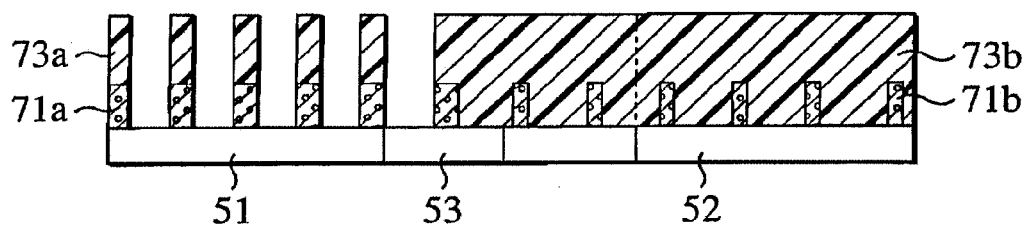
FIG. 100 is a sectional diagram showing a part of the semiconductor device fabrication method according to the second modification example of the tenth embodiment.
Figure 101:
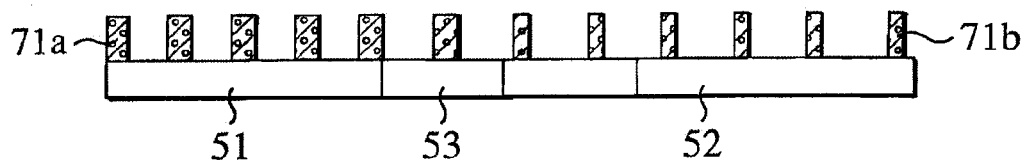
FIG. 101 is a sectional diagram showing a part of the semiconductor device fabrication method according to the second modification example of the tenth embodiment.

By using such a mask pattern, it is possible to protect the element isolation region 53 from the etching for the gate material film performed in the process shown in FIG. 97.

Eleventh Embodiment

Hereinafter, a description will be given to the eleventh embodiment.

The eleventh embodiment relates to a case that is applied to a formation of a gate layer pattern in an integrated circuit (IC) having an element region in which metal oxide semiconductor (MOS) transistors and the like are formed and an isolation region around the element region.

In the eleventh embodiment, gate electrodes are formed in the element region by performing a sliming process and gate wirings are formed in the element isolation region without performing the sliming process.

A description will be given of concrete examples of the eleventh embodiment.

First Example

FIGS. 102A-102C to FIGS. 108A-108C are diagrams showing a manufacturing process of a gate layer (gate electrode and gate wiring) according to the first example of the eleventh embodiment. In those diagrams, each of FIGS. 102A, 103A, 104A, 105A, 106A, 107A, and 108A shows a plan pattern, and each of FIGS. 102B, 103B, 104B, 105B, 106B, 107B, and 108B shows a sectional view of line B-B', and each of FIGS. 102C, 103C, 104C, 105C, 106C, 107C, and 108C shows a sectional view of line C-C'.

Figures 102A, 102B, 102C:
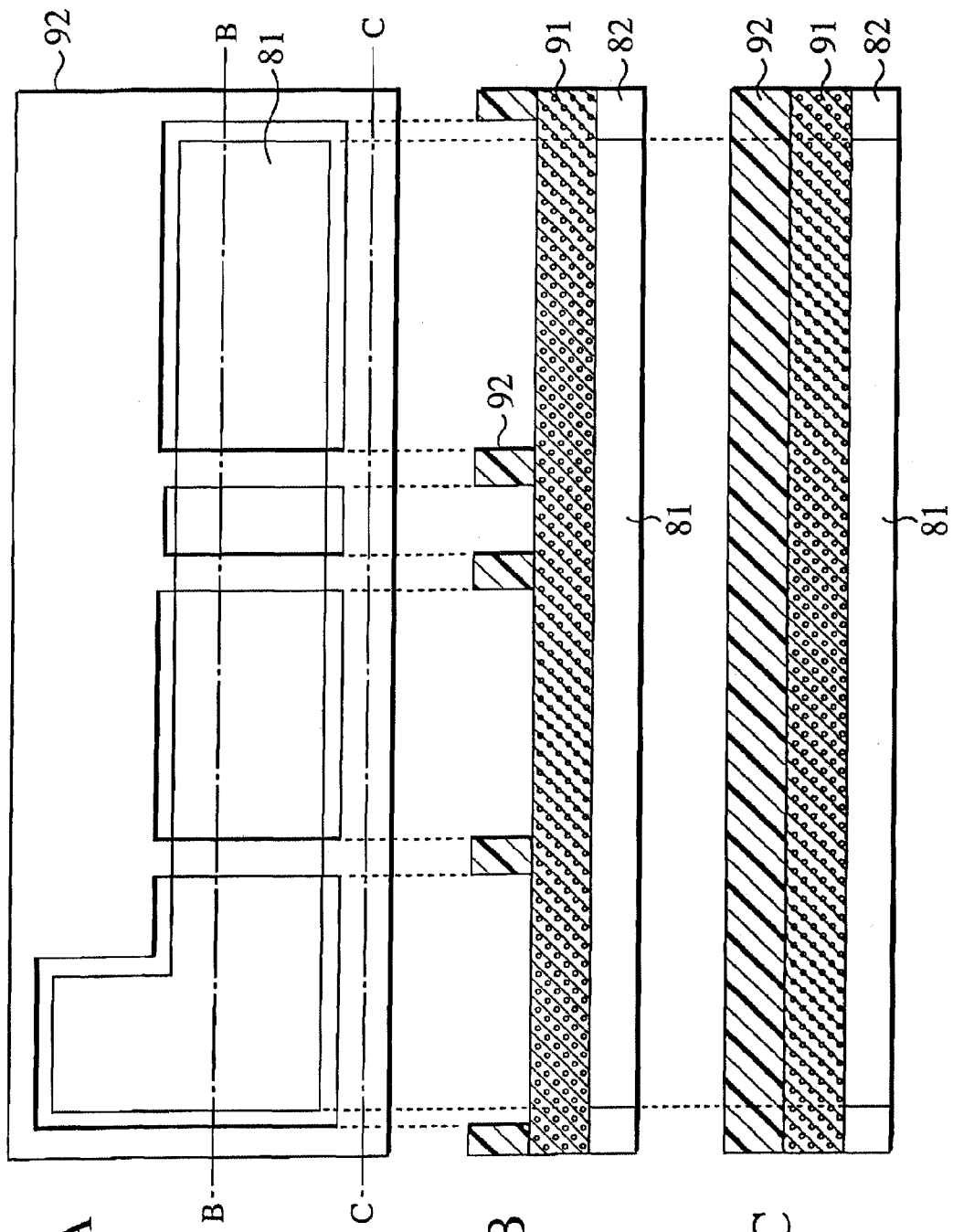
FIGS. 102A-102C are a plan view and sectional views along B-B and C-C lines of the plan view of a semiconductor device made by the process in a semiconductor device fabrication method according to a first example of the eleventh embodiment.

First, as shown in FIGS. 102A-102C, a gate material film 91, for example, a poly-silicon film is formed over a semiconductor substrate having an element region 81 and an element isolation region 82. Then, a resist film is formed over the gate material film 91. Following this process, a pattern is transferred onto the resist film using an exposure mask, and the resist film is developed in order, to form a resist pattern 92. By this resist pattern 92, a gate pattern (gate electrode pattern) is formed in the element region 81 and covers (or protects) at least a region in which a gate pattern will be arranged in the element isolation region 82. By the way, although FIG. 102A omits the resist pattern 92 over the element isolation region 82 for brevity, in actual cases, the resist pattern 92 is also formed toward outside (this can be applied to other diagrams in the eleventh embodiment) of the element isolation region 82.

In this lithography process, in order to prevent the formation of a gate pattern in the area other than the element region 81 by a position-mismatching or by a variation in the fabrication processes such as an operation of an exposure device, a state of an underlying substrate, and the like, the end portion of the resist pattern 92 is formed outside from the element region 81. In other words, the exposure process uses the exposure mask that has been so designed that the end portion of the resist pattern 92 is shifted (for example, by approximately several ten nm) toward the direction of the element isolation region 82 from the boundary portion of the element isolation region 82.

By the way, like the cases of the tenth embodiment, the exposure mask used in the exposure process has been treated by the optical proximity correction (OPC) so that the gate pattern is formed in a desired dimension over the wafer.

Figure 103A:
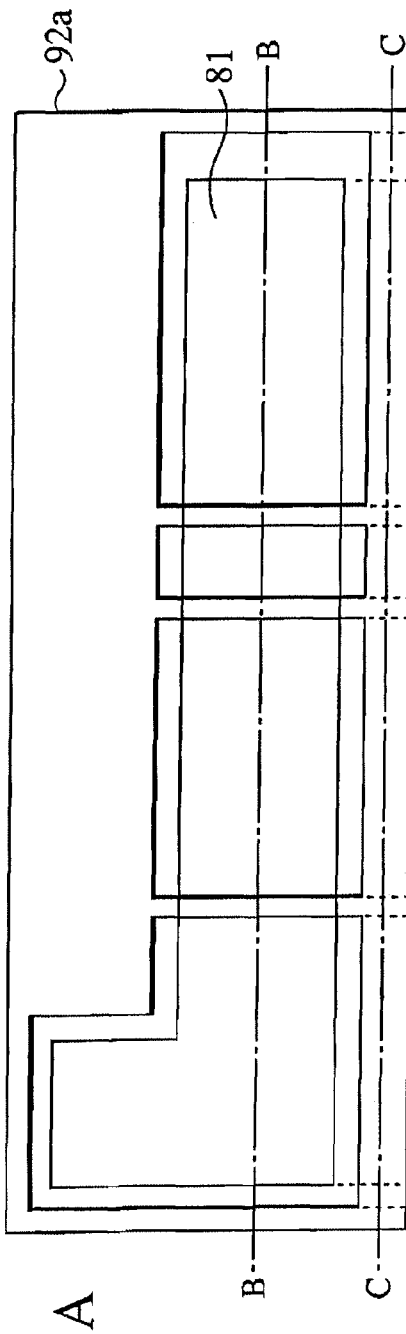
FIGS. 103A-103C are a plan view and sectional views along B-B and C-C lines of the plan view of a semiconductor device made by the process in a semiconductor device fabrication method according to the first example of the eleventh embodiment.
Figure 103B:
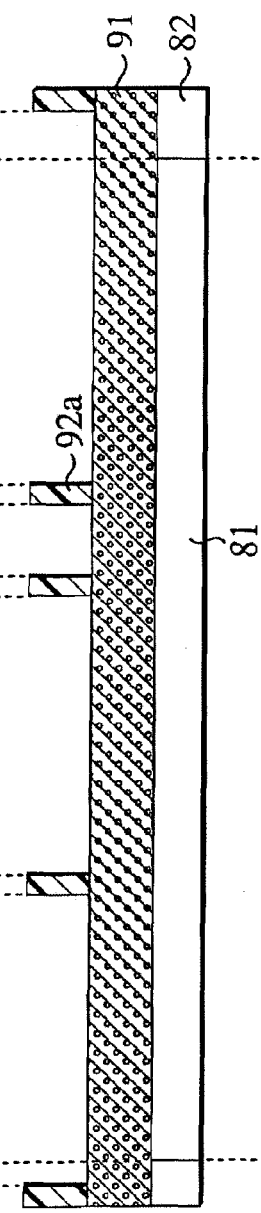
Figure 103C:
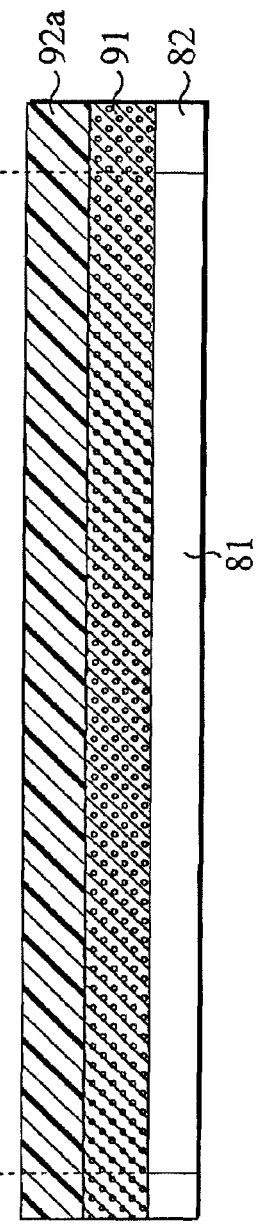
Figures 104A, 104B, 104C:
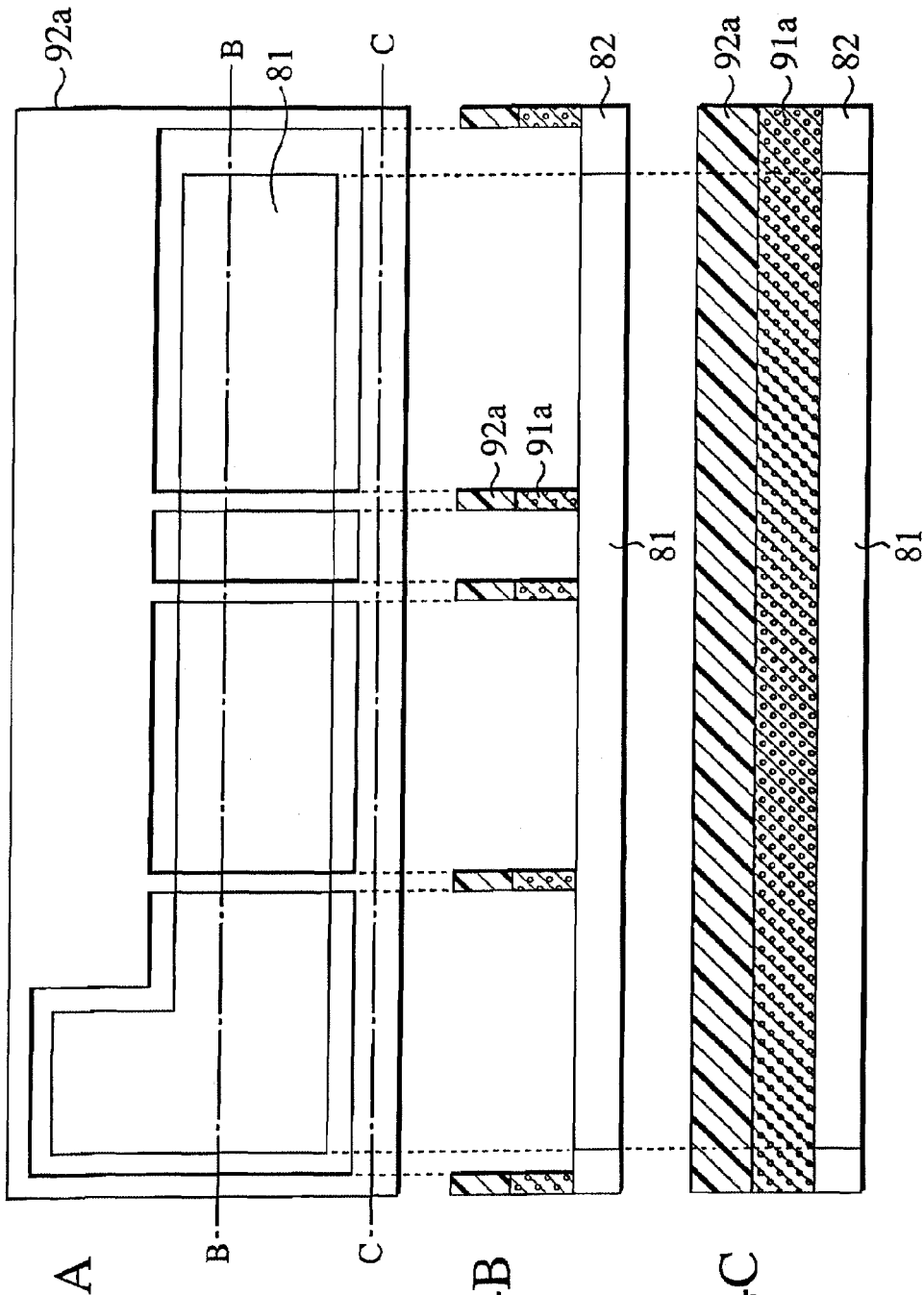
FIGS. 104A-104C are a plan view and sectional views along B-B and C-C lines of the plan view of a semiconductor device made by the process in a semiconductor device fabrication method according to the first example of the eleventh embodiment.

Next, as shown in FIGS. 103A-103C, the resist pattern 92 is slimmed by performing the etching (sliming process) in order to form a resist pattern 92a. Following this sliming process, as shown in FIGS. 104A-104C, the gate material film 91 is etched using the resist pattern 92a as a mask in order to form a gate material film pattern 91a. Further, as shown in FIGS. 105A-105C, the resist pattern 92a is then removed.

Next, as shown in FIGS. 106A-106C, after a resist film is applied onto the entire surface, a pattern is transferred onto this resist film using the exposure mask. The resist film is then developed in order to form a resist pattern 93. This resist pattern 93 will form the gate pattern (gate wiring pattern) in the element isolation region 82 and covers (or protects) the entire of the element region 81.

At this time, in order to certainly protect the element region 81 from a position-mismatching during a pattern exposure or from a variation of a dimension of the resist pattern caused by variations in the fabrication processes such as an operation of an exposure device, a state of an underlying substrate, and the like, the end portion of the resist pattern 93 is so formed in the boundary portion of the element region 81 and the element isolation region 82 that the end portion of the resist pattern 63 is positioned at the outside of the element region 91. In other words, the exposure process uses the exposure mask that has been so designed that the end portion of the resist pattern 93 is shifted (for example, by approximately several ten nm) toward the direction of the element isolation region 82 from the boundary portion of the element isolation region 82. Further, in order to eliminate the unnecessary gate material film from the element isolation region 82, the exposure process uses the exposure mask that has been designed so that the end portion of the resist pattern 93 is inside (element region 81 side) in position form the end portion of the resist pattern 92 shown in FIGS. 102A-102C in the boundary portion of the element region 81 and the element isolation region 82.

In addition, like the cases of the tenth embodiment, the exposure mask used in this exposure process has been treated by the optical proximity correction (OPC) so that the gate pattern is formed over the wafer with a desired dimension. Moreover, it is possible to use a multi-layer resist film as the resist film used in this exposure process, like the cases in the first embodiment described above.

Figures 107A, 107B, 107C:
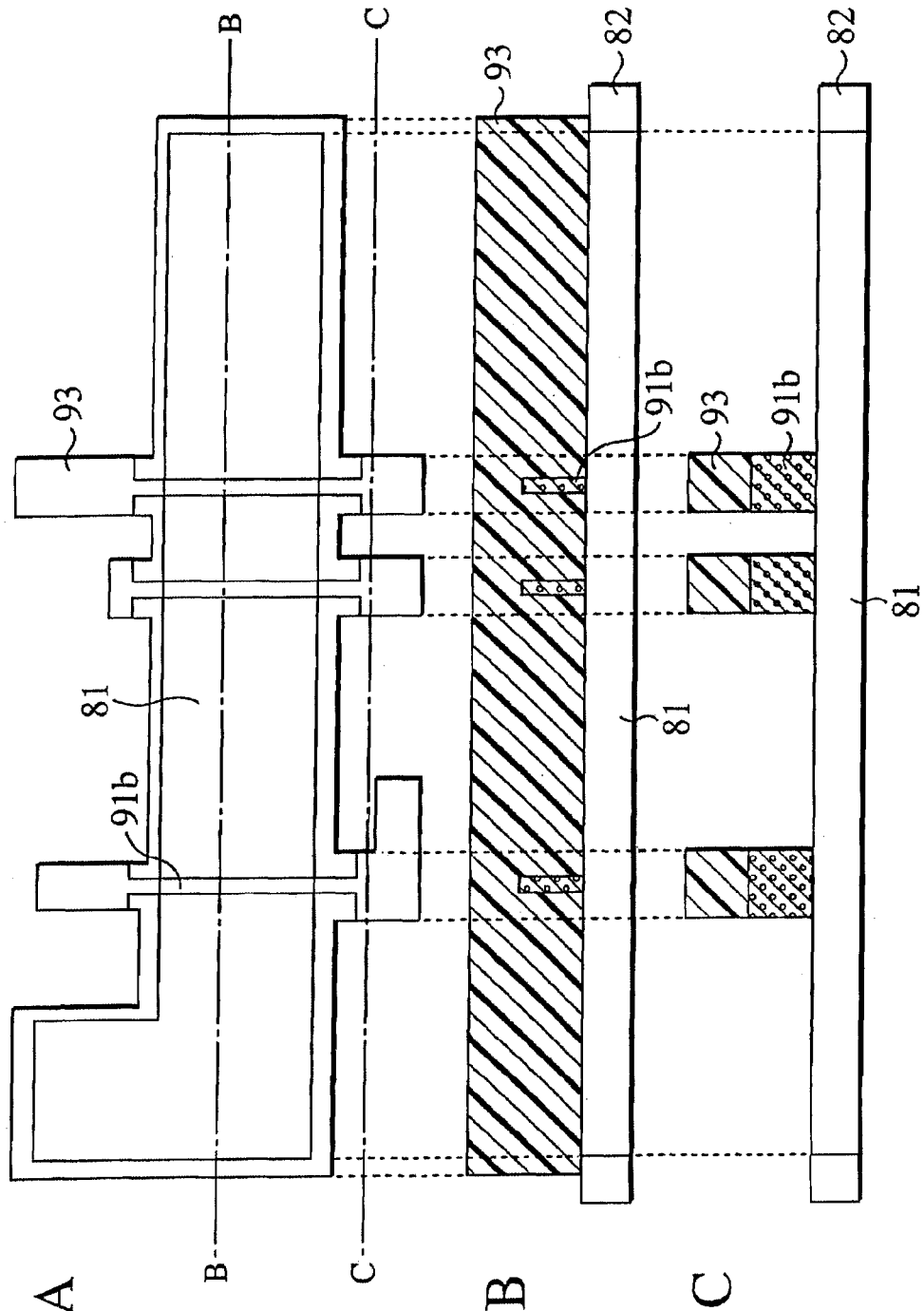
FIGS. 107A-107C are a plan view and sectional views along B-B and C-C lines of the plan view of a semiconductor device made by the process in a semiconductor device fabrication method according to the first example of the eleventh embodiment.

Next, as shown in FIGS. 107A-107C, the gate material film is etched using the resist pattern 93 as a mask, so that the gate material film pattern 91b is formed. Further, as shown in FIGS. 108A-108C, the resist pattern 93 is removed.

As described above, according to the eleventh embodiment, it is possible to form the gate pattern in the element region whose dimension is not more than the limitation of the lithography process by performing the sliming process, and also possible to form the gate pattern in the element isolation region with a narrow space pattern because the sliming process does not affect the gate pattern in the element isolation region.

Second Example

FIGS. 109A-109C to FIGS. 115A-115C are diagrams showing a manufacturing process of a gate layer (gate electrode and gate wiring) according to the second example of the eleventh embodiment. In those diagrams, each of FIGS. 109A, 110A, 111A, 112A, 113A, 114A, and 115A shows a plan pattern, and each of FIGS. 109B, 110B, 111B, 112B, 113B, 114B, and 115B shows a sectional view of line B-B', and each of FIGS. 109C, 110C, 111C, 112C, 113C, 114C, and 115C shows a sectional view of line C-C'.

Figures 109A, 109B, 109C:
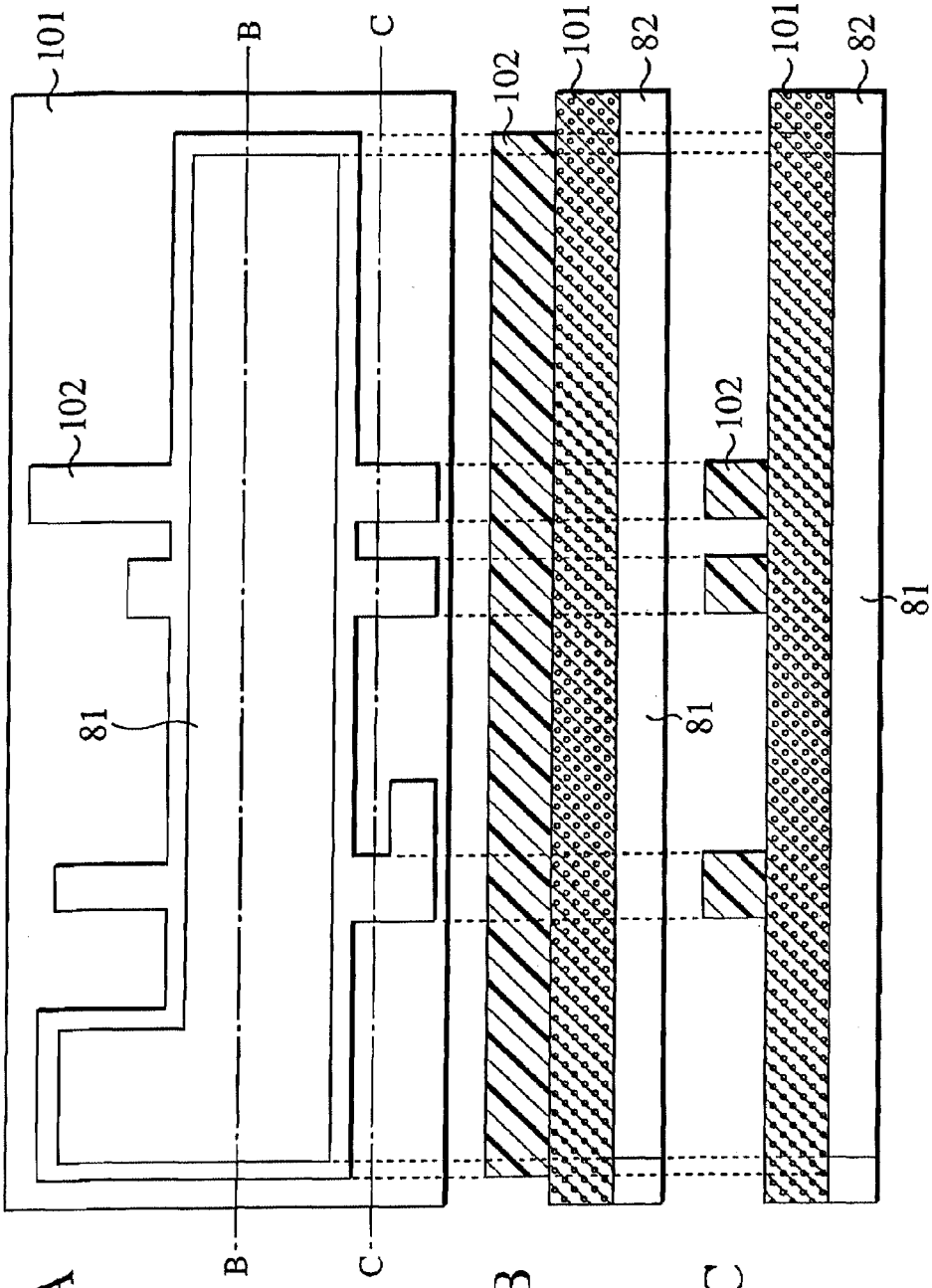
FIGS. 109A-109C are a plan view and sectional views along B-B and C-C lines of the plan view of a semiconductor device made by the process in a semiconductor device fabrication method according to a second example of the eleventh embodiment.

In the first example of the eleventh embodiment described above, a gate pattern is firstly formed in the element region and a gate pattern is then formed in the element isolation region. On the contrary, in this second example, a gate pattern is firstly formed in the element isolation region and a gate pattern is then formed in the element region. First, as shown in FIGS. 109A-109C, like the first example of the eleventh embodiment, a gate material film 101, for example, a polysilicon film is formed over a semiconductor substrate having an element region 81 and an element isolation region 82. Then, a resist film is formed over the gate material film 101. Following this process, a pattern is transferred onto the resist film using an exposure mask, and the resist film is developed in order to form a resist pattern 102. By this resist pattern 102, a gate pattern (gate wiring pattern) is formed in the element isolation region 82 and covers (or protects) the entire area of the element region 81.

At this time, in order to certainly form the element region 81, the end portion of the resist pattern 102 is so formed that the end portion, of the resist pattern 102 is outside in position of the element region 81. In other word, the exposure process uses the exposure mask that has been so designed that the end portion of the resist pattern 102 is shifted (for example, by approximately several ten nm) toward the direction of the element isolation region 82 from the boundary portion of the element isolation region 82. By the way, like the cases of the tenth embodiment, the exposure mask used in the exposure process has been treated by the optical proximity correction (OPC) so that the gate pattern is formed over the wafer with a desired dimension.

Next, as shown in FIGS. 110A-110C, the gate material film is etched using the resist pattern 102 as a mask in order to form a gate material film pattern 101a. Further, as shown in FIGS. 111A-111C, the resist pattern 102a is then removed.

Next, as shown in FIGS. 111A-111C, after a resist film is applied onto the entire surface, a pattern is transferred onto this resist film using the exposure mask. The resist film is then developed in order to form a resist pattern 103. This resist pattern 103 will form the gate pattern (gate wiring pattern) in the element isolation region 82 and covers (or protects) the entire of the element region 81.

At this time, in order to certainly protect the element region 81 from a position-mismatching during a pattern exposure or from a variation of a dimension of the resist pattern caused by variations in the fabrication processes such as an operation of an exposure device, a state of an underlying substrate, and the like, the end portion of the resist pattern 103 is so formed in the boundary portion of the element region 81 and the element isolation region 82 that the end portion of the resist pattern 103 is positioned at the outside of the element region 81. In other words, the exposure process uses the exposure mask that has been so designed that the end portion of the resist pattern 103 is shifted (for example, by approximately several ten nm) toward the direction of the element isolation region 82 from the boundary portion of the element isolation region 82. Further, in order to eliminate the unnecessary gate material film from the element isolation region 82, the exposure process uses the exposure mask that has been designed so that the end portion of the resist pattern 103 is inside (element region 81 side) in position form the end portion of the resist pattern 102 shown in FIGS. 109A-109C in the boundary portion of the element region 81 and the element isolation region 82.

In addition, like the cases of the tenth embodiment, the exposure mask used in this exposure process has been treated by the optical Proximity correction (OPC) so that the gate pattern is formed over the wafer with a desired dimension. Moreover, it is possible to use a multi-layer resist film as the resist film used in this exposure process, like the cases in the tenth embodiment described above.

Next, as shown in FIGS. 113A-113C, the resist pattern 103 is slimed by performing the etching process (namely, the sliming process) in order to form the resist pattern 103*a*.

Following this process, as shown in FIGS. 114A-114C, the gate material film is etched using the resist pattern 103 as a mask, so that the gate material film pattern 101*b* is formed. Further, as shown in FIGS. 115A-115C, the resist pattern 103 is removed.

As described above, according to the second example of the eleventh embodiment, like the first example, it is possible to form the gate pattern in the element region whose dimension is not more than the limitation of the lithography process by performing the sliming process, and also possible to form the gate pattern in the element isolation region with a narrow space pattern because the sliming process does not affect the gate pattern in the element isolation region.

As described above in detail, in both the tenth and eleventh embodiments, it is possible to form two-parts, performed and not performed by the sliming process, in a same layer, and to obtain the entire area in the same layer with desired pattern dimensions.

That is, in those embodiments, when a circuit pattern is formed in a specified area, the non-specified area is covered with a resist, and on the contrary, when a circuit pattern is formed in the non-specified area, the specified area is covered with a resist. Thereby, the execution of the sliming process does not affect the dimension of the circuit pattern in the non-specified area during the sliming process to slim the circuit pattern in the specified area. Therefore it is possible to form both the patterns, performed and not performed by the sliming process, with desired circuit pattern dimensions.

Twelfth Embodiment

FIGS. 116A to 116F are sectional views showing a semiconductor device fabrication method of the twelfth embodiment, in actual, showing fabrication processes in a gate layer pattern (gate electrode pattern and a gate wiring pattern) fabrication method of MOS transistors in the semiconductor device fabrication method.

Figure 116A:
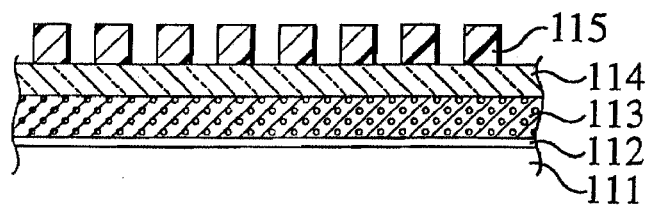
FIGS. 116A-116F are sectional views showing the semiconductor device fabrication method according to the twelfth embodiment.

First, as shown in FIG. 116A, a gate insulation film (for example, silicon oxide film of approximately 1-3 nm thickness) 112 and a gate material film (for example, a poly-silicon film of approximately 150-200 nm thickness) 113 are formed over a semiconductor substrate 111, and further, a hard mask material film 114 (approximately, 50-100 nm thickness) is formed over the gate material film 113. In this case, a SiON film is used as the hard mask material film 114.

Following this process, a resist film (a thin film resist of approximately 200-300 nm thickness) is applied over the hard mask material film 114. The resist film is then exposed and developed by a usual lithography process in order to form a resist pattern 115. This resist pattern 115 also includes a dummy pattern in addition to a large scale integration (LSI) circuit pattern (here, the gate electrode pattern and the gate wiring pattern that will be finally required for use).

The use of the dummy pattern can substantially make a uniform pattern density of the resist pattern 115 over the entire area (LSI formation region) of the semiconductor substrate 111. In this case, each of the line width and the space width of the resist pattern 115 is approximately 100 nm, for example.

Figure 116B:
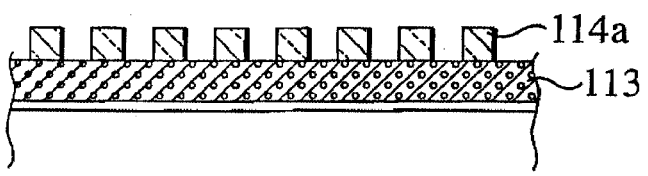

Next, as shown in FIG. 116B, an anisotropy etching as a dry etching is performed for the hard mask material film 114 using the resist pattern 115 as a mask, so that a hard mask material pattern 114*a* is formed. In this dry etching process, a gas of a phloro-carbon series such as $CF_4$ is used as the dry etching gas.

Because the thickness of the hard mask material film 114 is thin, it is not necessary to use the highly selective etching that was described in the related art section. However, when the highly selective etching is used and the hard mask material film 114 is etched while protecting the resist pattern 115 by adhering the reaction products to the resist pattern 115, the amount of the adhesion of the reaction products to the resist pattern 115 become approximately uniform in the entire area of the resist pattern because the pattern density of the resist pattern 115 makes uniform.

After this process, the resist pattern 115 is removed by $O_2$ ashing process or a process (hereinafter referred to as "SP process") using a stripper solution made of a mixed solution of a hydrogen peroxide solution and a sulfuric acid, or it is also possible to use a combination of the $O_2$ ashing process and the SP process.

Figure 116C:
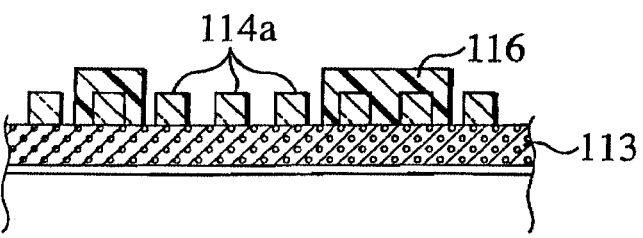

Next, as shown in FIG. 116C, a resist film is applied and the resist film is exposed and then developed by the usual lithography process. A resist pattern 116 is thereby formed.

This resist pattern 116 covers only the area corresponding to the LSI circuit pattern, that is finally required, in the hard mask material film pattern 114*a*.

Figure 116D:
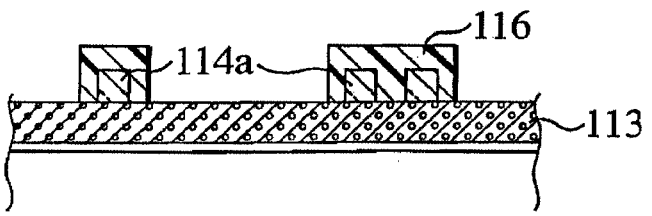

Following this process, as shown in FIG. 116D, the area of the dummy pattern in the hard mask material film pattern 114*a* is removed by etching using a thermal phosphoric acid.

Figure 116E:
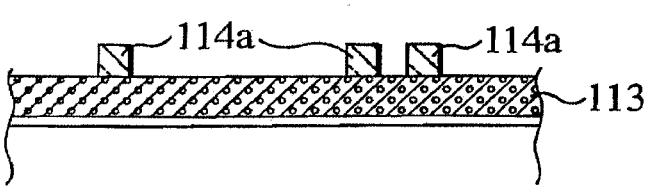

Further, as shown in FIG. 116E, the resist pattern 116 is removed by the $O_2$ ashing process or PS process. In this case, it is also possible to use a combination of both the $O_2$ ashing process and SP process.

Figure 116F:
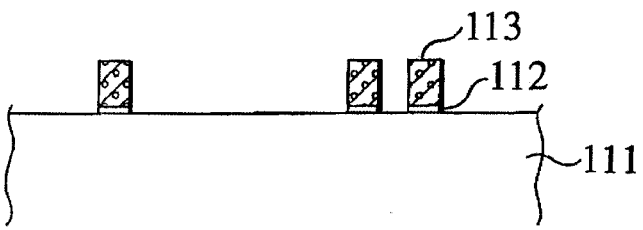

Next, as shown in FIG. 116F, the gate material film 113 and the gate insulation film 112 are etched by the dry etching (Reactive Ion Etching: RIE) of anisotropic etching using the remained hard mask material pattern 114*a*, namely, the pattern corresponding to the LSI circuit pattern as a mask, so that the gate layer pattern is formed. In this dry etching process, a gas of Halogen series such as $Cl_2$, HBr and the like is used as the etching gas. It is not necessary to use the highly selective etching (which was described in the description of the related art) in this dry etching process because the hard mask material film is hard and has a high RIE resistant when compared with the resist film. Hence, if there are a rough pattern area and a dense pattern area in the LSI circuit pattern, the pattern dimension of the LSI circuit pattern is not changed.

Finally, the hard mask material film pattern 114a is removed by etching using a thermal phosphoric acid.

As described above, according to the twelfth embodiment, it is possible to obtain a gate layer pattern having an uniform pattern width in the entire area regardless of the rough/dense degree of the gate layer pattern by forming a hard mask material film pattern using a resist pattern of an uniform pattern density and by etching a gate material film using the hard mask material film pattern.

Thirteenth Embodiment

FIGS. 117A to 117G are sectional views showing a semiconductor device fabrication method of the thirteenth embodiment, in actual, showing fabrication processes in a gate layer pattern (gate electrode pattern and a gate wiring pattern) fabrication method of MOS transistors in the semiconductor device fabrication method.

In the thirteenth embodiment, a process is added into the processes of the twelfth embodiment shown in FIG. 116A to FIG. 116F. Hence, the processes other than this additional process are the same as those of the twelfth embodiment and the explanation of those same processes is basically applied to the thirteenth embodiment.

Figure 117A:
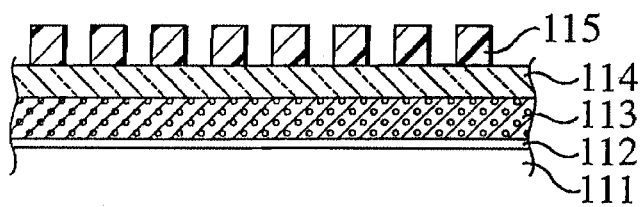
FIGS. 117A-117G are sectional views showing the semiconductor device fabrication method according to the thirteenth embodiment.

First, as shown in FIG. 117A, the gate insulation film 112, the gate material film 113, and the hard mask material film 114 are formed over the semiconductor substrate 111, and further, the resist pattern 115 is formed over the hard mask material film 114, like the manner of the twelfth embodiment.

Figure 117B:
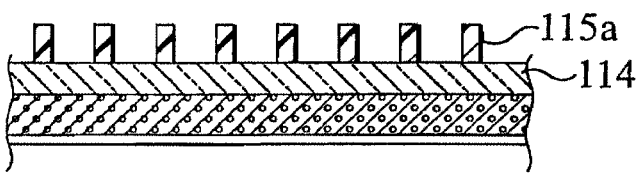

Next, as shown in FIG. 117B, the resist pattern 115 is slimmed by performing the sliming process in order to form a resist pattern 115a slimmed. In this sliming process, a dry etching is performed, and a mixed gas of HBr, $CH_4$, and $O_2$ is used as an etching gas, for example.

At this time, the amount of the sliming process (namely, a sliming width) of the resist pattern 115 is uniform in the entire area and the pattern width of the slimmed resist pattern 115a becomes uniform in the entire area because the pattern density of the resist pattern 115 has been uniform.

Figure 117C:
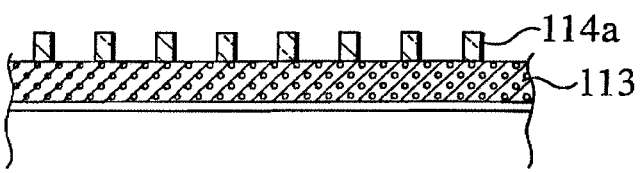

Next, as shown in FIG. 117C, like the manner of the twelfth embodiment, the hard mask material film 114 is etched using the resist pattern 115a as a mask in order to form the hard mask material film pattern 114a. Like the same reason of the twelfth embodiment, the pattern width of the hard mask material film pattern 114a becomes uniform in the entire area. After this process, like the same manner of the twelfth embodiment, the resist pattern 115a is removed.

Figure 117D:
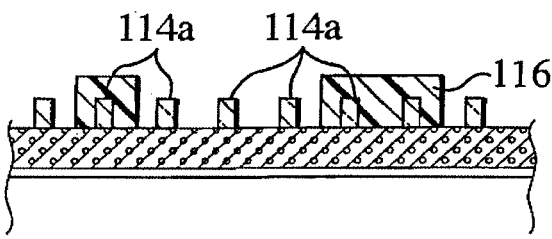
Figure 117E:
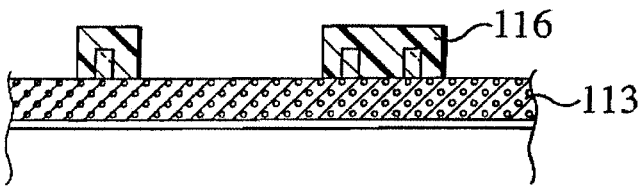
Figure 117F:
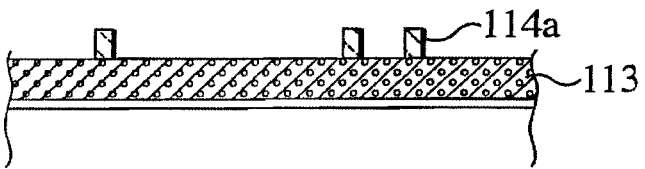
Figure 117G:
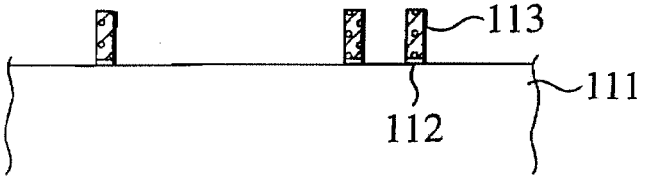

Following processes are the same as those processes of the twelfth embodiment. That is, as shown in FIG. 117D, the resist pattern 116 that covers the area corresponding to the LSI circuit pattern, that will be finally required, is formed in the hard mask material film pattern 114a. Following this process, as shown in FIG. 117E, the dummy pattern in the hard mask material film pattern 114a is removed using the resist pattern 116 as a mask by performing the etching process. Further, after the resist pattern 116 is removed shown in FIG. 117F, the gate layer pattern is formed, as shown in FIG. 117G, by etching the gate material film 113 and the gate insulation film 112 using the remained hard mask material film pattern 114a as a mask. Finally, the hard mask material film pattern 114a is removed by performing the etching process.

In the third embodiment, like the twelfth embodiment, it is possible to obtain the gate layer pattern having a uniform pattern width in the entire area regardless of the rough/dense degree of the gate layer pattern. Further, it is possible to further form a finer gate layer pattern by performing the sliming process of the resist pattern.

Fourteenth Embodiment

FIGS. 118A to 118G are sectional views showing a semiconductor device fabrication method of the fourteenth embodiment, in actual, showing fabrication processes in a gate layer pattern (gate electrode pattern and a gate wiring pattern) fabrication method of MOS transistors in the semiconductor device fabrication method.

In the fourteenth embodiment, a process is added into the processes of the twelfth embodiment shown in FIG. 116A to FIG. 116F. Hence, the processes other than this additional process are the same as those of the twelfth embodiment and the explanation of those same processes is basically applied to the thirteenth embodiment unless it is mentioned.

Figure 118A:
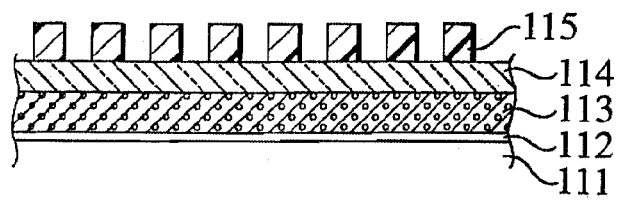
FIGS. 118A-118F are sectional views showing the semiconductor device fabrication method according to fourteenth embodiment.

First, as shown in FIG. 118A, the gate insulation film 112, the gate material film 113, and the hard mask material film 114 are formed over the semiconductor substrate 111, and the resist pattern 115 is then formed over the hard mask material film 114, like the manner of the twelfth embodiment.

Figure 118B:
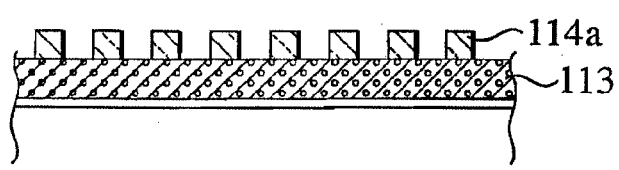

Next, as shown in FIG. 118B, the hard mask material film 114 is etched using the resist pattern 115 as a mask, so that the hard mask material film pattern 114a is formed. Like the same reason in the twelfth embodiment, the pattern width of the hard mask material film pattern 114a can be uniform in the entire area. After this process, like the manner of the twelfth embodiment, the resist pattern 115 is removed.

Figure 118C:
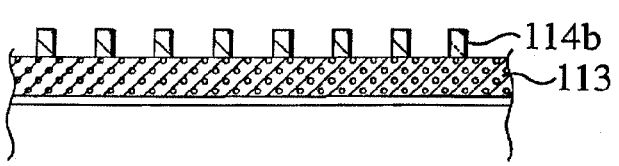

Next, as shown in FIG. 118C, like the manner of the twelfth embodiment, the hard mask material film pattern 114a is slimmed by performing the sliming process, so that the slimmed hard mask material film pattern 114b can be obtained. Dry etching or wet etching is used in this sliming process. The dry etching uses an etching gas, for example, a gas of a phloro-carbon series such as $CHF_3$, and the wet etching uses an etching solution, for example, an etching solution of HF series.

At this time, because the pattern density of the hard mask material film pattern 114a has been uniform, the sliming amount (namely, the sliming width) of the hard mask material film pattern 114b becomes approximately uniform in the entire area.

Figure 118D:
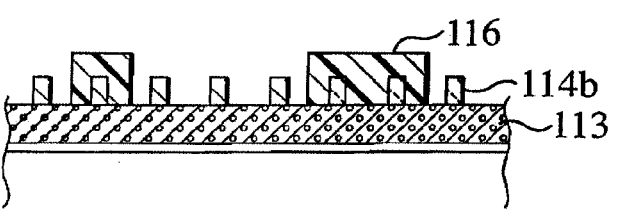
Figure 118E:
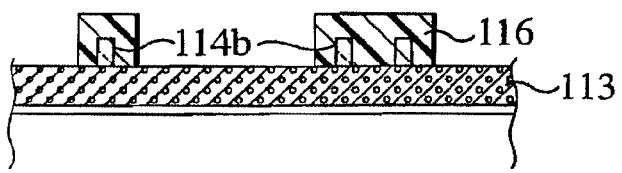
Figure 118F:
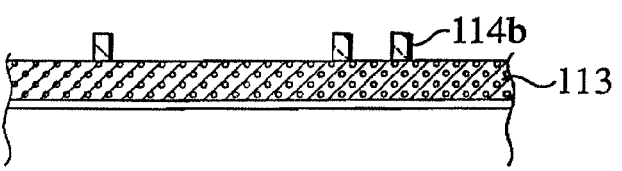
Figure 118G:
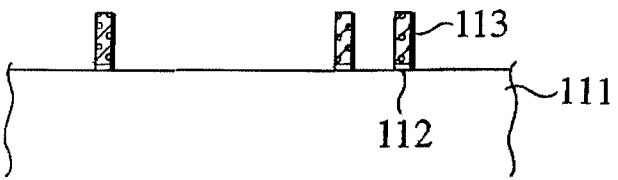

Following processes are the same as those processes of the twelfth embodiment. That is, as shown in FIG. 118D, the resist pattern 116 that covers the area corresponding to the LSI circuit pattern (which is finally required) is formed in the hard mask material film pattern 114b. Following this process, as shown in FIG. 118E, the dummy pattern in the hard mask material film pattern 114b is removed using the resist pattern 116 as a mask by performing the etching process. Further, after the resist pattern 116 is removed shown in FIG. 118F, the gate layer pattern is formed, as shown in FIG. 118G, by etching the gate material film 113 and the gate insulation film 112 using the remained hard mask material film pattern 114b as a mask. Finally, the hard mask material film pattern 114b is removed by performing the etching process.

In the fourteenth embodiment, like the twelfth embodiment, it is possible to obtain the gate layer pattern having a uniform pattern width in the entire area regardless of the rough/dense degree of the gate layer pattern. Further, it is possible to further form a finer gate layer pattern by performing the sliming process of the hard mask material film pattern.

Fifteenth Embodiment

FIGS. 119A to 119H are sectional views showing a semiconductor device fabrication method of the fifteenth embodiment, in actual, showing fabrication processes in a gate layer pattern (gate electrode pattern and a gate wiring pattern) fabrication method of MOS transistors in the semiconductor device fabrication method.

In the fifteenth embodiment, processes are added into the processes of the twelfth embodiment shown in FIG. 116A to FIG. 116F. In actual, the additional processes, which have been added in both the thirteenth embodiment and the fourteenth embodiment, are added into the processes of the twelfth embodiment. Hence, the processes other than those additional processes are the same as those of the twelfth embodiment and the explanation of those same processes in the twelfth to fourteenth embodiments is basically applied to the fifteenth embodiment unless mentioned.

Figure 119A:
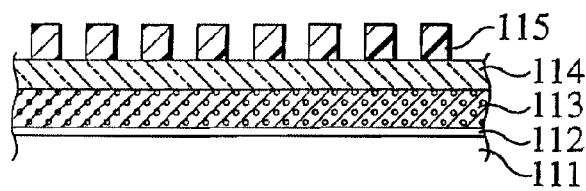
FIGS. 119A-119H are sectional views showing the semiconductor device fabrication method according to the fifteenth embodiment.

First, as shown in FIG. 119A, the gate insulation film 112, the gate material film 113, and the hard mask material film 114 are formed over the semiconductor substrate 111, and further, the resist pattern 115 is formed over the hard mask material film 114, like the manner of the twelfth embodiment.

Figure 119B:
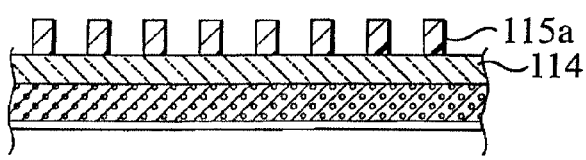

Next, as shown in FIG. 119B, the resist pattern 115 is slimmed by performing the sliming process in order to form the slimmed resist pattern 115a. At this time, the amount of the sliming process (namely, the sliming width) of the resist pattern 115 becomes uniform in the entire area and the pattern width of the slimmed resist pattern 115a becomes uniform in the entire area because the pattern density of the resist pattern 115 has been uniform.

Figure 119C:
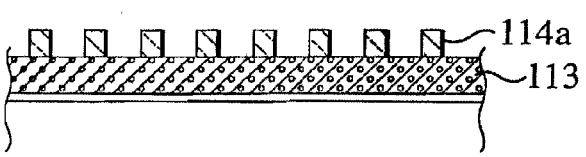

Next, as shown in FIG. 119C, like the manner of the twelfth embodiment, the hard mask material film 114 is etched using the resist pattern 115a as a mask in order to form the hard mask material film pattern 114a. Like the same reason of the twelfth embodiment, the width (pattern width) of the hard mask material film pattern 114a becomes uniform in the entire area. After this process, like the manner of the twelfth embodiment, the resist pattern 115a is removed.

Figure 119D:
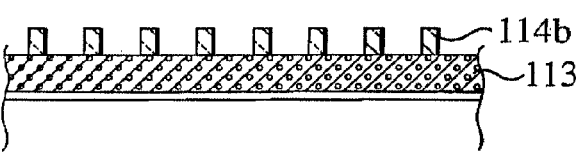

Next, as shown in FIG. 119D, like the fourteenth embodiment, the hard mask material film pattern 114a is slimmed by performing the sliming process, so that the slimmed hard mask material film pattern 114b can be obtained. At this time, because the pattern density of the hard mask material film pattern 114a has been uniform, the amount of the sliming (namely, the sliming width) of the hard mask material film pattern 114b becomes approximately uniform in the entire area.

Figure 119E:
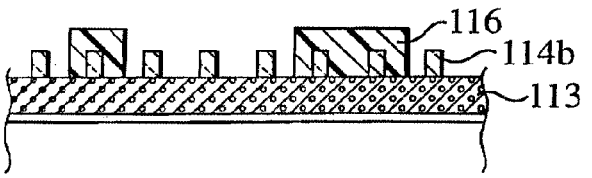
Figure 119F:
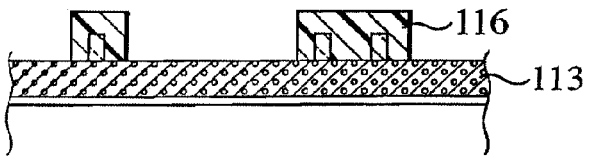
Figure 119G:
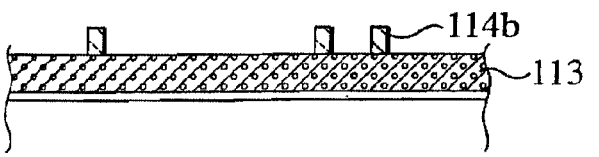
Figure 119H:
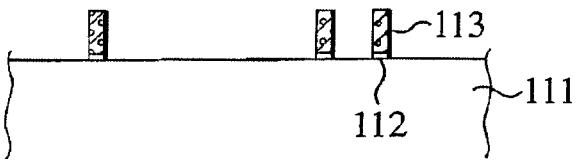
Figure 122A:
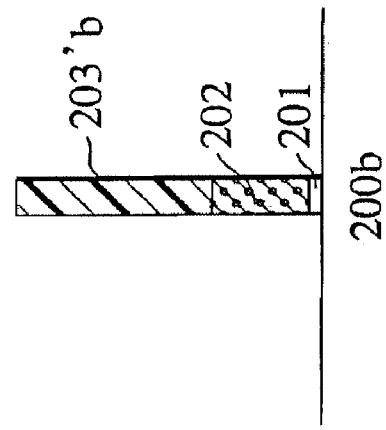
Figure 122B:
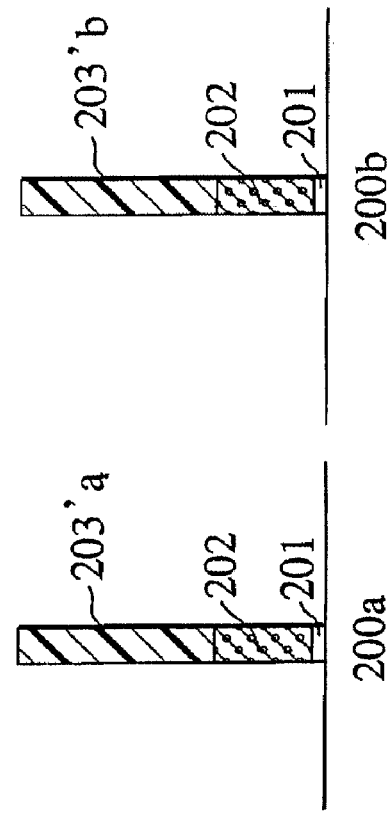
Figure 122C:
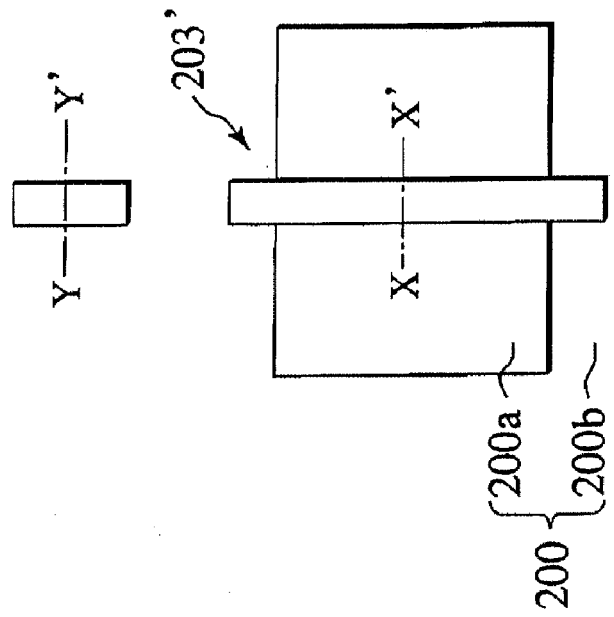
Figures 123A, 123B, 123C:
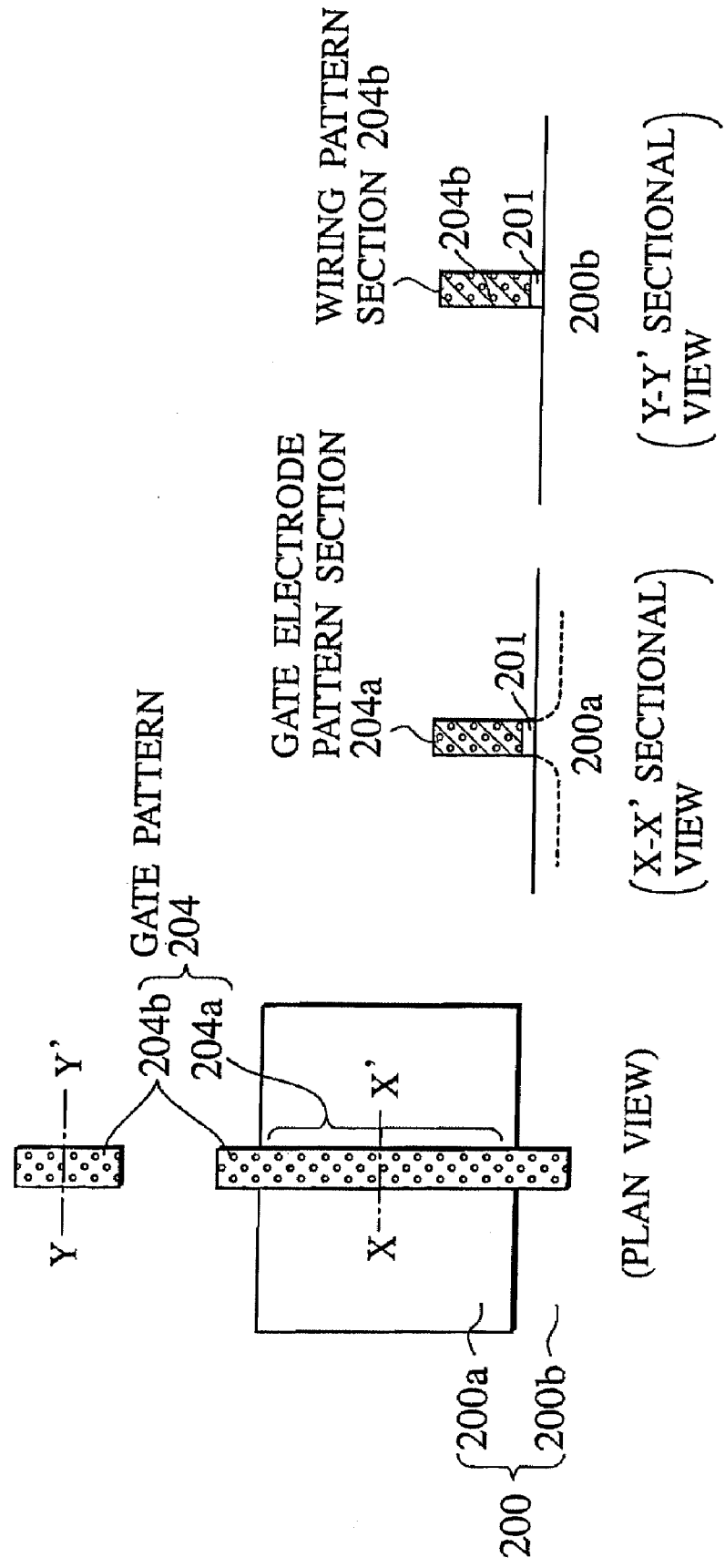
Figure 125:
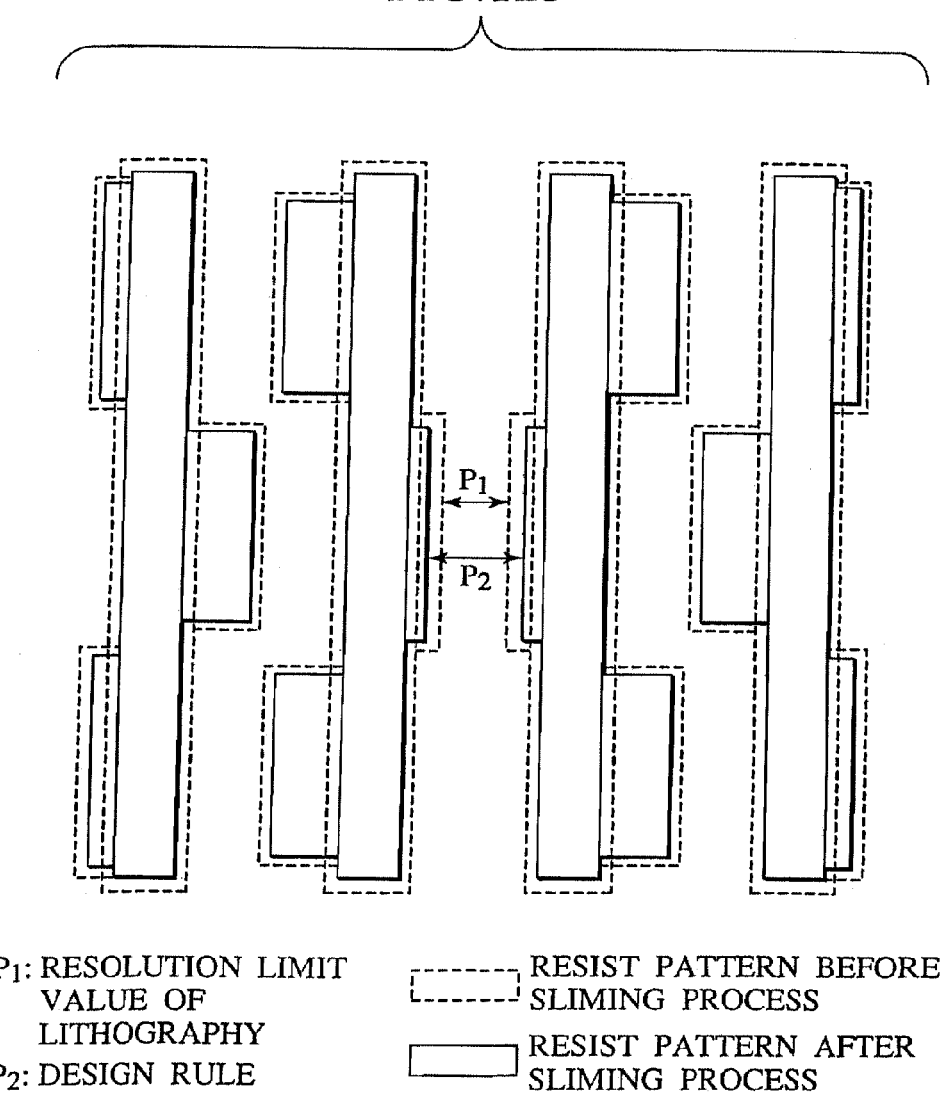

Following processes are the same as those processes of the twelfth embodiment. That is, as shown in FIG. 119E, the resist pattern 116 that covers the area corresponding to the LSI circuit pattern, that will be finally required is formed, in the hard mask material film pattern 114b. Following this process, as shown in FIG. 119F, the dummy pattern in the hard mask material film pattern 114b is removed using the resist pattern 116 as a mask by performing the etching process. Further, after the resist pattern 116 is removed shown in FIG. 119G, the gate layer pattern is formed, as shown in FIG. 119H, by etching the gate material film 113 and the gate insulation film 112 using the remained hard mask material film pattern 114b as a mask. Finally, the hard mask material film pattern 114b is removed by performing the etching process. The line width of the obtained gate layer pattern formed by the above processes becomes approximately 60 nm, for example.

In the fifteenth embodiment, like the twelfth embodiment, it is possible to obtain the gate layer pattern having an uniform pattern width in the entire area regardless of the rough/dense degree of the gate layer pattern. Further, it is possible to further form a finer gate layer pattern by performing the sliming process of the resist pattern and the hard mask material film pattern.

In the twelfth embodiment through the fifteenth embodiment, although the hard mask material film is formed between the gate material film and the resist film, it is possible to use an anti-reflection material film or a planarization material film. Further, it is also possible to use a single layer film made up of one of the hard mask material film, the anti-reflection material film, and the planarization material film, or to use a laminated layer film made up of a combination of those films.

Instead of the silicon oxynitride film (SiON film) as the anti-reflection material film described in the twelfth to fifteenth embodiments, it is possible to use following films: silicon oxynitride film (SiON film); silicon oxidation film ($SiO_2$); silicon nitride film ($Si_3N_4$ film); aluminum oxide film ($Al_2O_3$ film); silicon carbide film (SiC film); carbon film (C film); and the like. Further, instead of the planarization material film it is possible to use a film including an organic coating film of "i" ray spectrum resist, for example, a film on which an organic coating film such as SOG (Spin On Glass) and the like is coated.

Furthermore, the hard mask material film, the anti-reflection material film, and the planarization material film are commonly used in order to increase a pattern-accuracy in a lithography process. The hard mask material film, in general, is formed over or under a resist film in order to transfer a resist pattern of the resist film on it and then used as an etching mask for an underlying layer. The anti-reflection material film, in general, is formed over or under the resist film in order to decrease the amount of an exposure light reflected from the underlying layer during a pattern exposure process. The planarization material film, in general, is formed over or under the resist film in order to decrease an influence of a rough surface of the underlying layer.

Moreover, although the twelfth embodiment through the fifteenth embodiment explain the cases of the formation of the gate layer pattern of the transistor, it is possible to apply the above-described manners of those embodiments to various LSI fabrication processes.

Further, it is possible to decrease an influence of a dimension error caused by the pattern rough/dense degree, and it is thereby possible to form a fine pattern with high accuracy.

Still furthermore, it is acceptable to slim a first resist pattern by performing the sliming process after the first resist pattern is formed, and it is also acceptable to slim a second material film pattern by performing the sliming process after the second material film pattern is formed. Further, it is also acceptable to slim the first resist pattern by performing the sliming process after the first resist pattern is formed and to slim the second material film pattern by performing the sliming process after the second material film pattern is formed.

As described above, it is possible to obtain a uniform pattern density by forming a dummy pattern in addition to a desired pattern over the first resist pattern. It is possible to obtain the second material film having uniform pattern width by etching the second material film using the first resist pattern of the uniform pattern density as a mask. When the first material film is etched using a part corresponding to a desired pattern in the second material film as a mask, different from the case in which the resist is used as a mask, it is possible to uniform the pattern width of the first material film in the entire area because there is no influence of the pattern rough/dense degree. Moreover, when the sliming process is performed, it is possible to uniform the pattern width in the entire area because the pattern density has been uniform.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device fabrication method of forming desired patterns over a specified area and non-specified area, comprising:
    forming a first resist film over a material film formed over a work substrate;
    transferring a first mask pattern, including a circuit pattern for the non-specified area and a protection pattern for the specified area, to the first resist film using a first exposure mask;
    forming a first resist pattern by developing the first resist film to which the first mask pattern has been transferred;
    forming a first material film pattern by etching the material film using the first resist pattern as a mask;
    removing the first resist pattern;
    forming a second resist film over the work substrate over which the first material film pattern has been formed;
    transferring a second mask pattern, including a circuit pattern for the specified area and a protection pattern for the non-specified area, to the second resist film using a second exposure mask;
    forming a second resist pattern by developing the second resist film to which the second mask pattern has been transferred;
    slimming the second resist pattern;
    forming a second material film pattern by etching the material film using the slimmed second resist pattern as a mask; and
    removing the slimmed second resist pattern.

2. A semiconductor device fabrication method of forming desired patterns over a specified area and non-specified area, comprising:
    forming a first resist film over a material film formed over a work substrate;
    transferring a first mask pattern, including a circuit pattern for the specified area and a protection pattern for the non-specified area, to the first resist film using a first exposure mask;
    forming a first resist pattern by developing the first resist film to which the first mask pattern has been transferred;
    slimming the first resist pattern;
    forming a first material film pattern by etching the material film using the slimmed first resist pattern as a mask;
    removing the slimmed first resist pattern,
    forming a second resist film over the work substrate over which the first material film pattern has been formed;
    transferring a second mask pattern, including a circuit pattern for the non-specified area and a protection pattern for the specified area, to the second resist film using a second exposure mask;
    forming a second resist pattern by developing the second resist film to which the second mask pattern has been transferred;
    forming a second material film pattern by etching the material film using the second resist pattern as a mask; and
    removing the second resist pattern.

3. The semiconductor device fabrication method according to claim 1, wherein the protection pattern for the specified area protects at least a formation expected-area for the circuit pattern of the specified area, and the protection pattern for the non-specified area protects at least the circuit pattern for the non-specified area.

4. The semiconductor device fabrication method according to claim 2, wherein the protection pattern for the non-specified area protects at least a formation expected-area for the circuit pattern of the non-specified area, and the protection pattern for the specified area protects at least the circuit pattern for the specified area.

5. The semiconductor device fabrication method according to claim 1, wherein the specified area corresponds to a logic circuit area, the non-specified area corresponds to a memory circuit area, and the logic circuit area is separated from the memory circuit area through an element isolation area.

6. The semiconductor device fabrication method according to claim 1, wherein the specified area corresponds to an element area, the non-specified area corresponds to an element isolation area, and the element area is surrounded with the element isolation area.

7. The semiconductor device fabrication method according to claim 5, wherein an end part of the protection pattern for the specified area is in the element isolation area in an area in which the logic circuit area and the memory circuit area are faced to each other.

8. The semiconductor device fabrication method according to claim 5, wherein an end part of the protection pattern for the non-specified area is in the element isolation area in an area in which the logic circuit area and the memory circuit area are faced to each other.

9. The semiconductor device fabrication method according to claim 5, wherein an end part of the protection pattern for the specified area and an end part of the protection pattern for the non-specified area are in the element isolation area in an area in which the logic circuit area and the memory circuit area are faced to each other, and
    a position relationship between the protection pattern of the specified area and the protection pattern of the non-specified area is determined under a condition in which both the end part of the protection pattern for the specified area and the end part of the protection pattern for the non-specified area are not overlapped to each other.

10. The semiconductor device fabrication method according to claim 5, wherein an end part of the protection pattern for the specified area and an end part of the protection pattern for the non-specified area are in the element isolation area in an area in which the logic circuit area and the memory circuit area are faced to each other, and
    a position relationship between the protection pattern of the specified area and the protection pattern of the non-specified area is determined under a condition in which both the end part of the protection pattern for the specified area and the end part of the protection pattern for the non-specified area are overlapped to each other.

11. The semiconductor device fabrication method according to claim 6, wherein, in the boundary area of the element area and the element isolation area, the end area of the protection pattern for the specified area is outside of the element area.

12. The semiconductor device fabrication method according to claim 6, wherein, in the boundary area of the element area and the element isolation area, the end area of the protection pattern for the non-specified area is outside of the element area.

13. The semiconductor device fabrication method according to claim 6, wherein, in the boundary area of the element area and the element isolation area, the end area of the protection pattern for the specified area is outside of the element area, and the end area of the protection pattern of the non-specified area is further outside of the end area of the protection pattern of the specified area.

14. The semiconductor device fabrication method according to claim 6, wherein the circuit pattern of the specified area is elongated to the non-specified area.

15. The semiconductor device fabrication method according to claim 1, wherein the first exposure mask and the second exposure mask are used for the formation of a gate layer pattern.

16. The semiconductor device fabrication method according to claim 1, wherein at least one of the first exposure mask and the second exposure mask is treated by an optical proximity correction.

* * * * *